US012669748B2

(12) United States Patent
Hatakeyama

(10) Patent No.: US 12,669,748 B2
(45) Date of Patent: Jun. 30, 2026

(54) CHEMICALLY AMPLIFIED RESIST COMPOSITION AND PATTERNING PROCESS

(71) Applicant: Shin-Etsu Chemical Co., Ltd., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 566 days.

(21) Appl. No.: 18/115,192

(22) Filed: Feb. 28, 2023

(65) Prior Publication Data

US 2023/0288804 A1 Sep. 14, 2023

(30) Foreign Application Priority Data

Mar. 11, 2022 (JP) ................................ 2022-038122

(51) Int. Cl.

*G03F 7/039* (2006.01)
*G03F 7/038* (2006.01)
*G03F 7/20* (2006.01)

(52) U.S. Cl.

CPC .......... *G03F 7/0392* (2013.01); *G03F 7/0382* (2013.01); *G03F 7/2006* (2013.01)

(58) Field of Classification Search

None

See application file for complete search history.

(56) References Cited

U.S. PATENT DOCUMENTS 6,395,451 B1 * 5/2002 Jung ..................... H10P 14/683
430/326
2011/0217654 A1 * 9/2011 Yamato ................. G03F 7/0397
430/326
2020/0241417 A1 * 7/2020 Hatakeyama ..... C08F 220/1805
2020/0272048 A1 * 8/2020 Hatakeyama ......... G03F 7/0397

FOREIGN PATENT DOCUMENTS

JP 2001-194776 A 7/2001
JP 2002-226470 A 8/2002
JP 2002-363148 A 12/2002
JP 2011197067 A * 10/2011

OTHER PUBLICATIONS

Translated Description of Ichikawa (Year: 2011).*

* cited by examiner

*Primary Examiner* — Jonathan Johnson
*Assistant Examiner* — Andrew Preston Traywick
(74) *Attorney, Agent, or Firm* — WHDA, LLP

(57) ABSTRACT

A resist composition comprising a quencher and an acid generator is provided. The quencher is a compound having a nitro-substituted aromatic moiety-containing acid labile group and a heterocyclic amine structure in its molecule. The resist composition has a high sensitivity and forms a pattern with improved LWR or CDU, independent of whether it is of positive or negative tone.

12 Claims, No Drawings

CHEMICALLY AMPLIFIED RESIST COMPOSITION AND PATTERNING PROCESS

CROSS-REFERENCE TO RELATED APPLICATION

This non-provisional application claims priority under 35 U.S.C. § 119(a) on Patent Application No. 2022-038122 filed in Japan on Mar. 11, 2022, the entire contents of which are hereby incorporated by reference.

TECHNICAL FIELD

This invention relates to a chemically amplified resist composition and a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smart phones drives forward the miniaturization technology. As the advanced miniaturization technology, manufacturing of 7-nm node devices by double patterning of the ArF immersion lithography and 5-nm node devices by the EUV lithography is implemented in a mass scale.

As the pattern feature size is reduced, approaching to the diffraction limit of light, light contrast lowers. In the case of positive resist film, a lowering of light contrast leads to reductions of resolution and focus margin of hole and trench patterns. For preventing any influence of a reduction of resolution of resist pattern due to a lowering of light contrast, an attempt is made to enhance the dissolution contrast of resist film.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein polarity switch or crosslinking reaction takes place under the action of acid. The addition of quenchers to these resist compositions is quite effective for the purpose of controlling the diffusion of the acid to unexposed region to improve the contrast. A number of amine quenchers were proposed as disclosed in Patent Documents 1 to 3. Patent Document 3 is directed to a resist material comprising an amine compound having an acid labile group of tertiary ester type. Upon deprotection of acid labile groups, not only the base polymer, but also the amine quencher are increased in alkaline dissolution rate, leading to an improvement in dissolution contrast.

For the resist materials adapted for EB and EUV lithography where formation of ultrafine size patterns is required, not only the improvement in dissolution contrast, but also the strict control of acid diffusion are necessary. The amine quenchers of Patent Documents 1 to 3 lack the ability to control acid diffusion. There exists the desire to have a novel material capable of achieving low acid diffusion and high contrast.

CITATION LIST

Patent Document 1: JP-A 2001-194776
Patent Document 2: JP-A 2002-226470
Patent Document 3: JP-A 2002-363148

DISCLOSURE OF INVENTION

For the acid-catalyzed chemically amplified resist material, it is desired to develop a quencher capable of reducing the LWR of line patterns or improving the CDU of hole patterns and increasing sensitivity. To this end, it is necessary to significantly reduce the distance of acid diffusion and to improve the contrast at the same time, i.e., to ameliorate two contradictory properties.

An object of the invention is to provide a chemically amplified resist composition which exhibits a high sensitivity and a reduced LWR or improved CDU, independent of whether it is of positive tone or negative tone; and a pattern forming process using the same.

The inventor has found that when a compound having an acid labile group containing a nitro-substituted aromatic group and a heterocyclic amine structure in its molecule is added as the quencher to a chemically amplified resist composition comprising an acid generator, a high acid diffusion control ability due to the synergy of nitro group and heterocyclic amine structure, and an improvement in dissolution contrast as a result of deprotection of the acid labile group are available, any loss of film thickness after development is prevented, and particularly in the case of a positive resist composition, the solubility of a resist film in the exposed region is improved. The resist film is thus improved in LWR and CDU.

In one aspect, the invention provides a chemically amplified resist composition comprising a quencher and an acid generator, the quencher comprising a compound having an acid labile group containing a nitro-substituted aromatic moiety and a heterocyclic amine structure in its molecule.

In a preferred embodiment, the compound has the formula (1) or (2).

(1)

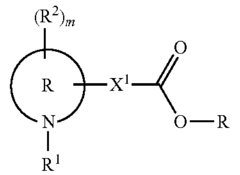

(2)

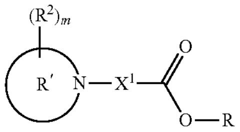

Herein m is 1 or 2, the circle R is a $C_3$-$C_{12}$ heterocycle containing the nitrogen atom in the formula, which may contain at least one moiety selected from an ether bond, ester bond, sulfide bond, sulfonyl moiety, and —N═, and $R^1$ and a carbon atom in the ring may bond together to form a bridged ring, the circle R' is a $C_3$-$C_{12}$ heterocycle containing the nitrogen atom in the formula, which may contain at least one moiety selected from an ether bond, ester bond, sulfide bond, sulfonyl moiety, —N═, and —N($R^1$)—, $R^1$ is hydrogen, a $C_1$-$C_6$ saturated hydrocarbyl group, acetyl, methoxycarbonyl, ethoxycarbonyl, n-propyloxycarbonyl, isopropyloxycarbonyl, tert-butoxycarbonyl, tert-pentyloxycarbonyl, methylcyclopentyloxycarbonyl, ethylcyclopentyloxycarbonyl, propylcyclopentyloxycarbonyl, phenyl, benzyl, naphthyl, naphtylinethyl, methylcyclohexyloxycarbonyl, ethylcyclohexyloxycarbonyl, 9-fluorenylmethyloxycarbonyl, allyloxycarbonyl, methoxymethyl, ethoxymethyl, propoxymethyl, or butoxymethyl, $R^2$ is hydrogen, halogen, a $C_1$-$C_6$ saturated hydrocarbyl group or phenyl group, some or all of the hydrogen atoms in the saturated hydrocarbyl group and phenyl group may be substituted by halogen, $X^1$ is a single bond, or a $C_1$-$C_{20}$ saturated hydrocarbylene group, $C_6$-$C_{12}$ arylene group, $C_7$-$C_{14}$ alkenylene group or group obtained by combining the foregoing, the saturated hydrocarbylene group, arylene group, alkenylene group or group obtained by combining the foregoing may contain at least one moiety selected from an ether bond, ester bond, sulfide, cyano, nitro, sulfonyl, sultone ring, lactone ring and halogen.

R is a group having the formula (R):

(R)

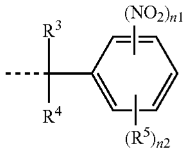

wherein n1 is 1 or 2, n2 is an integer of 0 to 3, $R^3$ and $R^4$ are each independently a $C_1$-$C_{10}$ aliphatic hydrocarbyl group which may contain a heteroatom, $R^3$ and $R^4$ may bond together to form a ring with the carbon atom to which they are attached, $R^5$ is hydrogen, halogen, $C_1$-$C_6$ alkyl group, $C_1$-$C_6$ alkoxy group or $C_1$-$C_6$ acyloxy group, and the broken line designates a valence bond.

In a preferred embodiment, the acid generator is capable of generating a sulfonic acid, imide acid or methide acid.

In a preferred embodiment, the resist composition further comprises a base polymer.

In one preferred embodiment, the base polymer comprises repeat units having the formula (a1) or repeat units having the formula (a2):

(a1)

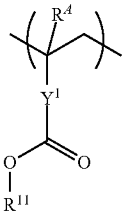

(a2)

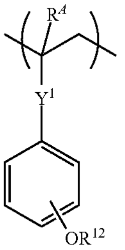

wherein $R^A$ is each independently hydrogen or methyl, $R^{11}$ and $R^{12}$ are each independently an acid labile group, $Y^1$ is a single bond, phenylene, naphthylene, or a $C_1$-$C_{12}$ linking group containing an ester bond and/or lactone ring, and $Y^2$ is a single bond or ester bond.

The resist composition is typically a chemically amplified positive resist composition.

In another preferred embodiment, the base polymer is free of an acid labile group.

The resist composition is typically a chemically amplified negative resist composition.

In a more preferred embodiment, the base polymer comprises repeat units having any one of the formulae (f1) to (f3).

(f1)

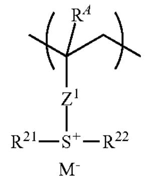

(f2)

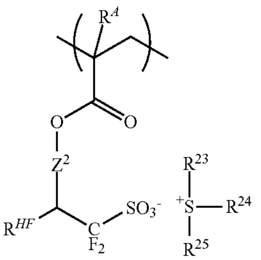

(f3)

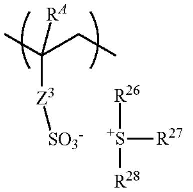

Herein $R^A$ is each independently hydrogen or methyl, $Z^1$ is a single bond, a $C_1$-$C_6$ aliphatic hydrocarbylene group, phenylene group, naphthylene group, or $C_7$-$C_{18}$ group obtained by combining the foregoing, or —O—Z''—, —C(=O)—O—Z''— or —C(=O)—NH—Z''—, $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety, $Z^2$ is a single bond, —$Z^{21}$—C(=O)—O—, —$Z^{21}$—O— or —$Z^{21}$—O—C(=O)—, $Z^{21}$ is a $C_1$-$C_{12}$ saturated hydrocarbylene group which may contain a carbonyl moiety, ester bond or ether bond, $Z^3$ is a single bond, methylene, ethylene, phenylene, fluorinated phenylene, trifluoromethyl-substituted phenylene group, —O—$Z^{31}$—, —C(=O)—O—$Z^{31}$—, or —C(=O)—NH—$Z^{31}$—, $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety, $R^{21}$ to $R^{28}$ are each independently halogen or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, $R^{HF}$ is hydrogen or trifluoromethyl, and $M^-$ is a non-nucleophilic counter ion.

The resist composition may further comprise an organic solvent and/or a surfactant.

In another aspect, the invention provides a pattern forming process comprising the steps of applying the chemically amplified resist composition defined herein onto a substrate to form a resist film thereon, exposing the resist film to high-energy radiation, and developing the exposed resist film in a developer.

Typically, the high-energy radiation is i-line of wavelength 365 run, ArF excimer laser of wavelength 193 nm, KrF excimer laser of wavelength 248 nm, EB or EUV of wavelength 3 to 15 nm.

ADVANTAGEOUS EFFECTS OF INVENTION

The quencher used herein is a compound having an acid labile group containing a nitro-substituted aromatic moiety and a heterocyclic amine structure in its molecule. The co-existence of nitro and amino groups ensures a high acid diffusion-suppressing effect. The dissolution contrast is improved by the deprotection reaction of the acid labile group. As a result, low acid diffusion and high contrast are achieved. The pattern as developed is reduced in LWR or improved in CDU. The quencher in the form of the compound is effective particularly when the resist composition is of positive tone.

DESCRIPTION OF EMBODIMENTS

As used herein, the singular forms "a," "an" and "the" include plural referents unless the context clearly dictates otherwise. The notation ($C_n$-$C_m$) means a group containing from n to in carbon atoms per group. The term "group" and "moiety" are interchangeable. The fluorinated compound refers to a fluorine-substituted or containing compound. In chemical formulae, the broken line designates a valence bond, and Me stands for methyl and Ac for acetyl.

The abbreviations and acronyms have the following meaning.

EB: electron beam

EUV: extreme ultraviolet

Mw: weight average molecular weight

Mn: number average molecular weight

Mw/Mn: molecular weight dispersity

GPC: gel permeation chromatography

PEB: post-exposure bake

PAG: photoacid generator

LWR: line width roughness

CDU: critical dimension uniformity

Resist Composition

The chemically amplified resist composition of the invention is defined as comprising a quencher and an acid generator, the quencher comprising a compound having an acid labile group containing a nitro-substituted aromatic moiety and a heterocyclic amine structure in its molecule. Upon light exposure, the acid generator generates an acid whereas the compound acts to neutralize the acid. Since deprotection reaction takes place at the same time, the carboxylic acid is released whereby the resist film in the exposed region is improved in alkaline dissolution. Since the nitro group has a high acid diffusion-suppressing effect, the synergy of the nitro group with the heterocyclic amine structure within the molecule exerts a high acid diffusion control ability. These lead to a reduced acid diffusion distance and an improved dissolution contrast. A pattern having reduced LWR or improved CDU is formed after development.

The compound exerts an acid diffusion-suppressing effect, a contrast-enhancing effect, and a LWR or CDU-improving effect, which are valid in positive or negative pattern formation by aqueous alkaline development and in negative pattern formation by organic solvent development.

Quencher

The quencher used herein comprises a compound having an acid labile group containing a nitro-substituted aromatic moiety, and a heterocyclic amine structure in its molecule, which is also referred to as "Compound A," hereinafter. Compound A preferably has the formula (1) or (2).

(1)

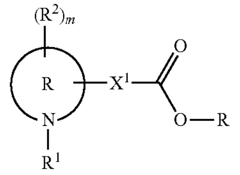

(2)

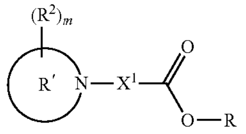

In formulae (1) and (2), in is 1 or 2.

In formula (1), the circle R is a $C_3$-$C_{12}$ heterocycle containing the nitrogen atom in the formula, which may contain at least one moiety selected from an ether bond, ester bond, sulfide bond, sulfonyl moiety, and —N═. $R^1$ and a carbon atom in the ring may bond together to form a bridged ring. In formula (2), the circle R' is a $C_3$-$C_{12}$ heterocycle containing the nitrogen atom in the formula, which may contain at least one moiety selected from an ether bond, ester bond, sulfide bond, sulfonyl moiety, and —N(R')—.

The nitrogen-containing $C_3$-$C_{12}$ heterocycle may be saturated or unsaturated and mono- or polycyclic. In the case of polycyclic, a fused ring or bridged ring is preferred. Examples of the heterocycle include aziridine, azirine, azetidine, azete, pyrrolidine, pyrroline, pyrrole, piperidine, tetrahydropyridine, pyridine, azepane, azocane, azanorbornane, azaadamantane, tropane, quinuclidine, oxazolidine, thiazolidine, morpholine, thiomorpholine, pyrazolidine, imidazolidine, pyrazoline, imidazoline, pyrazole, imidazole, triazole, tetrazole, pyrazine, triazine, indoline, indole, isoindole, pyrimidine, indolizine, benzimidazole, azaindole, azaindazole, purine, tetrahydroquinoline, tetrahydroisoquinoline, decahydroquinoline, decahydroisoquinoline, quinoline, isoquinoline, quinoxaline, phthalazine, quinazoline, cinnoline, and carbazole rings.

In the moiety —N($R^1$)—, $R^1$ is hydrogen, a $C_1$-$C_6$ saturated hydrocarbyl group, acetyl, methoxycarbonyl, ethoxycarbonyl, n-propyloxycarbonyl, isopropyloxycarbonyl, tert-butoxycarbonyl, tert-pentyloxycarbonyl, methylcyclopentyloxycarbonyl, ethylcyclopentyloxycarbonyl, propylcyclopentyloxycarbonyl, phenyl, benzyl, naphthyl, naphtylmethyl, methylcyclohexyloxycarbonyl, ethylcyclohexyloxycarbonyl, 9-fluorenylmethyloxycarbonyl, allyloxycarbonyl, methoxymethyl, ethoxymethyl, propoxymethyl, or butoxymethyl.

In formulae (1) and (2), $R^2$ is hydrogen, halogen, a $C_1$-$C_6$ saturated hydrocarbyl group or phenyl group. Some or all of the hydrogen atoms in the saturated hydrocarbyl group and phenyl group may be substituted by halogen.

The $C_1$-$C_6$ saturated hydrocarbyl group represented by $R^1$ and $R^2$ may be straight, branched or cyclic. Examples thereof include $C_1$-$C_6$ alkyl groups such as methyl, ethyl, n-propyl, isopropyl, n-butyl, isobutyl, sec-butyl, tert-butyl, n-pentyl, isopentyl, sec-pentyl, 3-pentyl, tert-pentyl, neopentyl, and n-hexyl; and $C_3$-$C_6$ cyclic saturated hydrocarbyl groups such as cyclopropyl, cyclobutyl, cyclopentyl, cyclohexyl, cyclopropylmethyl, cyclopropylethyl, cyclobutylmethyl, cyclobutylethyl, cyclopentylmethyl, cyclopentylethyl, cyclohexylinethyl, cyclohexylethyl, methylcyclopropyl, methylcyclobutyl, methylcyclopentyl, ethylcyclopropyl, and ethylcyclobutyl. Suitable halogen atoms represented by $R^2$ include fluorine, chlorine, bromine and iodine.

In formulae (1) and (2), $X^1$ is a single bond, or a $C_1$-$C_{20}$ saturated hydrocarbylene group, $C_6$-$C_{12}$ arylene group, $C_7$-$C_{14}$ alkenylene group or group obtained by combining the foregoing. The saturated hydrocarbylene group, arylene group, alkenylene group or group obtained by combining the foregoing may contain at least one moiety selected from an ether bond, ester bond, sulfide, cyano, nitro, sulfonyl, sultone ring, lactone ring and halogen.

In formulae (1) and (2), R is a group having the formula (R).

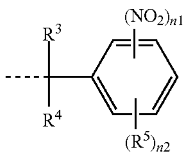

(R)

In formula (R), n1 is 1 or 2, and n2 is an integer of 0 to 3.

In formula (R), $R^3$ and $R^4$ are each independently a $C_1$-$C_{10}$ aliphatic hydrocarbyl group which may contain a heteroatom. $R^3$ and $R^4$ may bond together to form a ring with the carbon atom to which they are attached.

The $C_1$-$C_{10}$ aliphatic hydrocarbyl group represented by $R^3$ and $R^4$ may be saturated or unsaturated and straight, branched or cyclic. Examples thereof include $C_1$-$C_{10}$ alkyl groups such as methyl, ethyl, n-propyl, isopropyl, n-butyl, isobutyl, sec-butyl, tert-butyl, n-pentyl, isopentyl, sec-pentyl, 3-pentyl, tert-pentyl, neopentyl, and n-hexyl; $C_3$-$C_{10}$ cyclic saturated hydrocarbyl groups such as cyclopropyl, cyclobutyl, cyclopentyl, cyclohexyl, adamantyl, norbornyl, cyclopropylmethyl, cyclopropylethyl, cyclobutylmethyl, cyclobutylethyl, cyclopentylmethyl, cyclopentylethyl, cyclohexylmethyl, cyclohexylethyl, methylcyclopropyl, methylcyclobutyl, methylcyclopentyl, methylcyclohexyl, ethylcyclopropyl, ethylcyclobutyl, ethylcyclopentyl, and ethylcyclohexyl; $C_2$-$C_{10}$ alkenyl groups such as vinyl, 1-propenyl, 2-propenyl, butenyl, pentenyl, hexenyl, heptenyl, nonenyl, decenyl; $C_2$-$C_{10}$ alkynyl groups such as ethynyl, propynyl, butynyl, pentynyl, hexynyl, heptynyl, octynyl, nonynyl, decynyl; $C_3$-$C_{10}$ cyclic unsaturated aliphatic hydrocarbyl groups such as cyclopentenyl, cyclohexenyl, methylcyclopentenyl, methylcyclohexenyl, ethylcyclopentenyl, ethylcyclohexenyl, and norbornenyl; and combinations thereof.

In formula (R), $R^5$ is hydrogen, halogen, $C_1$-$C_6$ alkyl group, $C_1$-$C_6$ alkoxy group or $C_1$-$C_6$ acyloxy group. Suitable halogen atoms include fluorine, chlorine, bromine, and iodine. Suitable alkyl groups include methyl, ethyl, n-propyl, isopropyl, n-butyl, isobutyl, sec-butyl, and tert-butyl. Suitable alkoxy groups include methoxy, ethoxy, n-propyloxy, isopropyloxy, n-butyloxy, isobutyloxy, sec-butyloxy, and tert-butyloxy. Suitable acyloxy groups include methylcarbonyloxy, ethylcarbonyloxy, n-propylcarbonyloxy, isopropylcarbonyloxy, n-butylcarbonyloxy, isobutylcarbonyloxy, sec-butylcarbonyloxy, and tert-butylcarbonyloxy.

Examples of R are shown below, but not limited thereto.

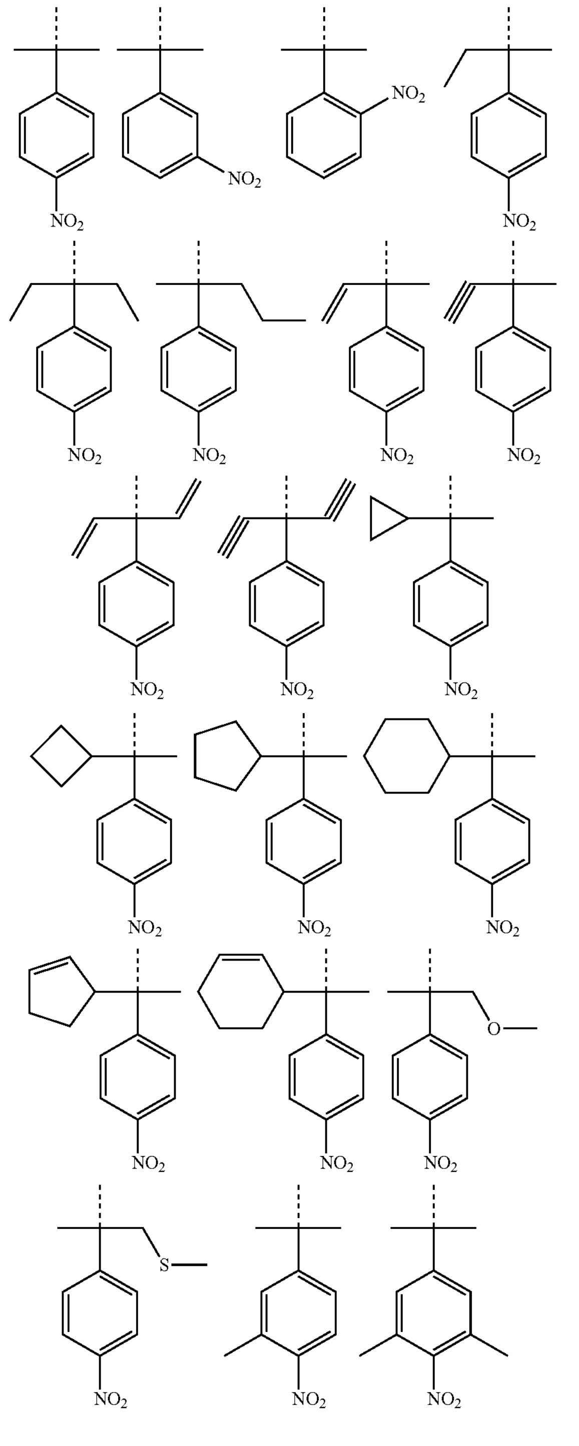

-continued
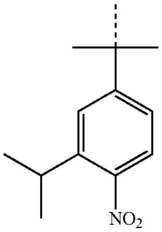 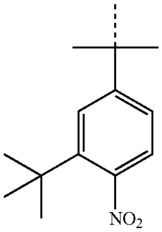 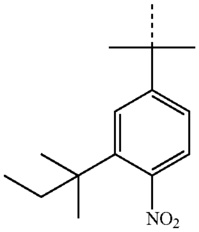
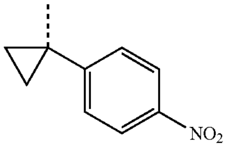 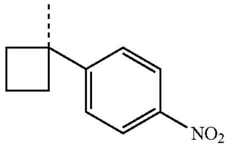
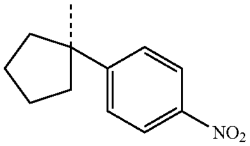 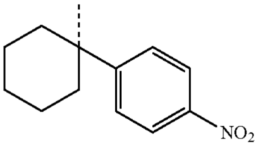
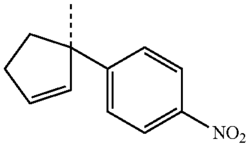 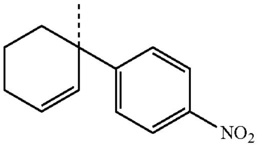
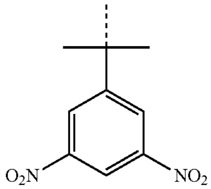 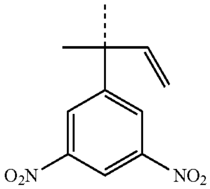
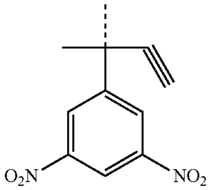 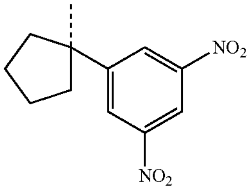
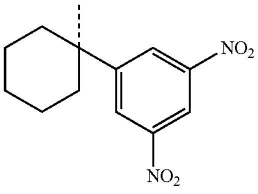 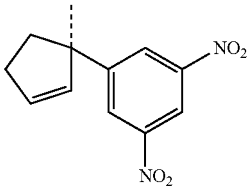
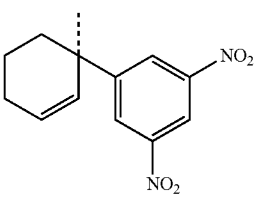 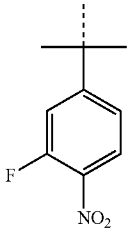 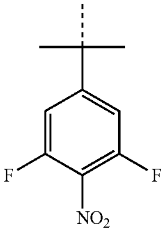
-continued
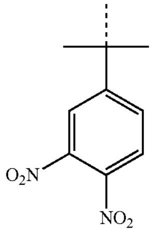 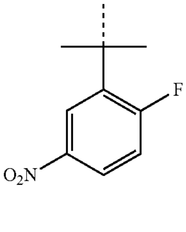 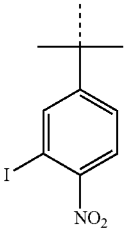
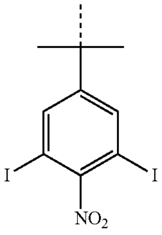 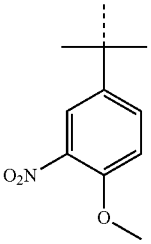 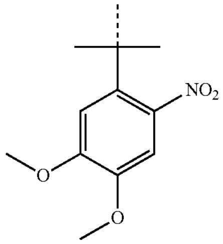
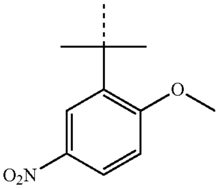 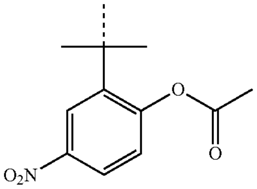
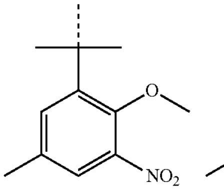 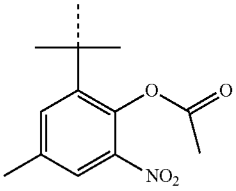
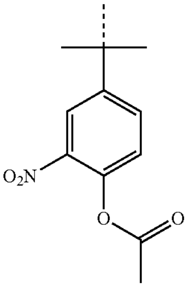 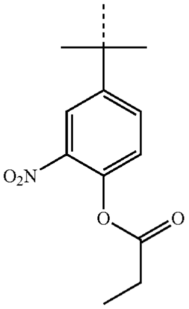
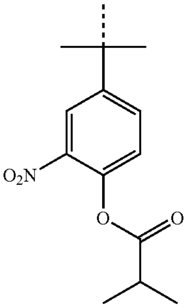 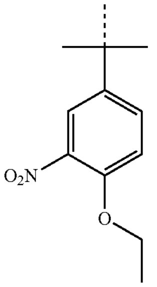 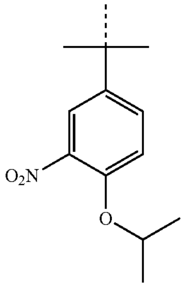
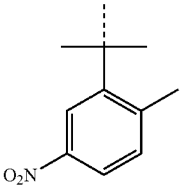 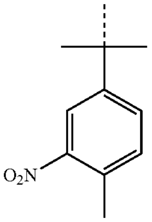 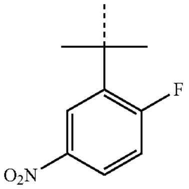

-continued
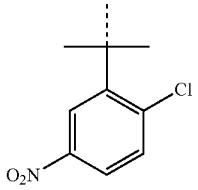
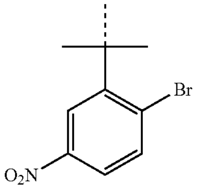
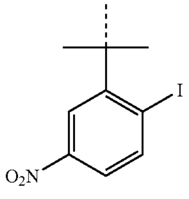
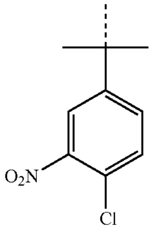
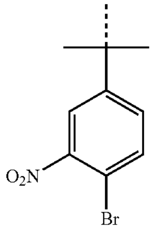
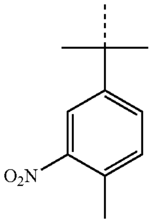
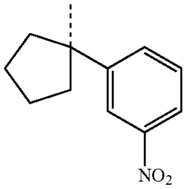
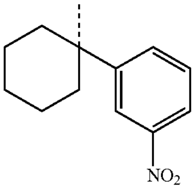
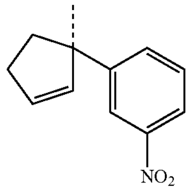
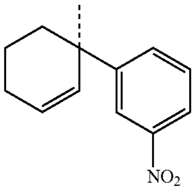
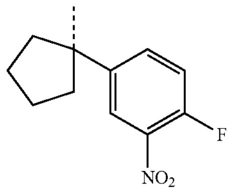
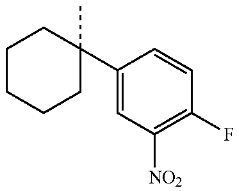
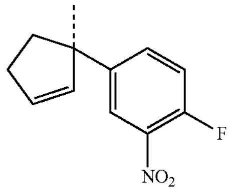
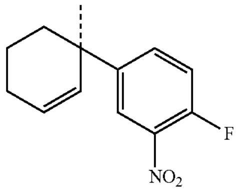
Examples of Compound A are shown below, but not limited thereto. $R^1$ and R are as defined above.
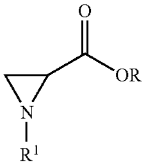
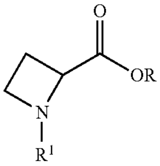
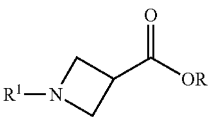
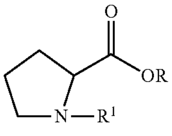
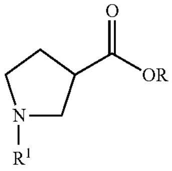
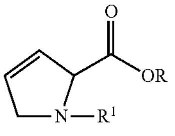
-continued
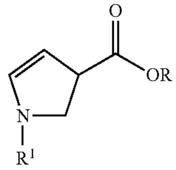
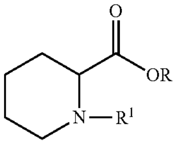
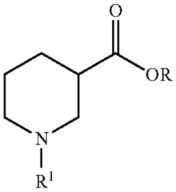
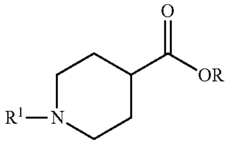
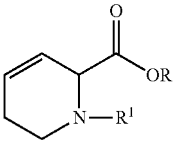
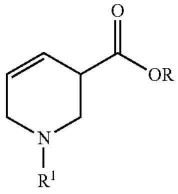
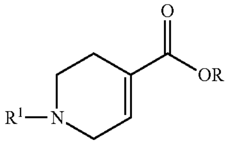
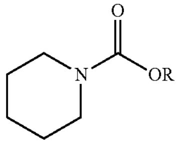
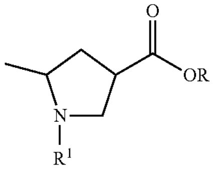
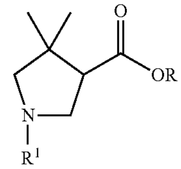
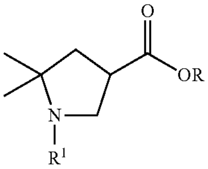
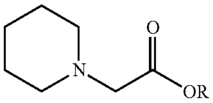
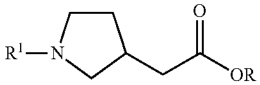
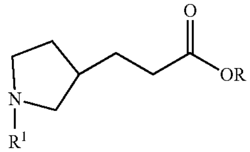
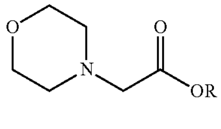
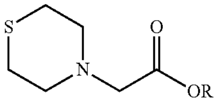
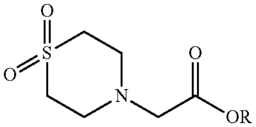
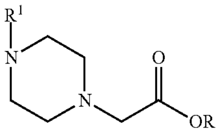
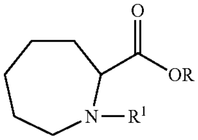
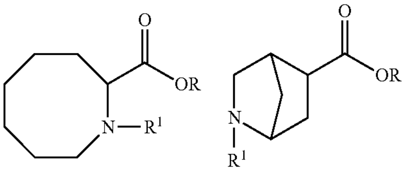

-continued
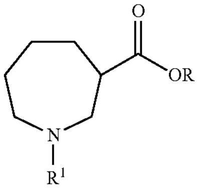
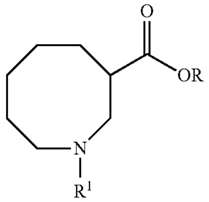
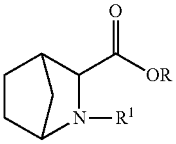
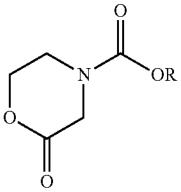
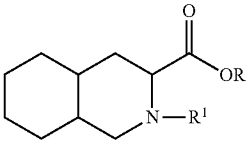
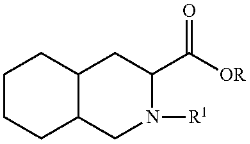
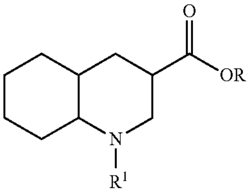
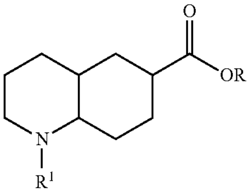
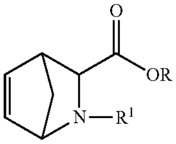
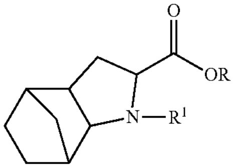
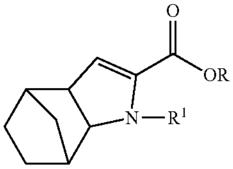
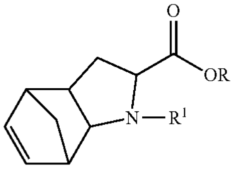
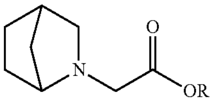
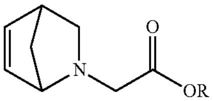
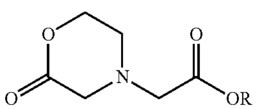
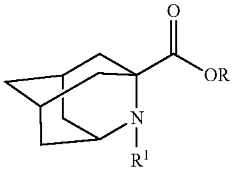
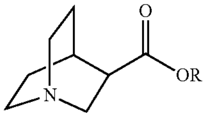
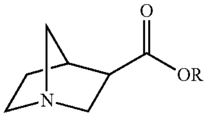
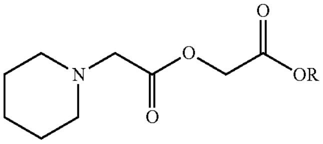
-continued
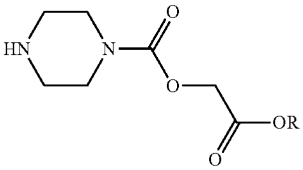
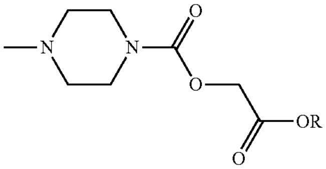
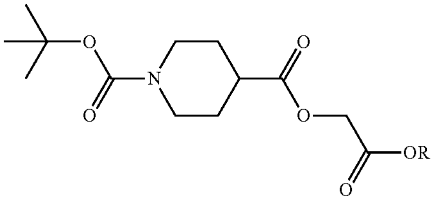
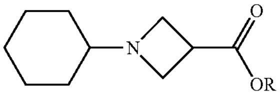
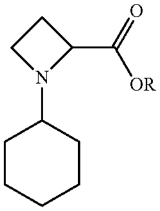
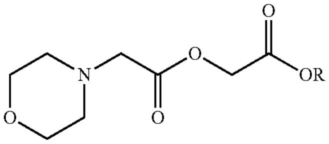
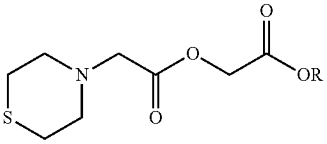
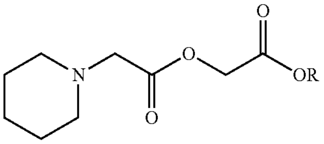
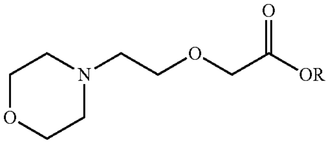
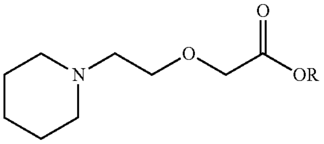
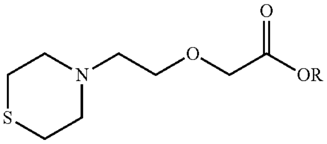

-continued
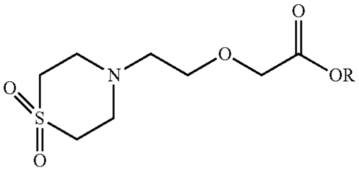
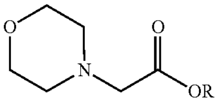
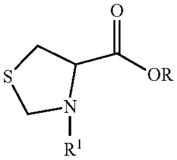
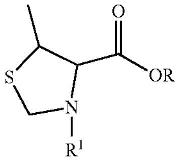
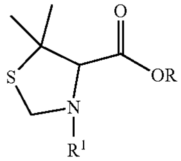
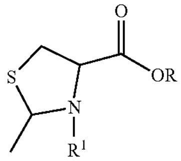
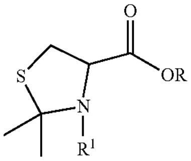
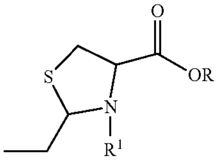
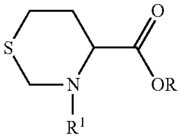
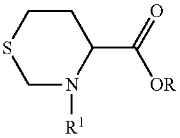
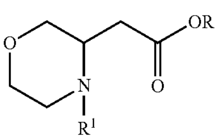
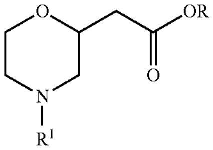
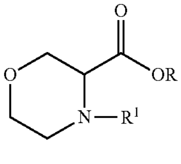
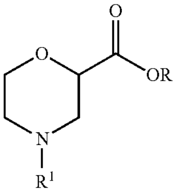
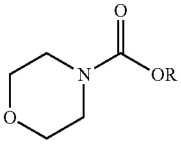
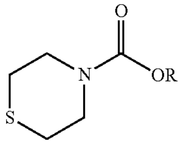
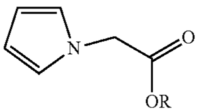
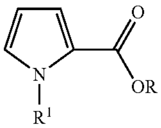
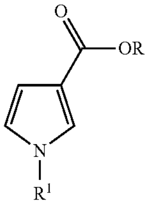
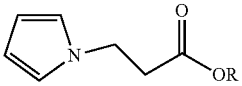
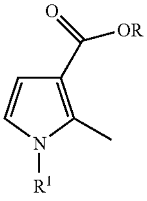
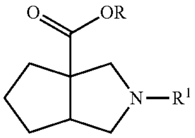
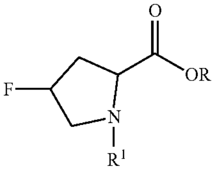
-continued
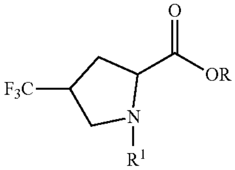
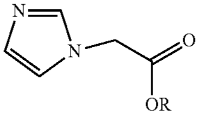
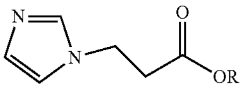
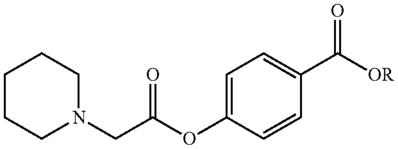
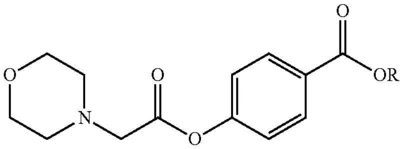
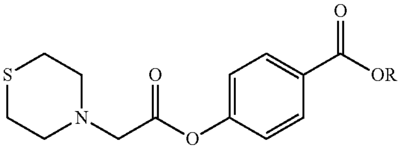
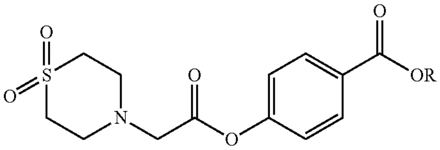
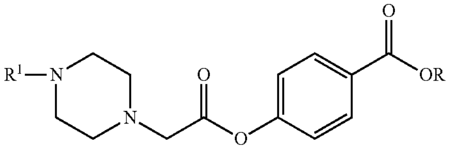
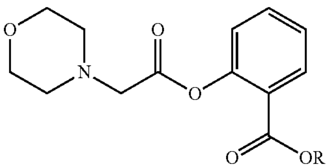
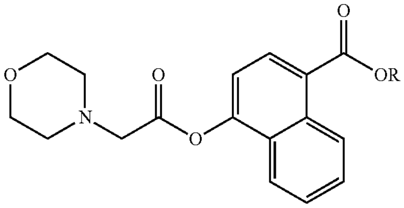
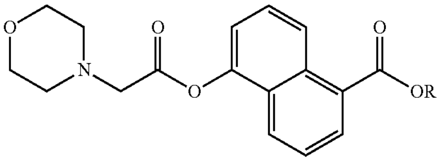
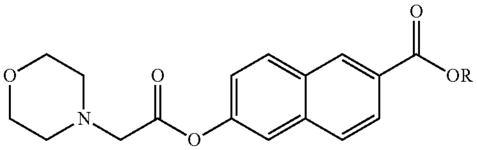

-continued
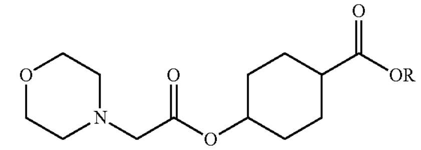
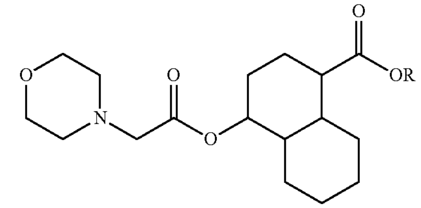
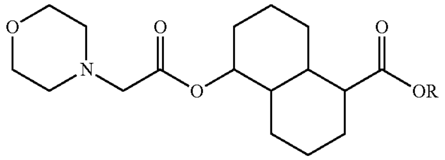
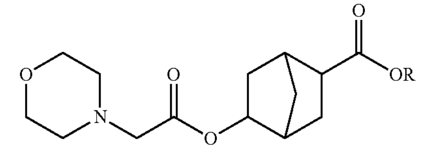
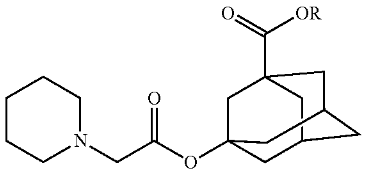
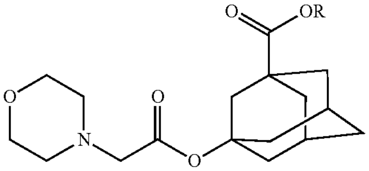
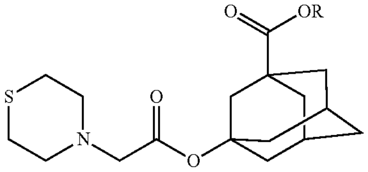
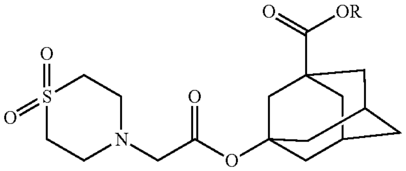
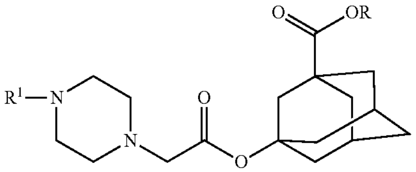
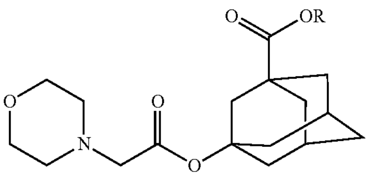
-continued
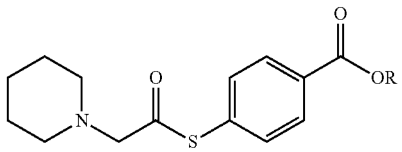
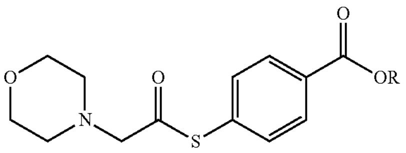
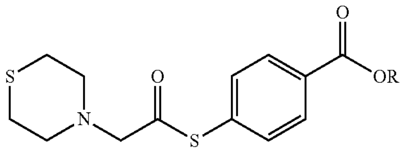
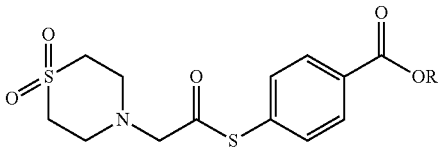
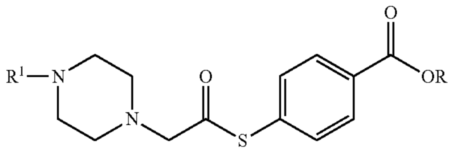
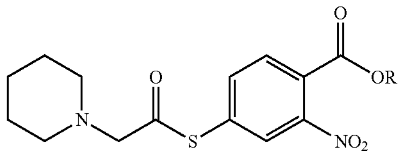
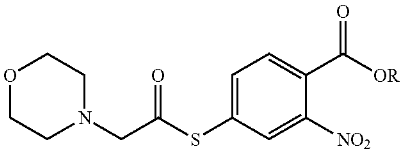
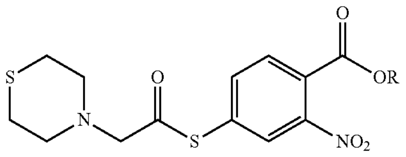
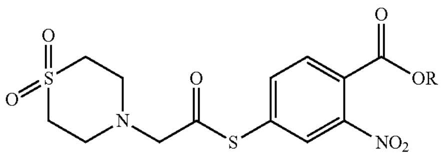
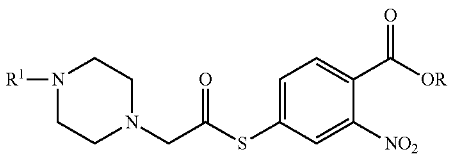

-continued
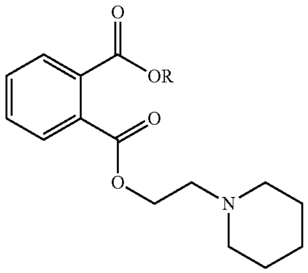
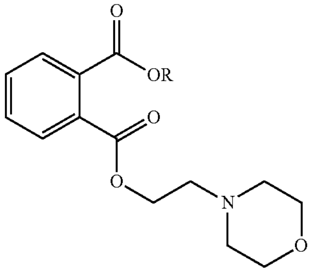
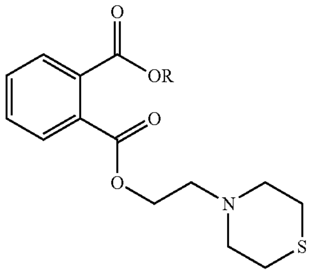
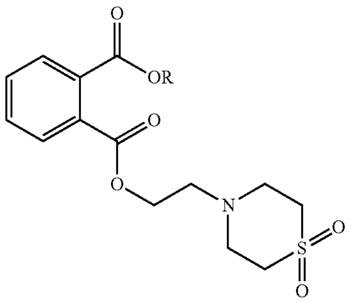
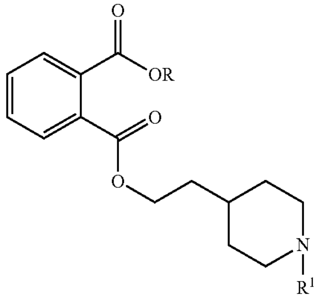
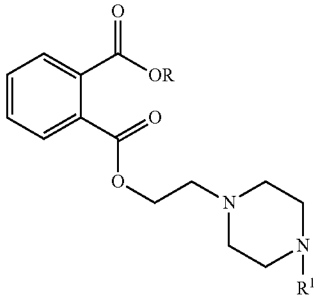
-continued
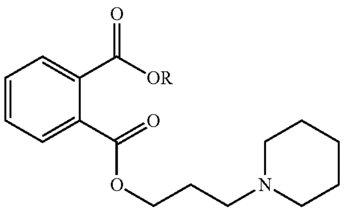
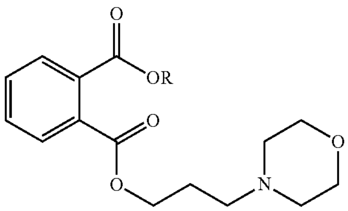
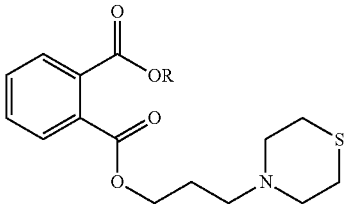
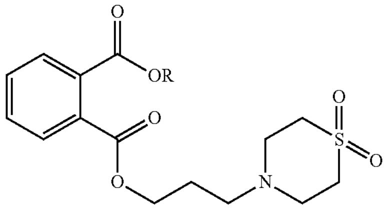
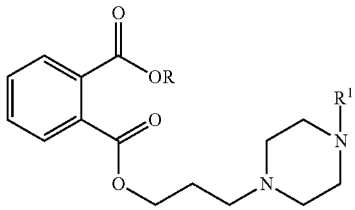
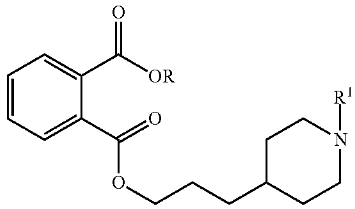
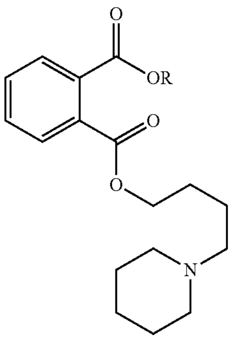
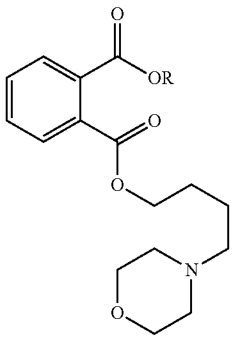

-continued
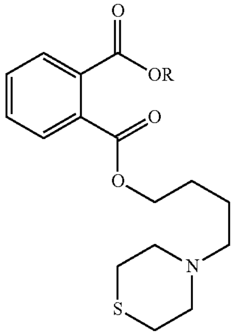
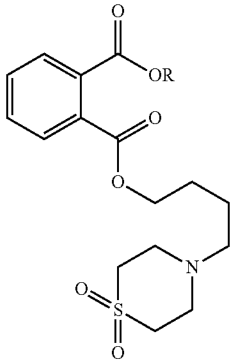
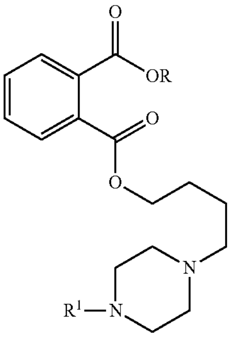
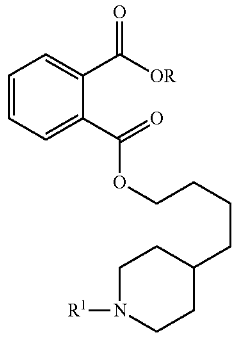
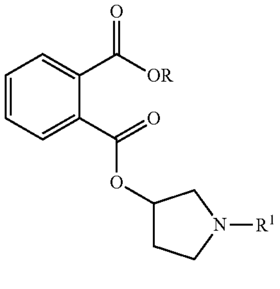
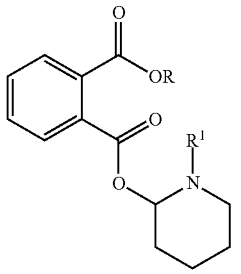
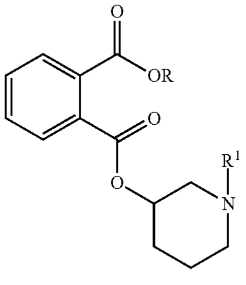
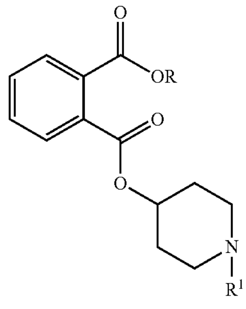
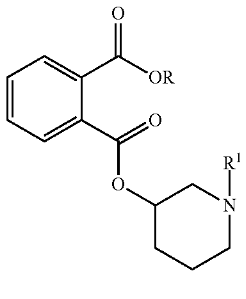
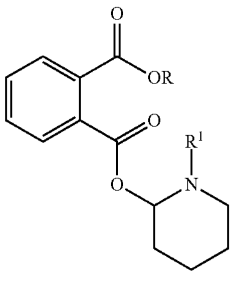
-continued
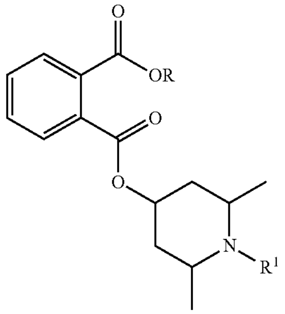
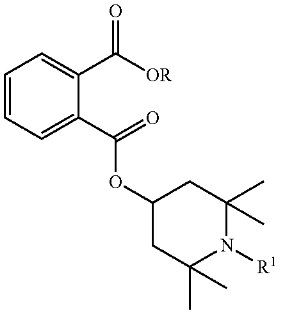
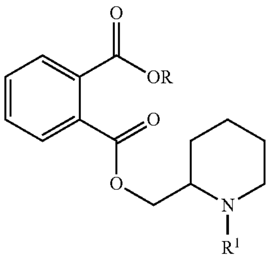
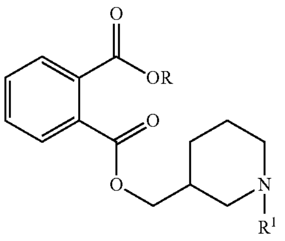
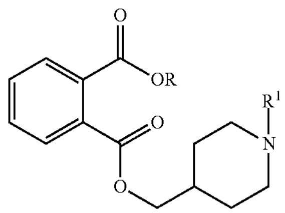
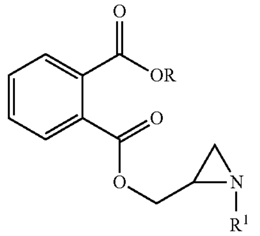
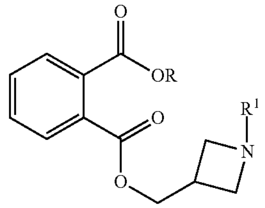
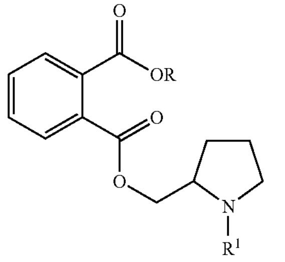
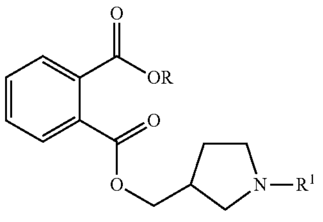
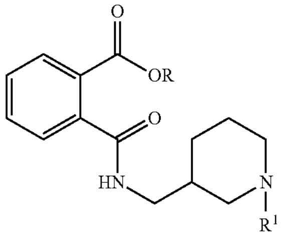
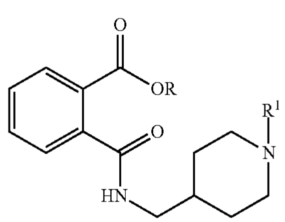

-continued
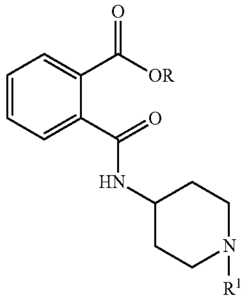
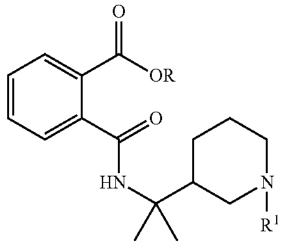
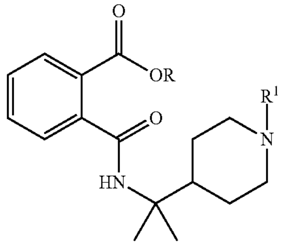
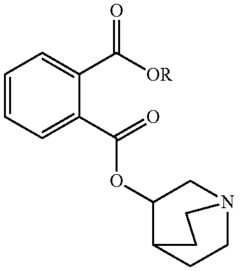
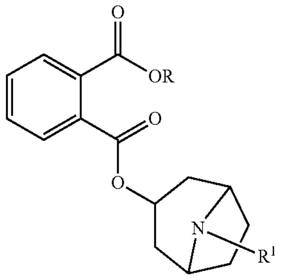
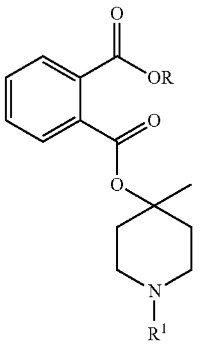
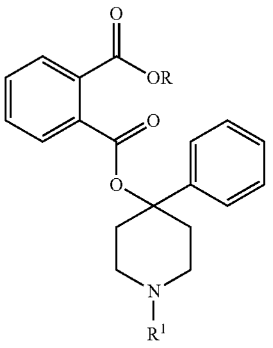
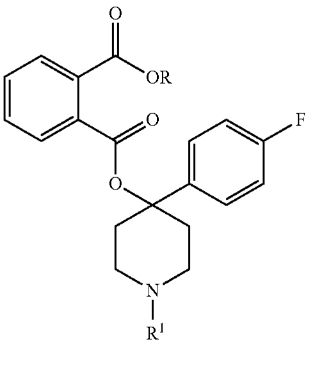
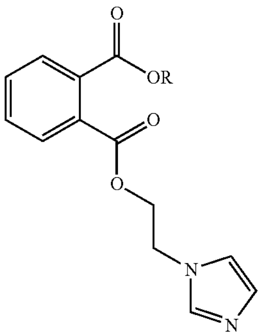
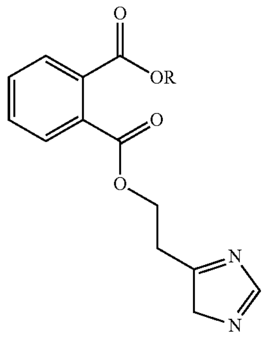
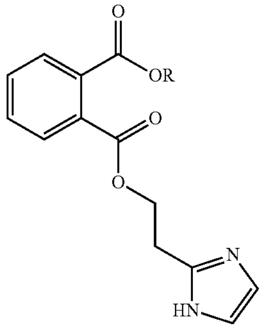
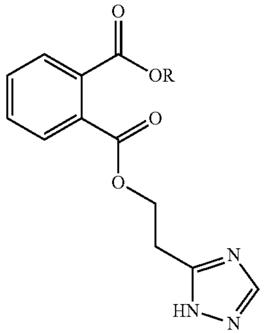
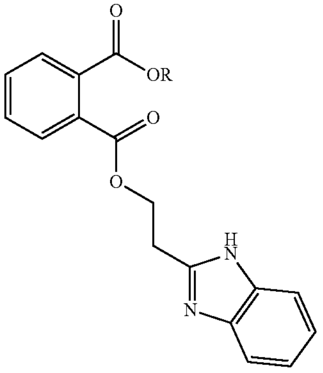
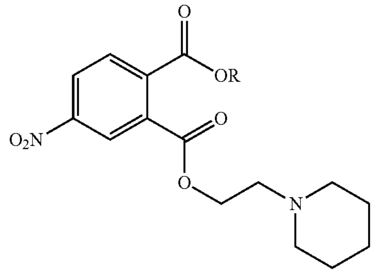
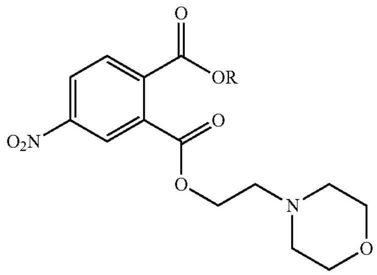

-continued
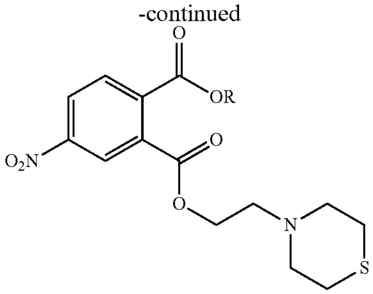
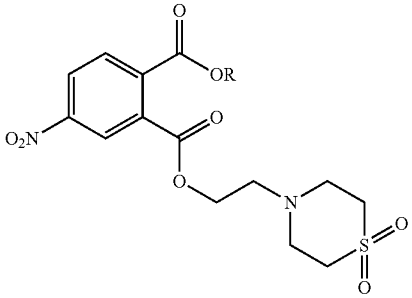
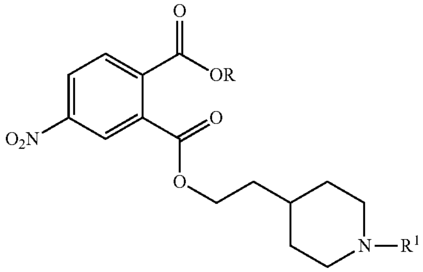
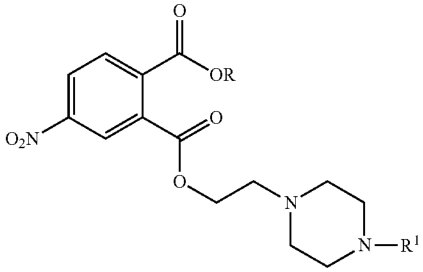
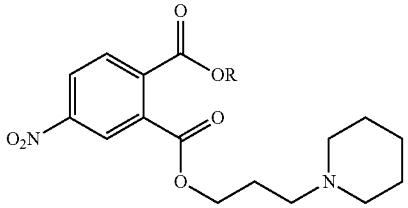
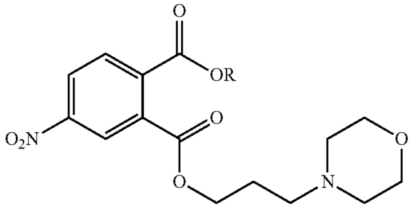
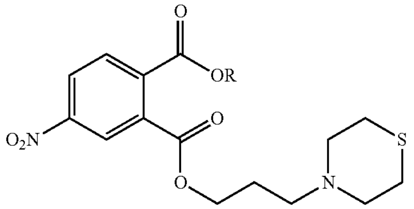
-continued
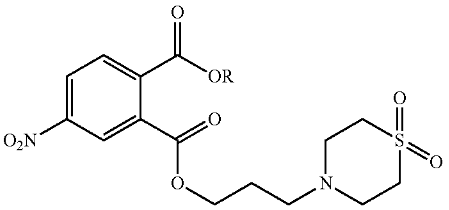
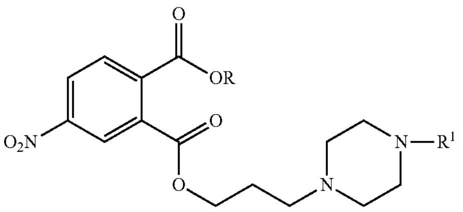
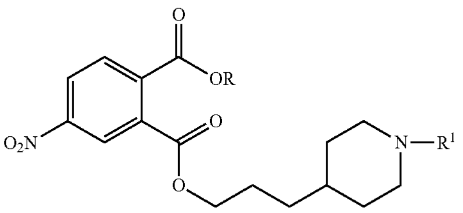
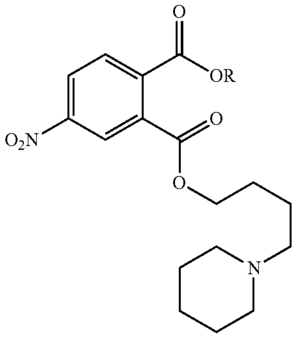
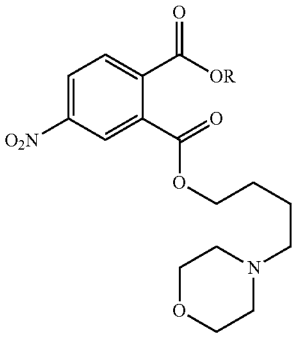
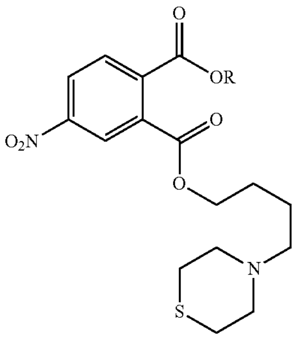

-continued
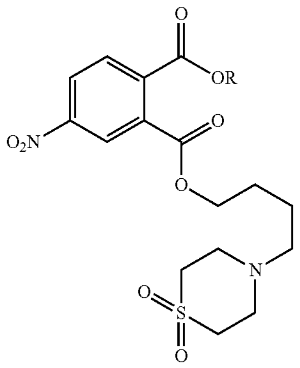
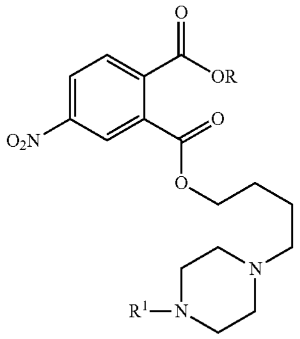
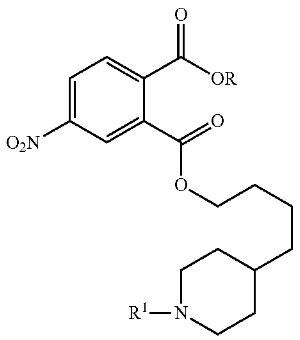
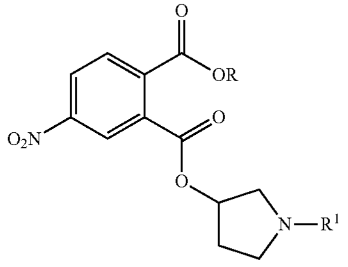
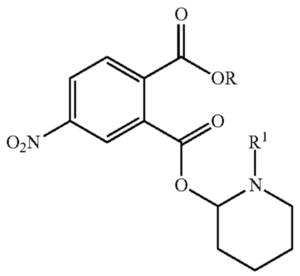
-continued
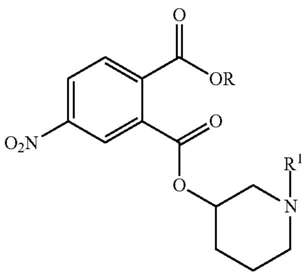
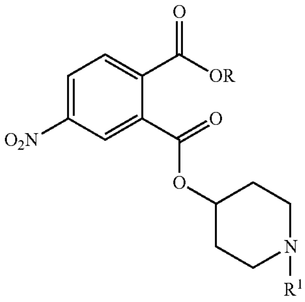
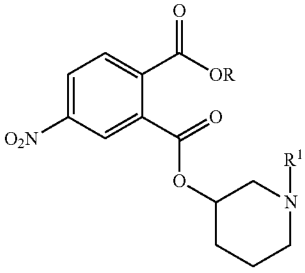
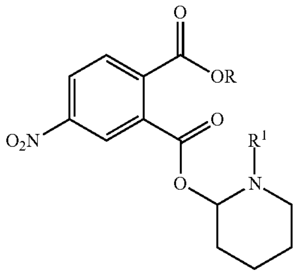
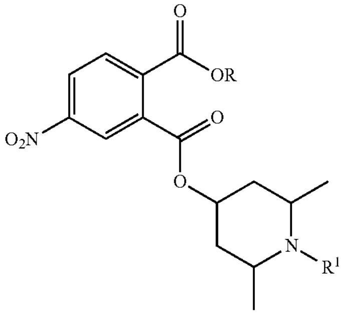

-continued
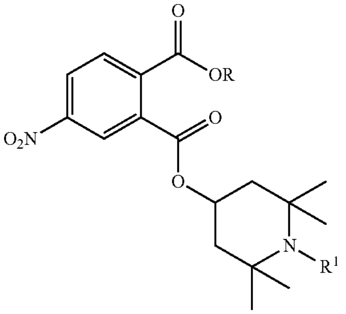
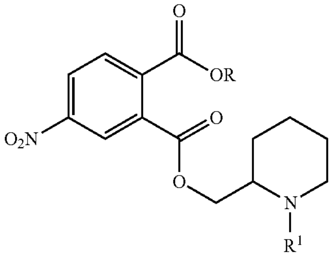
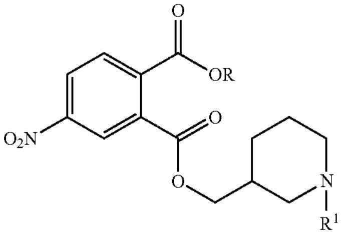
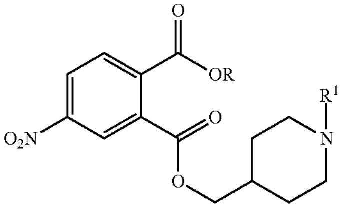
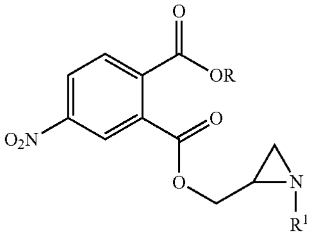
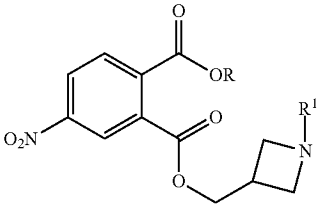
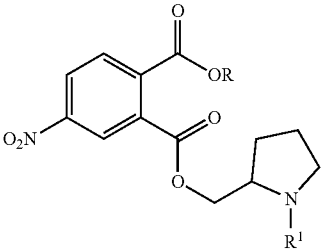
-continued
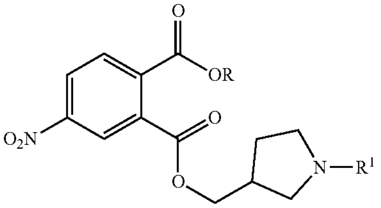
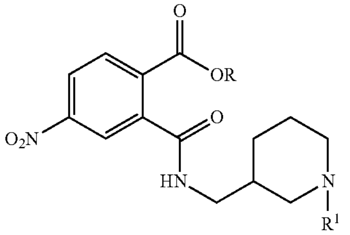
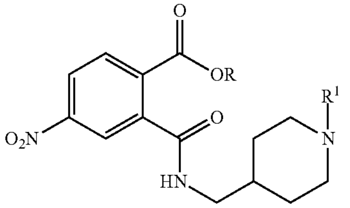
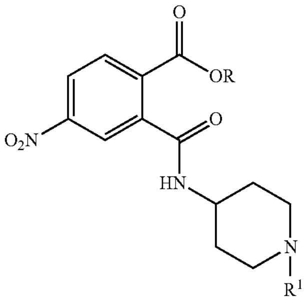
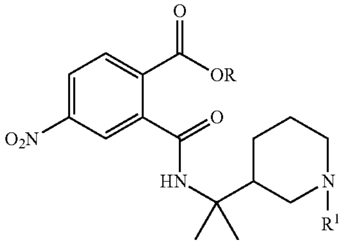
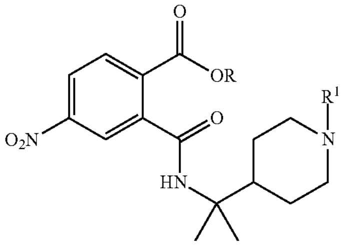
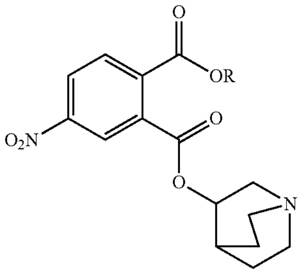

-continued
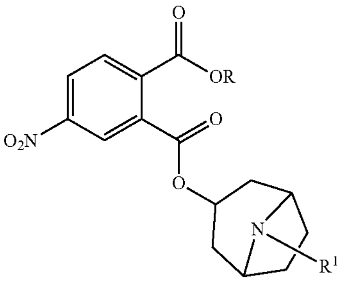
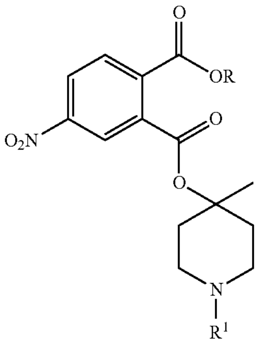
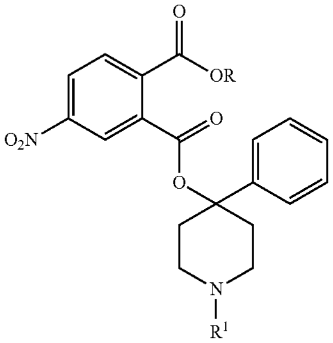
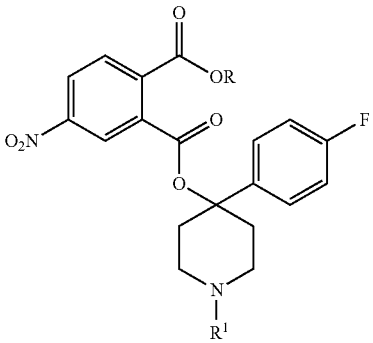
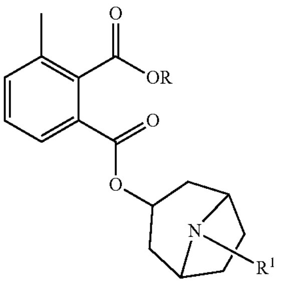
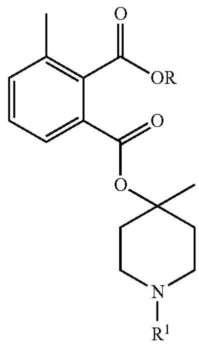
-continued
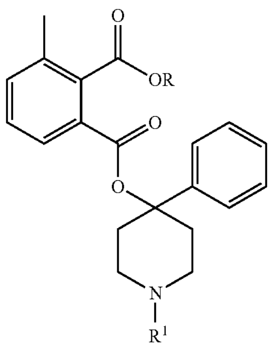
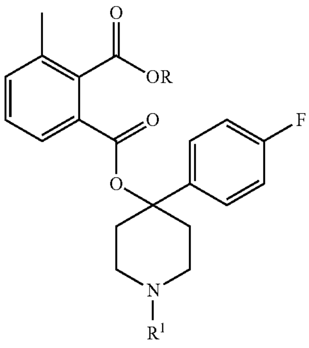
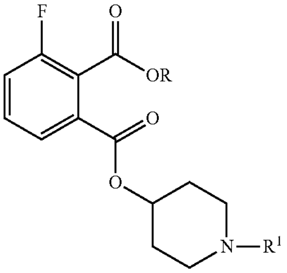
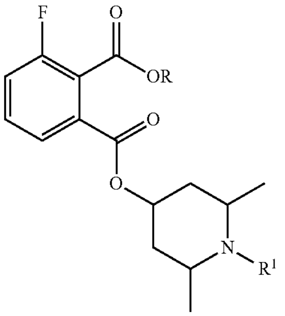
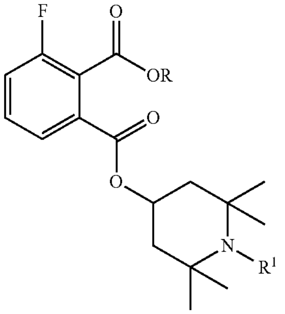

-continued
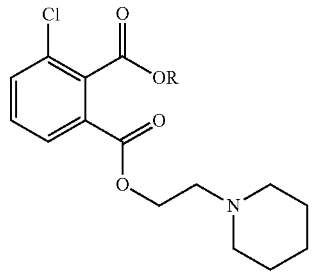
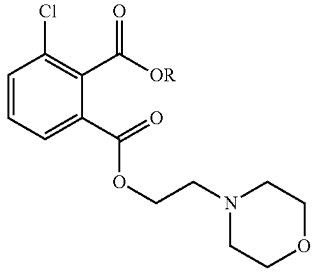
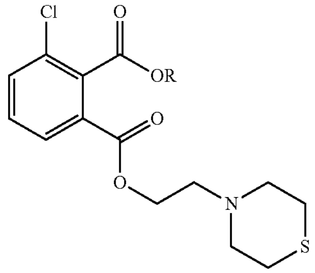
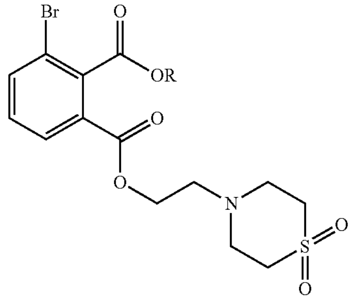
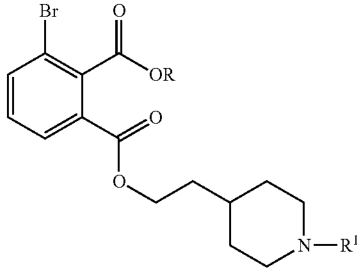
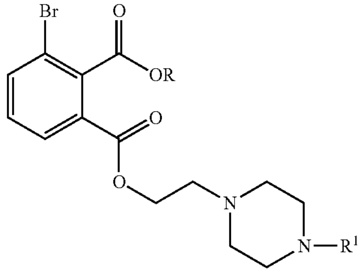
-continued
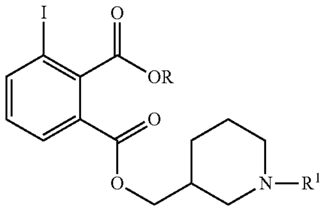
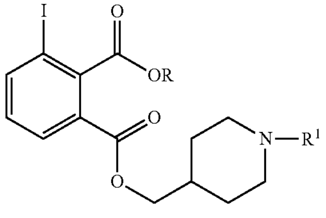
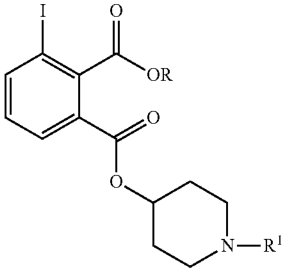
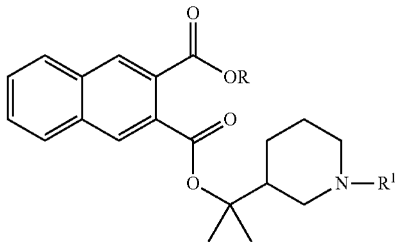
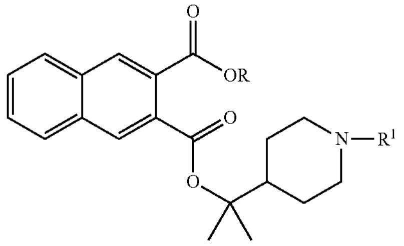
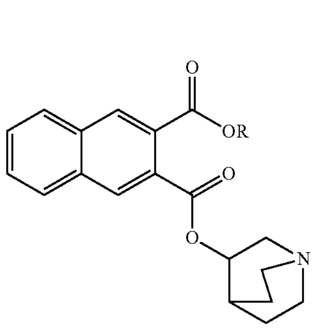

-continued
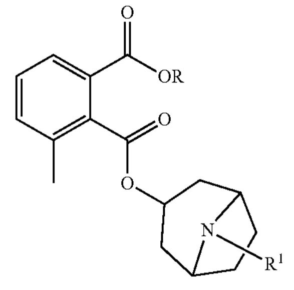
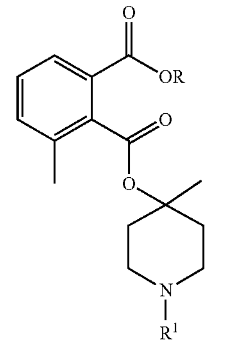
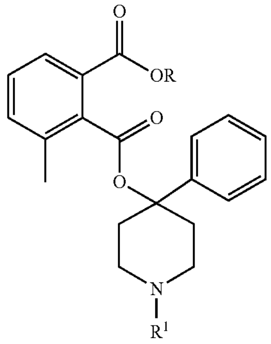
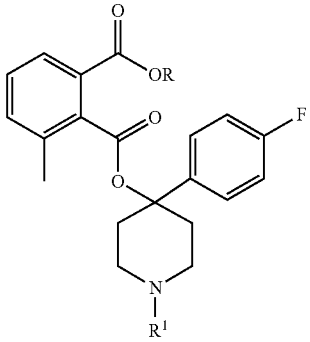
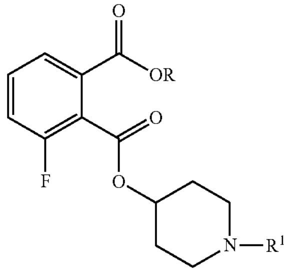
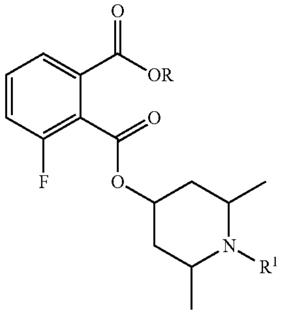
-continued
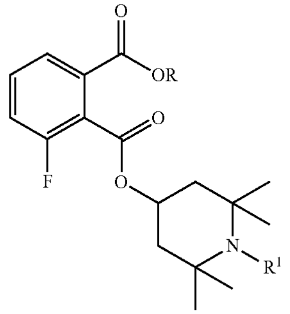
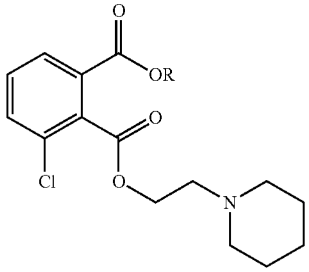
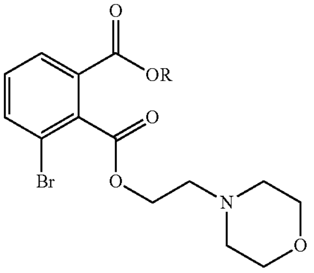
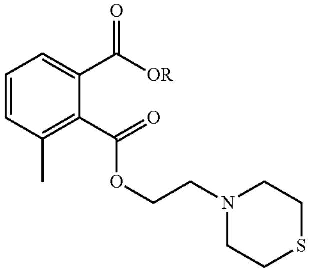
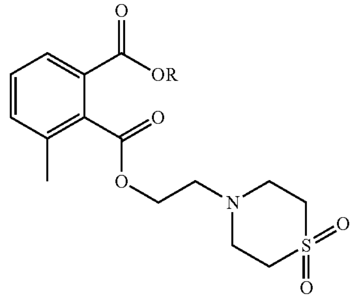
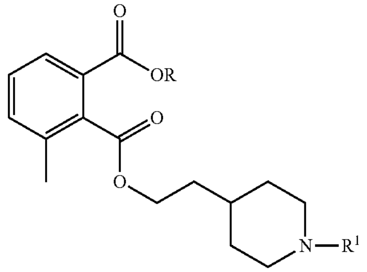

-continued
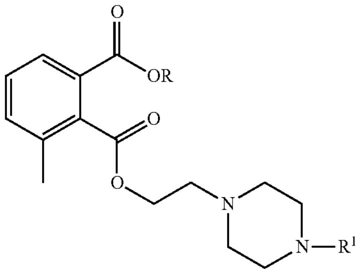
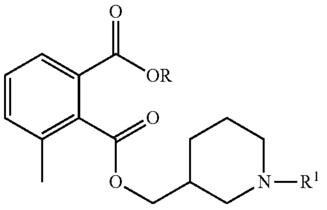
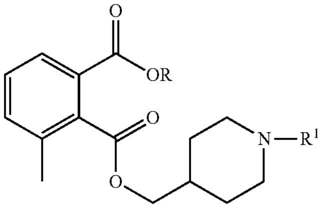
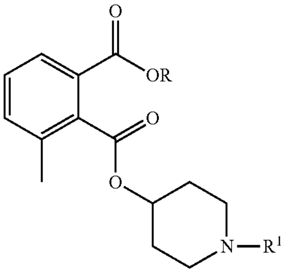
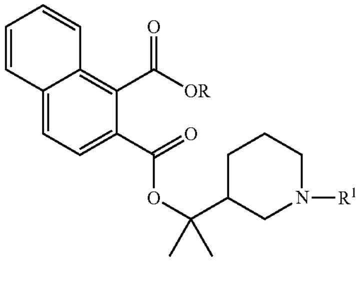
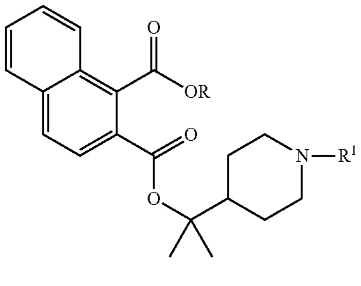
-continued
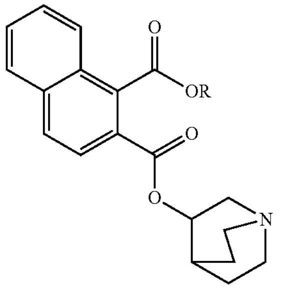
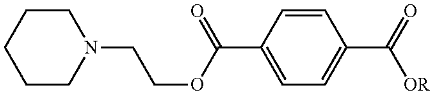
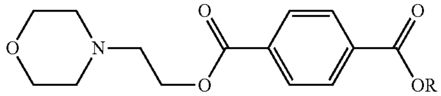
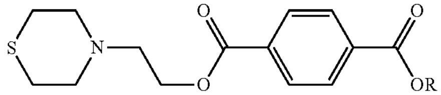
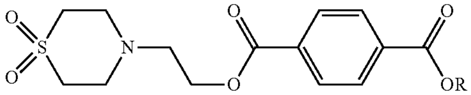
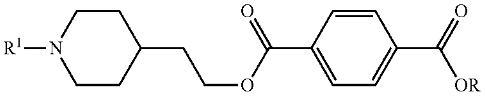
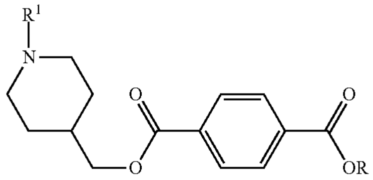
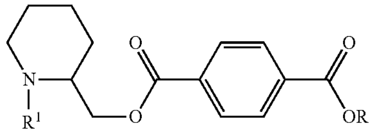
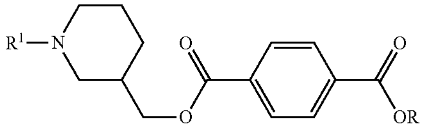
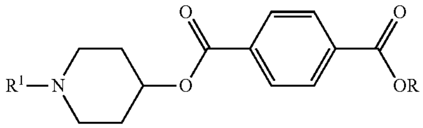
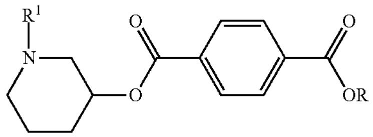
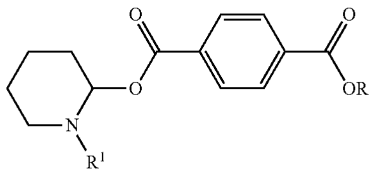

-continued
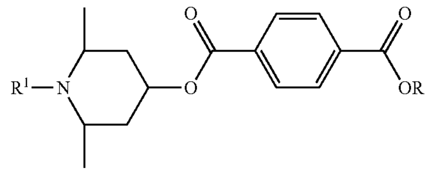
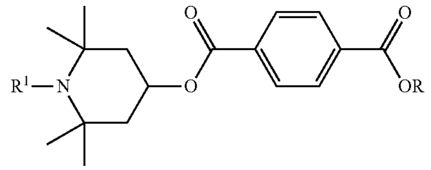
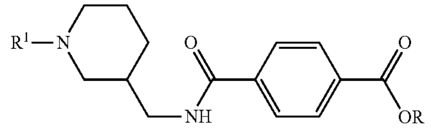
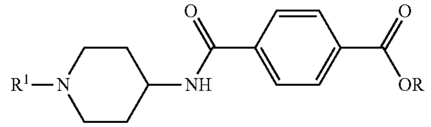
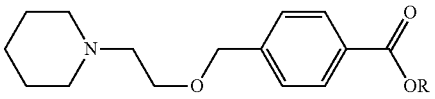
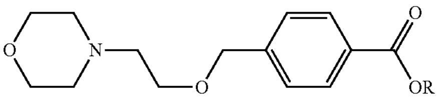
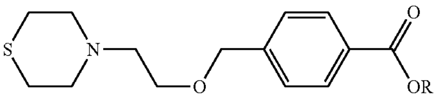
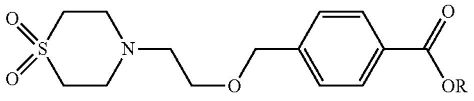
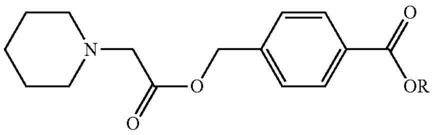
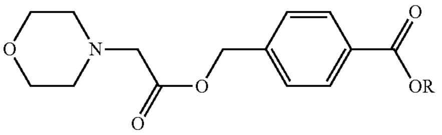
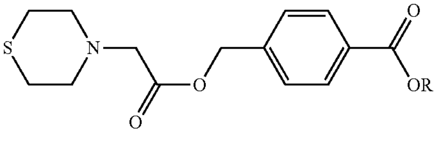
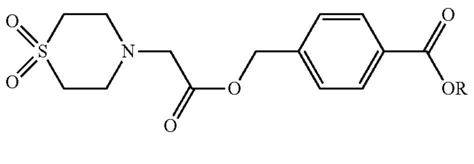
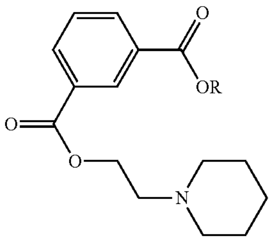
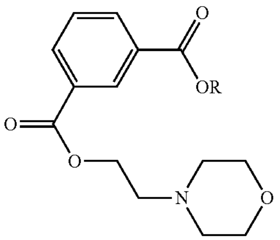
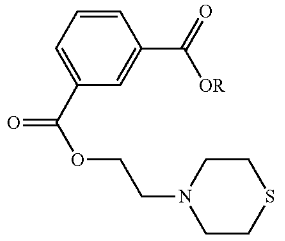
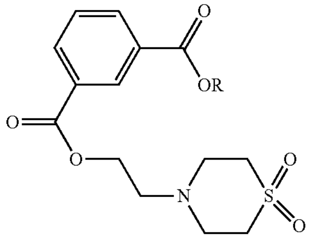
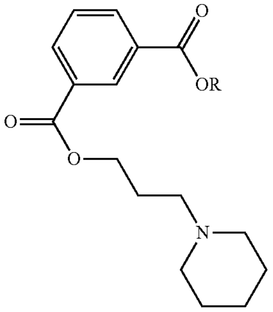
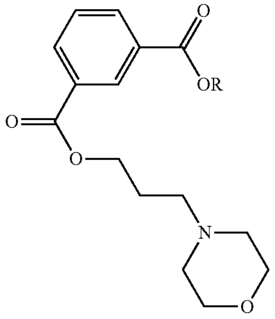
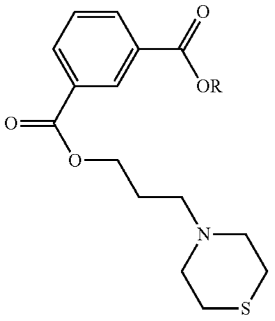
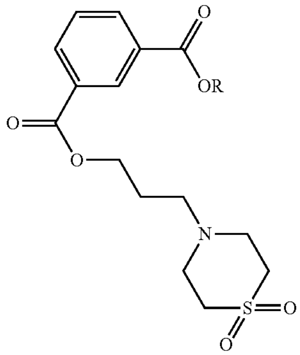
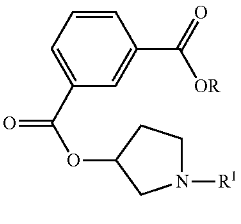
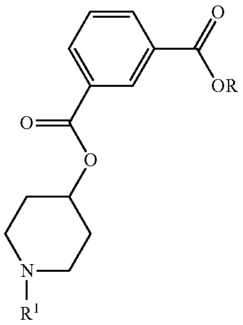

-continued
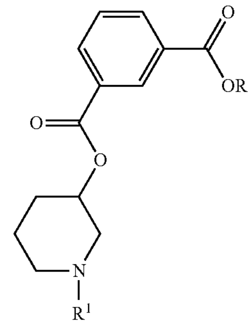
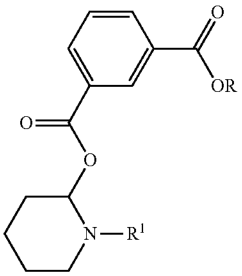
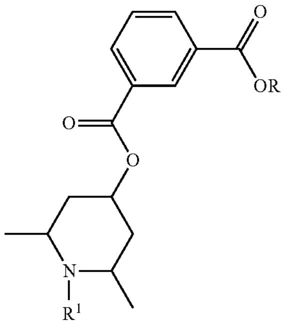
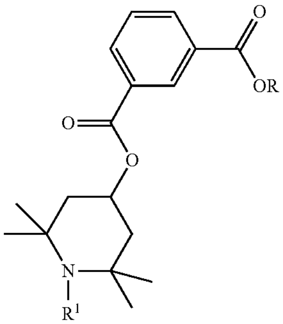
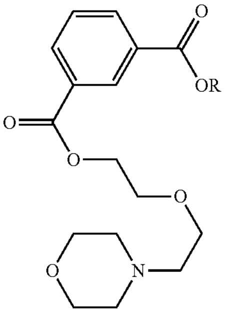
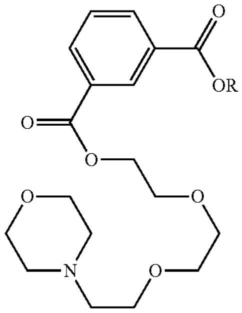
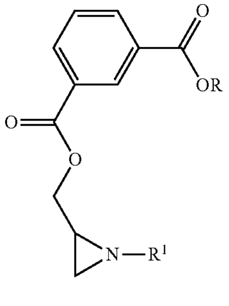
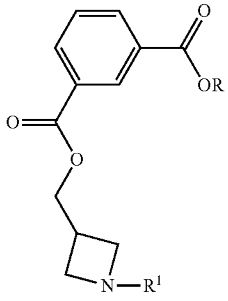
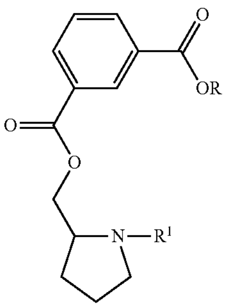
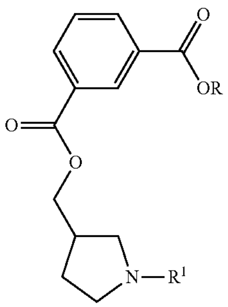
-continued
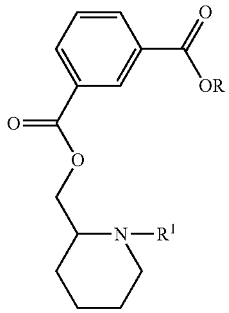
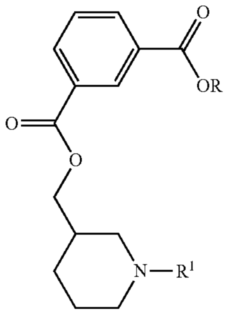
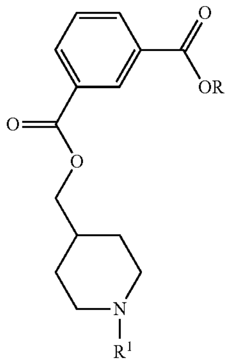
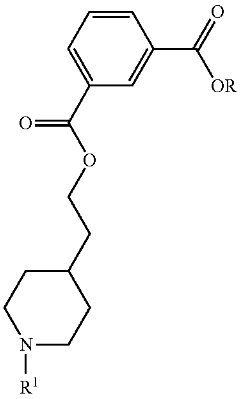
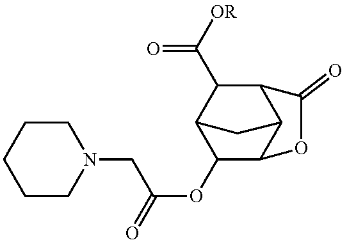
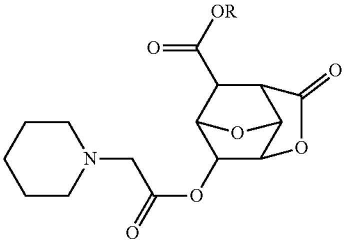
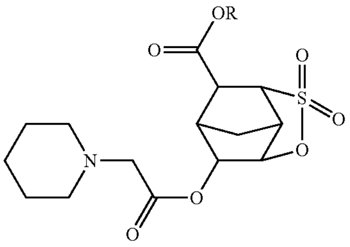
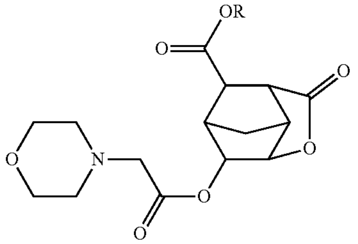

-continued
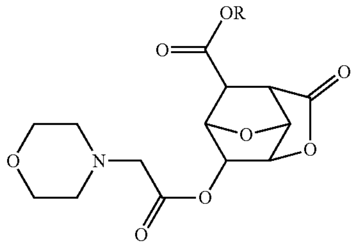
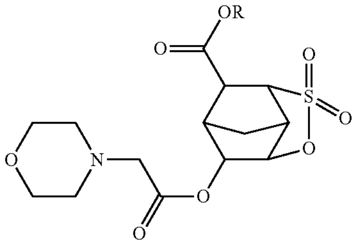
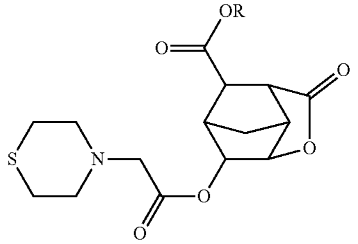
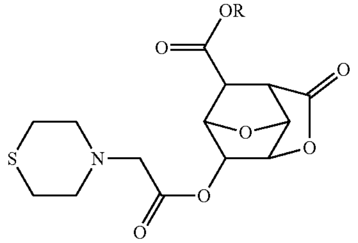
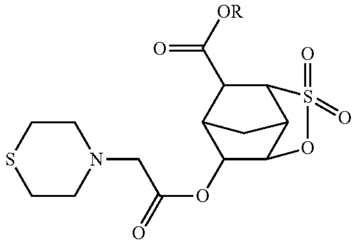
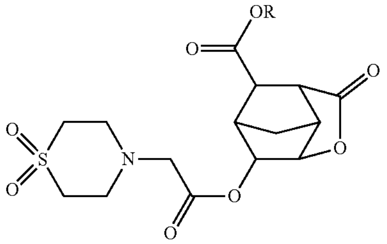
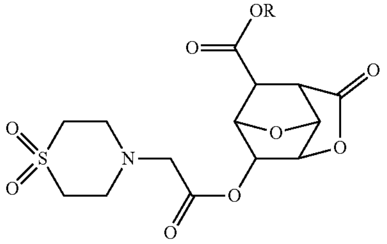
-continued
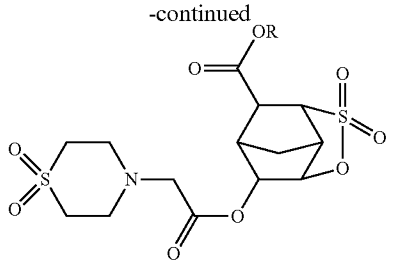
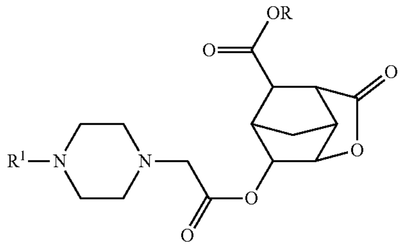
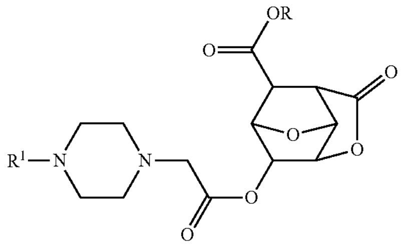
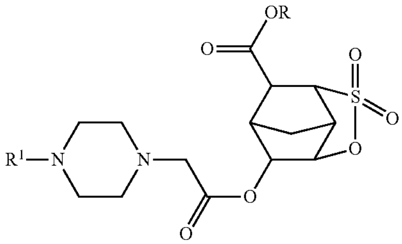
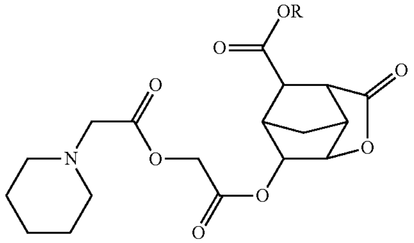
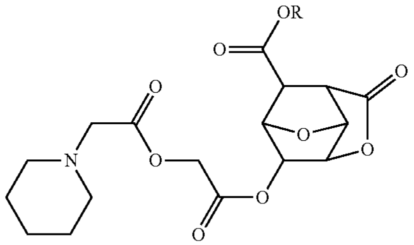
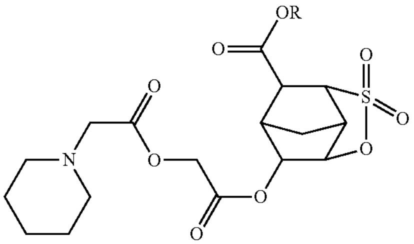

-continued
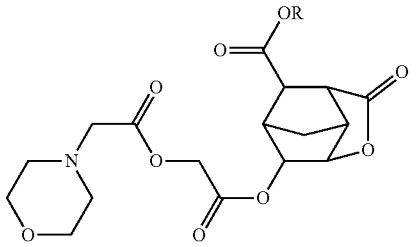
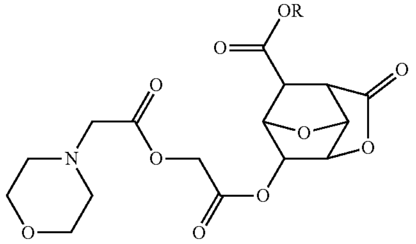
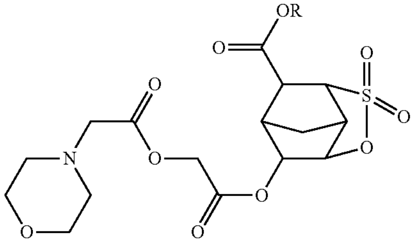
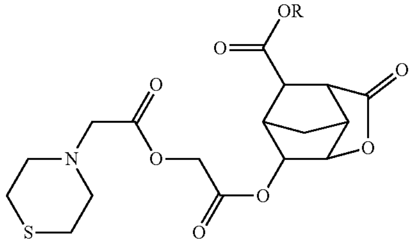
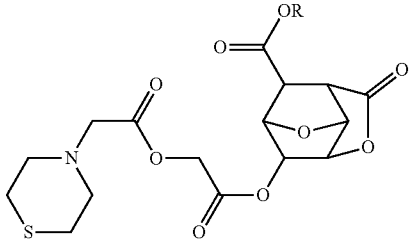
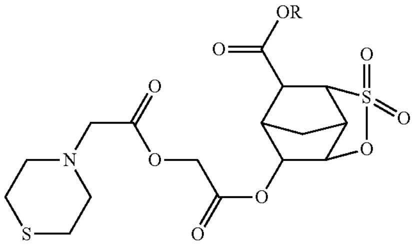
-continued
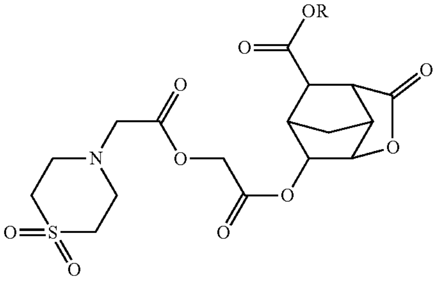
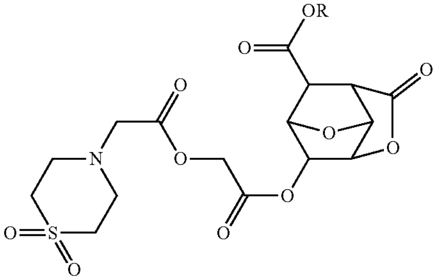
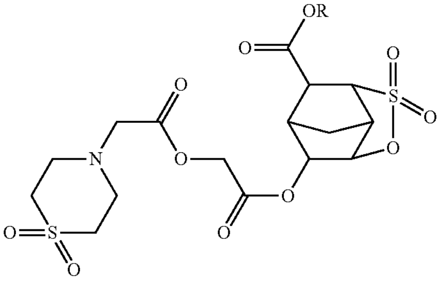
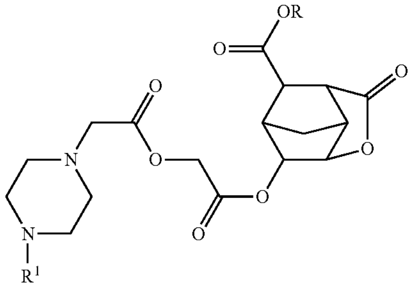
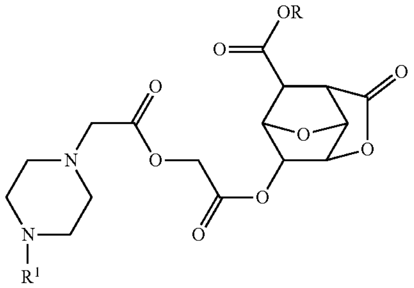
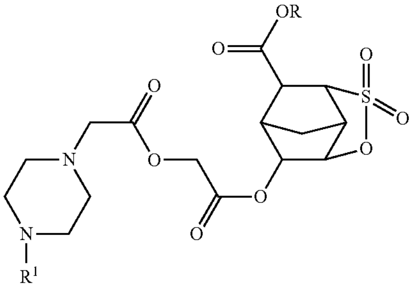

-continued
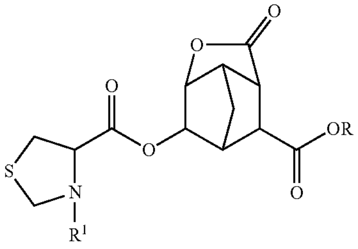
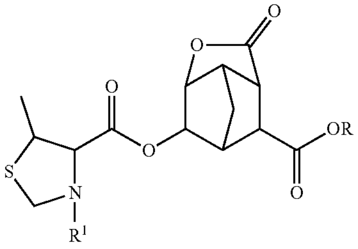
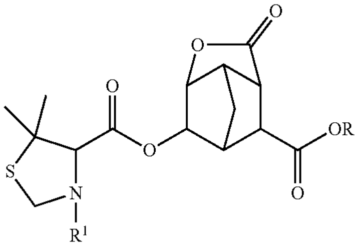
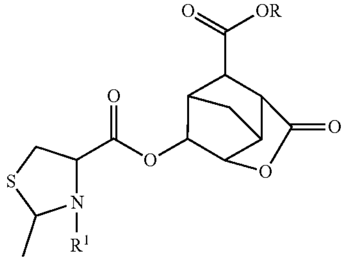
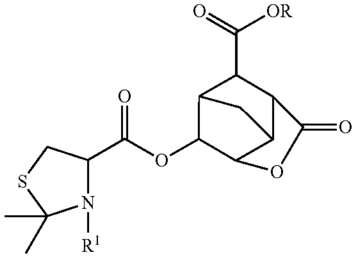
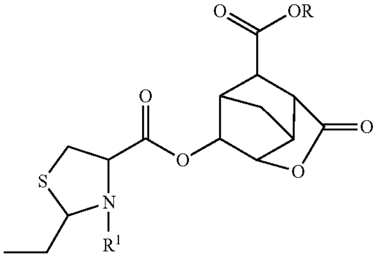
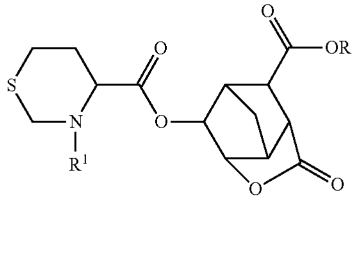
-continued
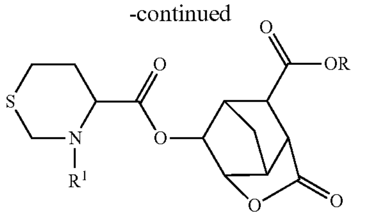
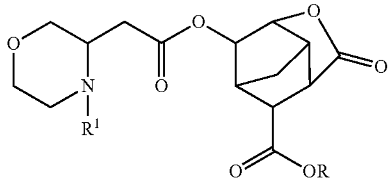
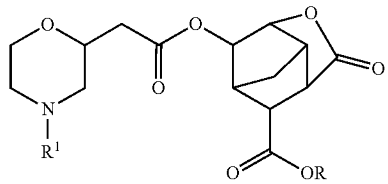
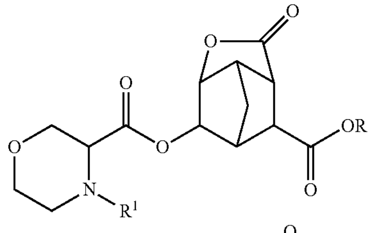
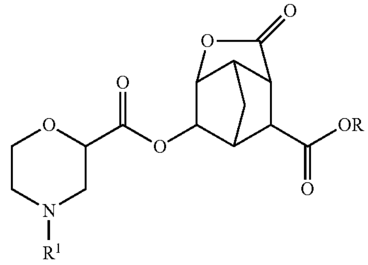
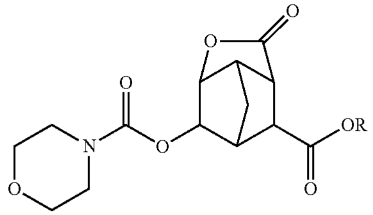
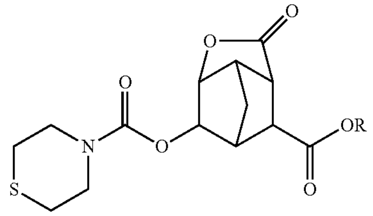
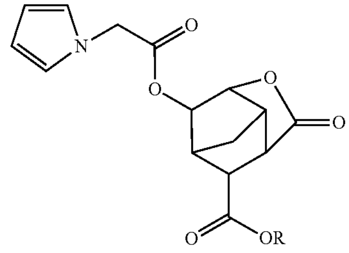

-continued
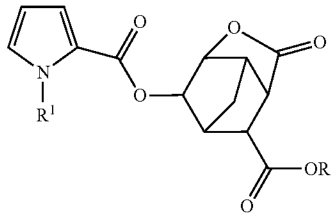
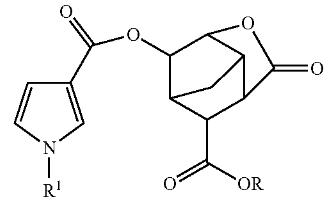
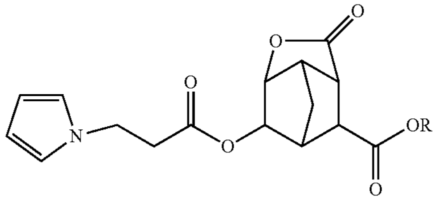
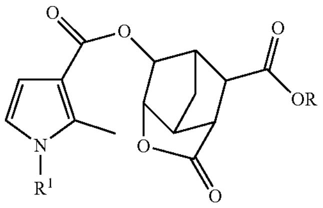
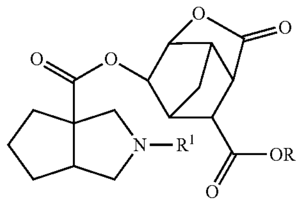
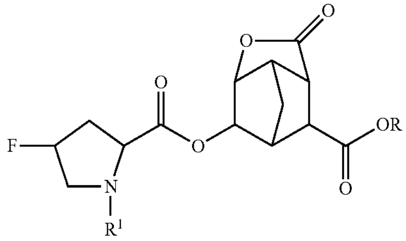
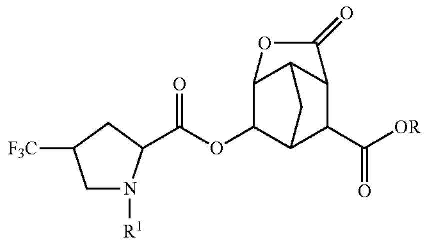
-continued
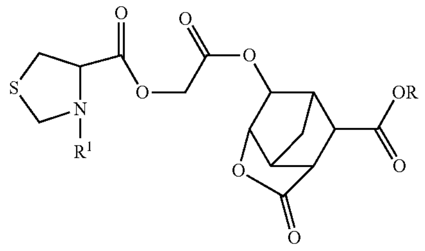
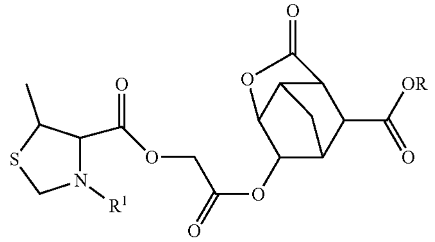
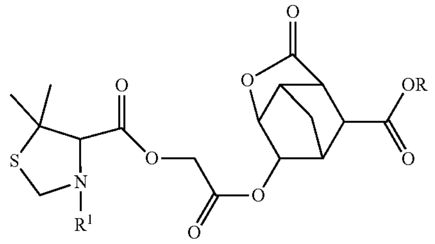
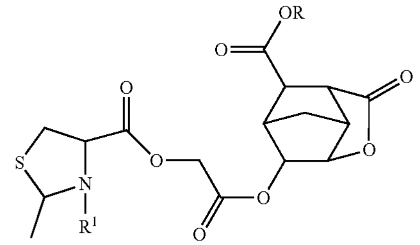
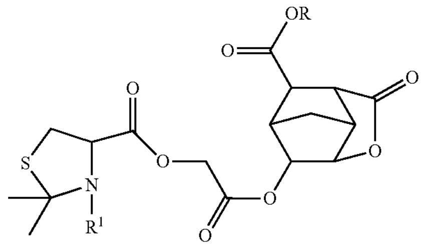
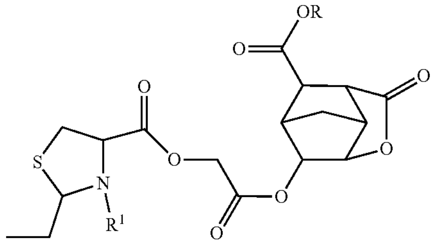
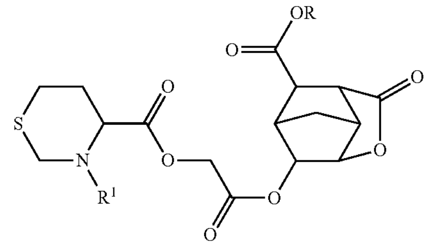

-continued
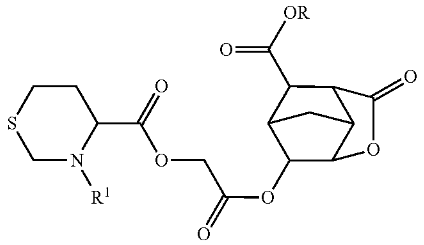
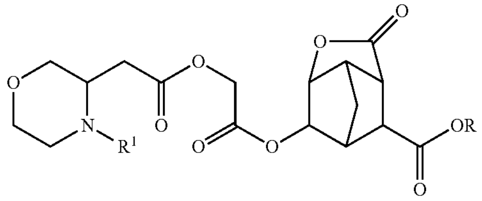
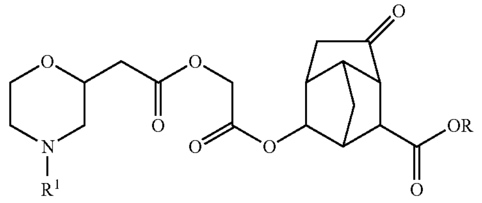
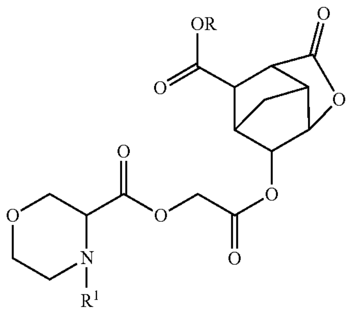
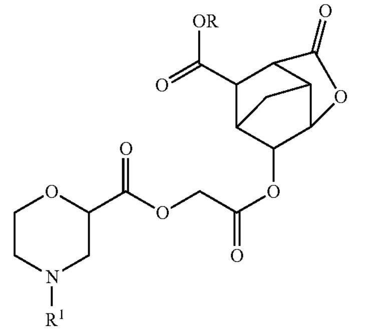
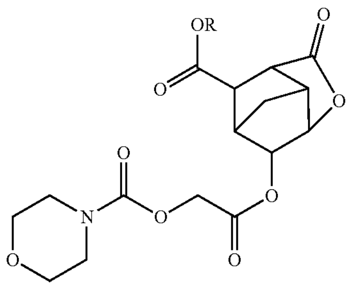
-continued
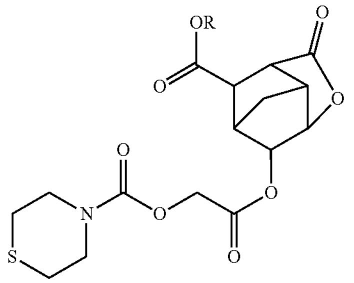
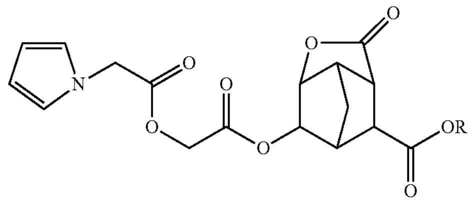
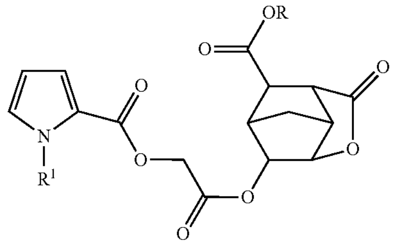
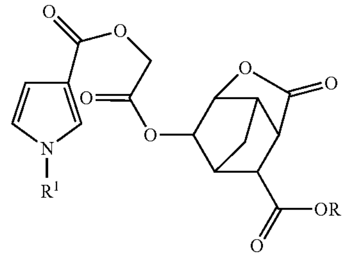
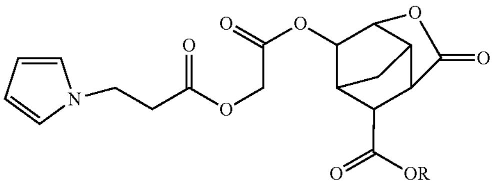
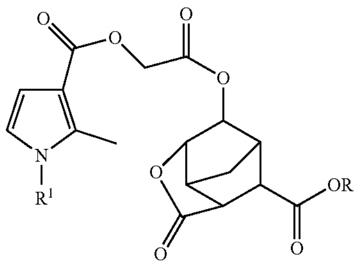
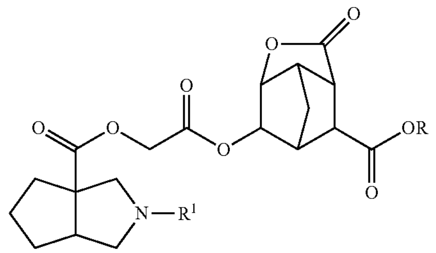

-continued

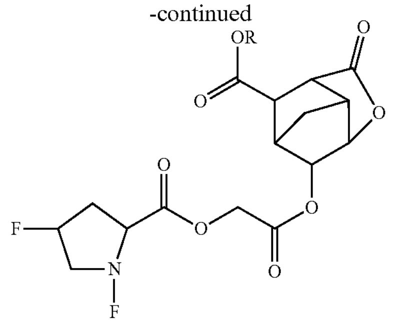

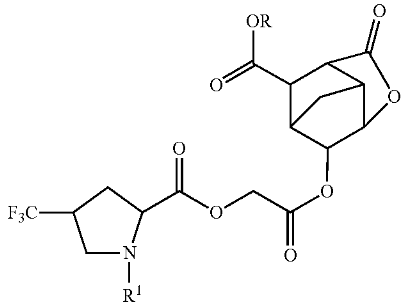

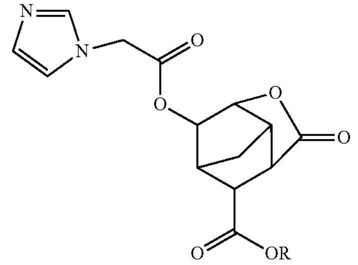

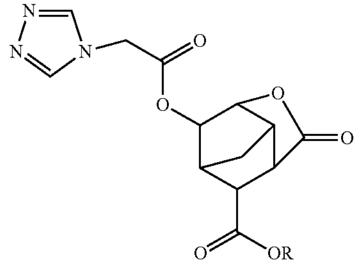

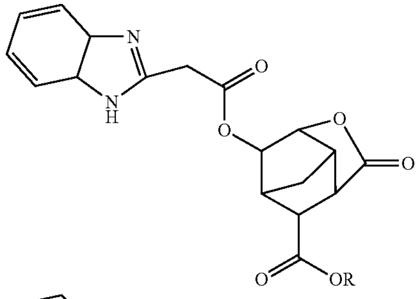

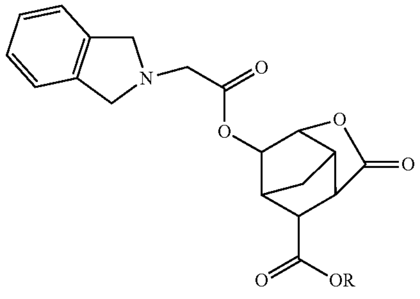

-continued

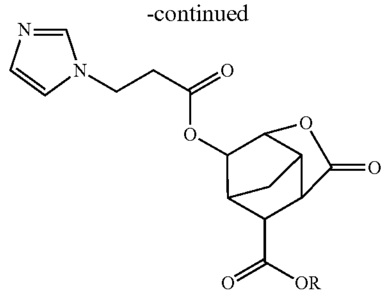

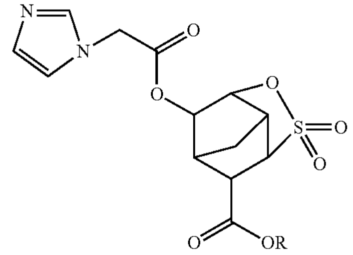

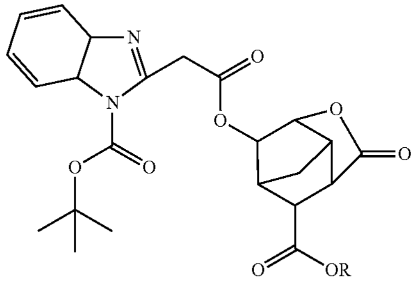

Since Compound A has an acid labile group containing a nitro-substituted aromatic moiety, and a heterocyclic amine structure in its molecule, the acid trapping ability due to the acid neutralizing reaction of the heterocyclic amine structure, the acid diffusion controlling ability of the nitro group, and the acid-catalyzed deprotection reaction of the acid labile group cooperate to achieve low acid diffusion and high contrast. Consequently, LWR or CDU can be improved.

Compound A may be synthesized, for example, by reacting a phthalic anhydride having a nitro group, a cyclic amine compound having a hydroxy group, and a tertiary or secondary alcohol for forming an acid labile group ester.

In the chemically amplified resist composition, the quencher in the form of Compound A is preferably present in an amount of 0.001 to 50 parts by weight, more preferably 0.01 to 20 parts by weight per 100 parts by weight of a base polymer (to be described later), as viewed from sensitivity and acid diffusion suppressing effect. Compound A may be used alone or in admixture of two or more.

The quencher may contain a quencher other than Compound A. The other quencher is typically selected from conventional basic compounds. Conventional basic compounds include primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy group, ether bond, ester bond, lactone ring, cyano group, or sulfonic ester bond as described in U.S. Pat. No. 7,537,880 (JP-A 2008-111103, paragraphs [0146]-[0164]), and compounds having a carbamate group as described in JP 3790649. Addition of a basic compound is effective for further suppressing the diffusion rate of acid in the resist film or correcting the pattern profile.

Quenchers of polymer type as described in U.S. Pat. No. 7,598,016 (JP-A 2008-239918) are also useful. The polymeric quencher segregates at the resist film surface and thus enhances the rectangularity of resist pattern. When a protective film is applied as is often the case in the immersion lithography, the polymeric quencher is also effective for preventing a film thickness loss of resist pattern or rounding of pattern top.

Also, sulfonium salts, iodonium salts or ammonium salts may be added as the other quencher. The sulfonium, iodonium or ammonium salts added as the other quencher are preferably salts of carboxylic acid, sulfonic acid, alkoxide, sulfonimide or saccharin compounds. The carboxylic acid may or may not be fluorinated at α-position.

Exemplary such quenchers include a compound having the formula (q1) which is an onium salt of α-non-fluorinated sulfonic acid, a compound having the formula (q2) which is an onium salt of carboxylic acid, and a compound having the formula (q3) which is an onium salt of alkoxide.

$$R^{q1}—SO_3^-\ \ Mq^+ \qquad (q1)$$

$$R^{q2}—CO_2^-\ \ Mq^+ \qquad (q2)$$

$$R^{q3}—O^-\ \ Mq^+ \qquad (q3)$$

In formula (q1), $R^{q1}$ is hydrogen or a $C_1$-$C_{40}$ hydrocarbyl group which may contain a heteroatom, exclusive of the hydrocarbyl group in which the hydrogen bonded to the carbon atom at α-position of the sulfo group is substituted by fluorine or fluoroalkyl moiety.

The $C_1$-$C_{40}$ hydrocarbyl group $R^{q1}$ may be saturated or unsaturated and straight, branched or cyclic. Examples thereof include $C_1$-$C_{40}$ alkyl groups such as methyl, ethyl, n-propyl, isopropyl, n-butyl, isobutyl, sec-butyl, tert-butyl, tert-pentyl, n-pentyl, n-hexyl, n-octyl, 2-ethylhexyl, n-nonyl, n-decyl; $C_3$-$C_{40}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decanyl, adamantyl, and adamantylmethyl; $C_2$-$C_{40}$ alkenyl groups such as vinyl, allyl, propenyl, butenyl and hexenyl; $C_3$-$C_{40}$ cyclic unsaturated aliphatic hydrocarbyl groups such as cyclohexenyl; $C_6$-$C_{40}$ aryl groups such as phenyl, naphthyl, alkylphenyl groups (e.g., 2-methylphenyl, 3-methylphenyl, 4-methylphenyl, 4-ethylphenyl, 4-tert-butylphenyl, 4-n-butylphenyl), dialkylphenyl groups (e.g., 2,4-dimethylphenyl and 2,4,6-triisopropylphenyl), alkylnaphthyl groups (e.g., methylnaphthyl and ethylnaphthyl), dialklylnaphthyl groups (e.g., dimethylnaphthyl and diethylnaphthyl); and $C_7$-$C_{40}$ aralkyl groups such as benzyl, 1-phenylethyl and 2-phenylethyl.

In the hydrocarbyl group, some or all of the hydrogen atoms may be substituted by a moiety containing a heteroatom such as oxygen, sulfur, nitrogen or halogen, and some constituent $—CH_2—$ may be replaced by a moiety containing a heteroatom such as oxygen, sulfur or nitrogen, so that the group may contain a hydroxy moiety, cyano moiety, carbonyl moiety, ether bond, ester bond, sulfonic ester bond, carbonate bond, lactone ring, stilton ring, carboxylic anhydride (—C(=O)—O—C(O)—), or haloalkyl moiety. Suitable heteroatom-containing hydrocarbyl groups include heteroaryl groups such as thienyl, 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl; and aryloxoalkyl groups, typically 2-aryl-2-oxoethyl groups such as 2-phenyl-2-oxoethyl, 2-(1-naphthyl)-2-oxoethyl and 2-(2-naphthyl)-2-oxoethyl.

In formula (q2), $R^{q2}$ is a $C_1$-$C_{40}$ hydrocarbyl group which may contain a heteroatom Examples of the hydrocarbyl group $R^{q2}$ are as exemplified above for the hydrocarbyl group $R^{q1}$. Also included are fluorinated alkyl groups such as trifluoromethyl, trifluoroethyl, 2,2,2-trifluoro-1-methyl-1-hydroxyethyl, 2,2,2-trifluoro-1-(trifluoromethyl)-1-hydroxyethyl, and fluorinated aryl groups such as pentafluorophenyl and 4-trifluoromethylphenyl.

In formula (q3), $R^{q3}$ is a $C_1$-$C_8$ straight, branched or cyclic alkyl group or $C_6$-$C_{10}$ aryl group, which contains at least 3 fluorine atoms and optionally contains a nitro moiety.

In formulae (q1), (q2) and (q3), $Mq^+$ is an onium cation. The onium cation is preferably a sulfonium, iodonium or ammonium cation, with the sulfonium cation being more preferred. Suitable sulfonium cations are as exemplified in U.S. Pat. No. 10,295,904 (JP-A 2017-219836).

A sulfonium salt of iodized benzene ring-containing carboxylic acid having the formula (q4) is also useful as the quencher.

(q4)

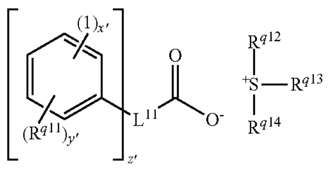

In formula (q4), $R^{q11}$ is hydroxy, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy, or $C_1$-$C_4$ saturated hydrocarbylsulfonyloxy group, in which some or all hydrogen may be substituted by halogen, or —N($R^{q11A}$)—C(O)—$R^{q11}$B, or —N($R^{q11A}$)—C(=O)—O—$R^{q11B}$, wherein $R^{q11A}$ is hydrogen or a $C_1$-$C_6$ saturated hydrocarbyl group and $R^{q11B}$ is a $C_1$-$C_6$ saturated hydrocarbyl or $C_2$-$C_8$ unsaturated aliphatic hydrocarbyl group.

In formula (q4), x' is an integer of 1 to 5, y' is an integer of 0 to 3, and z' is an integer of 1 to 3. L" is a single bond, or a $C_1$-$C_{20}$ (z'+1)-valent linking group which may contain an ether bond, carbonyl, ester bond, amide bond, sultone ring, lactam ring, carbonate bond, halogen, hydroxy or carboxy moiety or a mixture thereof. The saturated hydrocarbyl, saturated hydrocarbyloxy, saturated hydrocarbylcarbonyloxy and saturated hydrocarbylsulfonyloxy groups may be straight, branched or cyclic. Groups $R^{q11}$ may be identical or different when y' and/or z' is 2 or 3.

In formula (q4), $R^{q12}$, $R^{q13}$ and $R^{q14}$ are each independently halogen or a $C_1$-$C_{20}$ hydrocarbyl group which may contain a heteroatom. The hydrocarbyl group may be saturated or unsaturated and straight, branched or cyclic.

Examples thereof are as will be exemplified later for the hydrocarbyl group represented by $R^{101}$ to $R^{103}$ in formula (3). In the hydrocarbyl group, some or all hydrogen may be substituted by hydroxy, carboxy, halogen, oxo, cyano, nitro, sultone, sulfo, or sulfonium salt-containing moiety, or some constituent —$CH_2$— may be replaced by an ether bond, ester bond, carbonyl, amide bond, carbonate bond or sulfonic ester bond. A pair of $R^{q12}$ and $R^{q13}$ may bond together to form a ring with the sulfur atom to which they are attached.

Examples of the compound having formula (q4) include those described in U.S. Pat. No. 10,295,904 (JP-A 2017-219836) and US 20210188770 (JP-A 2021-091666).

The other quencher is preferably added in an amount of 0 to 5 parts, more preferably 0 to 4 parts by weight per 100 parts by weight of a base polymer to be described later. The quencher may be used alone or in admixture.

Acid Generator

The chemically amplified resist composition comprises an acid generator. The acid generator may be an acid generator of addition type which is different from the quencher and any of resist components to be described later. An acid generator capable of functioning as a base polymer, that is, polymer-bound acid generator is also acceptable.

The acid generator of addition type is typically a compound (PAG) capable of generating an acid upon exposure to actinic ray or radiation. Although the PAG used herein may be any compound capable of generating an acid upon exposure to high-energy radiation, those compounds capable of generating a sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, salts having the formula (3) are also preferred.

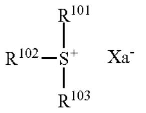

(3)

In formula (3), $R^{101}$ to $R^{103}$ are each independently halogen or a $C_1$-$C_{20}$ hydrocarbyl group which may contain a heteroatom.

Suitable halogen atoms include fluorine, chlorine, bromine and iodine.

The $C_1$-$C_{20}$ hydrocarbyl group represented by $R^{101}$ to $R^{103}$ may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl and adamantyl; $C_2$-$C_{20}$ alkenyl groups such as vinyl, propenyl, butenyl and hexenyl; $C_2$-$C_{20}$ alkynyl groups such as ethynyl, propynyl and butynyl; $C_3$-$C_{20}$ cyclic unsaturated aliphatic hydrocarbyl groups such as cyclohexenyl and norbornenyl: $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl and tert-butylnaphthyl; $C_7$-$C_{20}$ aralkyl groups such as benzyl and phenethyl; and combinations thereof.

Also included are substituted forms of the hydrocarbyl groups in which some or all of the hydrogen atoms are substituted by a moiety containing a heteroatom such as oxygen, sulfur, nitrogen or halogen, or some —$CH_2$— is replaced by a moiety containing a heteroatom such as oxygen, sulfur or nitrogen, so that the group may contain a hydroxy moiety, fluorine, chlorine, bromine, iodine, cyano moiety, nitro moiety, mercapto moiety, carbonyl moiety, ether bond, ester bond, sulfonic ester bond, carbonate bond, lactone ring, sultone ring, carboxylic anhydride (—C(=O)—O—C(=O)—) or haloallcyl moiety.

A pair of $R^{101}$ and $R^{102}$ may bond together to form a ring with the sulfur atom to which they are attached. Preferred are those rings of the structure shown below.

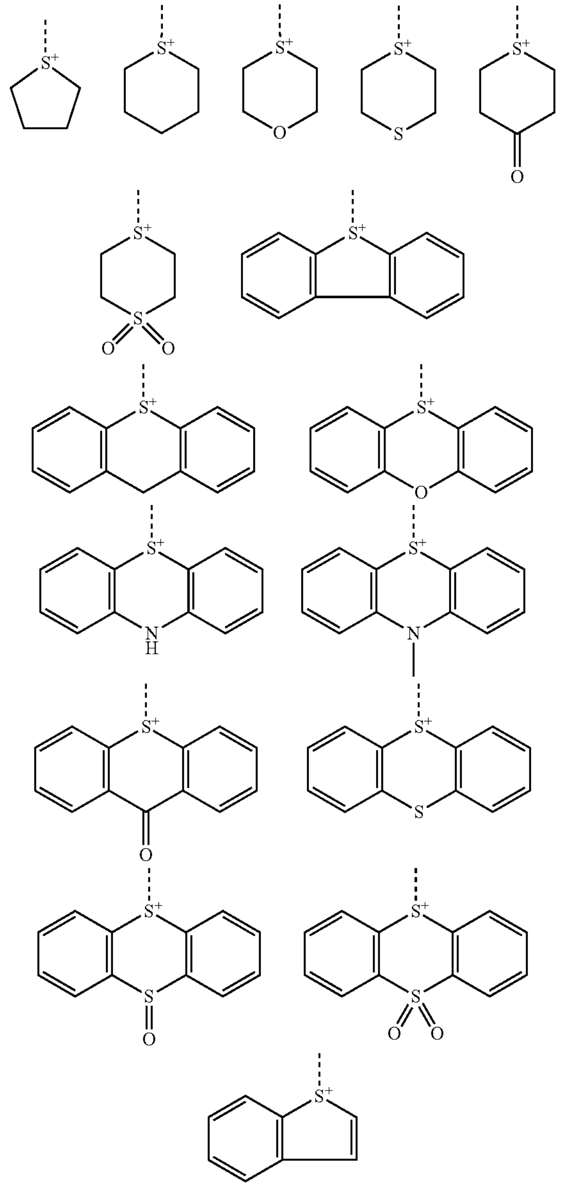

Herein, the broken line denotes a point of attachment to $R^{103}$.
Examples of the cation in the sulfonium salt having formula (3) are shown below, but not limited thereto.
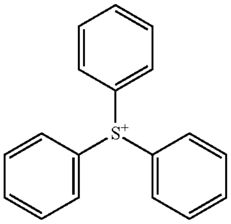
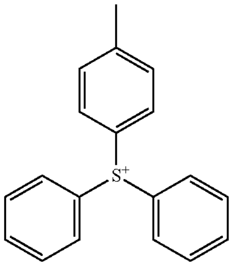
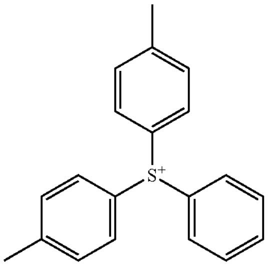
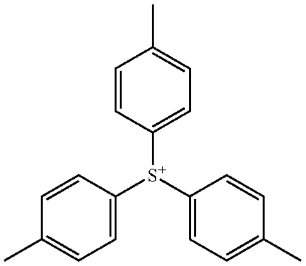
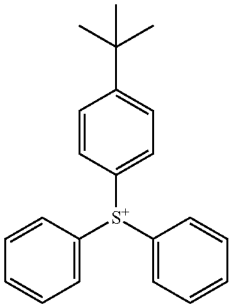
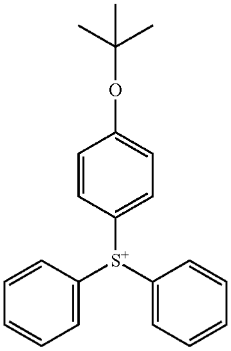
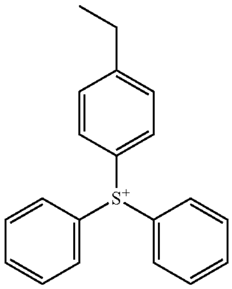
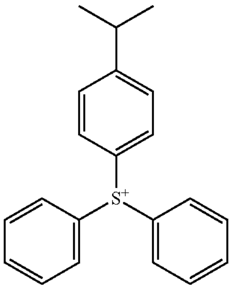
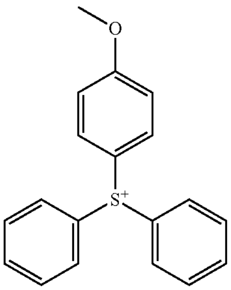
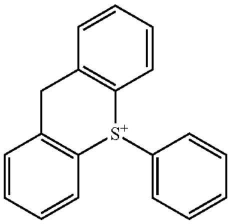
-continued
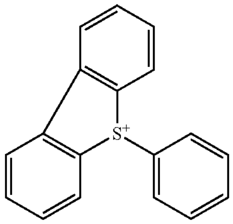
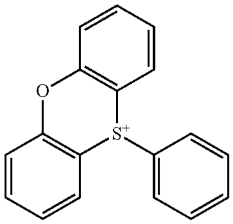
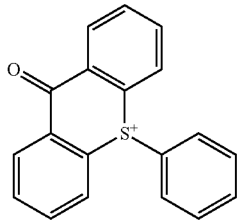
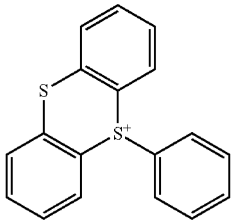
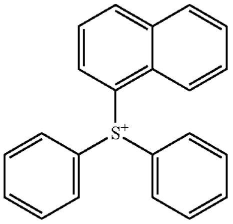
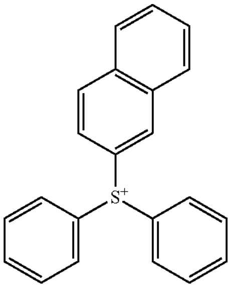
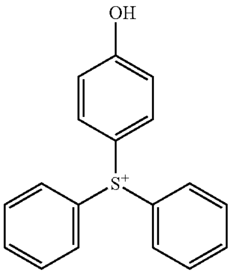
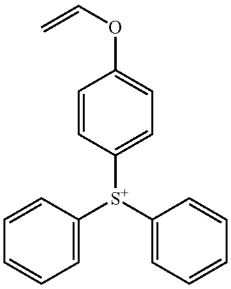
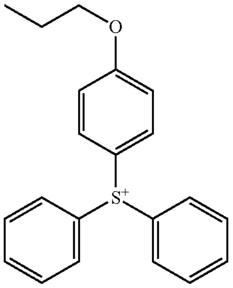
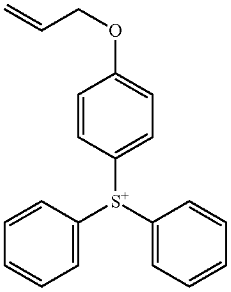
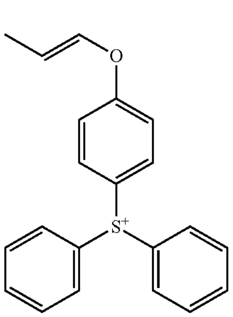
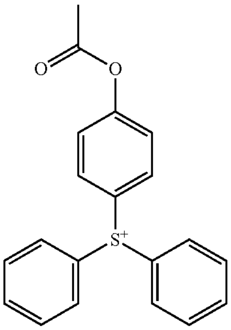

-continued
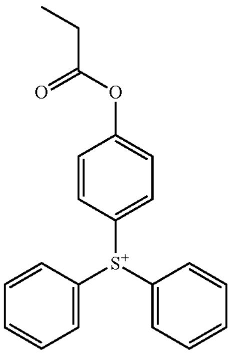
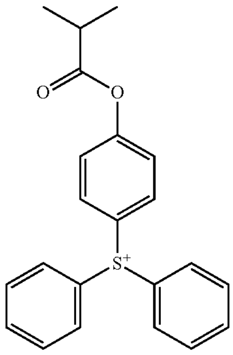
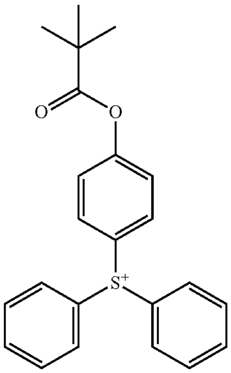
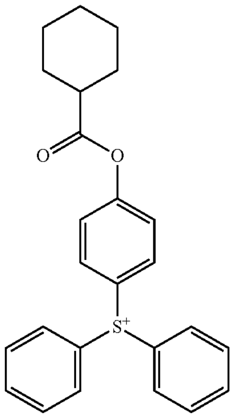
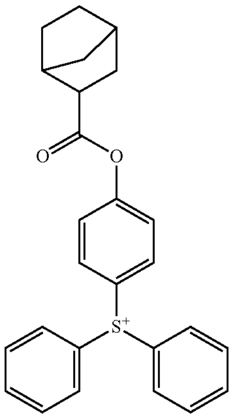
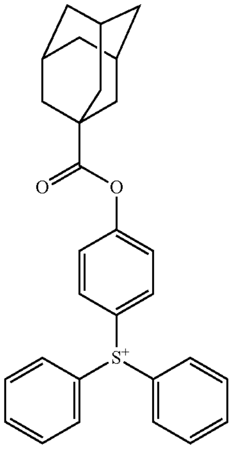
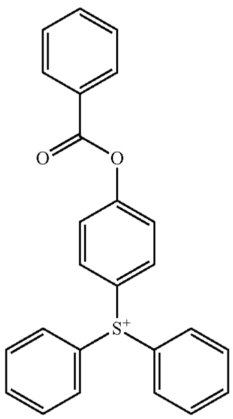
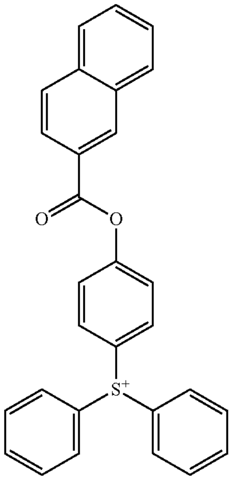
-continued
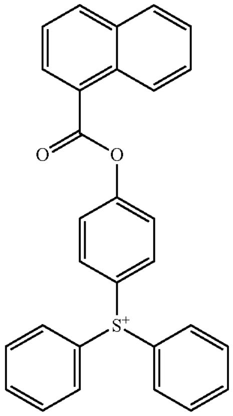
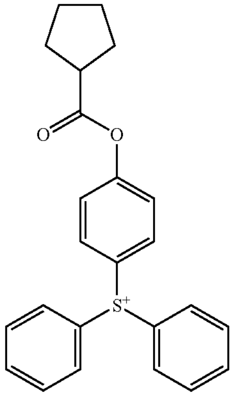
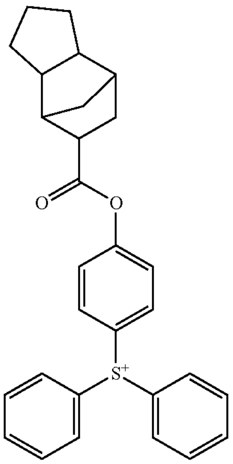
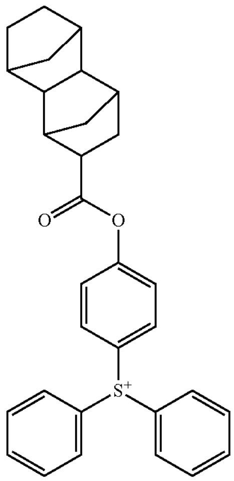
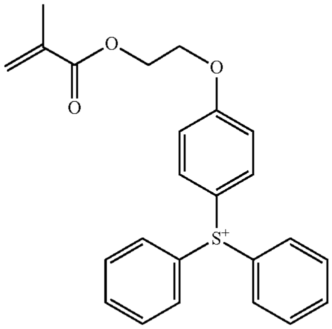
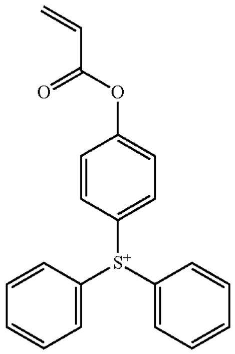
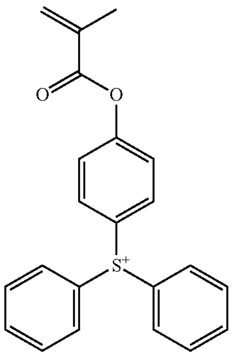
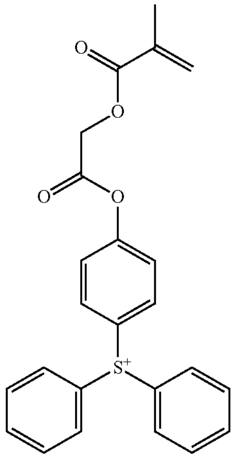

-continued
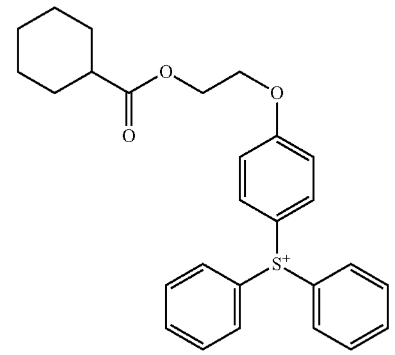
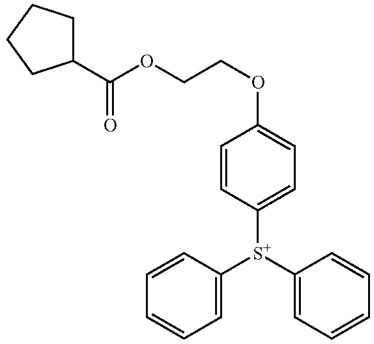
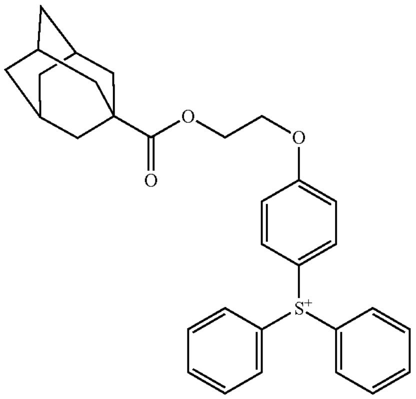
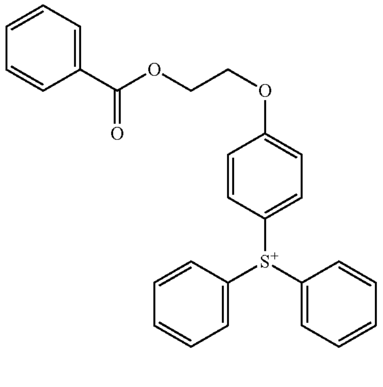
-continued
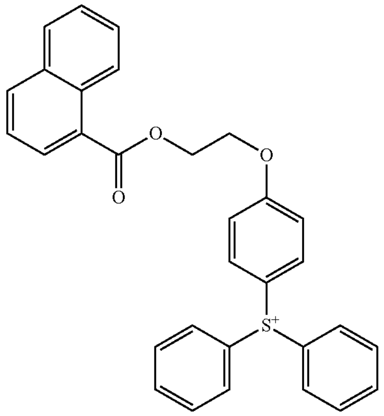
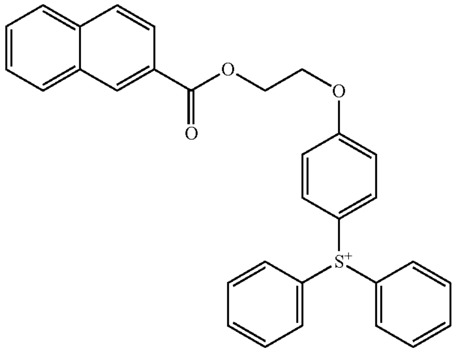
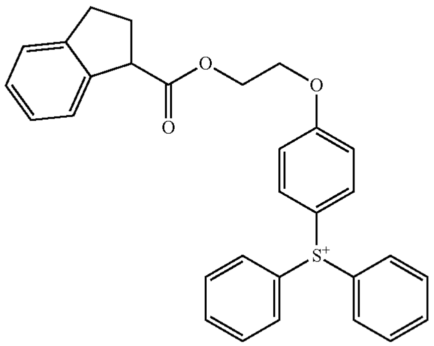
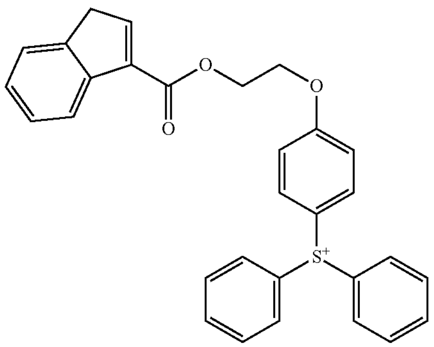

-continued
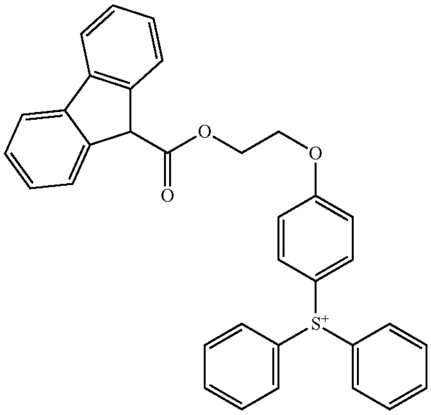
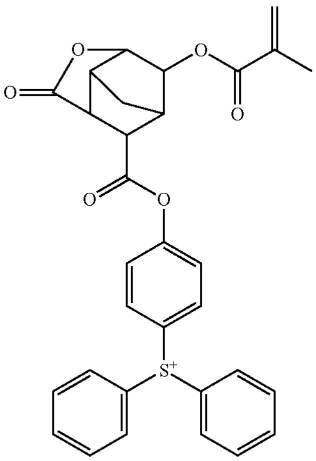
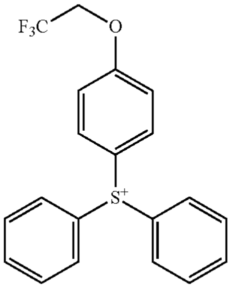
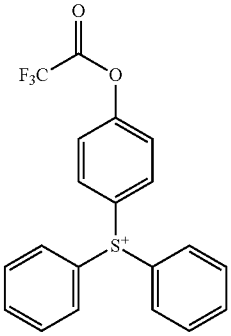
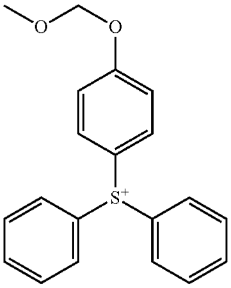
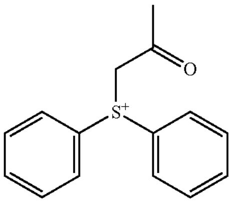
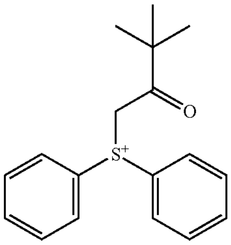
-continued
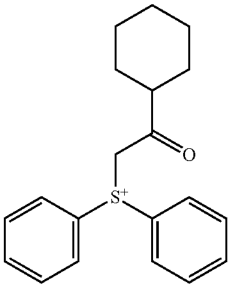
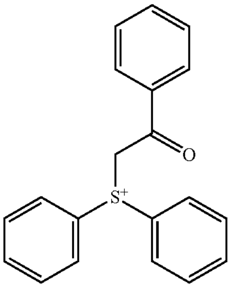
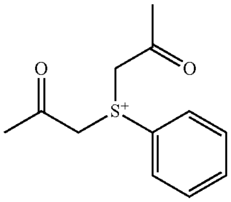
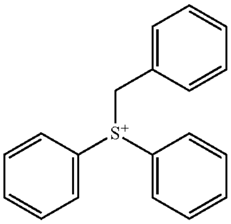
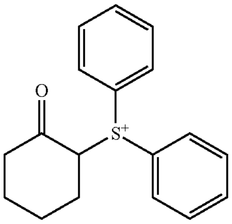
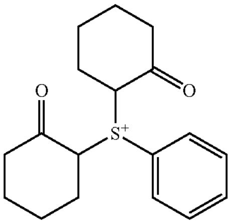
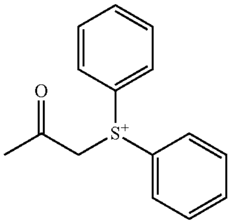
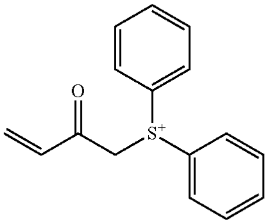
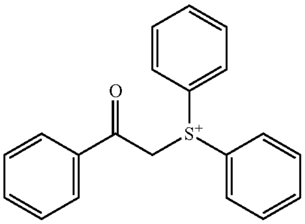
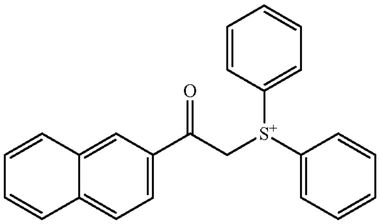
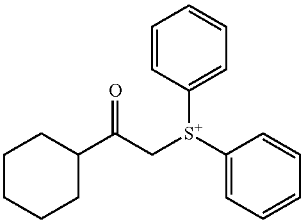

-continued
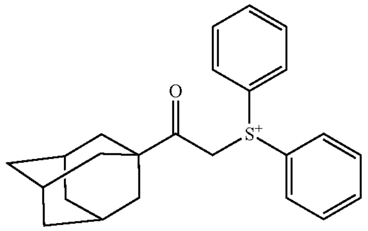
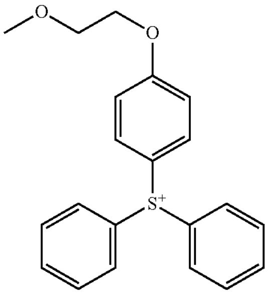
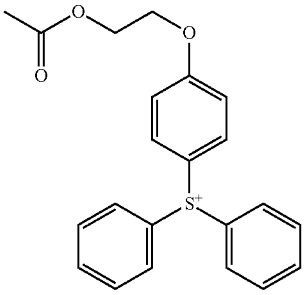
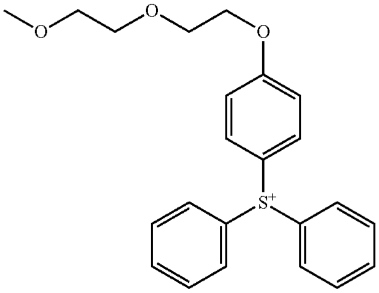
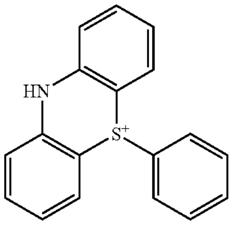
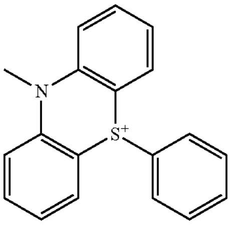
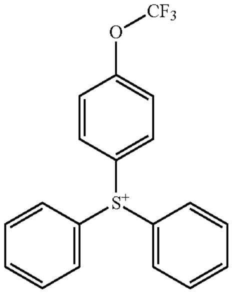
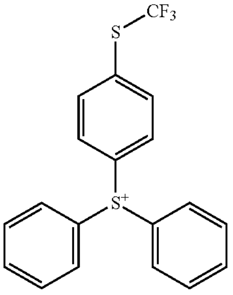
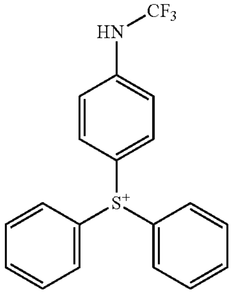
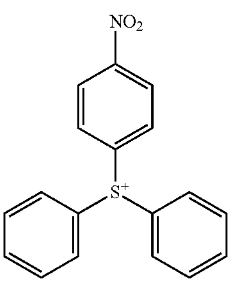
-continued
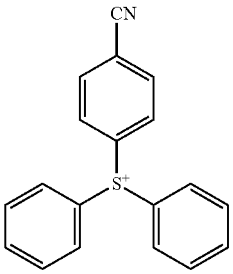
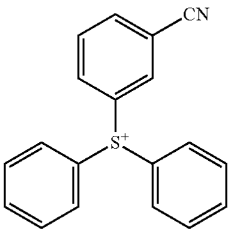
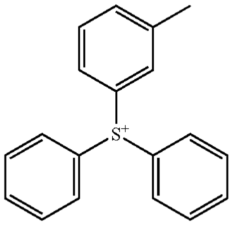
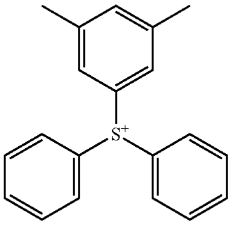
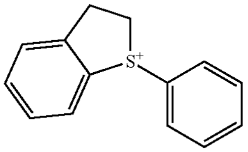
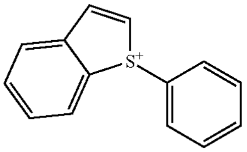
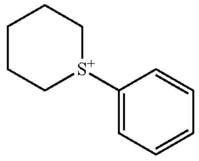
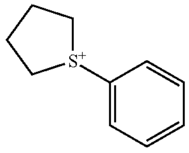
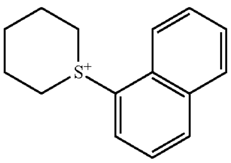
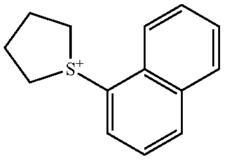
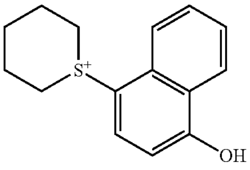
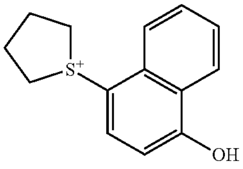
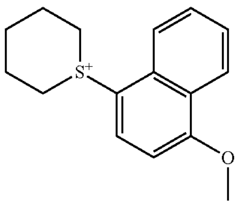
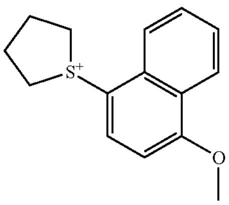
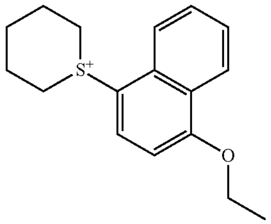
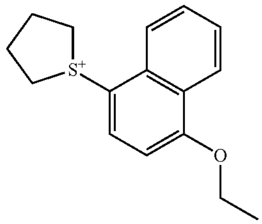

-continued
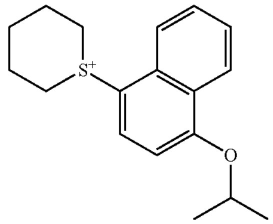
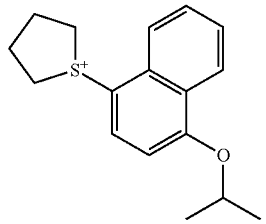
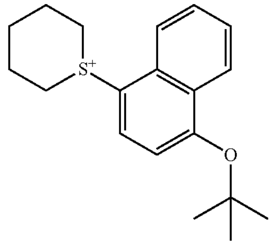
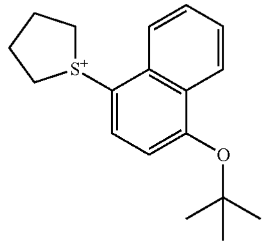
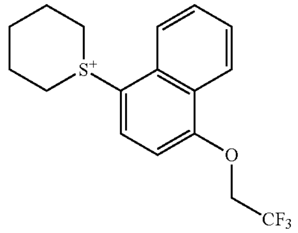
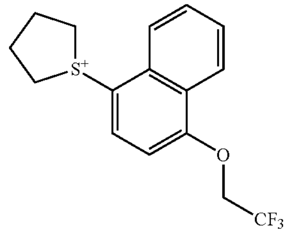
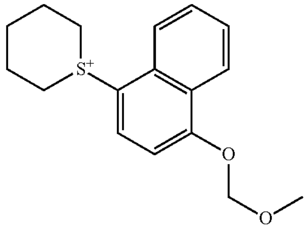
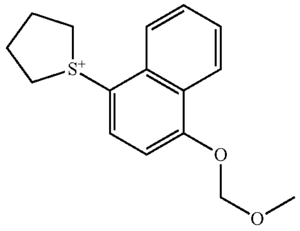
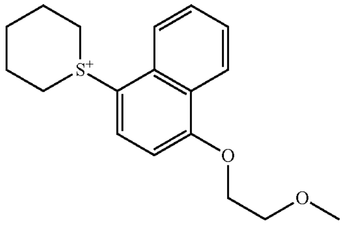
-continued
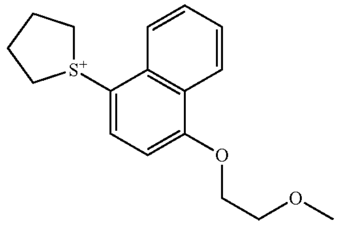
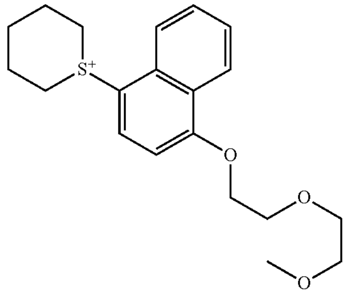
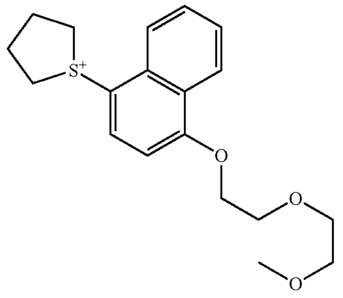
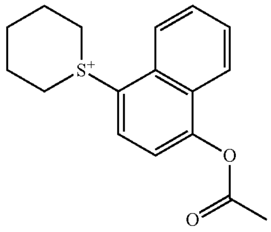
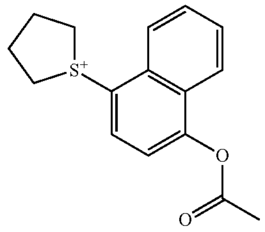
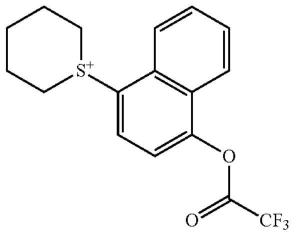
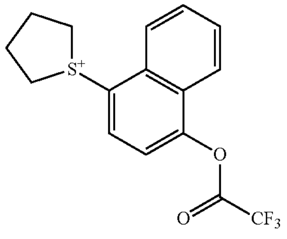

-continued
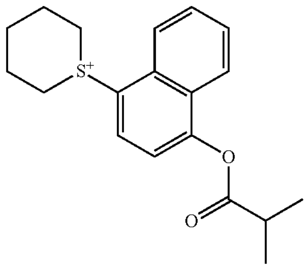
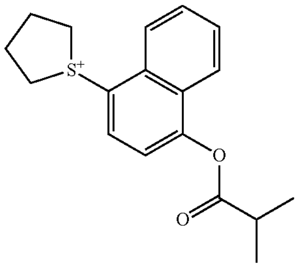
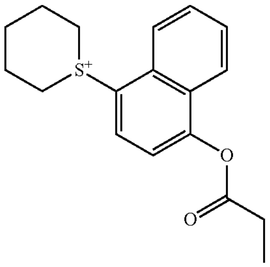
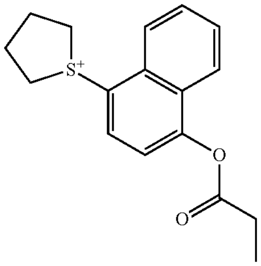
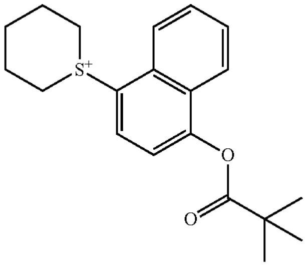
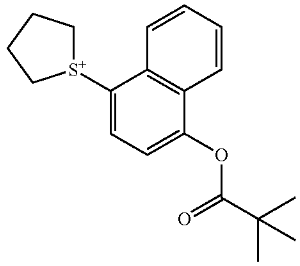
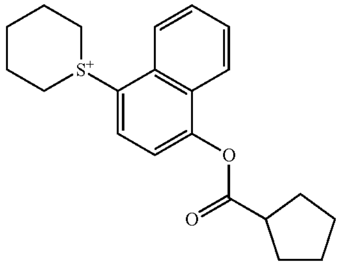
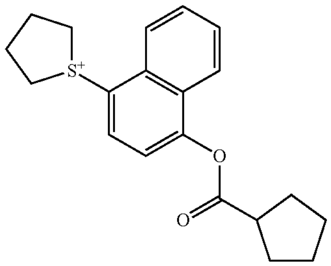
-continued
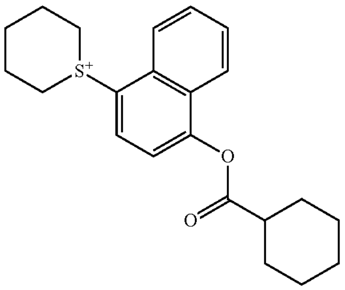
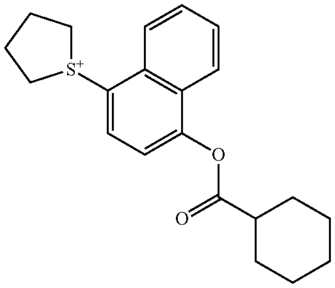
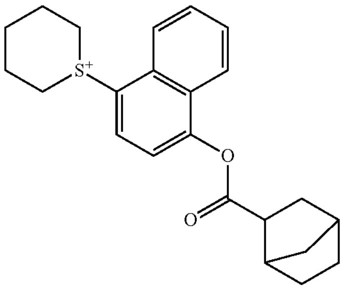
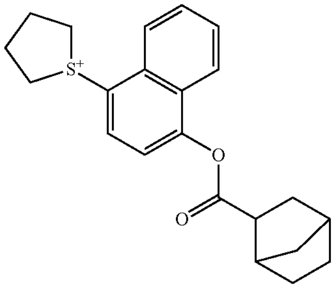
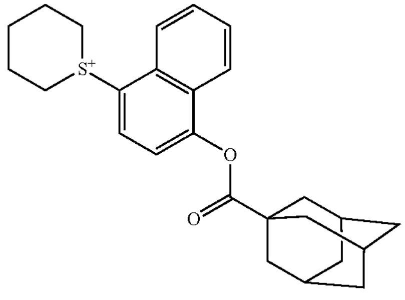

-continued
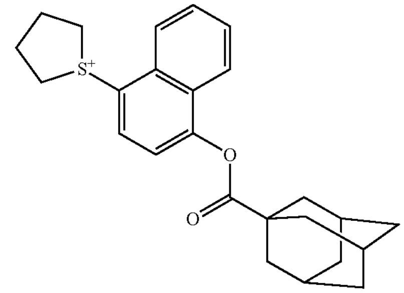
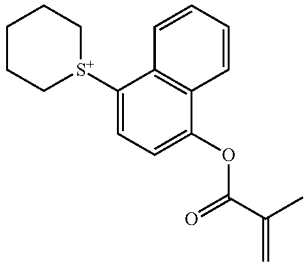
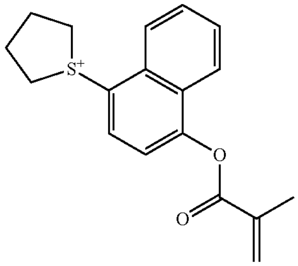
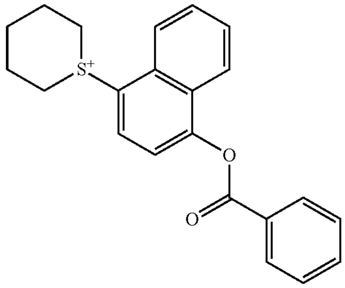
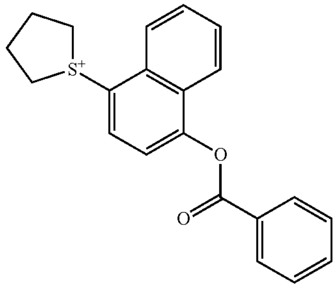
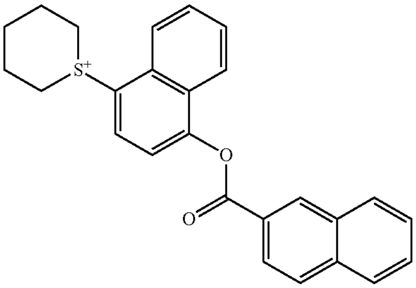
-continued
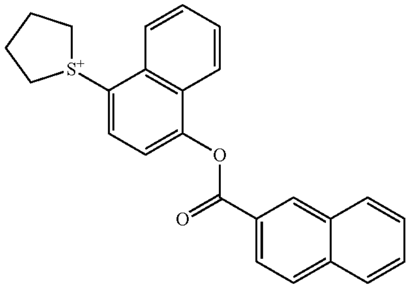
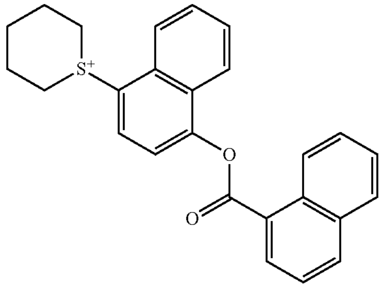
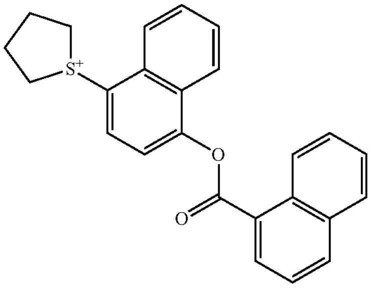
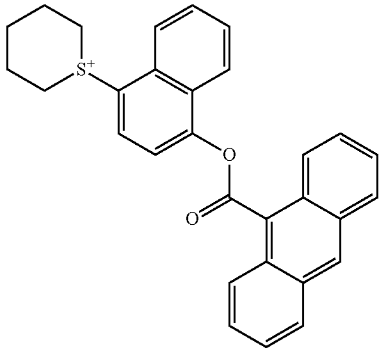
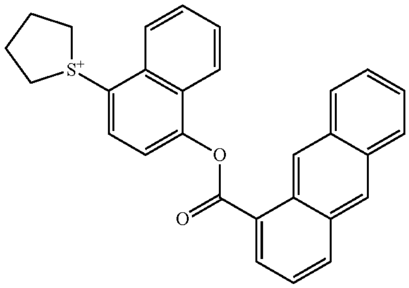

-continued
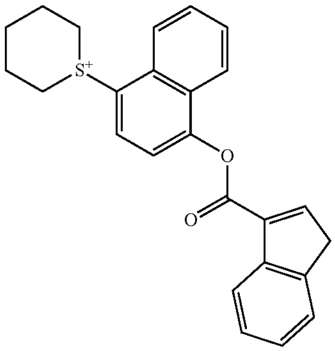
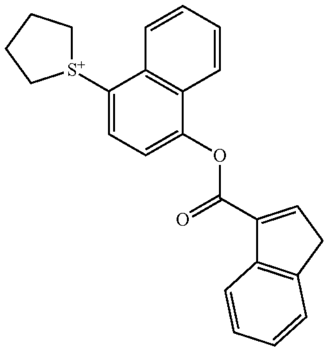
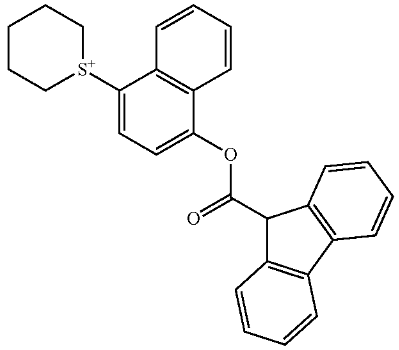
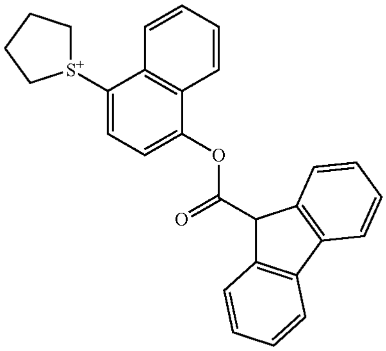
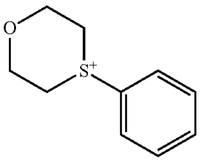
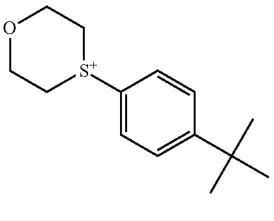
-continued
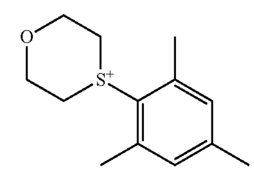
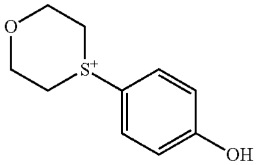
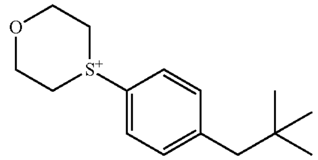
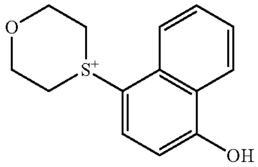
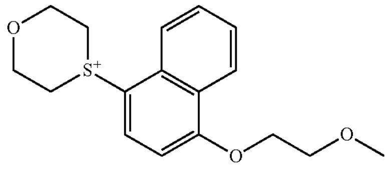
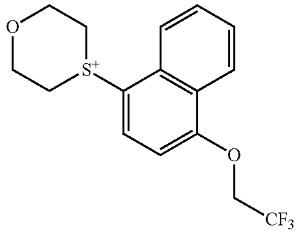
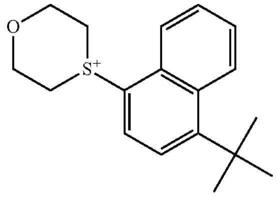
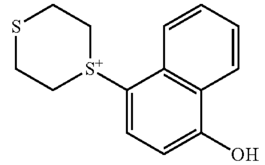
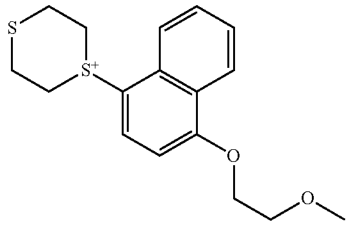
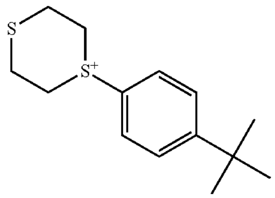
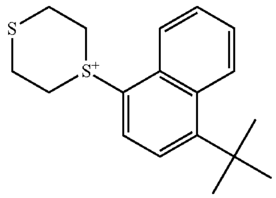
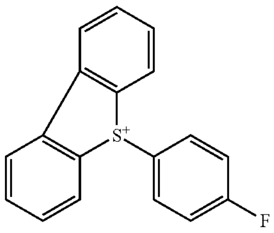
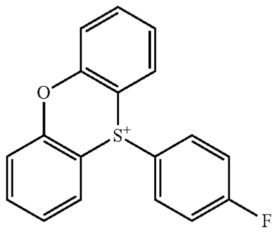

-continued
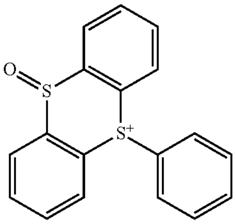
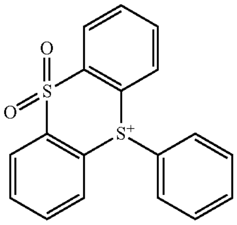
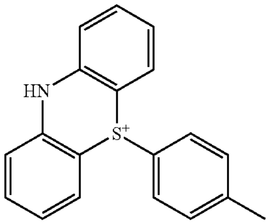
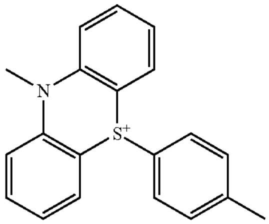
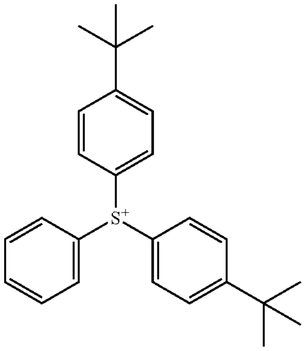
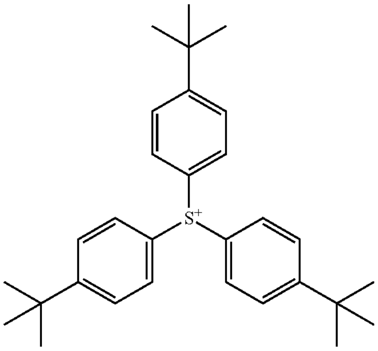
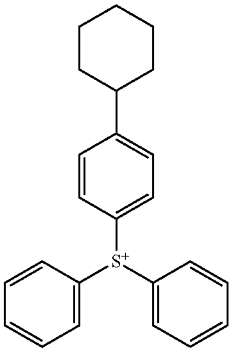
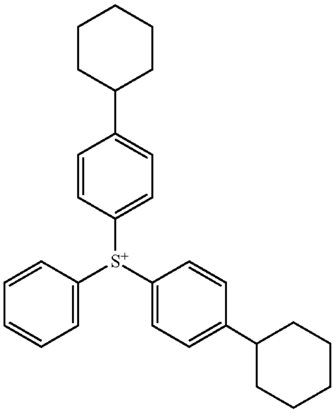
-continued
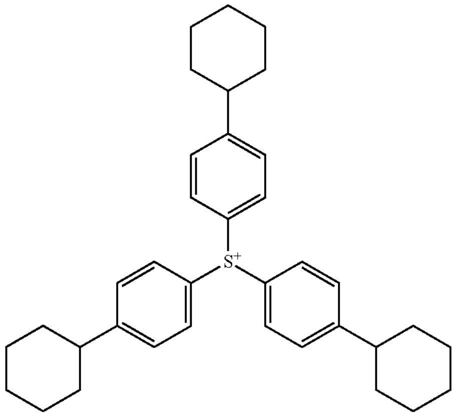
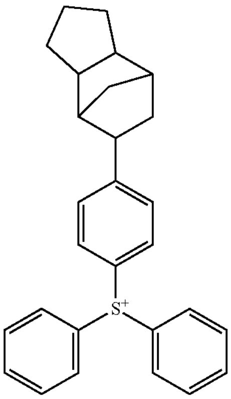
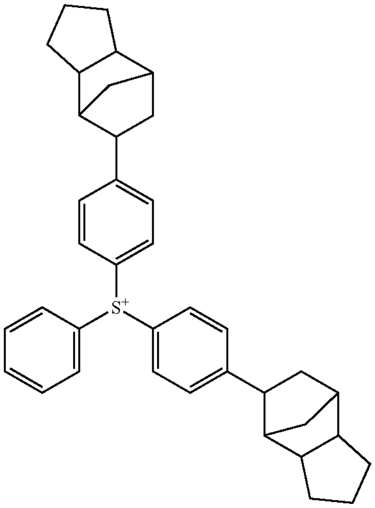

-continued
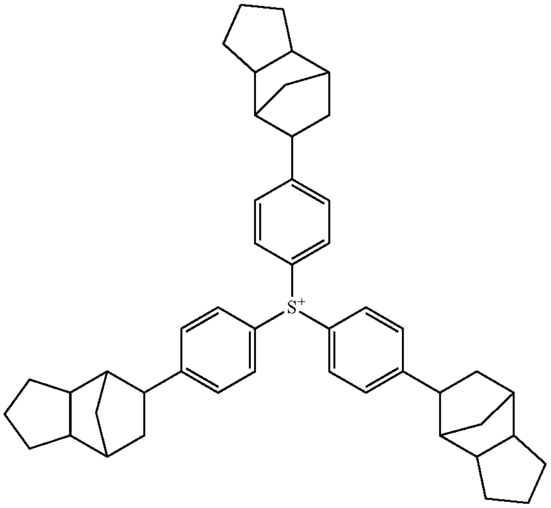 [SMILES: c1cc([S+](c2ccc(C3CC4CC3C3CCCC43)cc2)c2ccc(C3CC4CC3C3CCCC43)cc2)ccc1C1CC2CC1C1CCCC21]
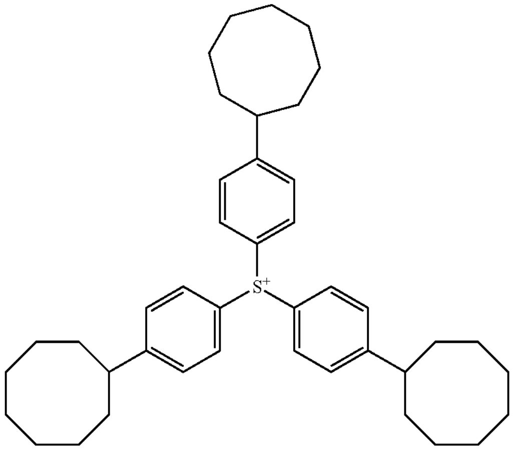
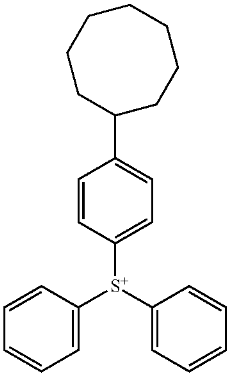
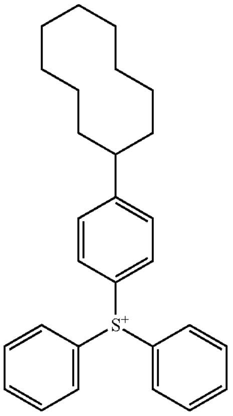
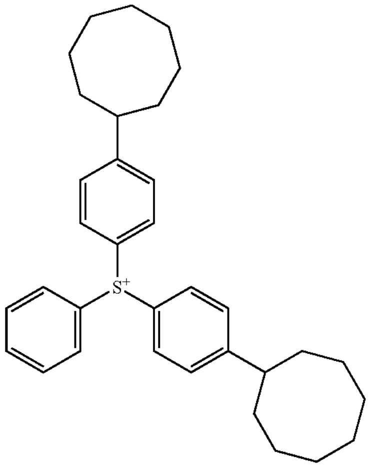
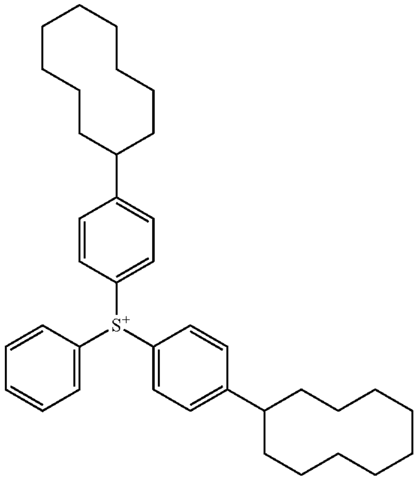
-continued -continued
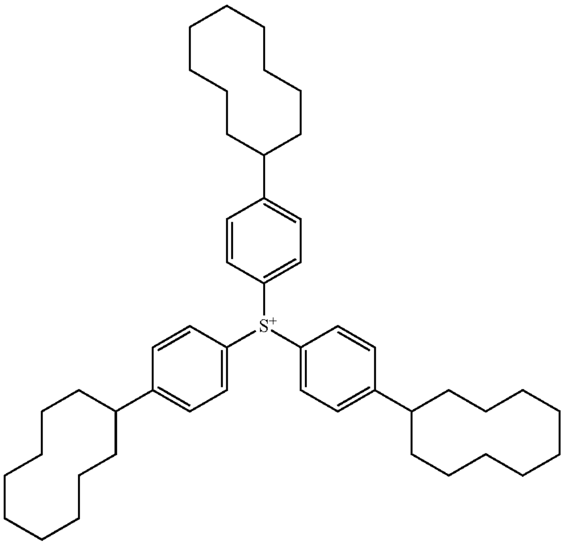
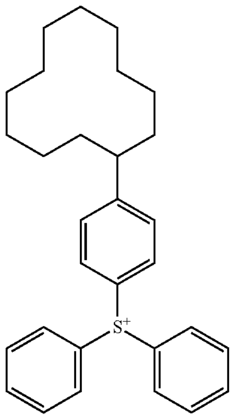
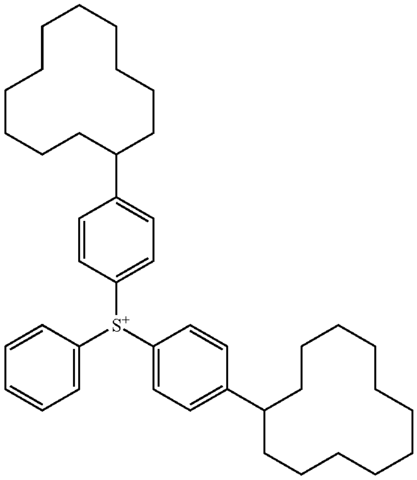
-continued
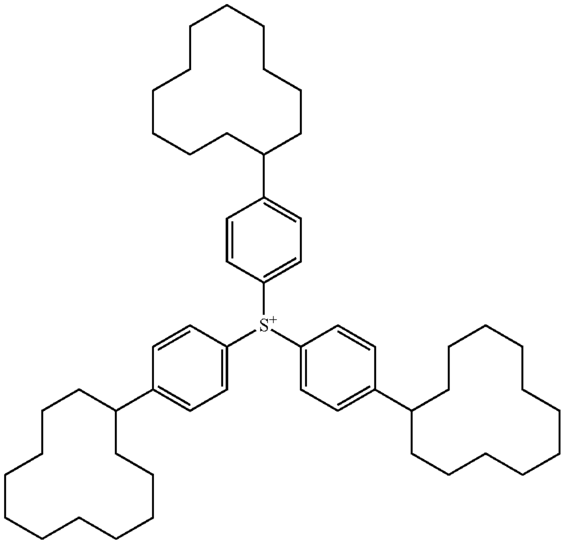
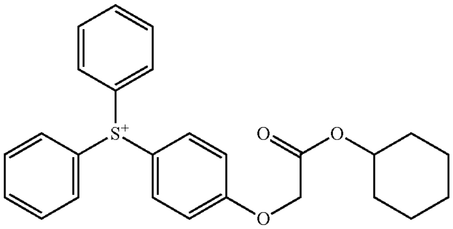
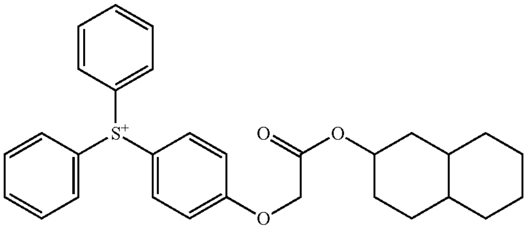
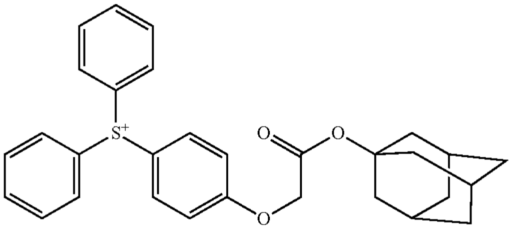
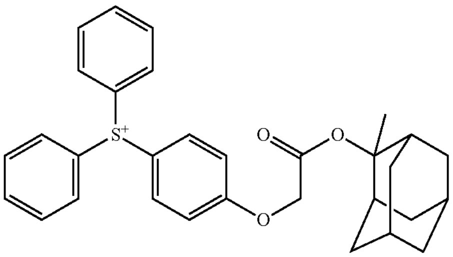

-continued
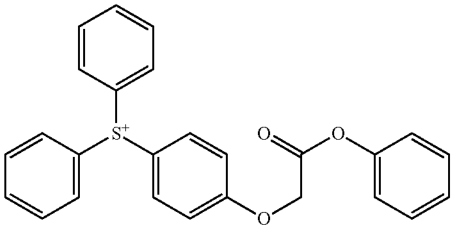
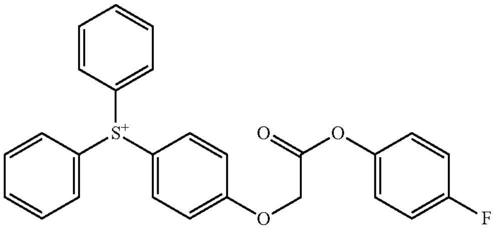
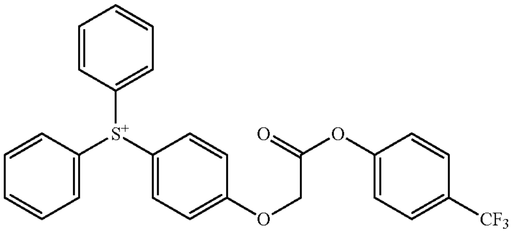
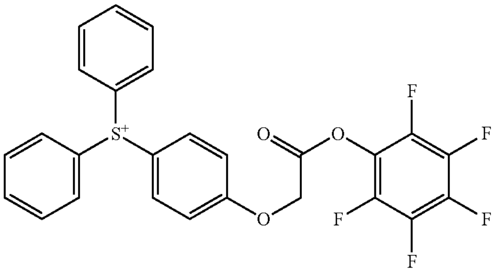
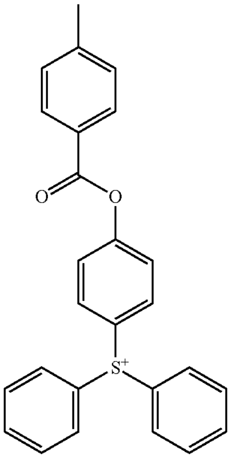
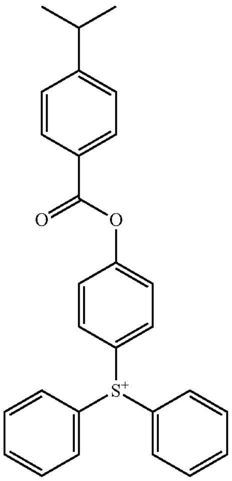
-continued
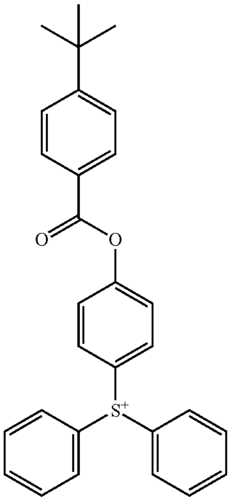
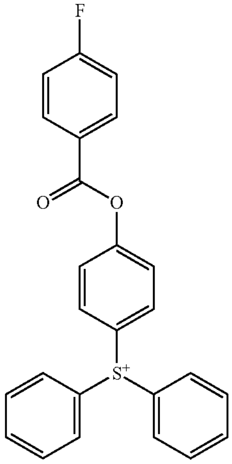
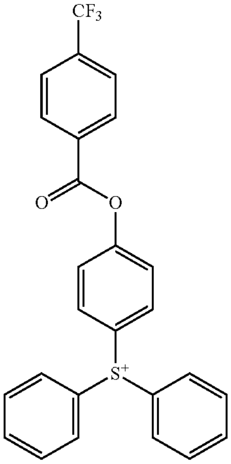
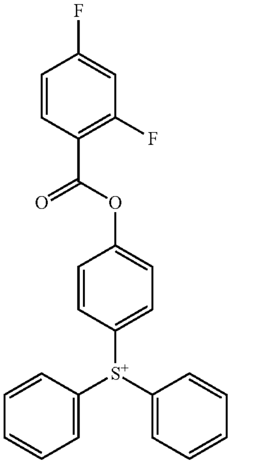
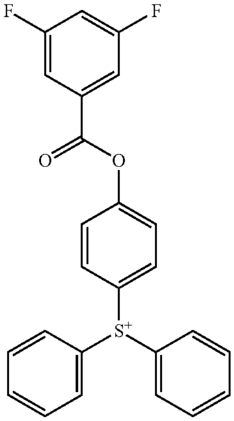
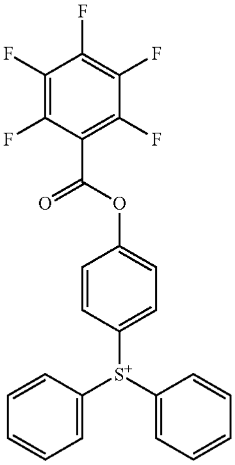
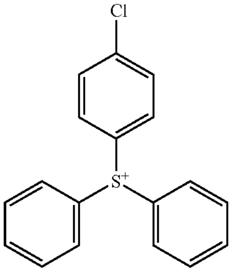
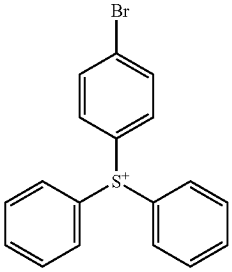

-continued
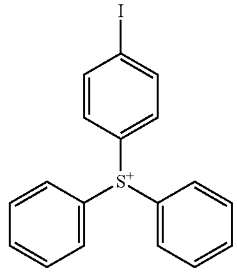
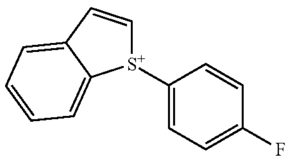
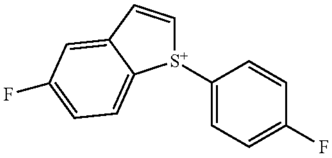
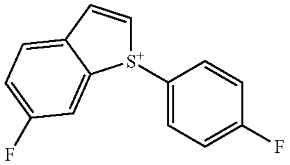
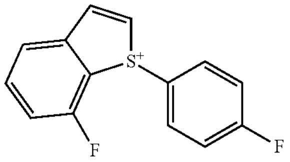
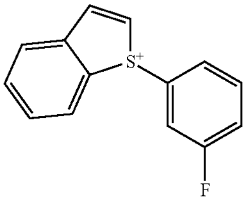
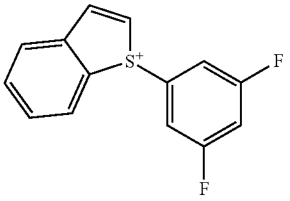
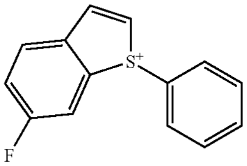
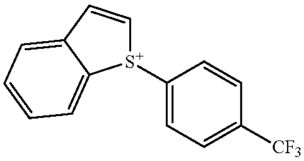
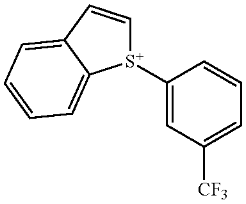
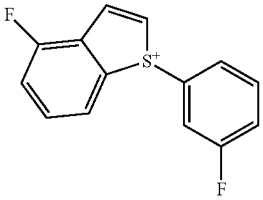
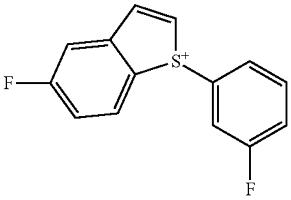
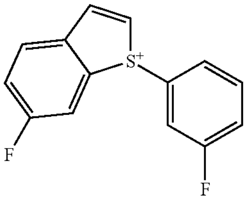
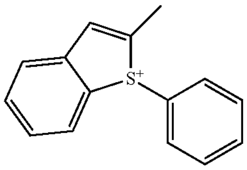
-continued
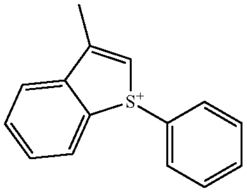
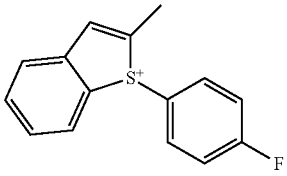
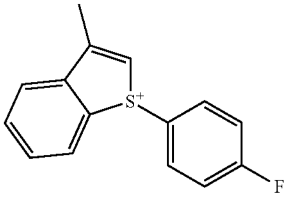
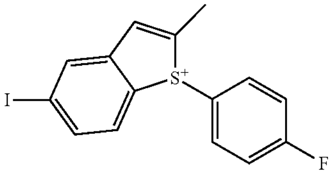
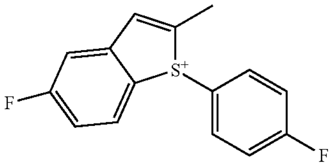
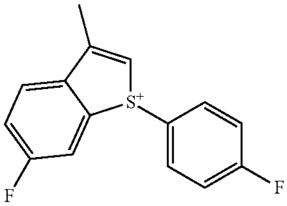
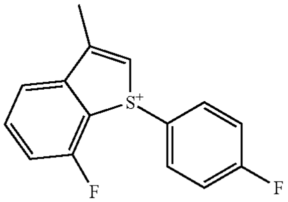
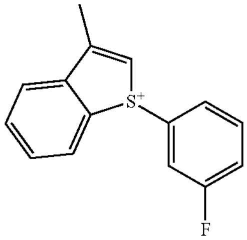
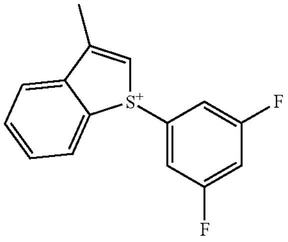
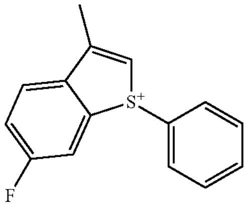
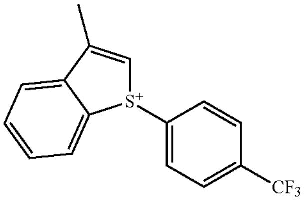
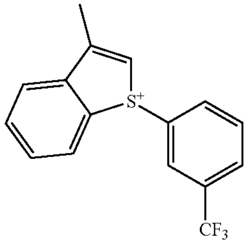

-continued
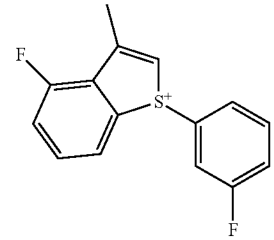
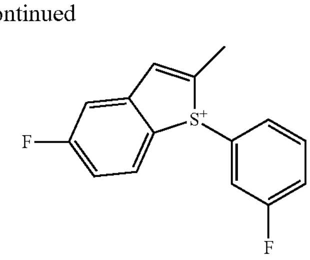
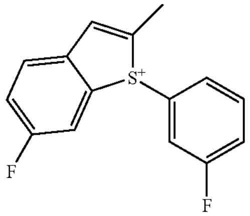
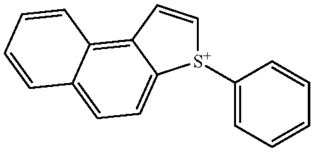
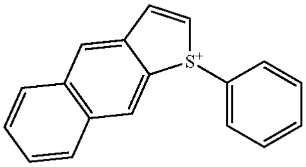
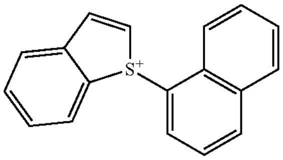
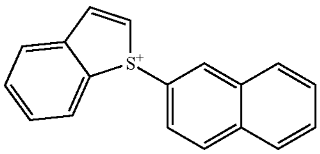
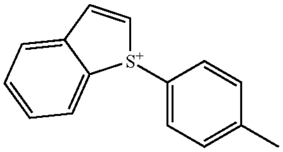
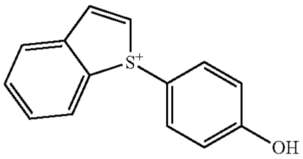
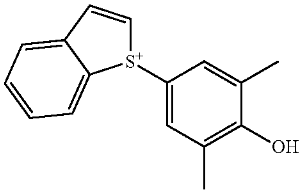
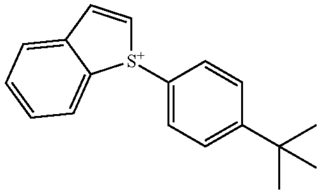
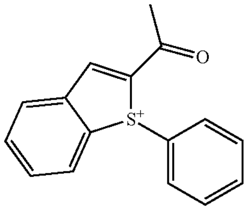
-continued
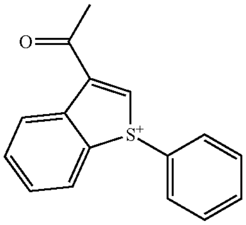
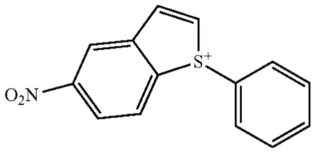
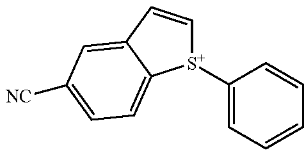
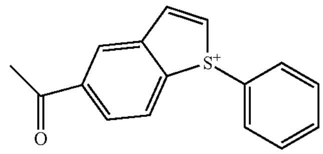
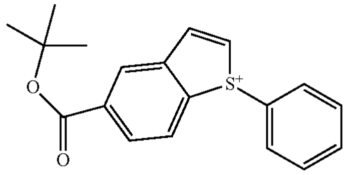
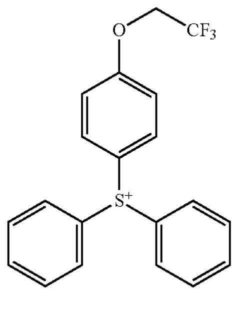
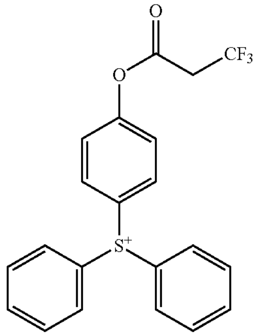
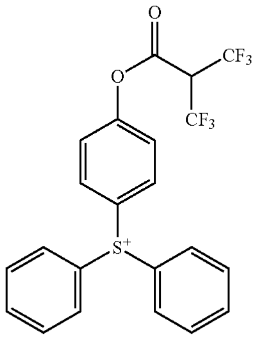
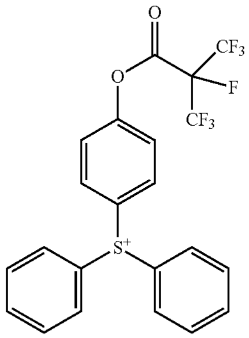
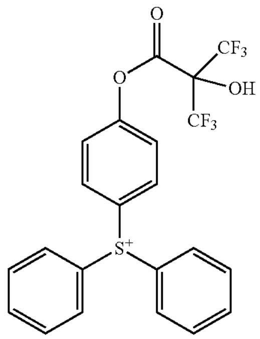
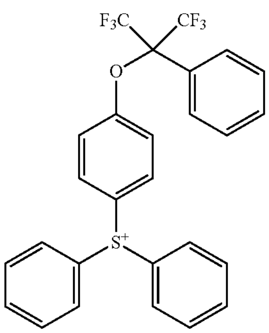

-continued
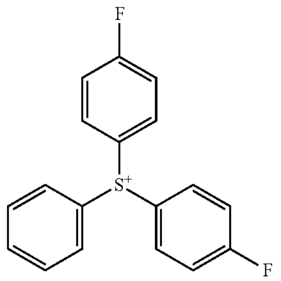
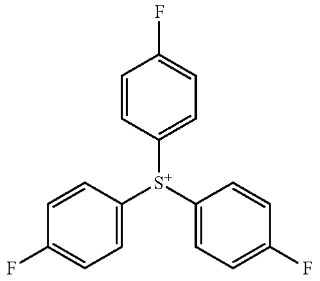
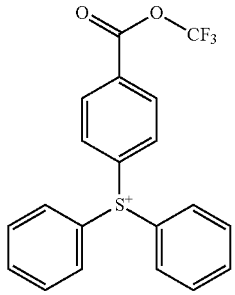
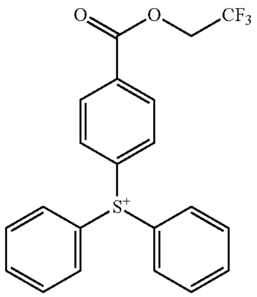
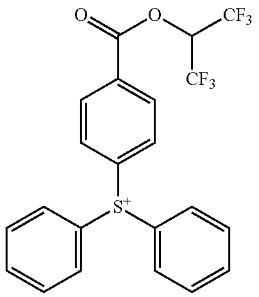
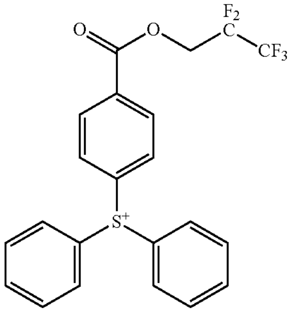
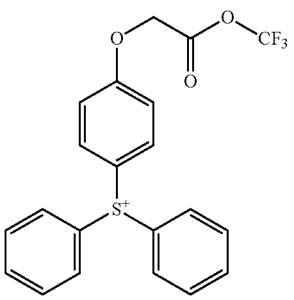
-continued
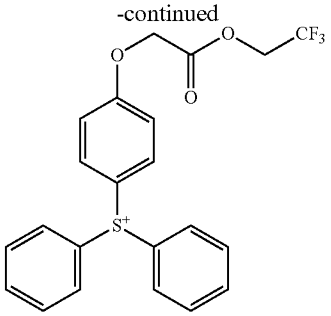
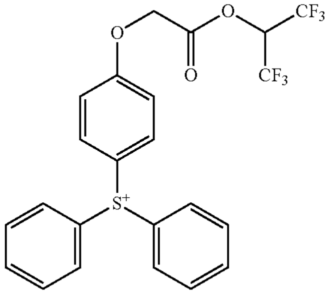
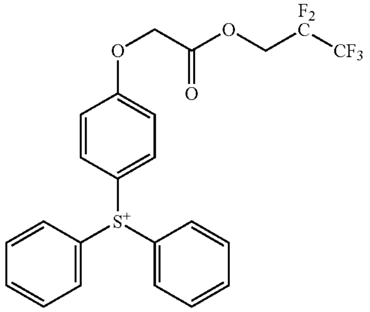
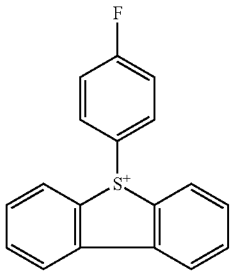
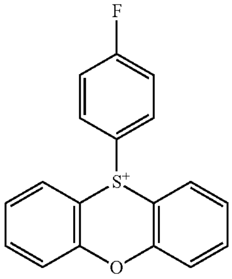
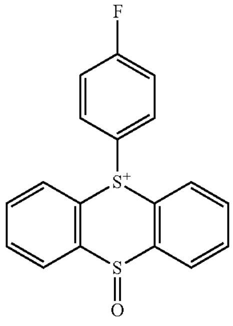
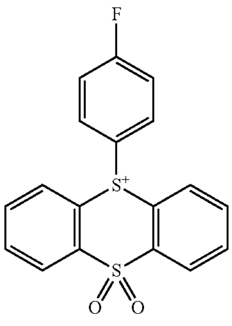
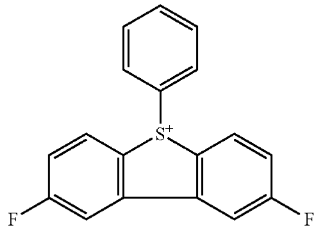

-continued
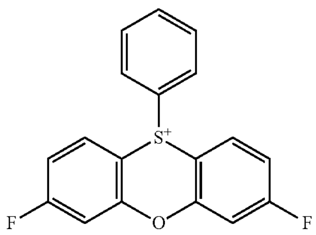
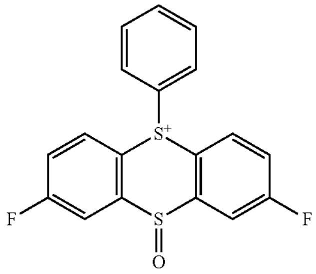
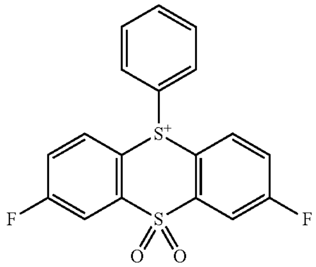
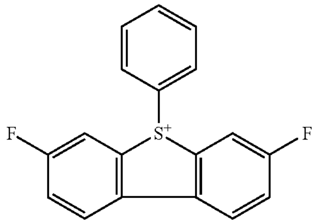
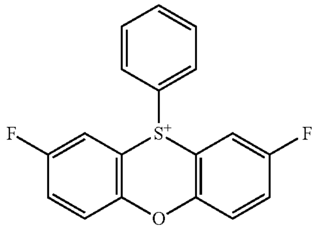
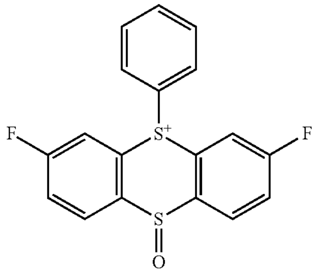
-continued
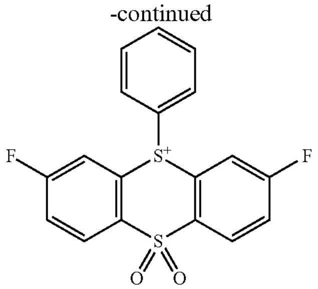
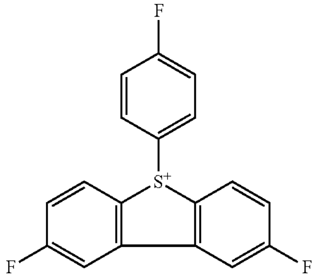
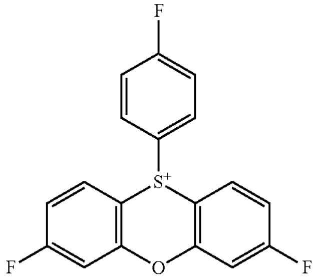
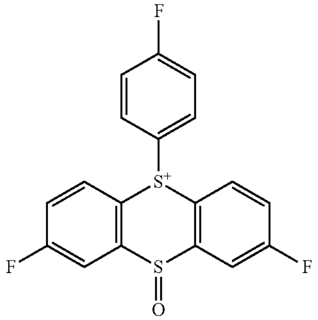
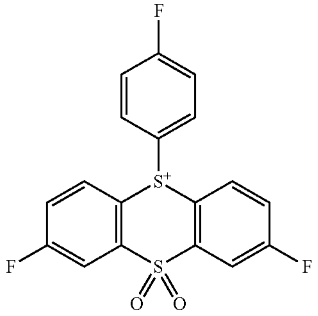
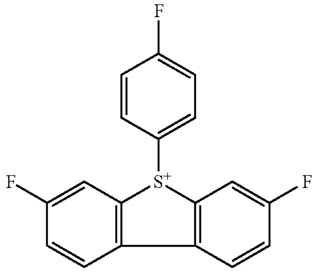

-continued
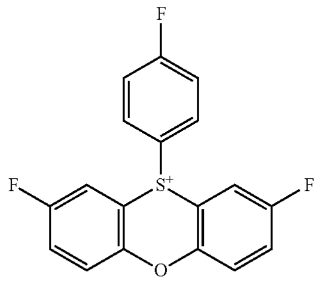
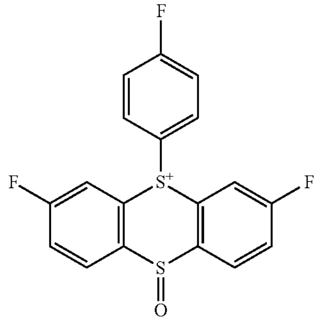
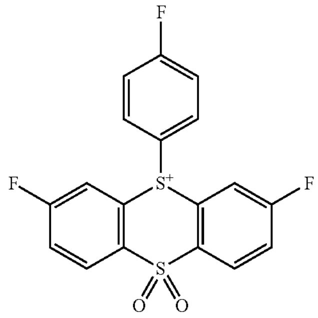
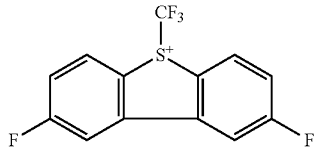
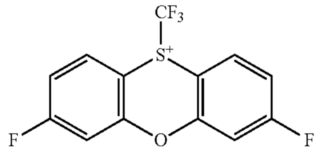
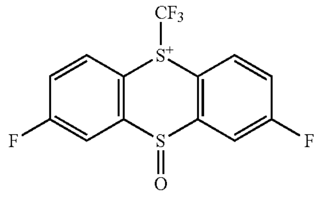
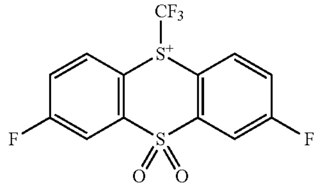
-continued
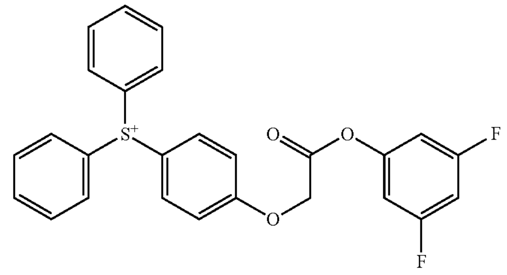
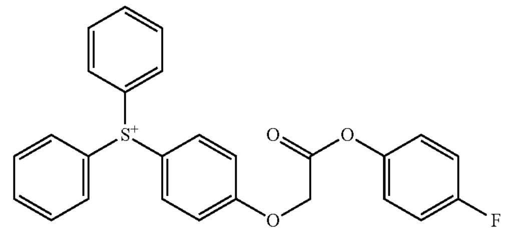
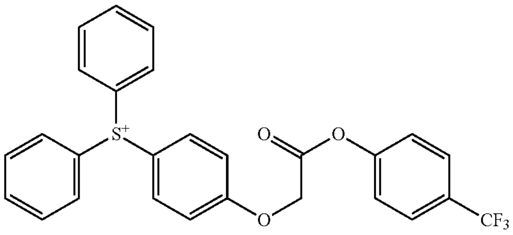
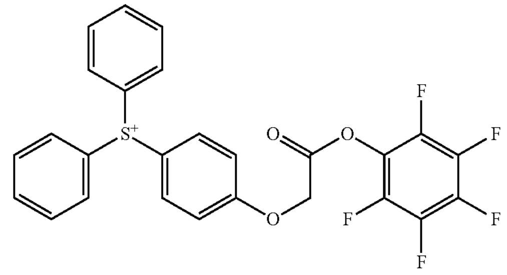
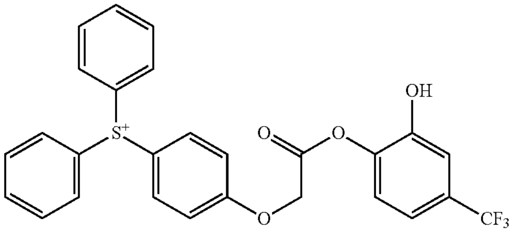
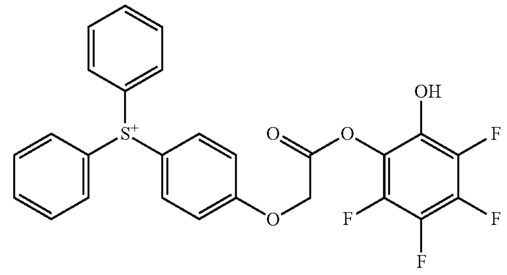

-continued
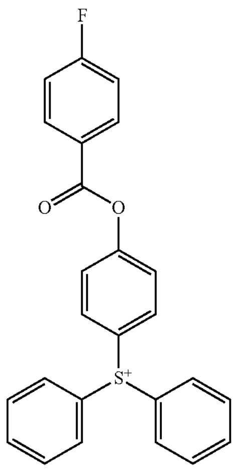
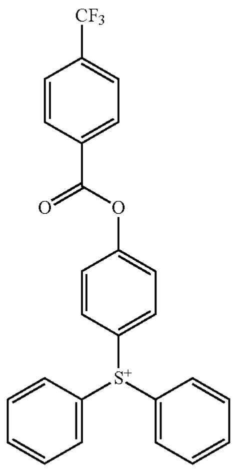
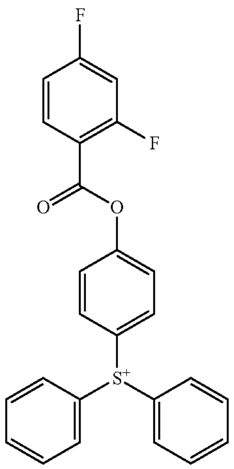
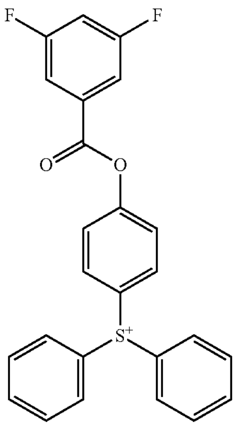
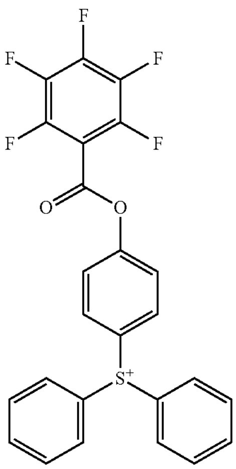
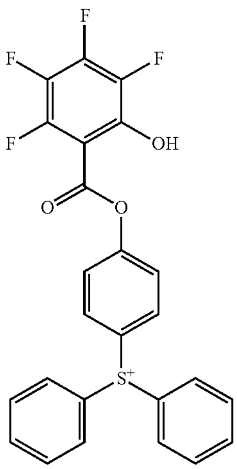
-continued
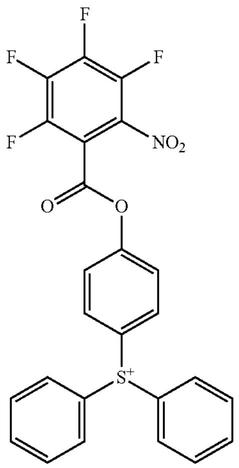
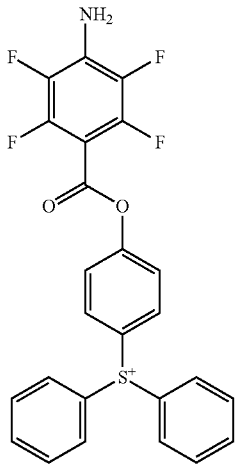
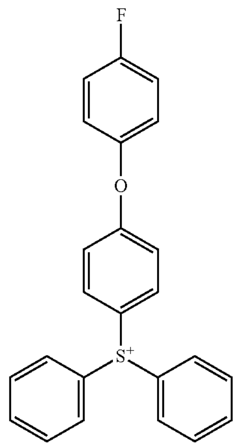
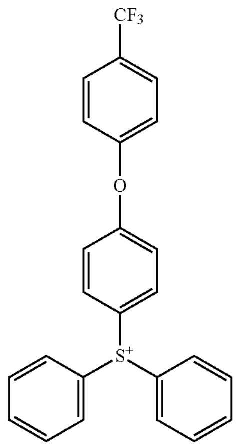
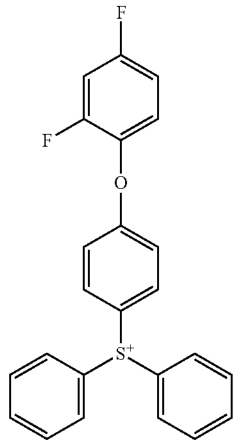
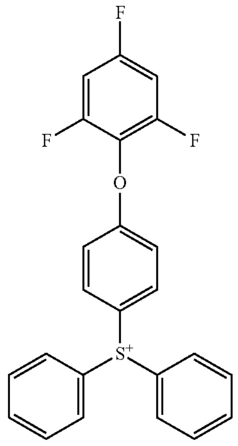

-continued
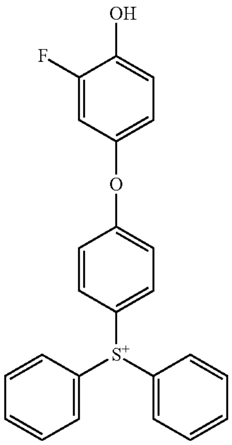
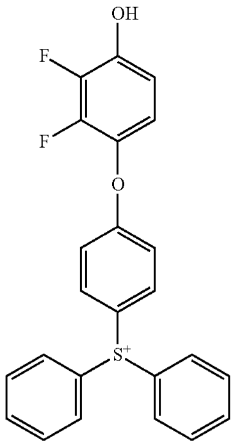
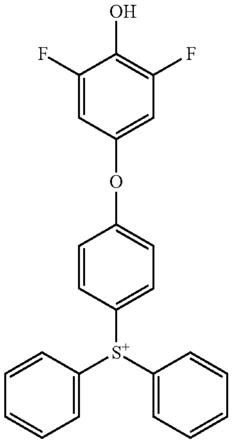
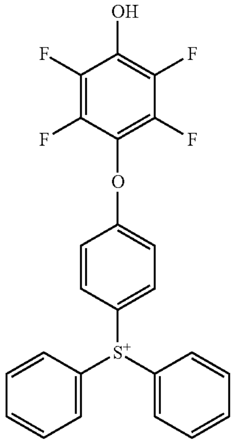
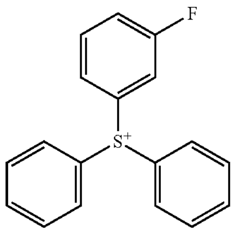
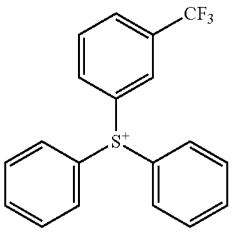
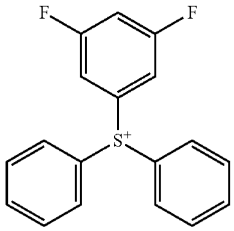
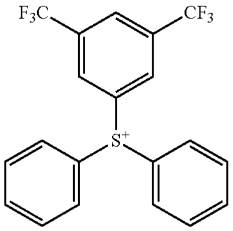
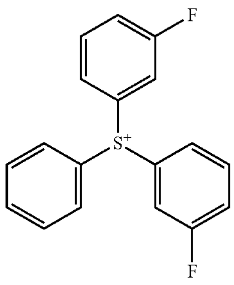
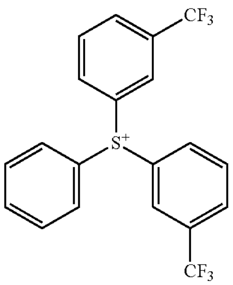
-continued
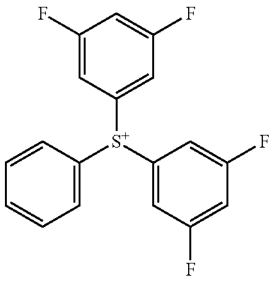
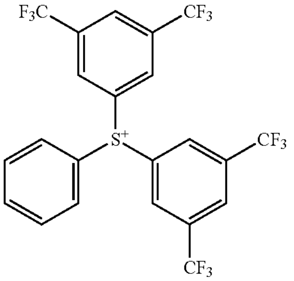
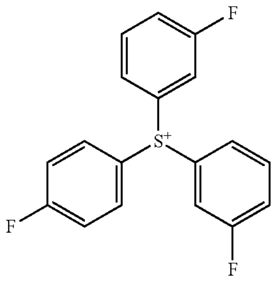
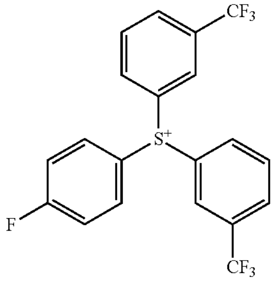
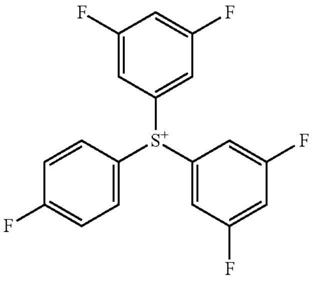
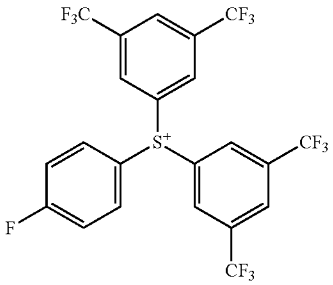
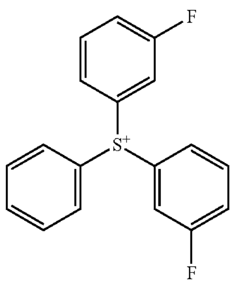
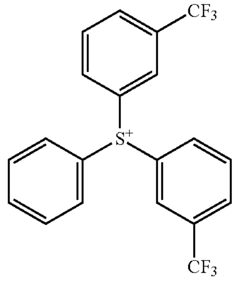
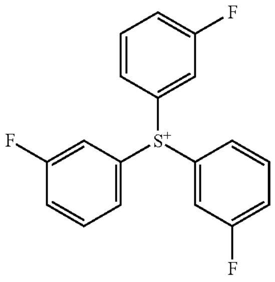
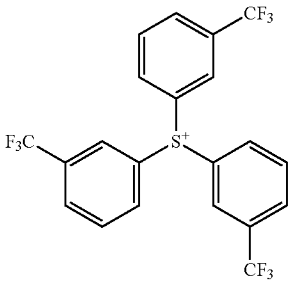
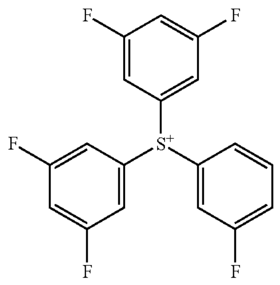

-continued
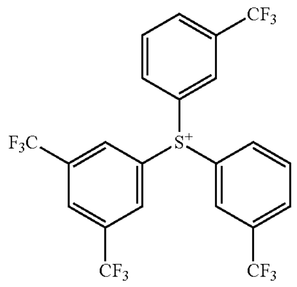
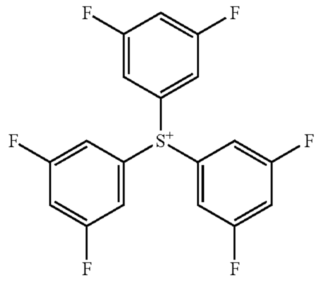
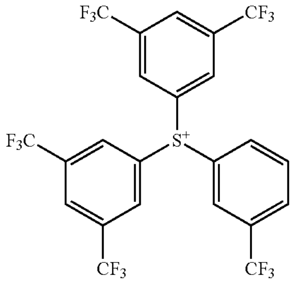
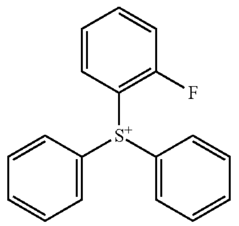
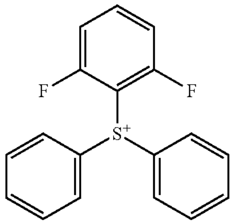
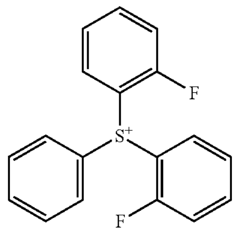
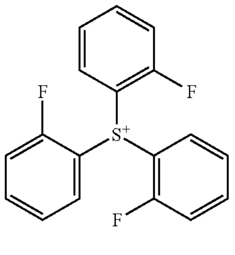
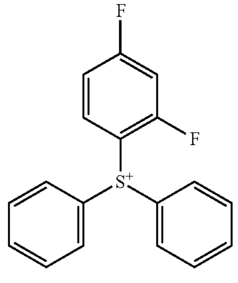
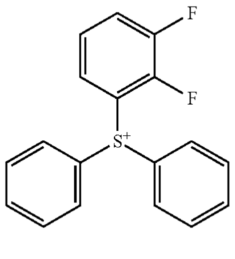
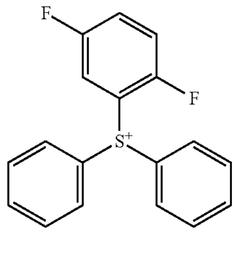
-continued
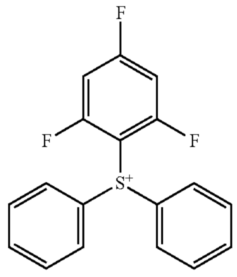
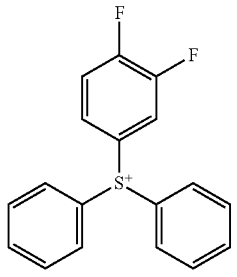
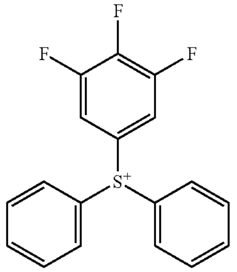
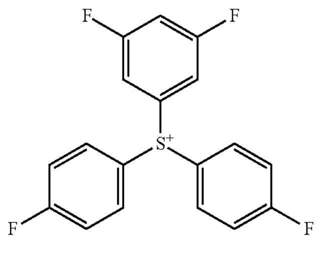
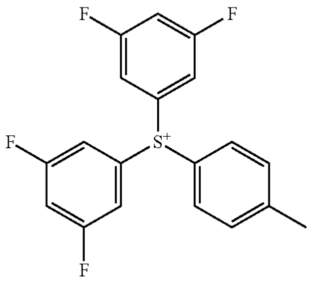
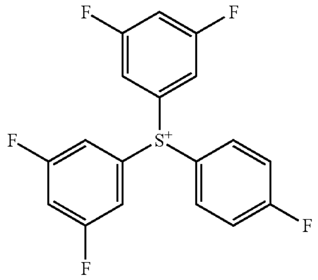
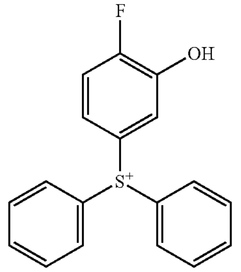
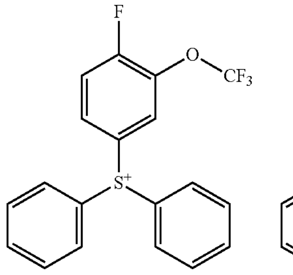
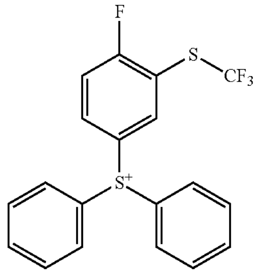

-continued
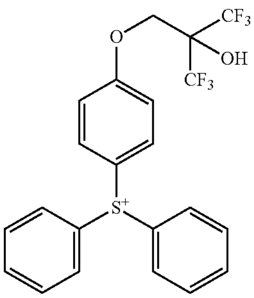
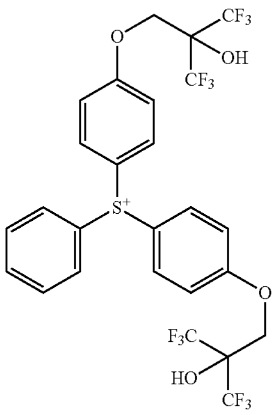
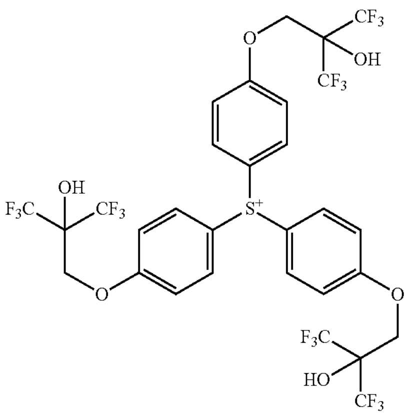
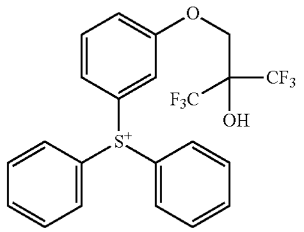
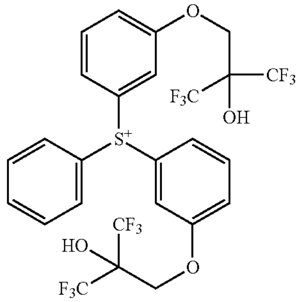
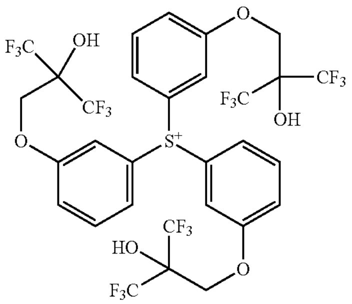
-continued
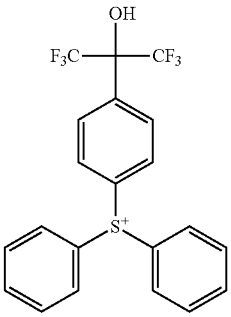
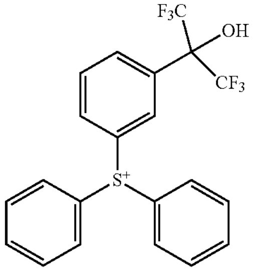
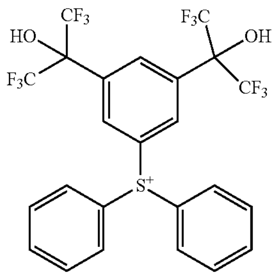
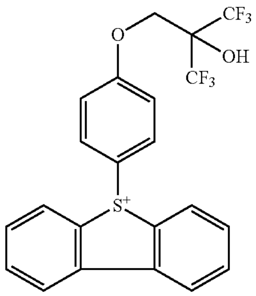
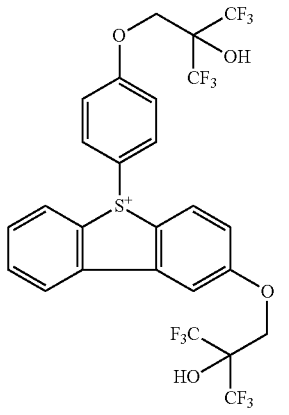
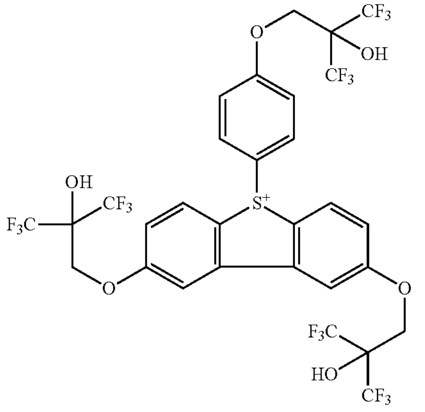
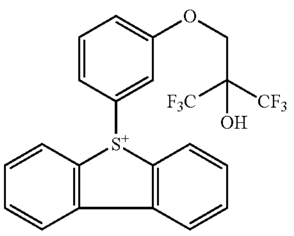

-continued
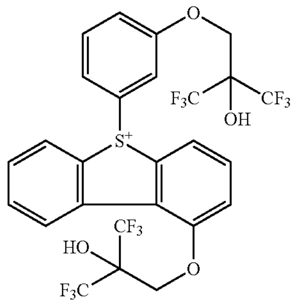
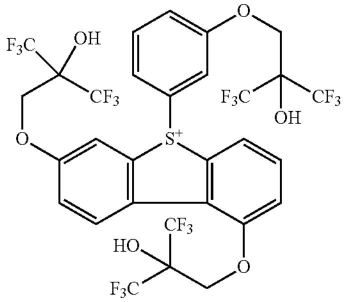
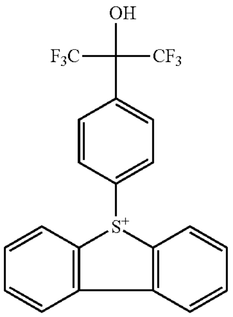
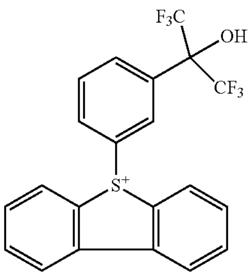
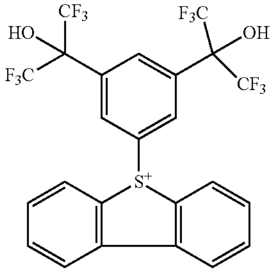
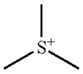
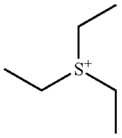
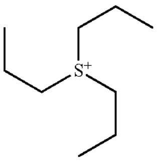
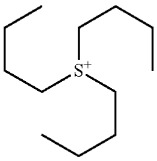
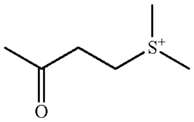
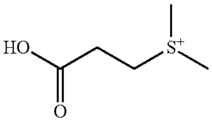
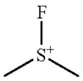
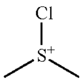
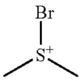
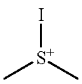
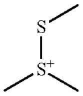
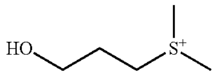
-continued
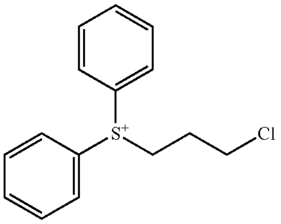
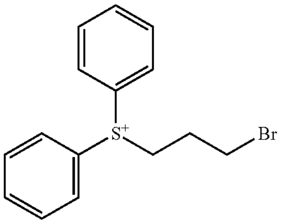
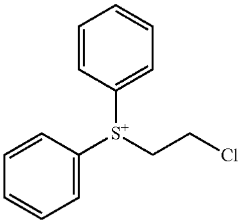
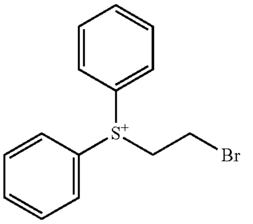
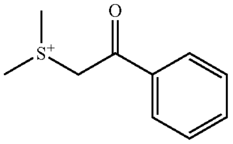
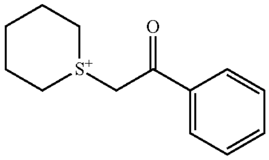
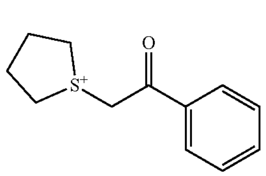
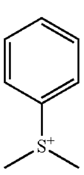
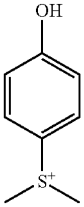
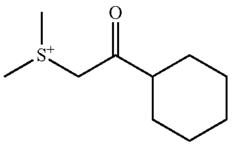
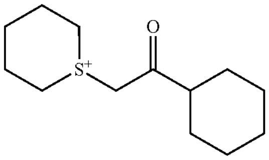
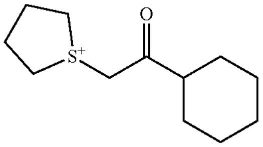
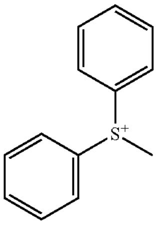
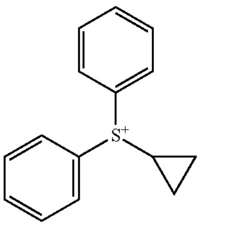
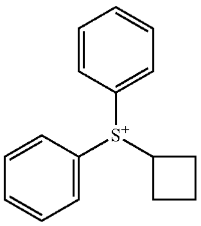

-continued

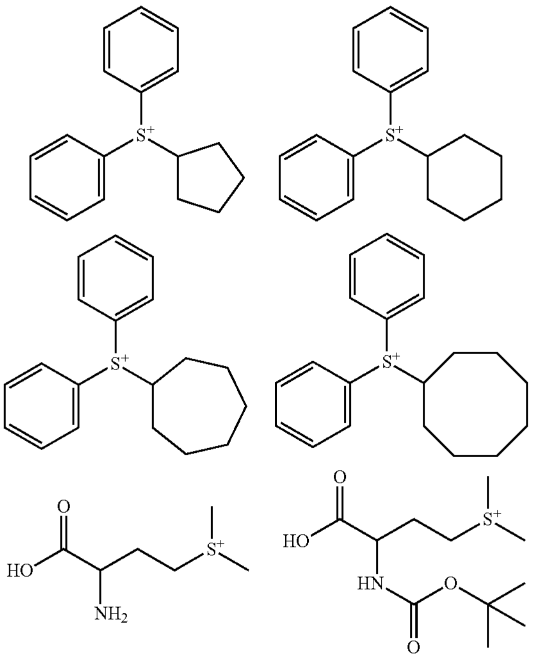

In formula (3), $Xa^-$ is an anion of the following formula (3A), (3B), (3C) or (3D).

(3A)

$R^{fa}$—$CF_2$—$SO_3^-$ (3B)

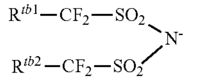

(3C)

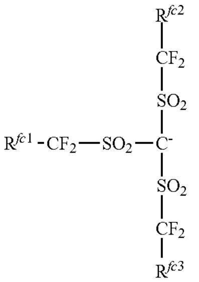

(3D)

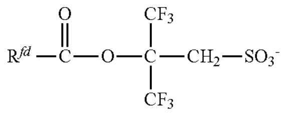

In formula (3A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof are as will be exemplified later for hydrocarbyl group $R^{111}$ in formula (3A').

Of the anions of formula (3A), a structure having the formula (3A') is preferred.

(3A')

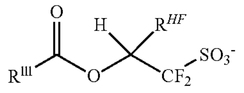

In formula (3A'), $R^{HF}$ is hydrogen or trifluoromethyl, preferably trifluoromethyl.

$R^{111}$ is a $C_1$-$C_{38}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation. The hydrocarbyl group $R^{111}$ may be saturated or unsaturated and straight, branched or cyclic. Suitable hydrocarbyl groups include $C_1$-$C_{38}$ alkyl groups such as methyl, ethyl, n-propyl, isopropyl, n-butyl, isobutyl, sec-butyl, tert-butyl, pentyl, neopentyl, hexyl, heptyl, 2-ethylhexyl, nonyl, undecyl, tridecyl, pentadecyl, heptadecyl, icosanyl; $C_3$-$C_{38}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; $C_2$-$C_{38}$ unsaturated aliphatic hydrocarbyl groups such as allyl and 3-cyclohexenyl; $C_6$-$C_{38}$ aryl groups such as phenyl, 1-naphthyl, 2-naphthyl; $C_2$-$C_{38}$ aralkyl groups such as benzyl and diphenylmethyl; and combinations thereof.

In the hydrocarbyl group, some or all of the hydrogen atoms may be substituted by a moiety containing a heteroatom such as oxygen, sulfur, nitrogen or halogen, or some —$CH_2$— may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(═O)—O—C(═O)) or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt containing an anion of formula (3A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (3A) are shown below, but not limited thereto.

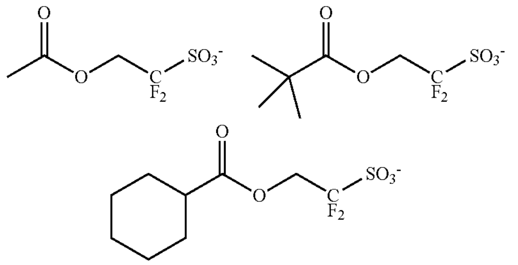

-continued
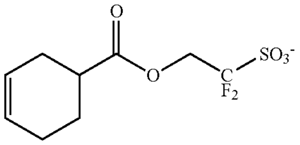
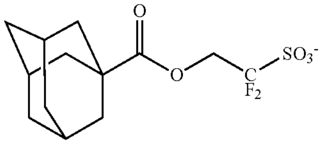
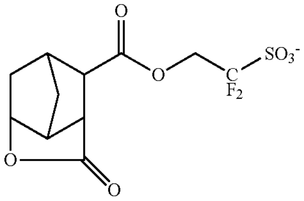
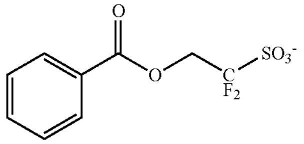
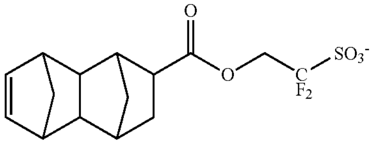
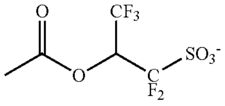
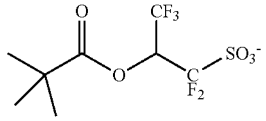
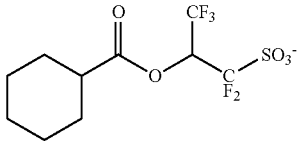
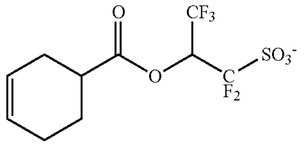
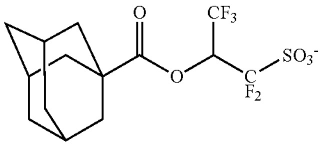
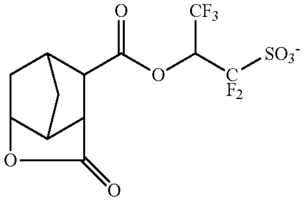
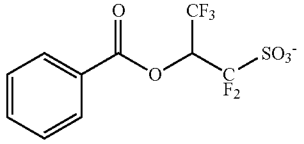
-continued
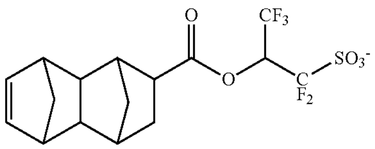
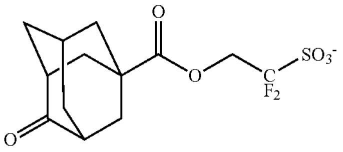
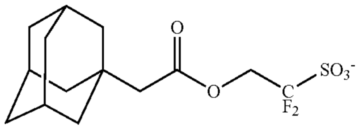
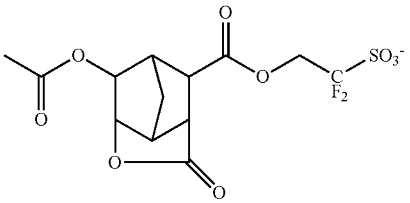
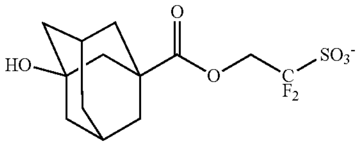
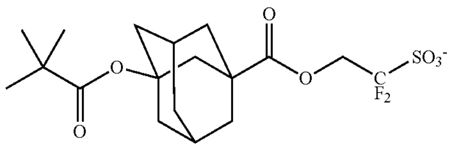
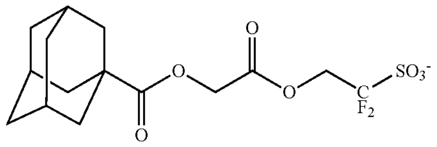
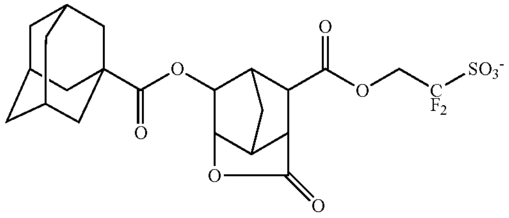
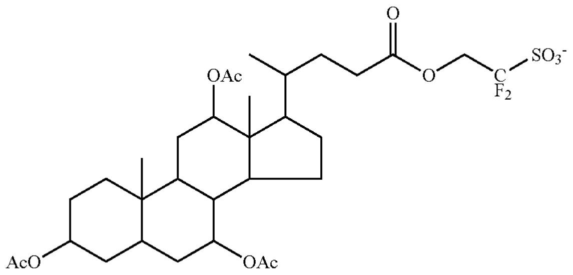

-continued

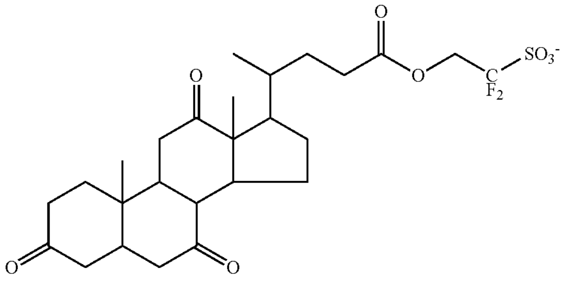

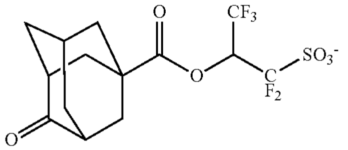

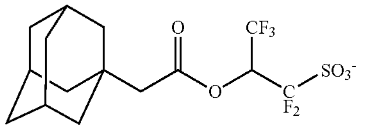

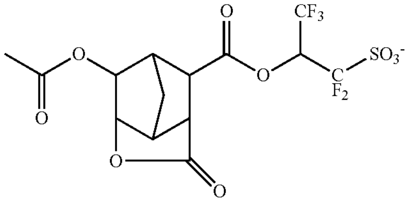

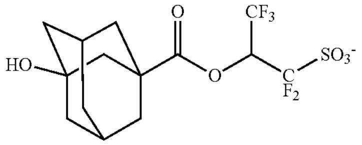

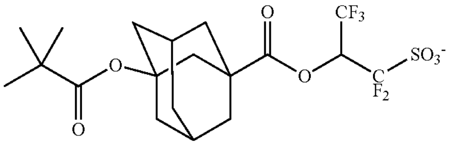

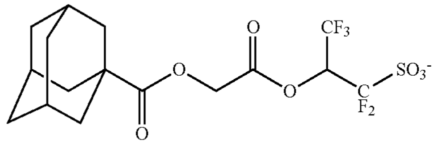

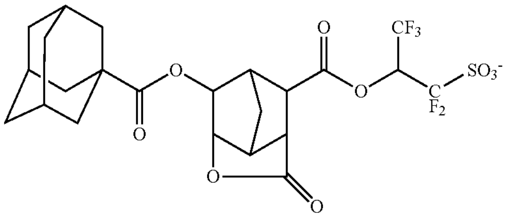

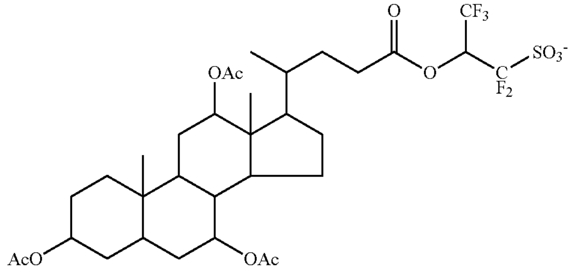

-continued

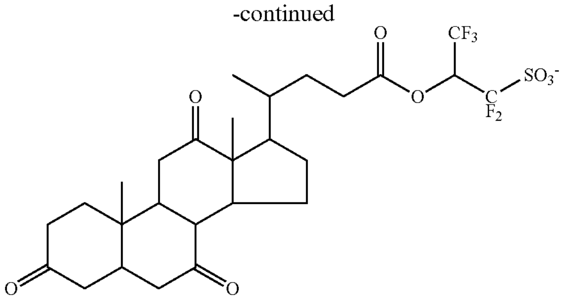

In formula (3B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (3A'). Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage ($—CF_2—SO_2—N^-—SO_2—CF_2—$) to which they are attached, and the ring-forming pair is preferably a fluorinated ethylene or fluorinated propylene group.

In formula (3C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (3A'). Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage ($—CF_2—SO_2—C^-—SO_2—CF_2—$) to which they are attached, and the ring-forming pair is preferably a fluorinated ethylene or fluorinated propylene group.

In formula (3D), $R^{fd}$ is a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$.

With respect to the synthesis of the sulfonium salt having an anion of formula (3D), reference is made to JP-A 2010-215608 and JP-A 2014-133723.

Examples of the anion having formula (3D) are shown below, but not limited thereto.

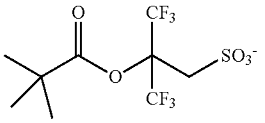

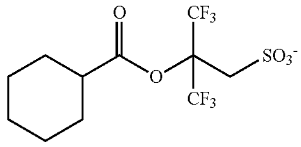

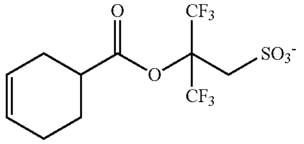

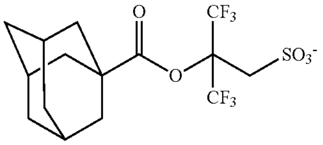

-continued

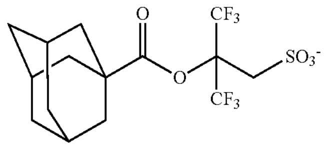

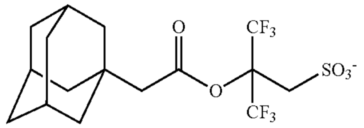

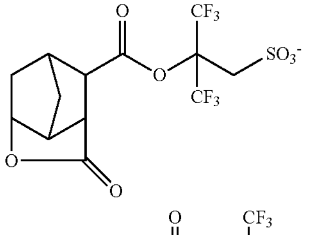

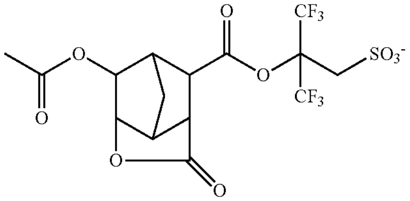

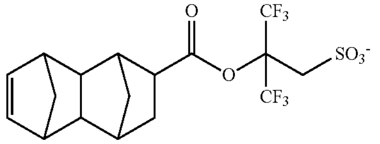

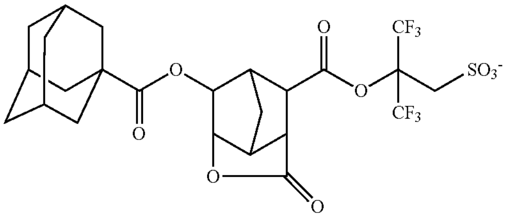

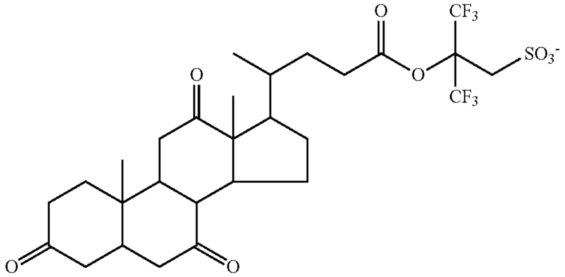

The compound having the anion of formula (3D) has a sufficient acid strength to cleave acid labile groups in the base polymer because it is free of fluorine at α-position of sulfo group, but has two trifluoromethyl groups at β-position. Thus the compound is a useful PAG.

Also compounds having the formula (4) are useful as the PAG.

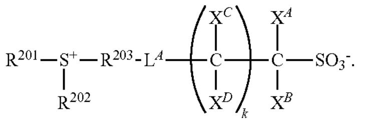

(4)

In formula (4), $R^{201}$ and $R^{202}$ are each independently halogen or a $C_1$-$C_{30}$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to form a ring with the sulfur atom to which they are attached. Exemplary rings are the same as described above for the ring that $R^{101}$ and $R^{102}$ in formula with the sulfur atom to which they are attached.

The hydrocarbyl groups $R^{201}$ and $R^{202}$ may be saturated or unsaturated and straight, branched or cyclic. Examples thereof include $C_1$-$C_{30}$ alkyl groups such as methyl, ethyl, n-propyl, isopropyl, n-butyl, isobutyl, sec-butyl, tert-butyl, n-pentyl, tert-pentyl, n-hexyl, n-octyl, 2-ethylhexyl, n-nonyl, and n-decyl; $C_3$-$C_{30}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.$0^{2,6}$]decanyl, and adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and anthracenyl; and combinations thereof. In the hydrocarbyl group, some or all of the hydrogen atoms may be substituted by a moiety containing a heteroatom such as oxygen, sulfur, nitrogen or halogen, or some —$CH_2$— may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(O)—O—C(=O)—) or haloalkyl moiety.

The hydrocarbylene group $R^{203}$ may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; $C_3$-$C_{30}$ cyclic saturated hydrocarbylene groups such as cyclopentanediyl, cyclohexanediyl, norbornanediyl and adamantanediyl; $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene and tert-butylnaphthylene; and combinations thereof. In the hydrocarbylene group, some or all of the hydrogen atoms may be substituted by a moiety containing a heteroatom such as oxygen, sulfur, nitrogen or halogen, or some —$CH_2$— may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(=O)—O—C(=O)—) or haloalkyl moiety. Of the heteroatoms, oxygen is preferred.

In formula (4), $L^A$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for $R^{203}$.

In formula (4), $X^A$, $X^B$, $X^C$ and $X^D$ are each independently hydrogen, fluorine or trifluoromethyl, with the proviso that at least one of $X^A$, $X^B$, $X^C$ and $X^B$ is fluorine or trifluoromethyl.

In formula (4), k is an integer of 0 to 3.

Of the PAGs having formula (4), those having formula (4') are preferred.

(4')

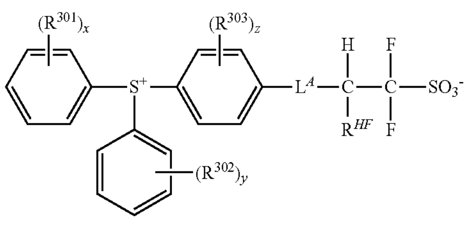

In formula (4'), $L^A$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for $R^{111}$ in formula (3A'). The subscripts x and y are each independently an integer of 0 to 5, and z is an integer of 0 to 4.

Examples of the PAG having formula (4) are as exemplified for the PAG having formula (2) in JP-A 2017-026980.

Of the foregoing PAGs, those having an anion of formula (3A') or (3D) are especially preferred because of reduced acid diffusion and high solubility in the solvent. Also those having formula (4') are especially preferred because of extremely reduced acid diffusion.

Also sulfonium and iodonium salts having an anion containing an iodized or brominated aromatic ring are useful PAGs. These salts typically have the formulae (5-1) and (5-2).

(5-1)

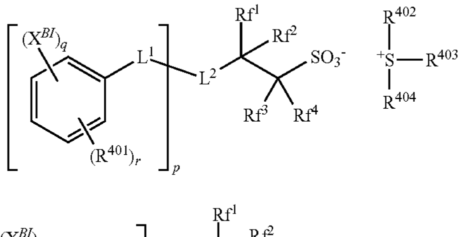

(5-2)

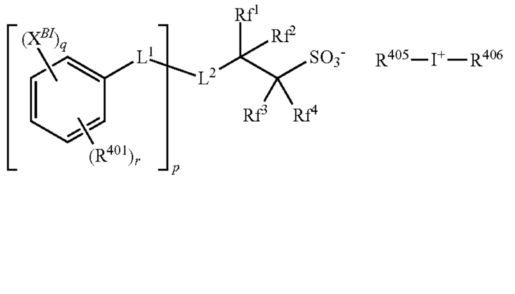

In formulae (5-1) and (5-2), p is an integer of 1 to 3; q is an integer of 1 to 5, and r is an integer of 0 to 3, meeting $1 \le q+r \le 5$. Preferably, q is 1, 2 or 3, more preferably 2 or 3, and r is 0, 1 or 2.

In formulae (5-1) and (5-2), $X^{BI}$ is iodine or bromine, and groups $X^{BI}$ may be identical or different when p and/or q is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group in case of p=1, and a $C_1$-$C_{20}$ (p+1)-valent linking group in case of p=2 or 3. The linking group may contain oxygen, sulfur or nitrogen.

$R^{401}$ is hydroxy, carboxy, fluorine, chlorine, bromine, amino or a $C_1$-$C_{20}$ hydrocarbyl group, $C_1$-$C_{20}$ hydrocarbyloxy group, $C_2$-$C_{20}$ hydrocarbylcarbonyl, $C_2$-$C_{20}$ hydrocarbyloxycarbonyl group, $C_2$-$C_{20}$ hydrocarbylcarbonyloxy or $C_1$-$C_{20}$ hydrocarbylsulfonyloxy group, which may contain fluorine, chlorine, bromine, hydroxy, amino or ether bond, or —N($R^{401A}$)($R^{401B}$), —N($R^{401C}$—C(=O)—$R^{401D}$ or —N($R^{401C}$)—C(=)—O—$R^{401D}$. $R^{401A}$ and $R^{401B}$ are each independently hydrogen or a $C_1$-$C_6$ saturated hydrocarbyl group. $R^{401C}$ is hydrogen or a $C_1$-$C_6$ saturated hydrocarbyl group which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{401D}$ is a $C_1$-$C_{16}$ aliphatic hydrocarbyl group, $C_6$-$C_{14}$ aryl group or $C_7$-$C_{15}$ aralkyl group, which may contain halogen, hydroxy, a $C_1$-$C_6$ saturated hydrocarbyloxy, $C_2$-$C_6$ saturated hydrocarbylcarbonyl, or $C_2$-$C_6$ saturated hydrocarbylcarbonyloxy moiety. The aliphatic hydrocarbyl group may be saturated or unsaturated and straight, branched or cyclic. The hydrocarbyl, hydrocarbyloxy, hydrocarbylcarbonyl, hydrocarbyloxycarbonyl, hydrocarbylcarbonyloxy, and hydrocarbylsulfonyloxy groups may be straight, branched or cyclic. Groups $R^{401}$ may be identical or different when p and/or r is 2 or more.

Inter alia, $R^{401D}$ is preferably selected from hydroxy, —N($R^{401C}$)—C(=O)—$R^{401D}$, —N($R^{401C}$)—C(=O)—O—$R^{401D}$, fluorine, chlorine, bromine, methyl, and methoxy.

In formulae (5-1) and (5-2), $R^{f1}$ to $R^{f4}$ are each independently hydrogen, fluorine or trifluoromethyl, at least one thereof being fluorine or trifluoromethyl. Also $R^{f1}$ and $R^{f2}$, taken together, may form a carbonyl group. Most preferably both $R^{f3}$ and $R^{f4}$ are fluorine.

In formulae (5-1) and (5-2), $R^{402}$ to $R^{406}$ are each independently halogen or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^{101}$ to $R^{103}$ in formula (3). In the hydrocarbyl group, some or all of the hydrogen atoms may be substituted by hydroxy, carboxy, halogen, cyano, nitro, mercapto, sultone, sulfo, or sulfonium salt-containing moiety; or some —$CH_2$— may be replaced by an ether bond, ester bond, carbonyl, amide bond, carbonate bond or sulfonic ester bond. A pair of $R^{402}$ and $R^{403}$ may bond together to form a ring with the sulfur atom to which they are attached. Examples of the ring are as exemplified above for the ring that $R^{101}$ and $R^{102}$ in formula (3), taken together, form with the sulfur atom to which they are attached.

The cation in the sulfonium salt having formula (5-1) is as exemplified above for the cation in the sulfonium salt having formula (3). Examples of the cation in the iodonium salt having formula (5-2) are shown below, but not limited thereto.
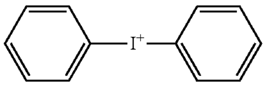
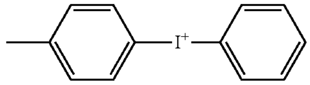
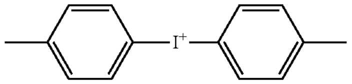
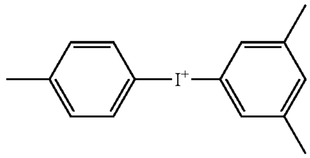
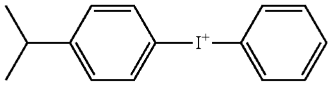
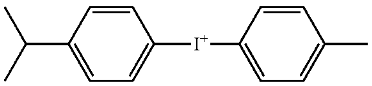
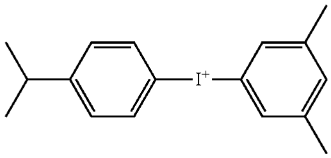
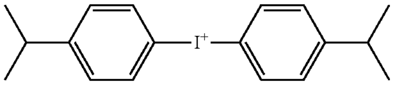
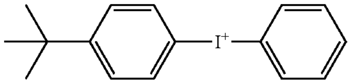
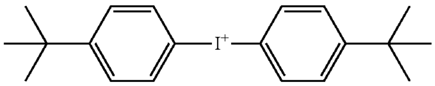
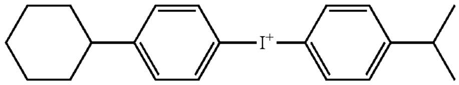
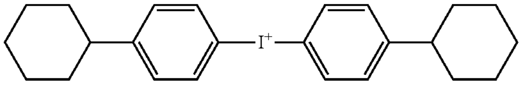
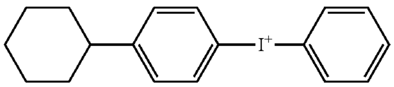
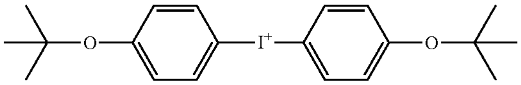
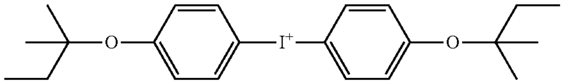
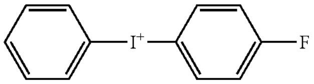
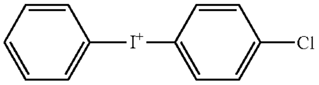
-continued
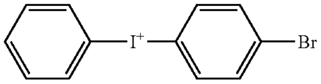
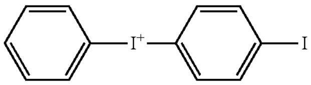
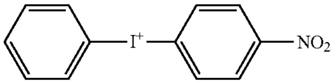
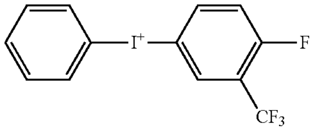
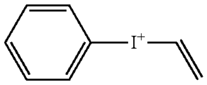
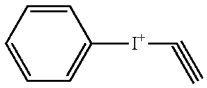
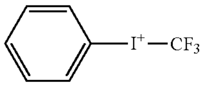
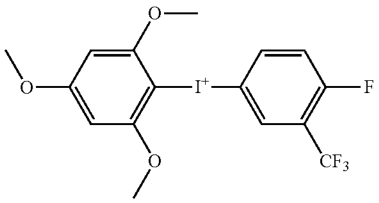
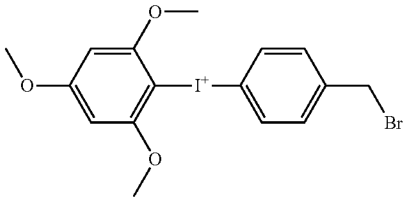
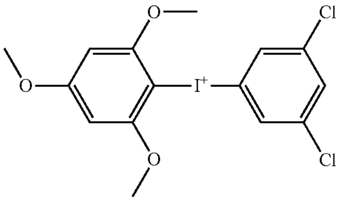
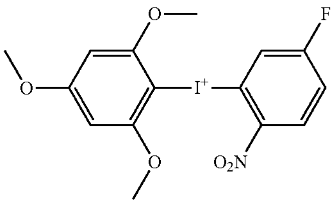
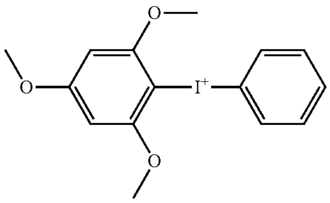
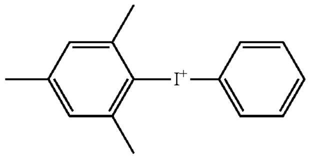

-continued
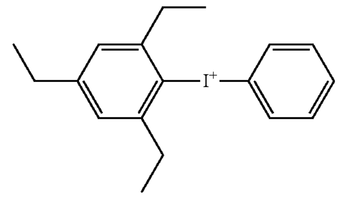
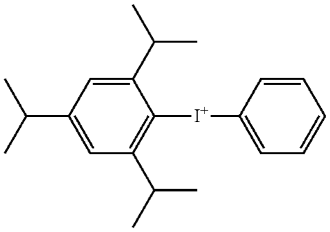
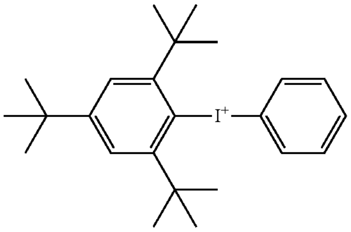
Examples of the anion in the onium salt having formula (5-1) or (5-2) are shown below, but not limited thereto. Herein $X^{BI}$ is as defined above.
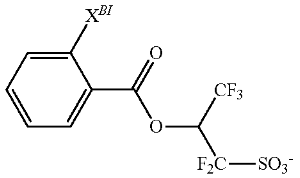
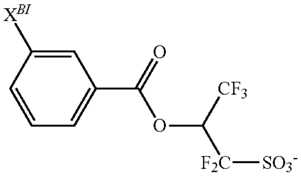
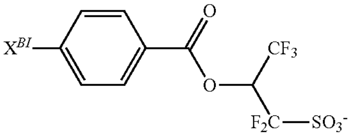
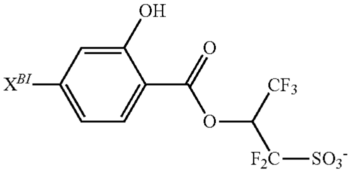
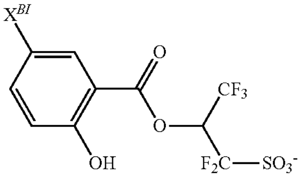
-continued
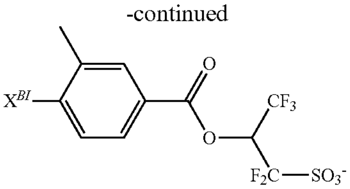
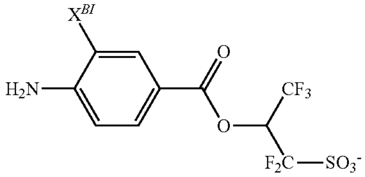
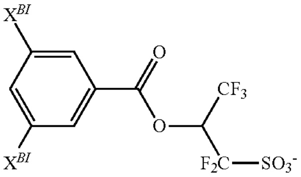
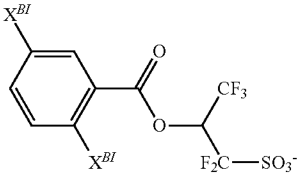
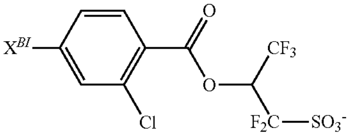
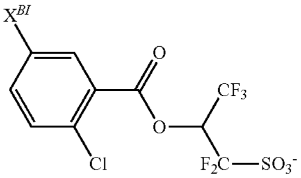
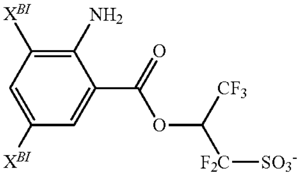
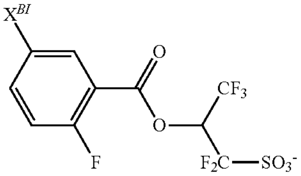
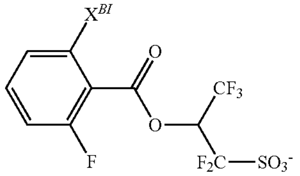
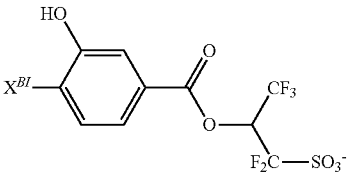

-continued
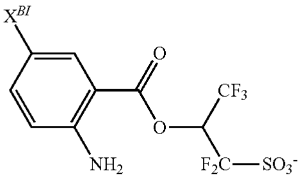
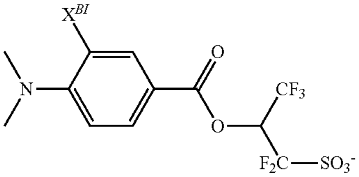
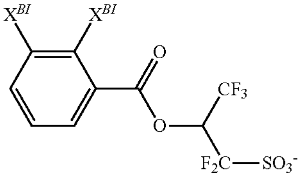
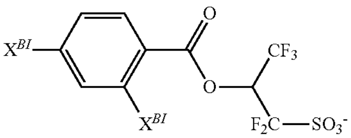
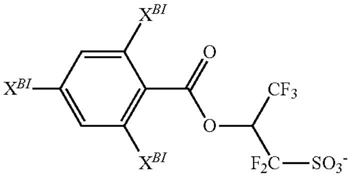
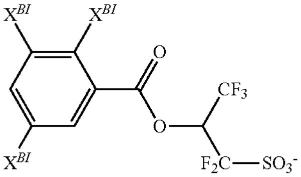
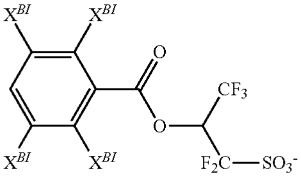
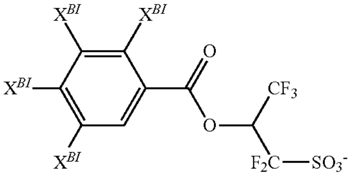
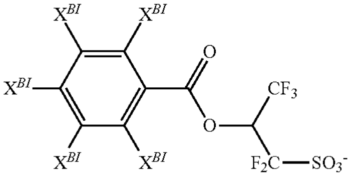
-continued
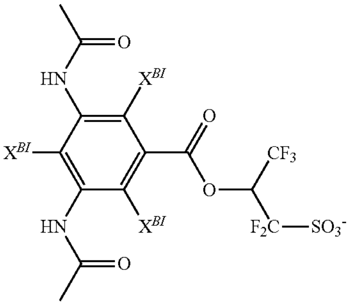
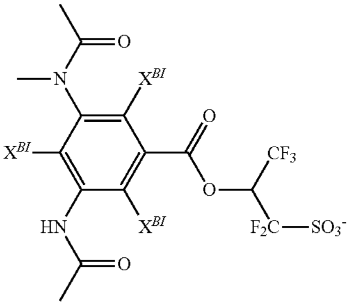
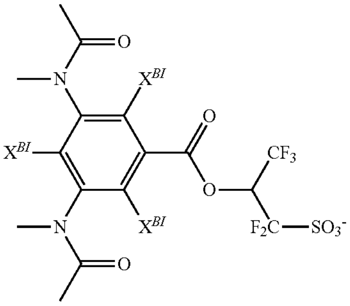
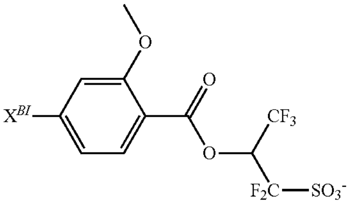
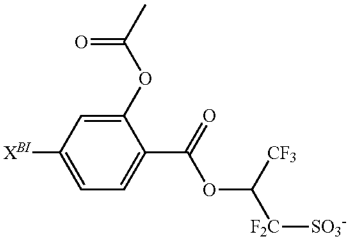
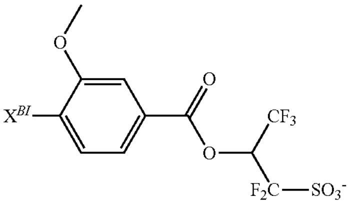

-continued
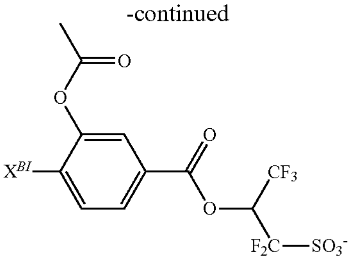
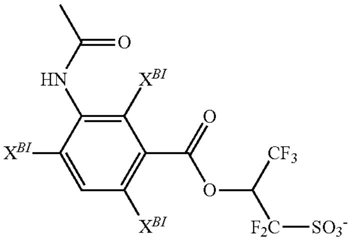
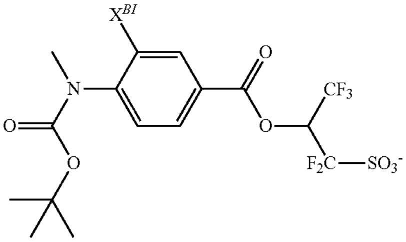
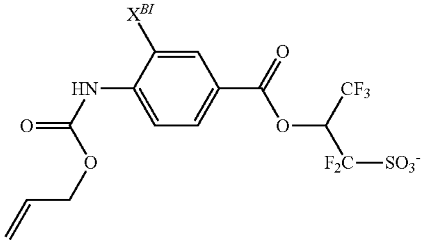
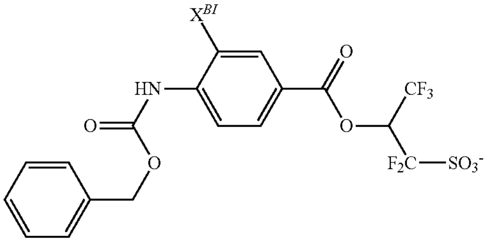
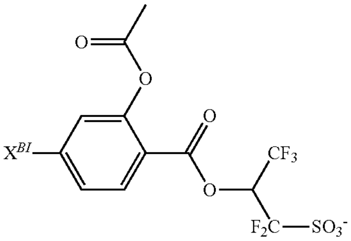
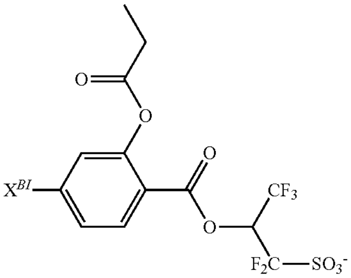
-continued
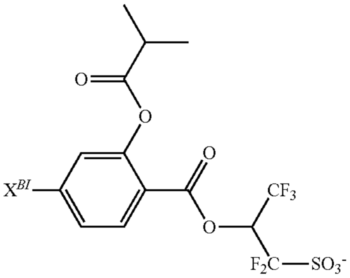
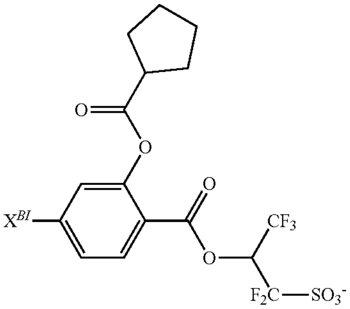
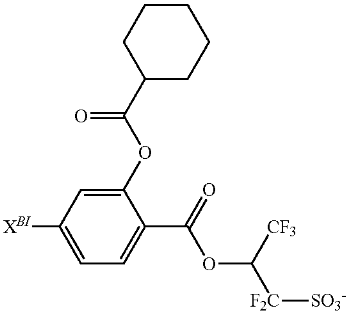
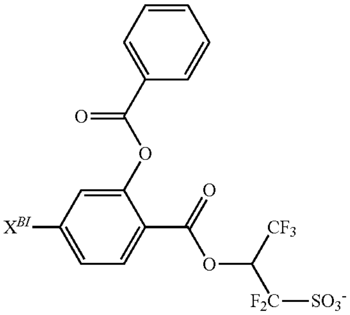
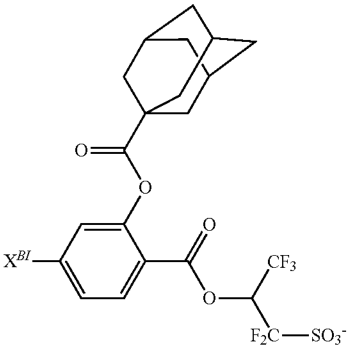

-continued
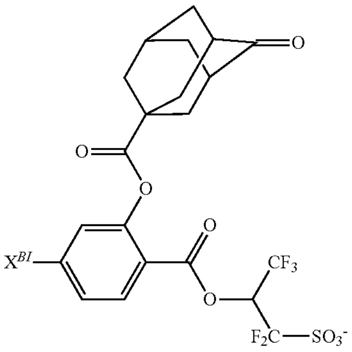
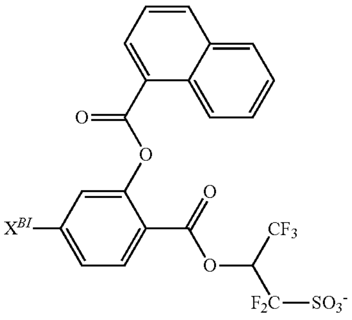
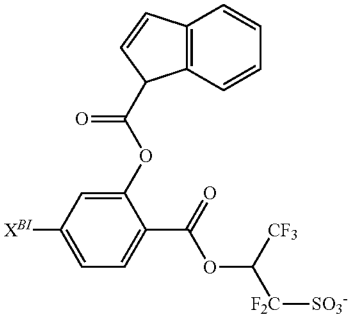
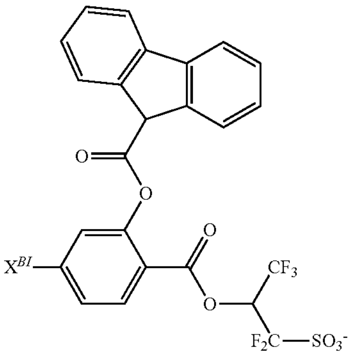
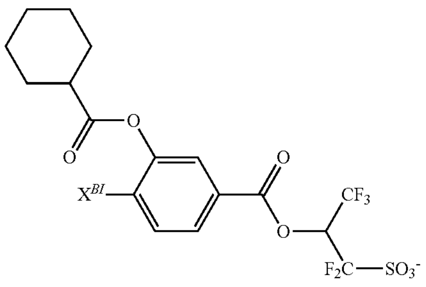
-continued
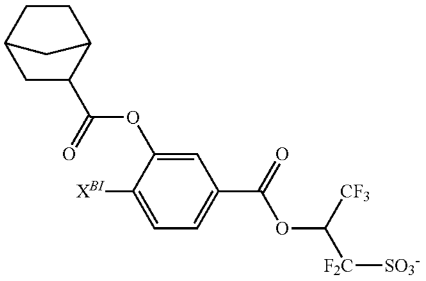
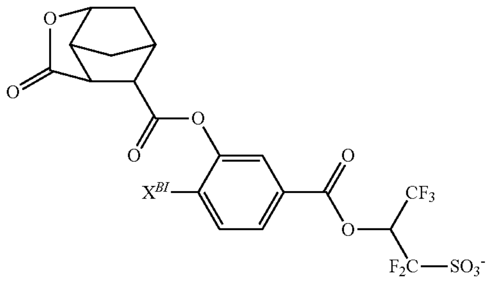
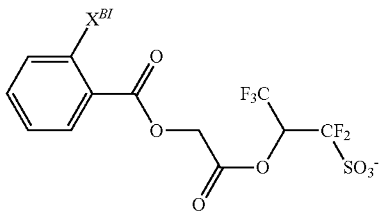
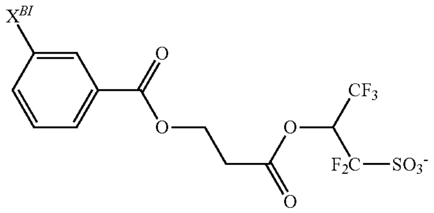
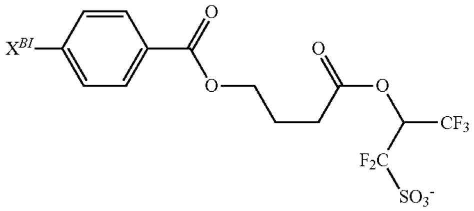
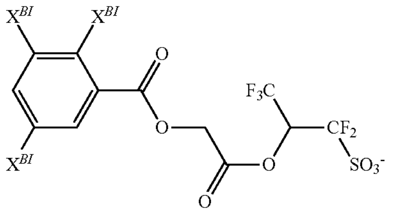
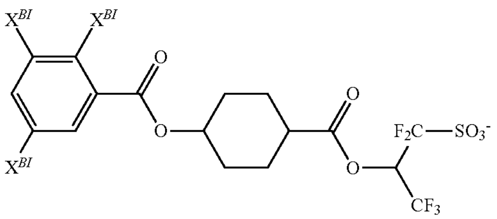

-continued
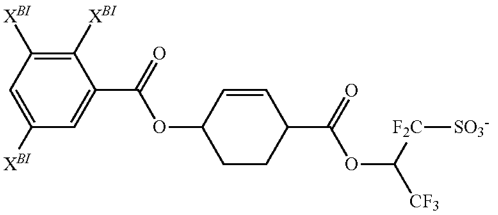
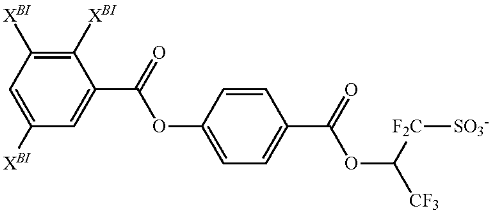
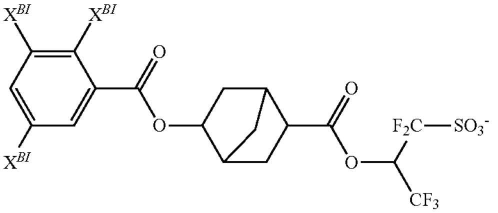
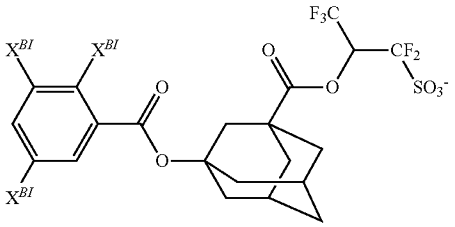
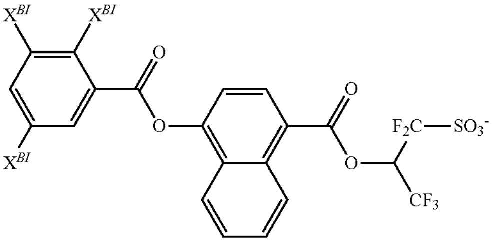
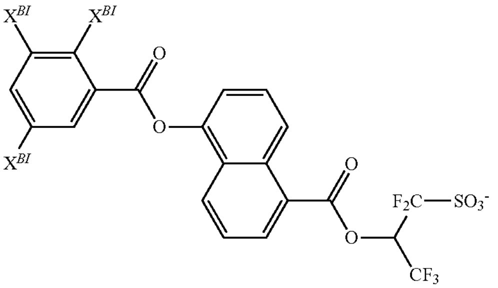
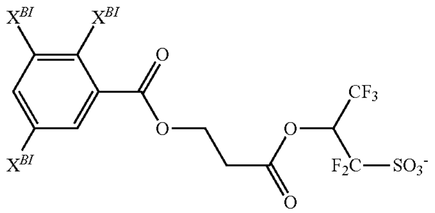
-continued
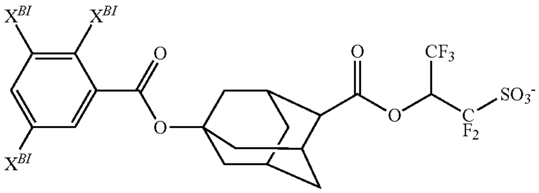
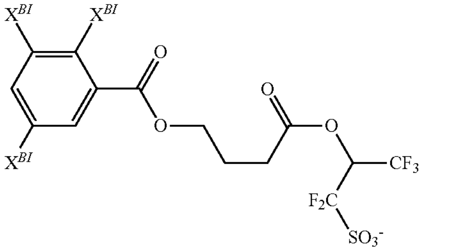
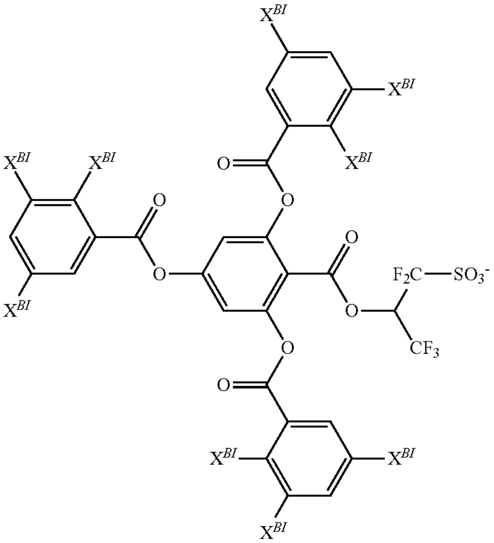
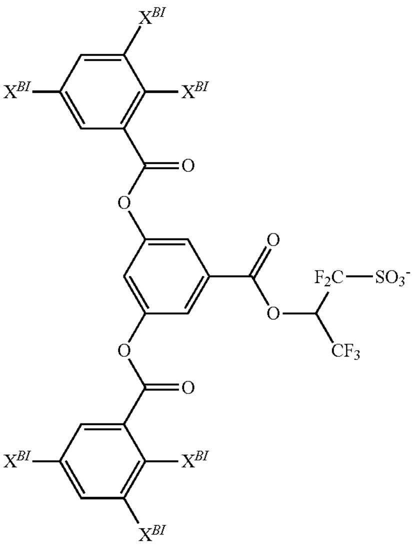

-continued
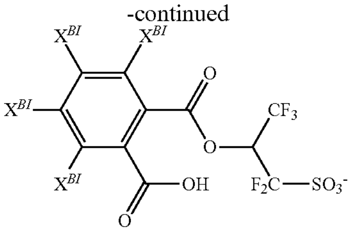
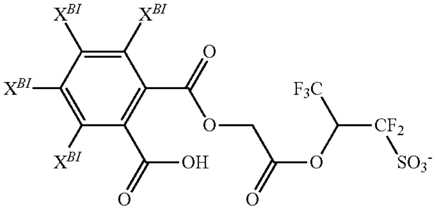
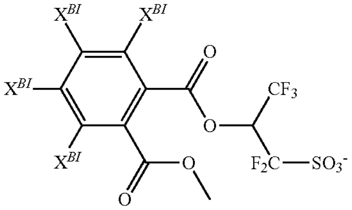
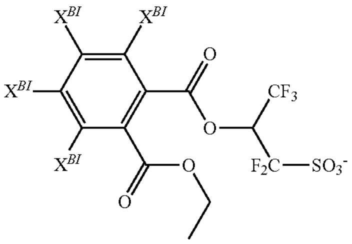
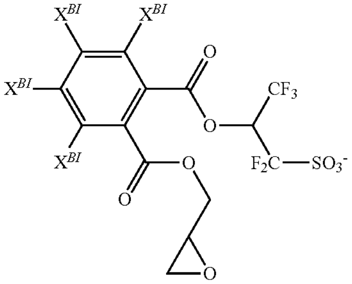
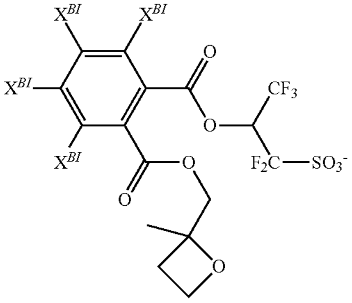
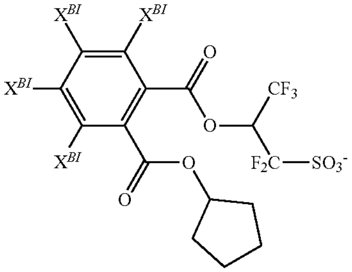
-continued
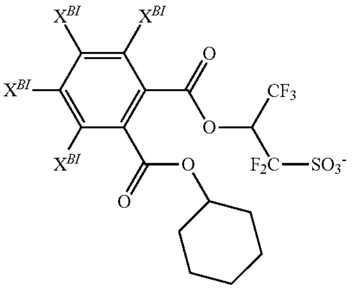
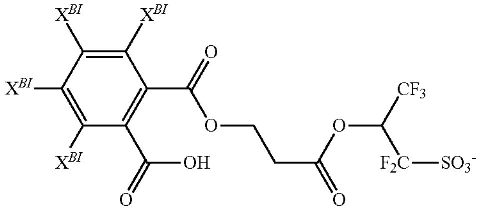
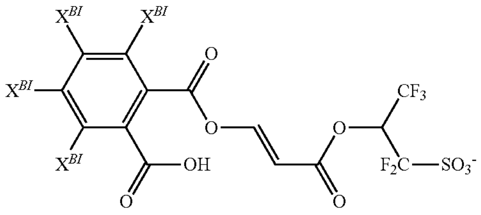
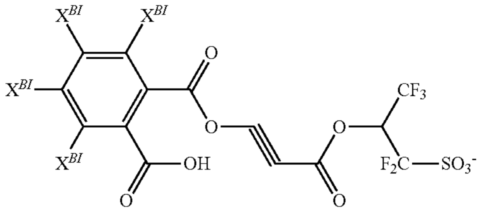
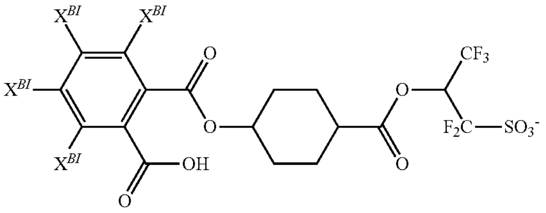
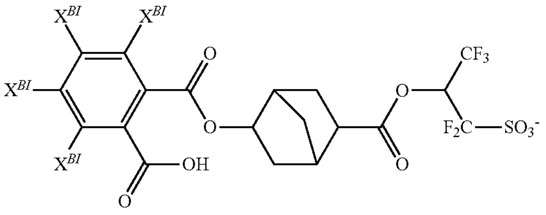
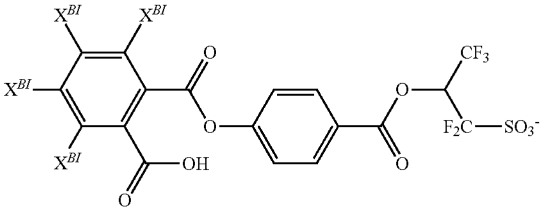

-continued
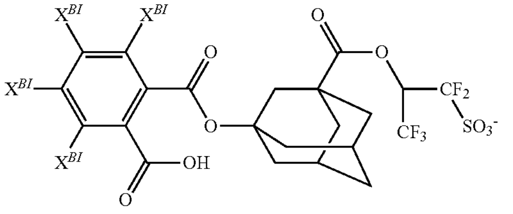
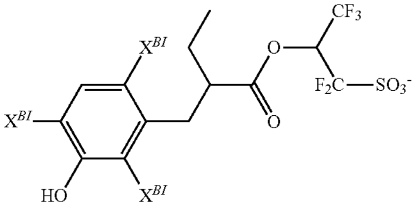
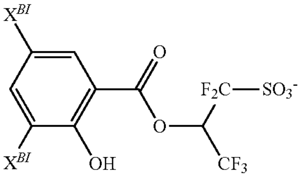
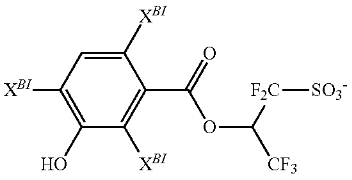
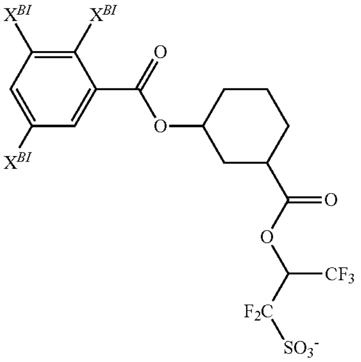
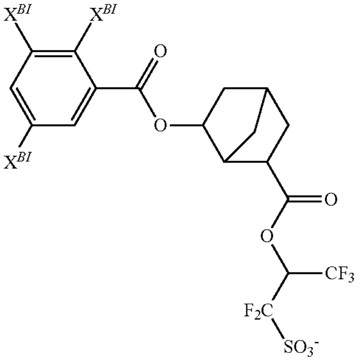
-continued
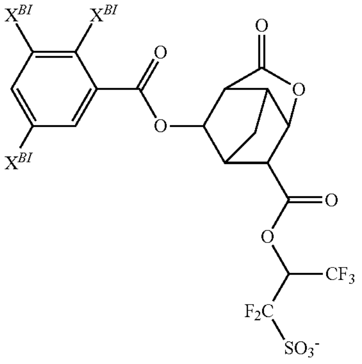
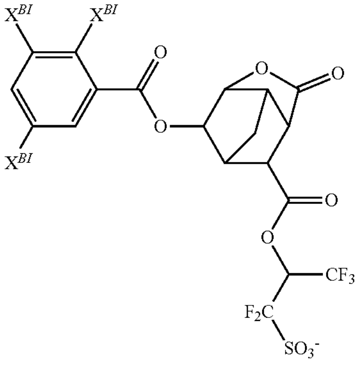
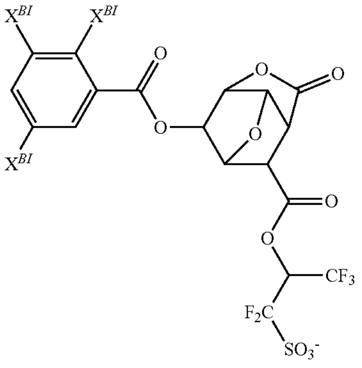
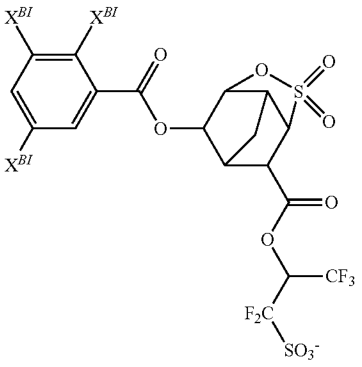

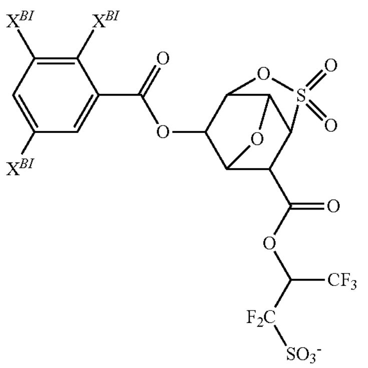
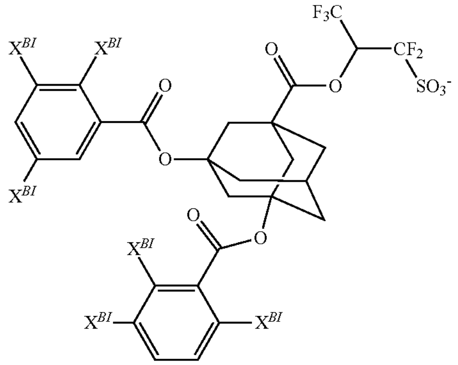
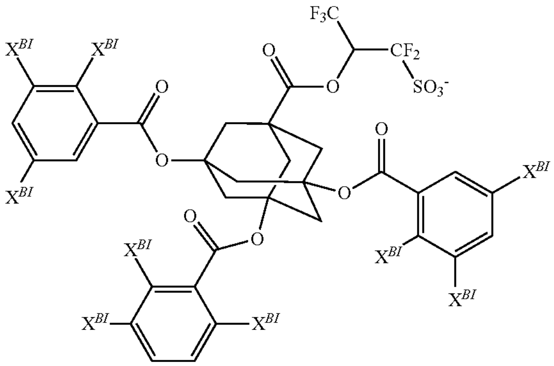
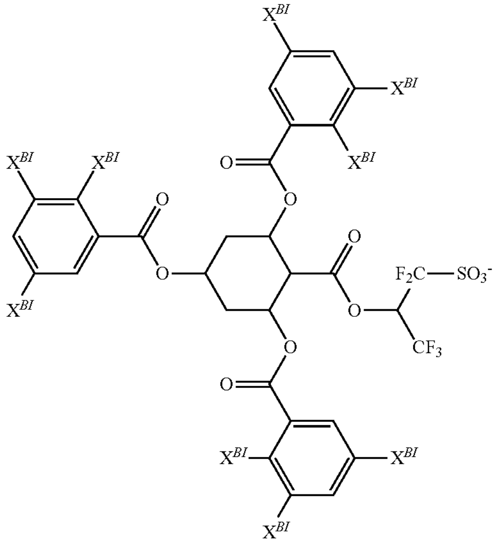
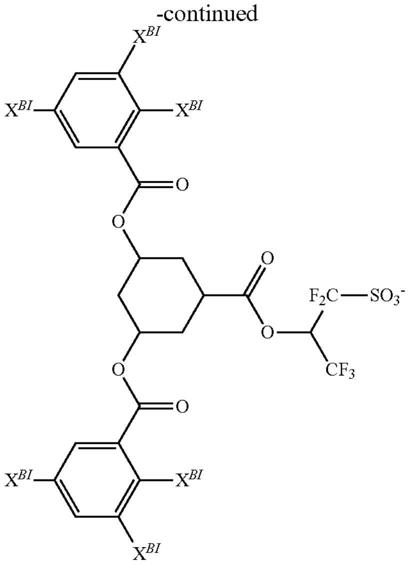
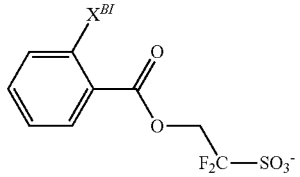
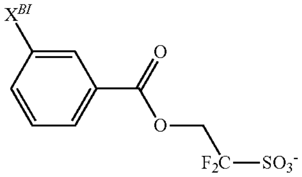
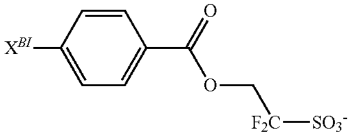
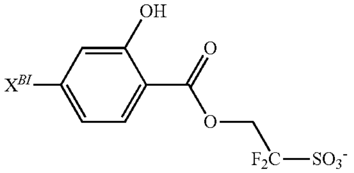
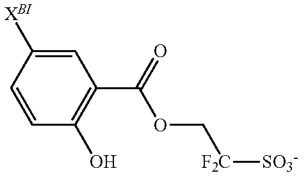
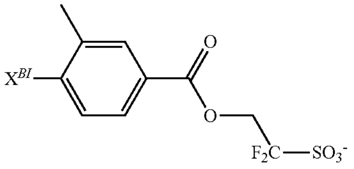
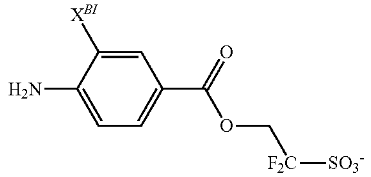

-continued
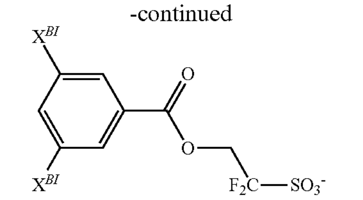
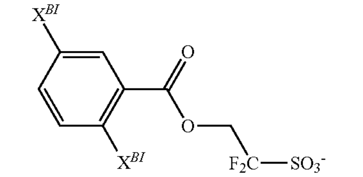
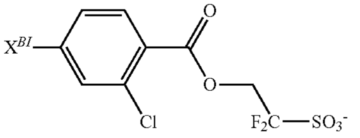
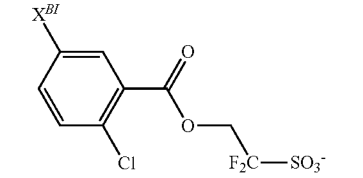
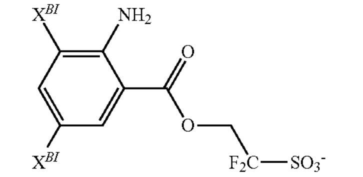
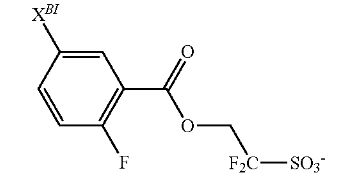
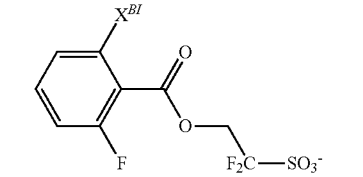
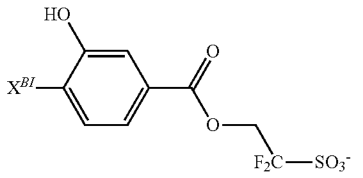
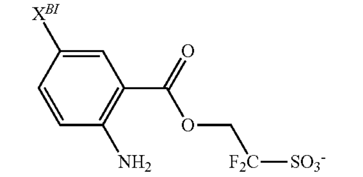
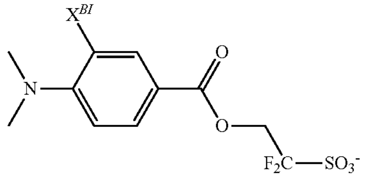
-continued
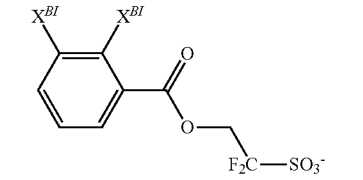
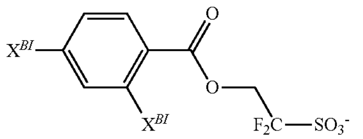
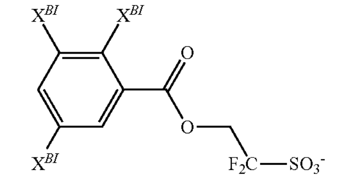
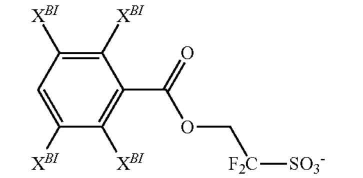
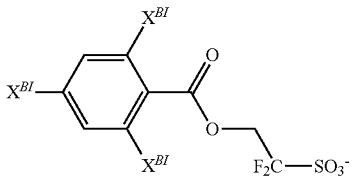
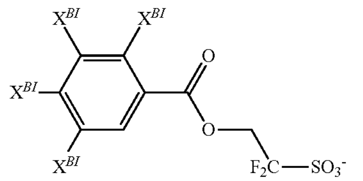
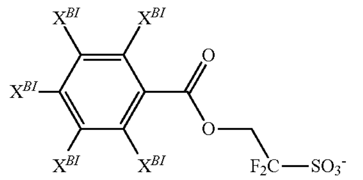
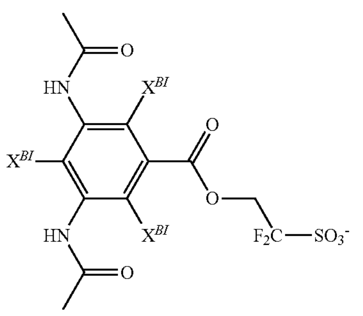

-continued
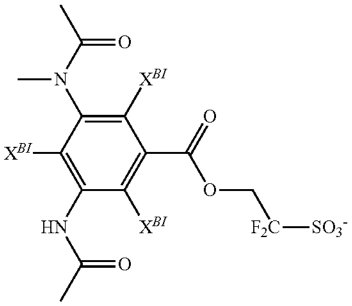
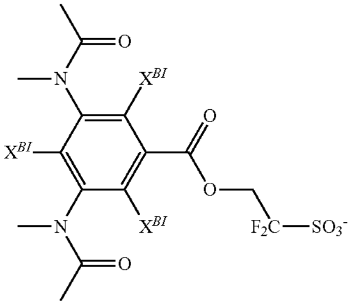
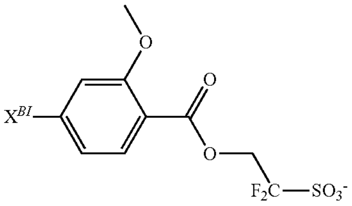
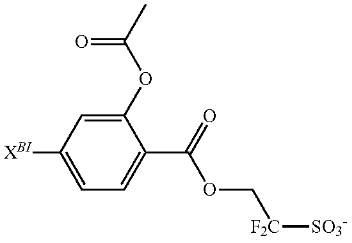
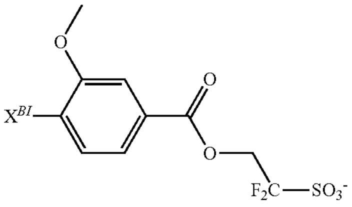
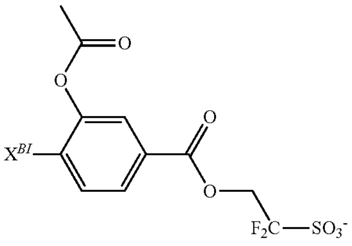
-continued
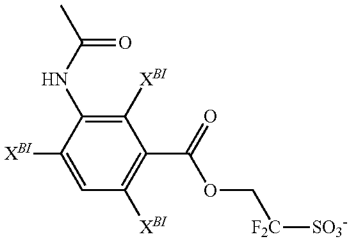
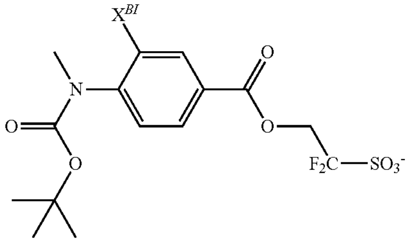
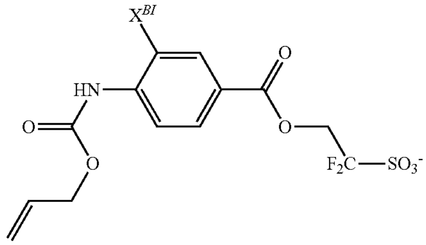
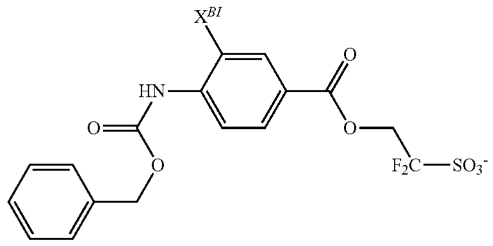
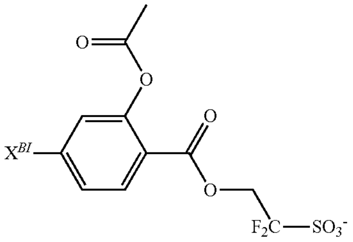
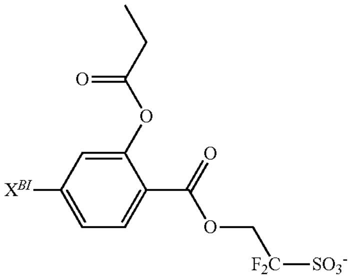

-continued
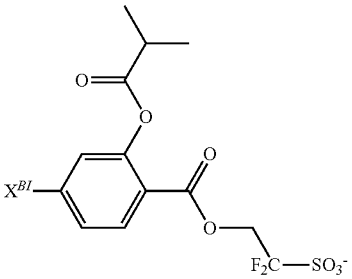
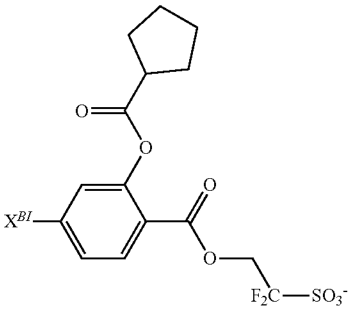
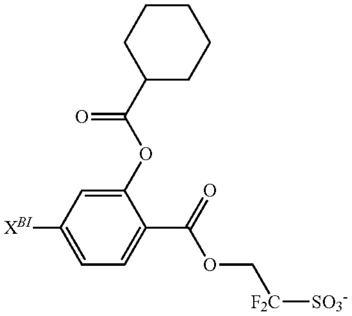
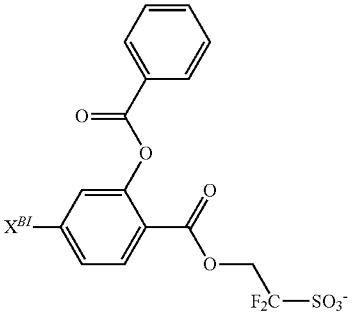
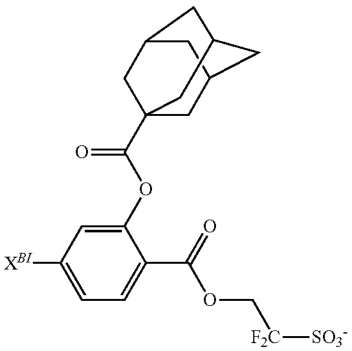
-continued
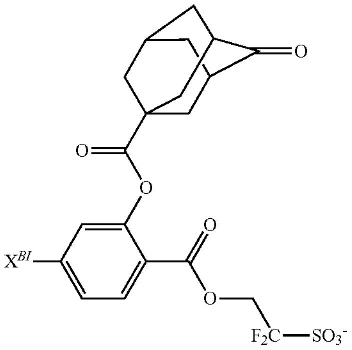
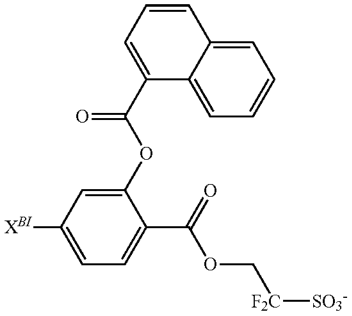
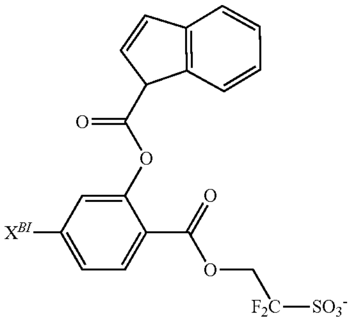
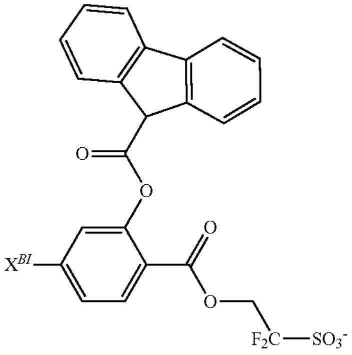
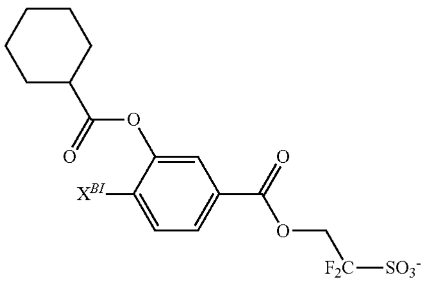

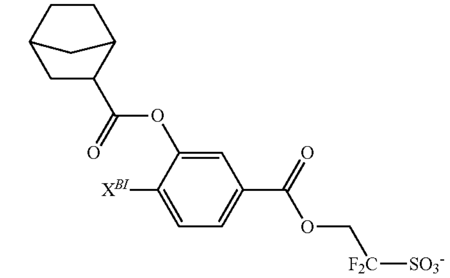
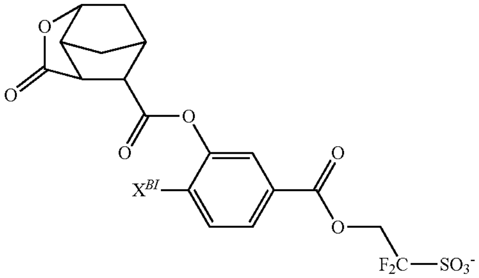
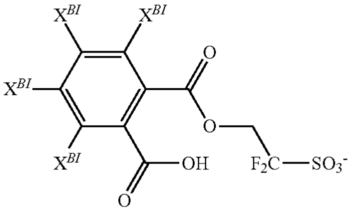
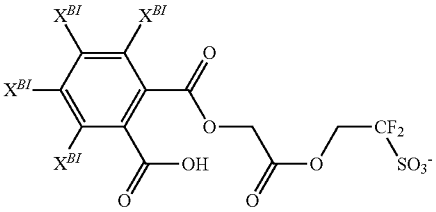
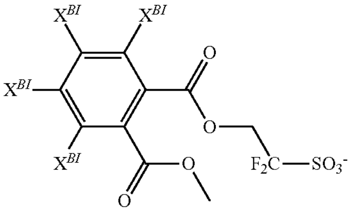
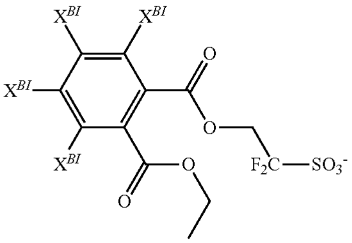
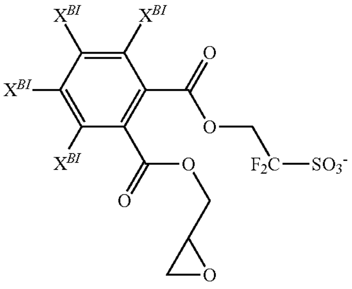
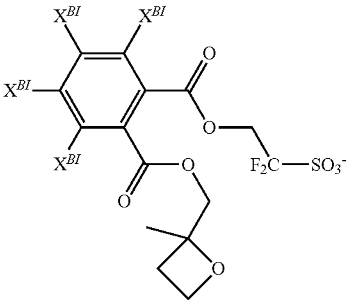
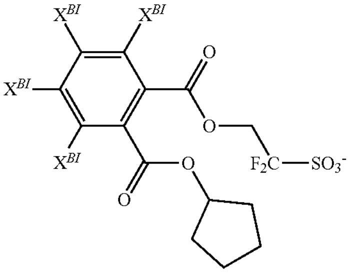
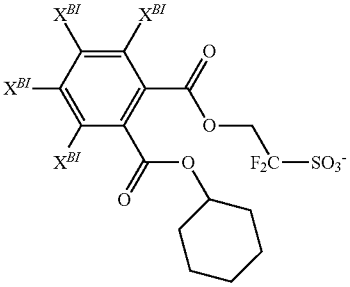
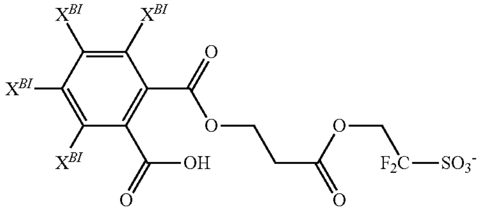
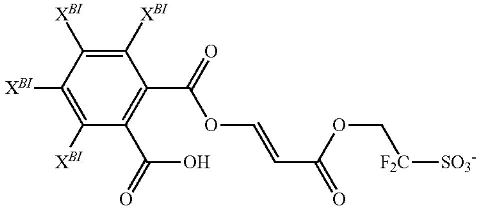
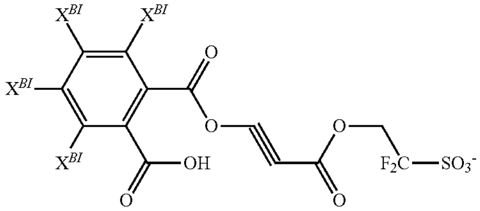
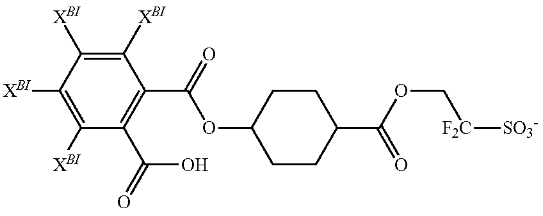

-continued
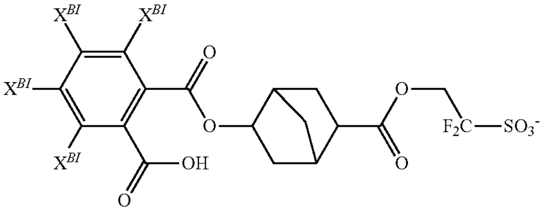
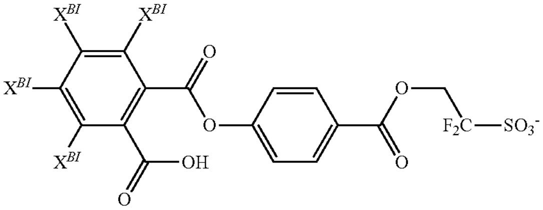
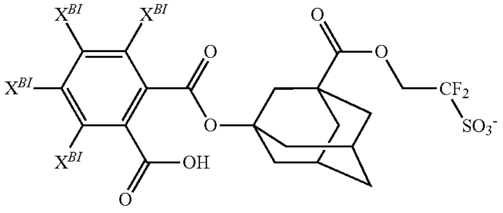
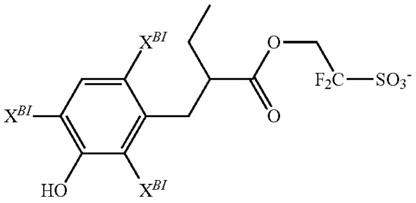
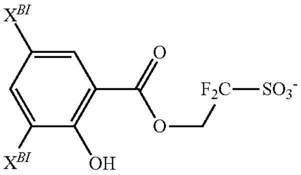
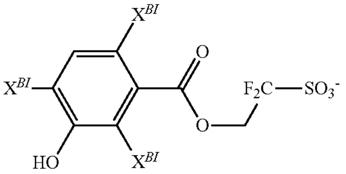
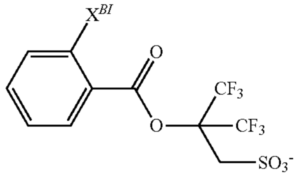
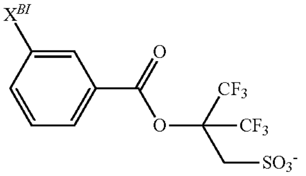
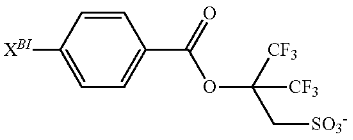
-continued
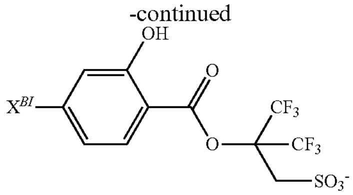
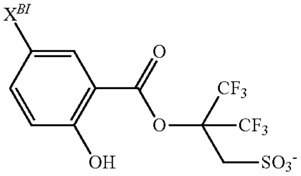
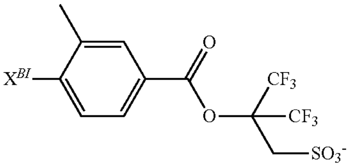
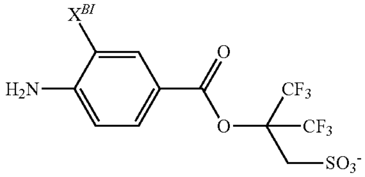
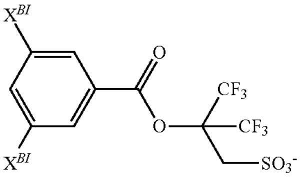
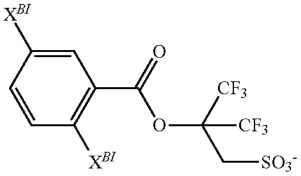
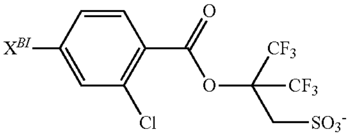
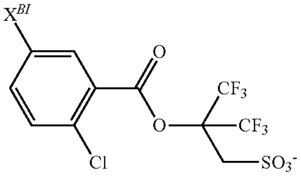
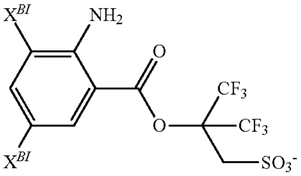
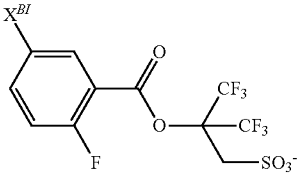

-continued
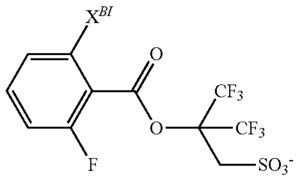
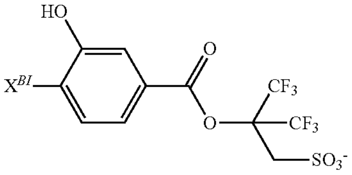
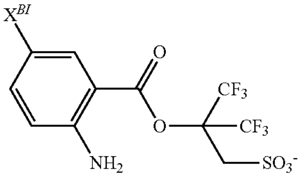
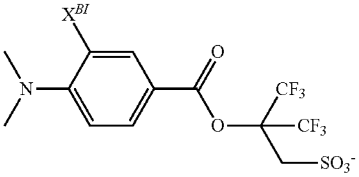
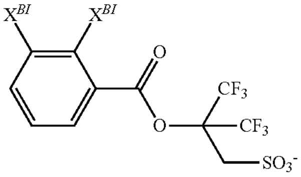
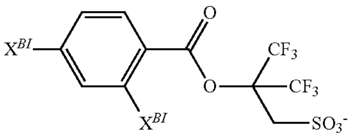
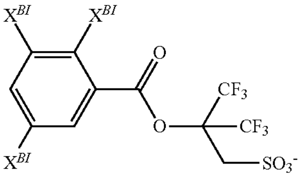
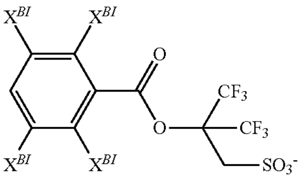
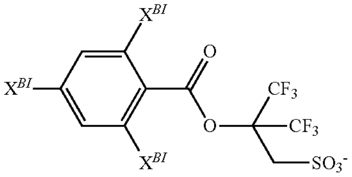
-continued
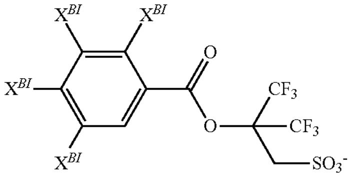
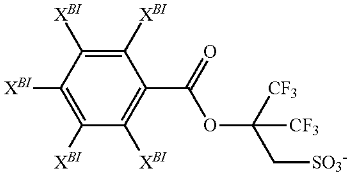
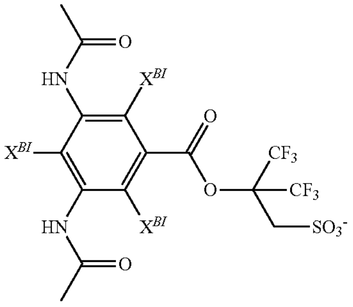
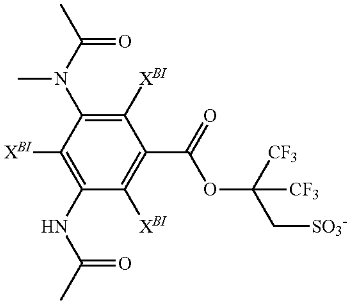
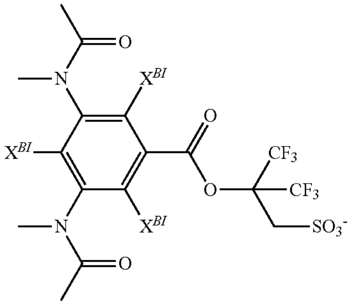
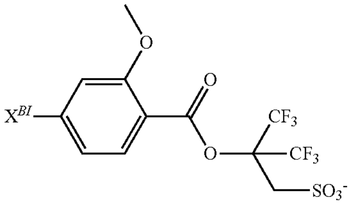
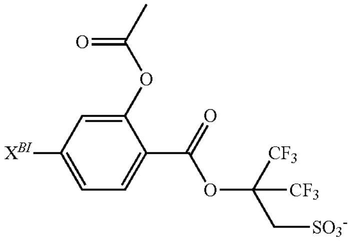

-continued
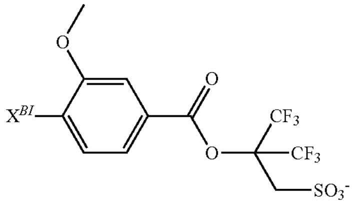
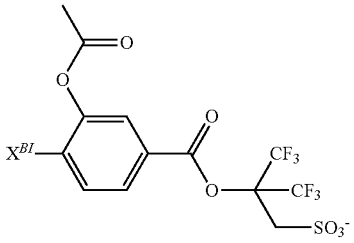
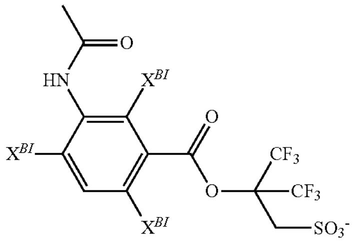
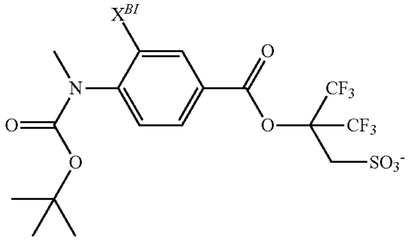
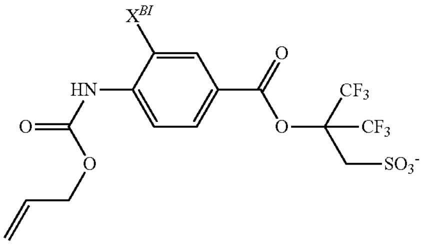
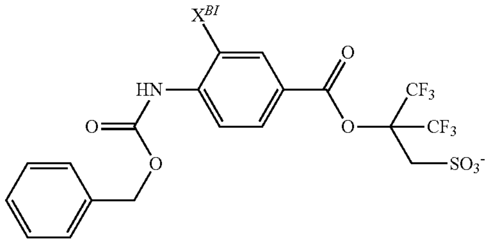
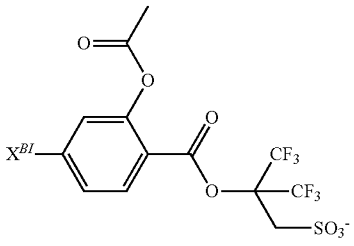
-continued
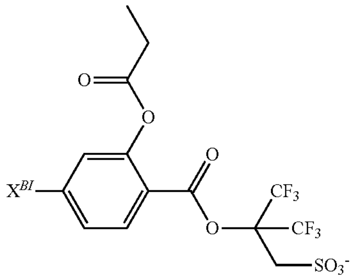
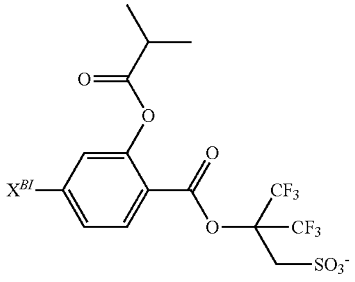
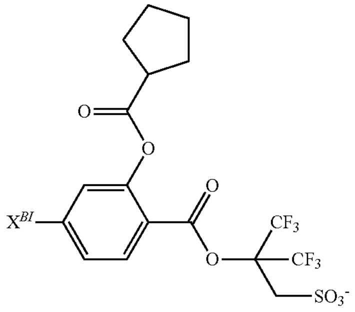
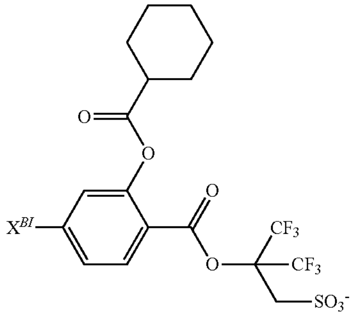
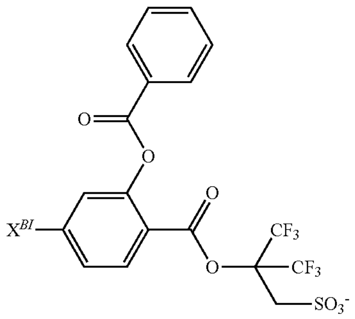

-continued
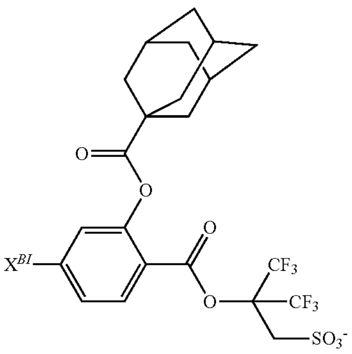
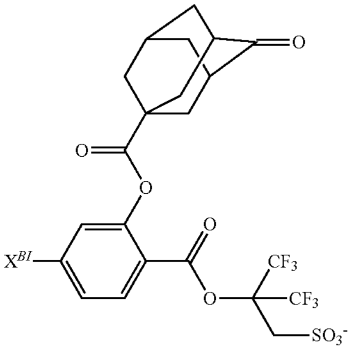
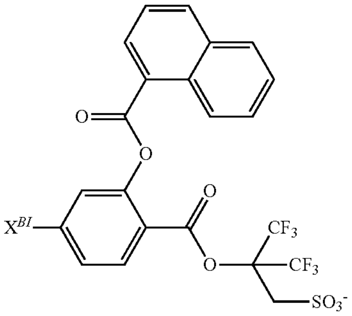
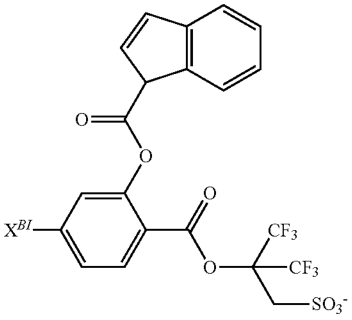
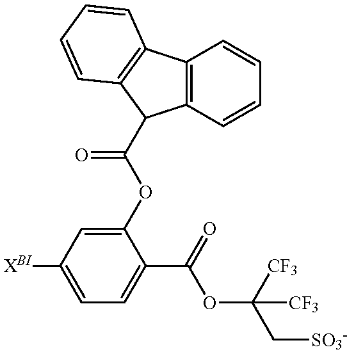
-continued
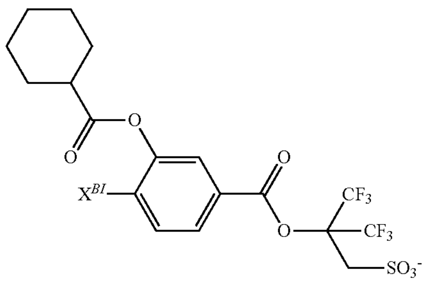
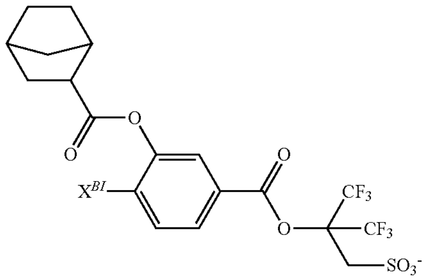
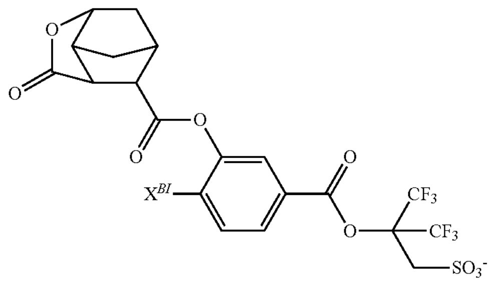
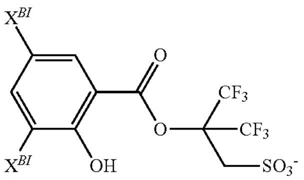
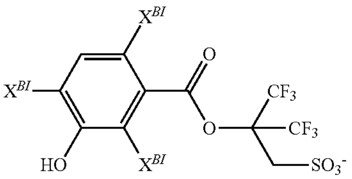
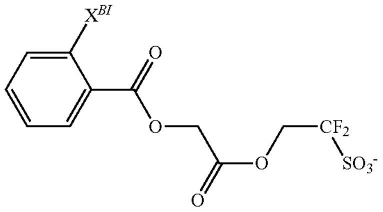
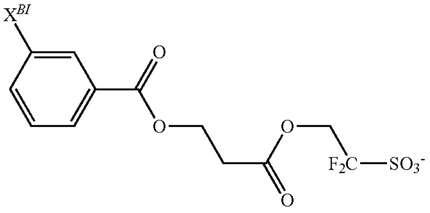

-continued
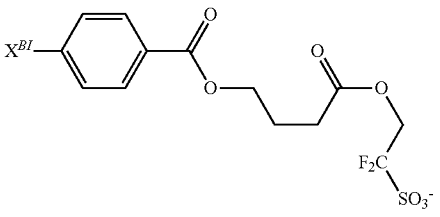
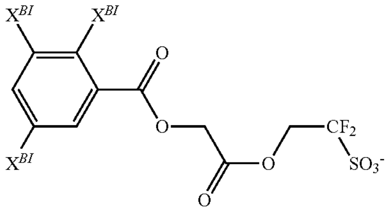
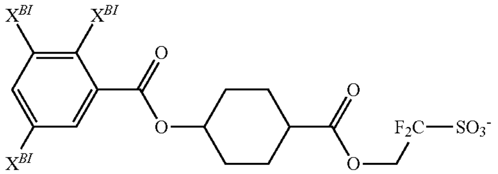
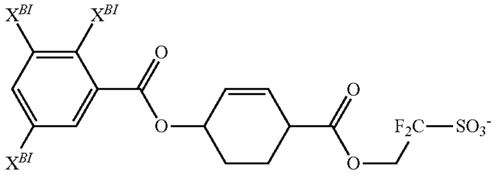
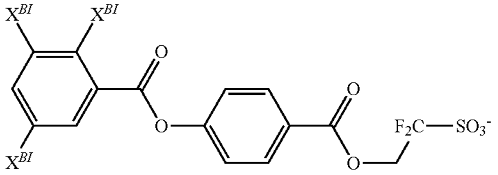
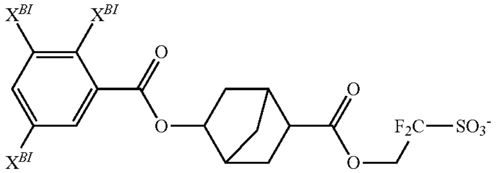
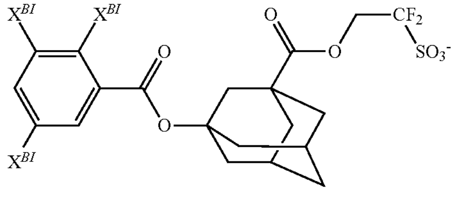
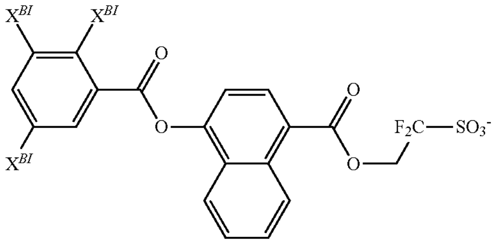
-continued
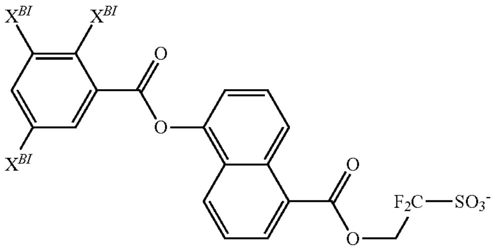
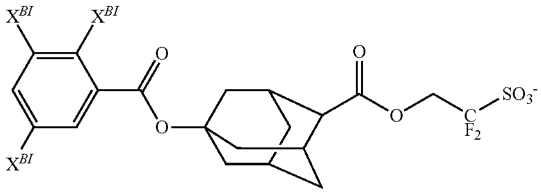
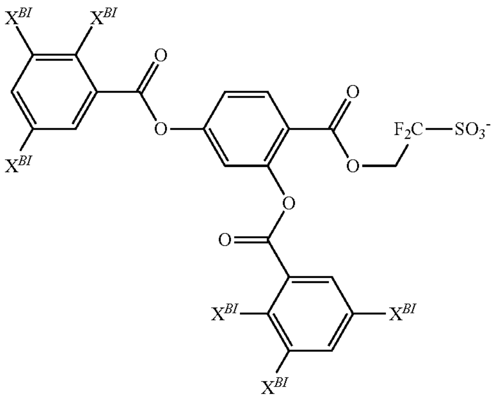
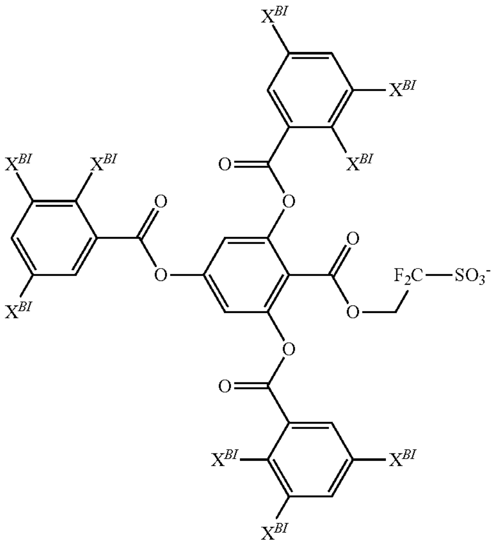

-continued
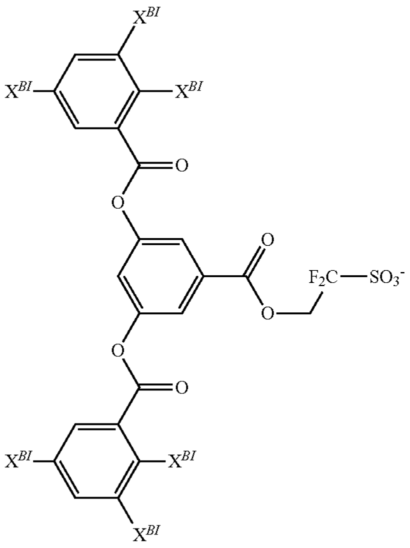
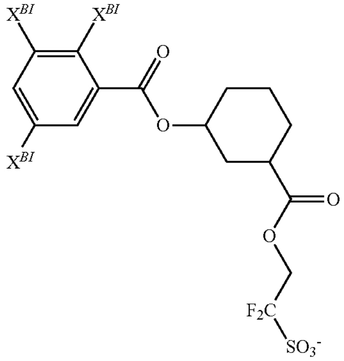
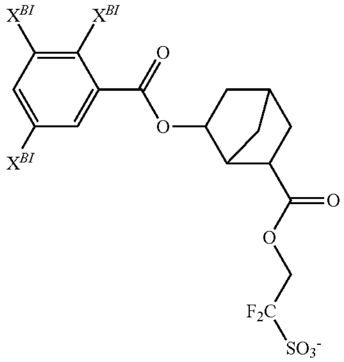
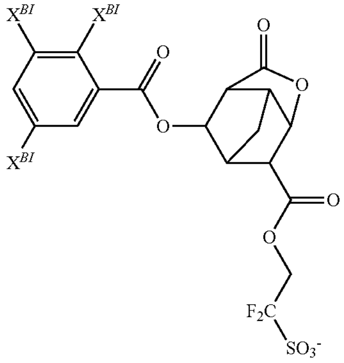
-continued
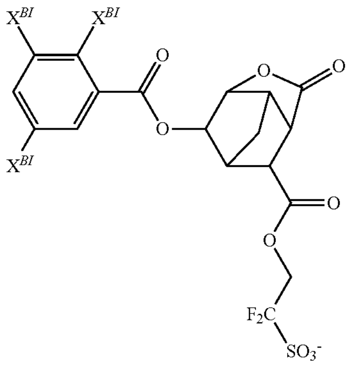
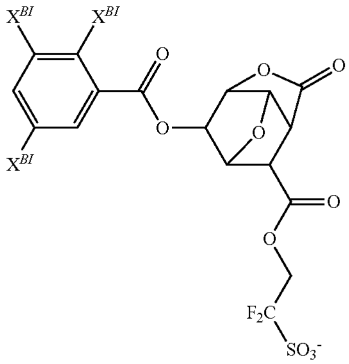
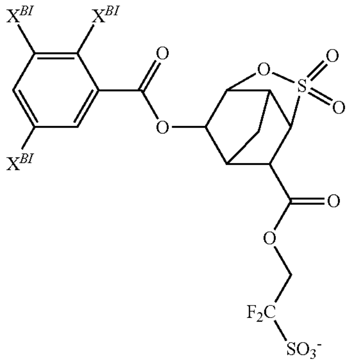
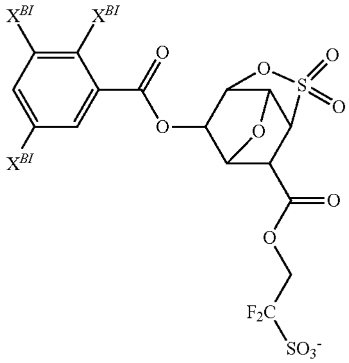

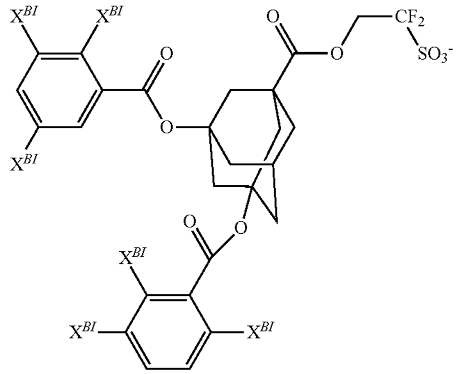
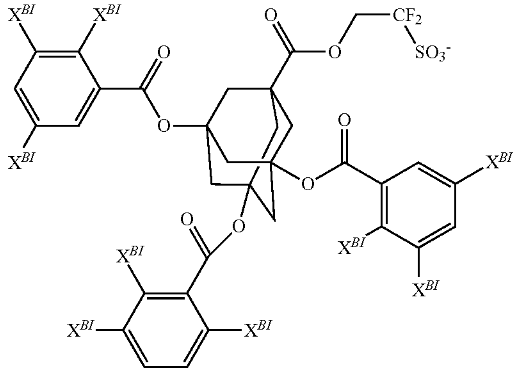
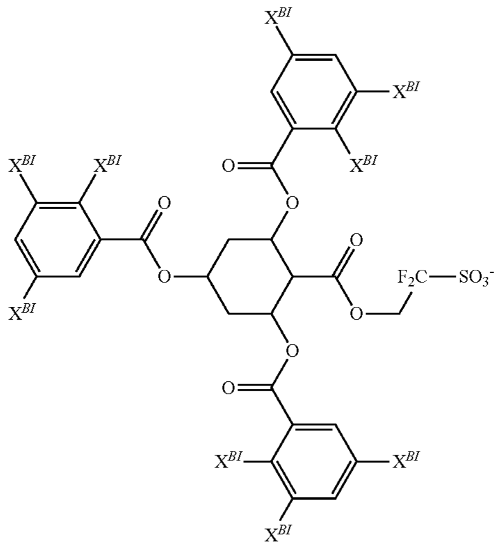
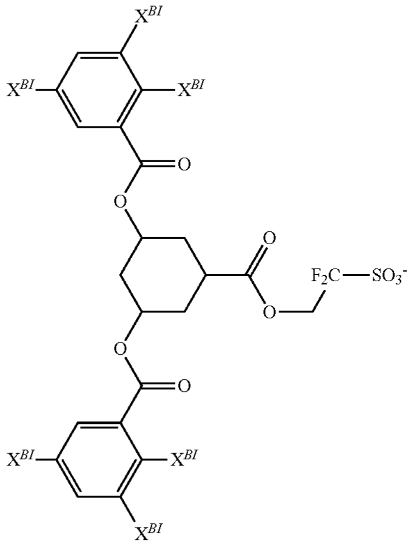
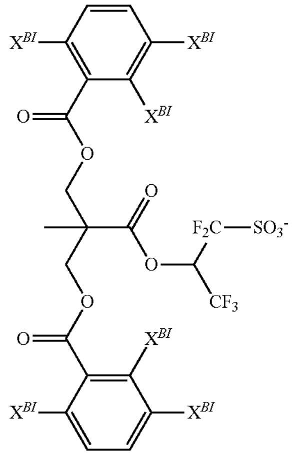
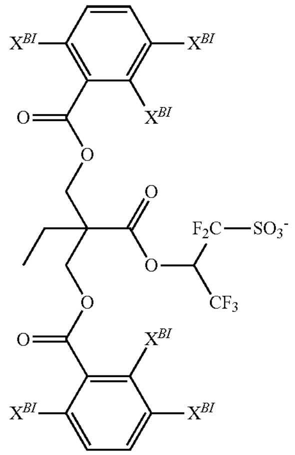

-continued
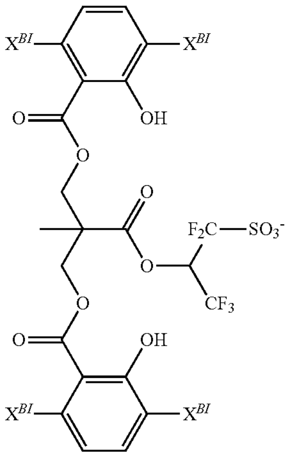
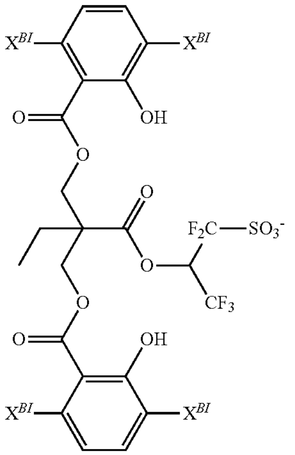
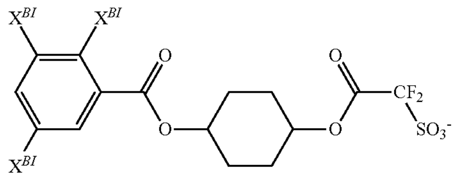
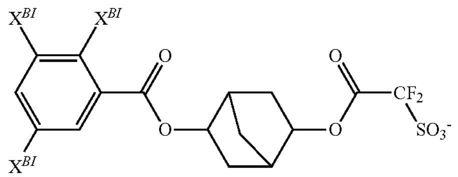
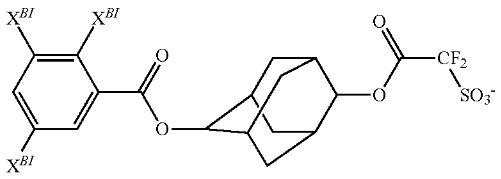
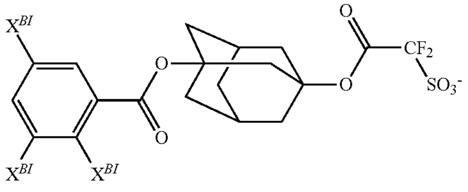
-continued
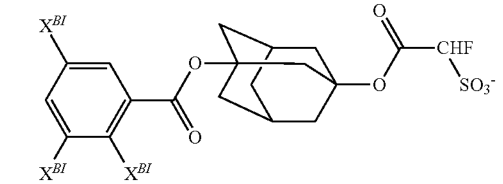
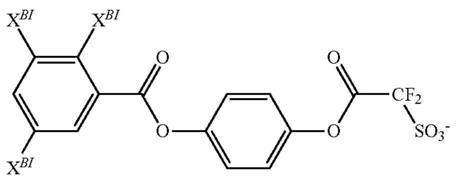
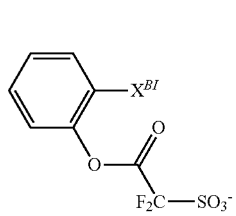
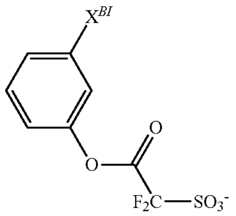
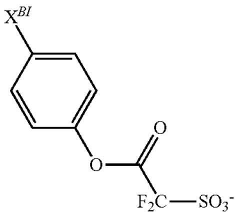
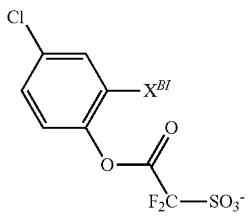
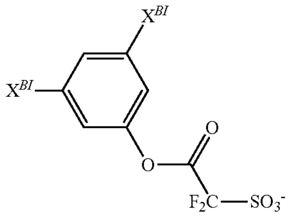
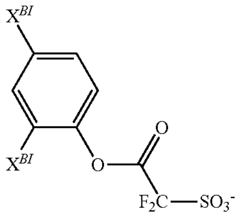
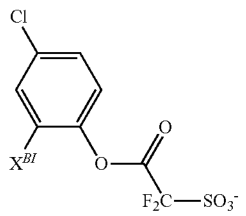
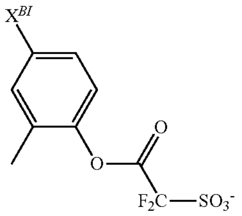
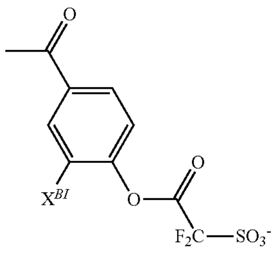
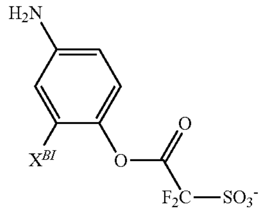

-continued
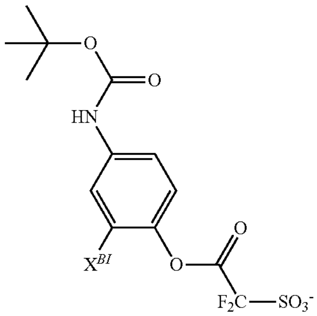
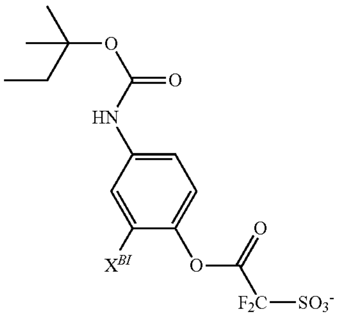
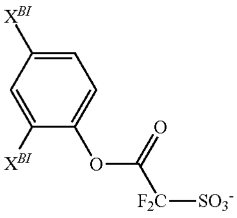
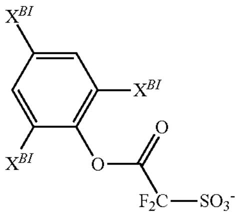
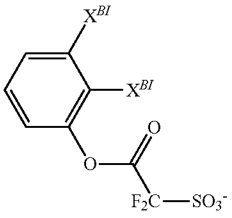
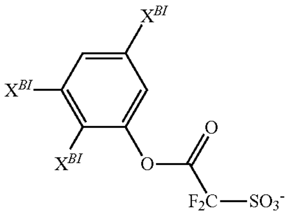
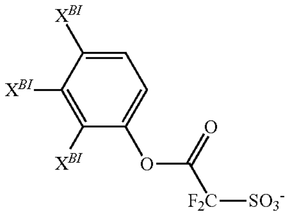
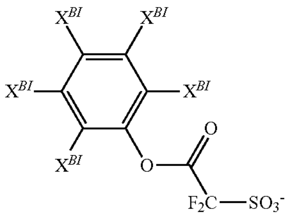
-continued
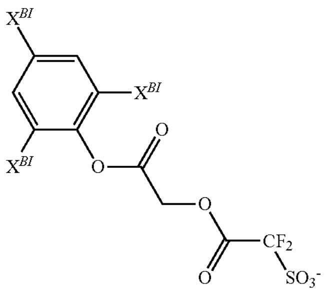
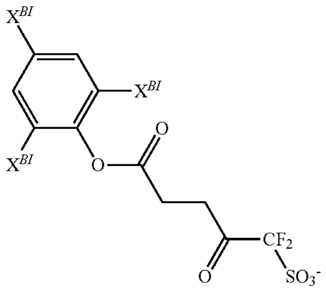
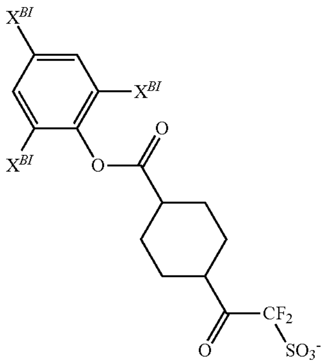
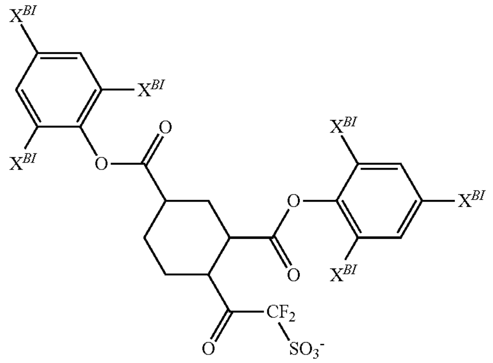
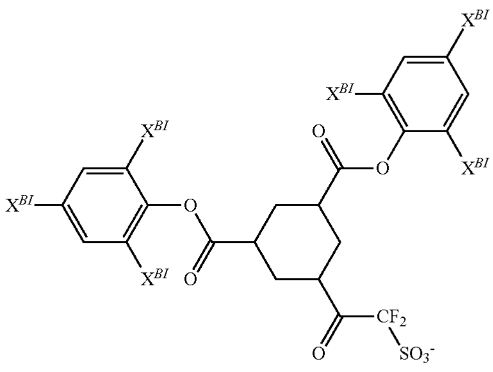

-continued
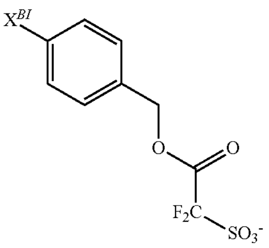
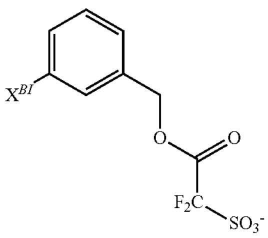
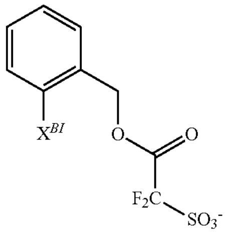
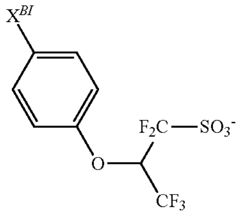
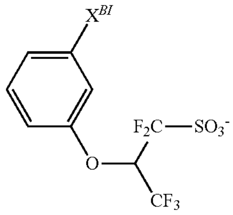
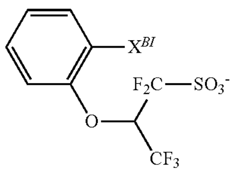
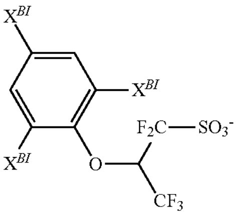
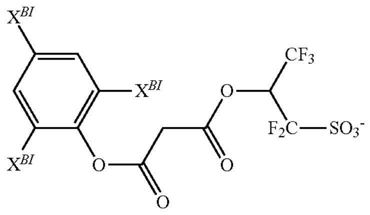
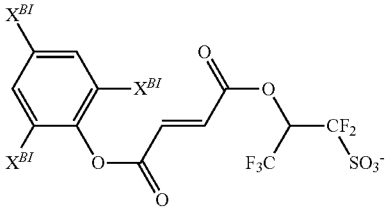
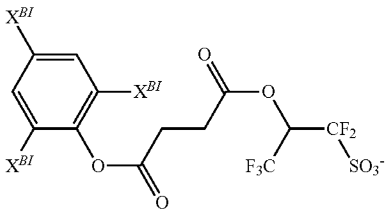
-continued
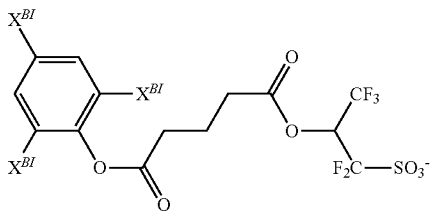
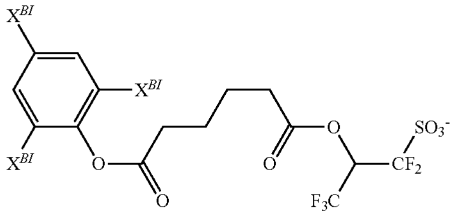
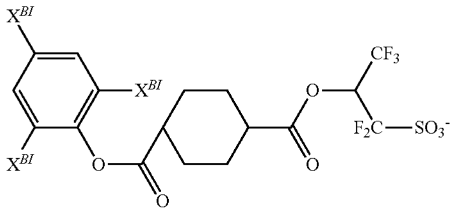
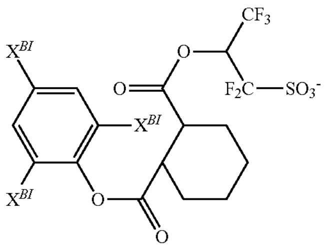
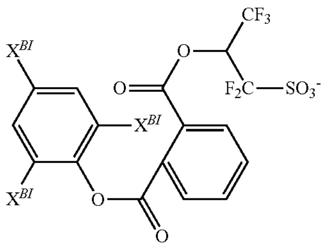
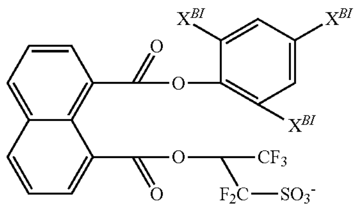
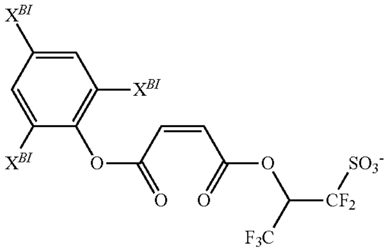

-continued
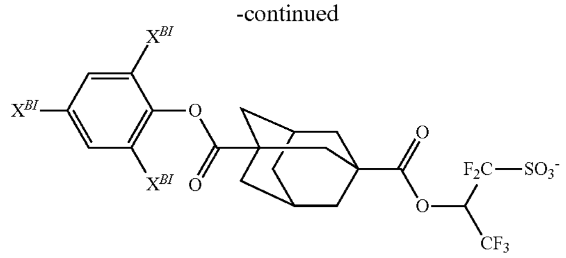
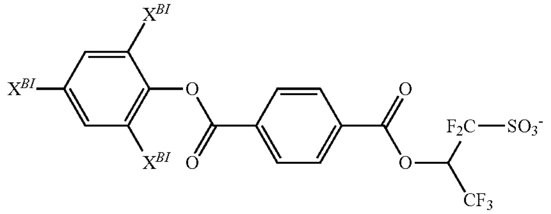
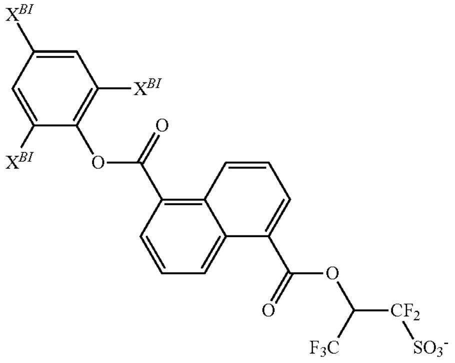
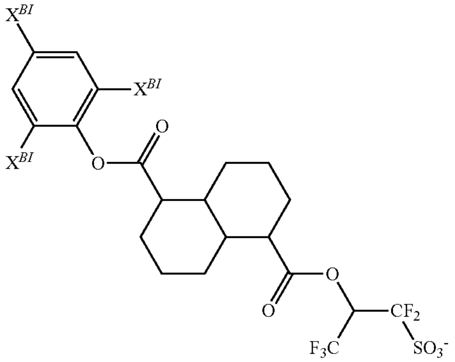
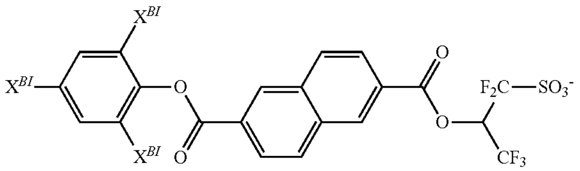
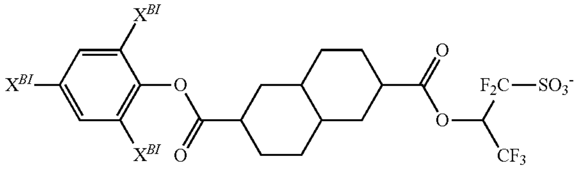
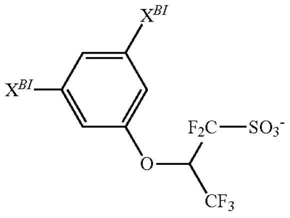
-continued
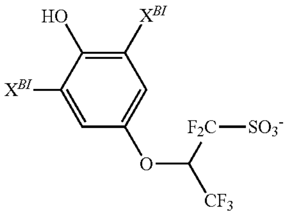
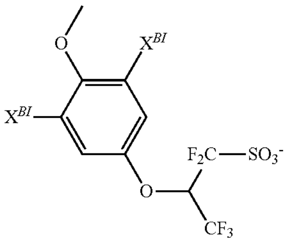
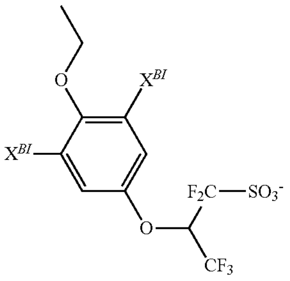
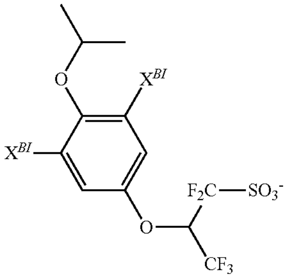
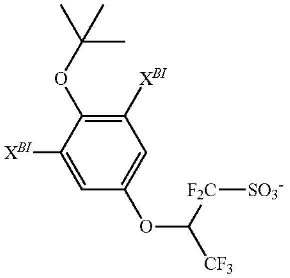
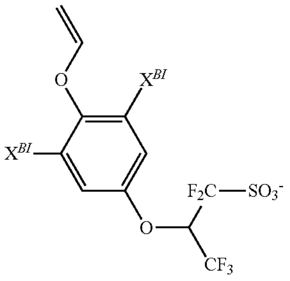

-continued
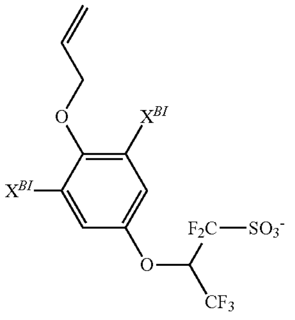
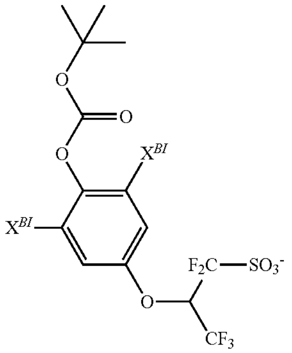
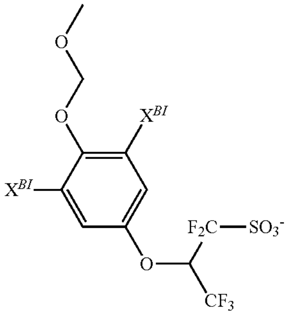
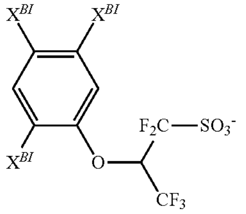
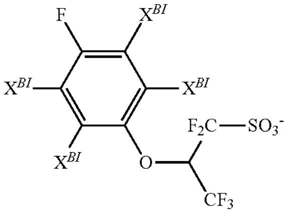
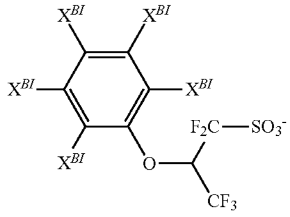
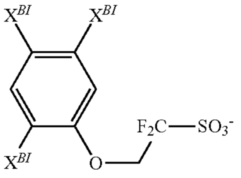
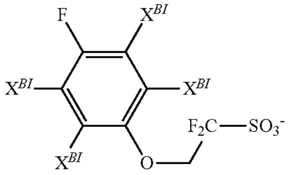
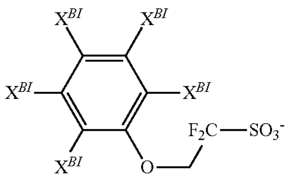
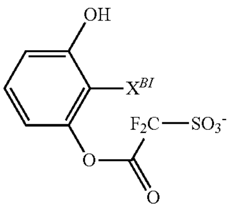
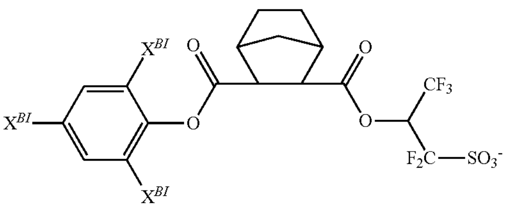
-continued
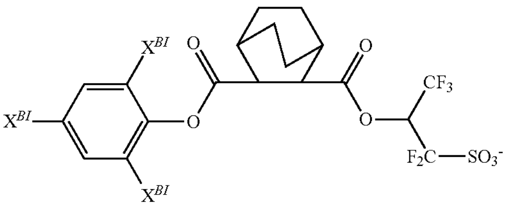
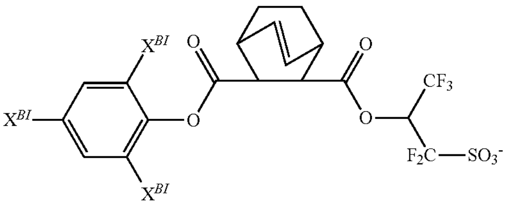
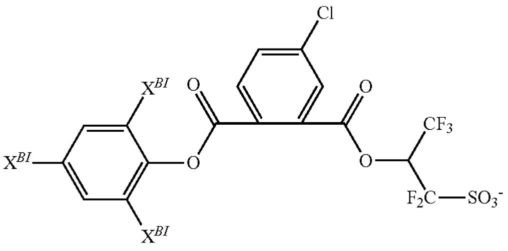
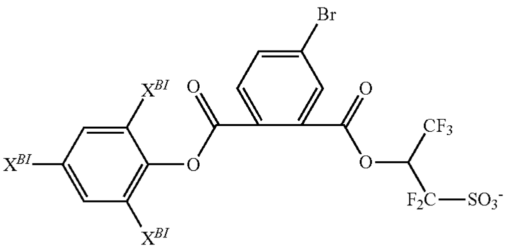
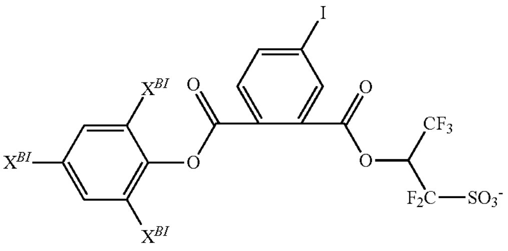
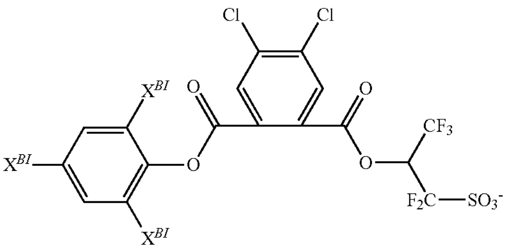
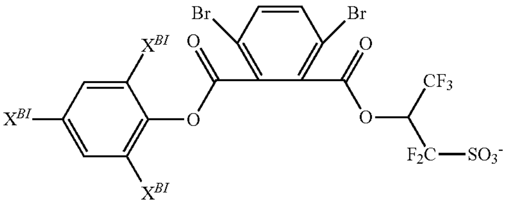

-continued
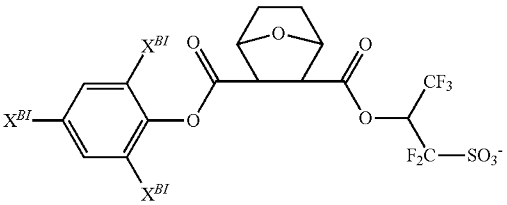
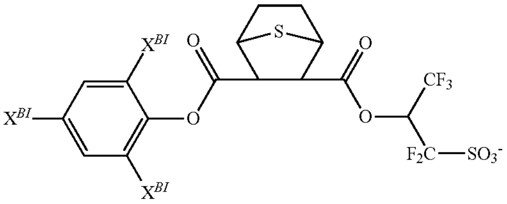
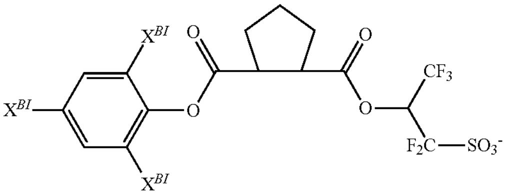
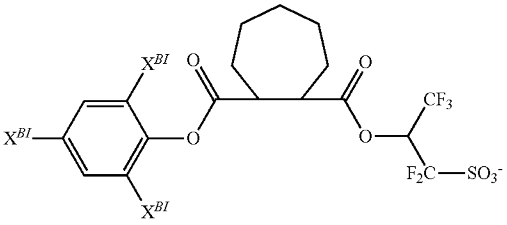
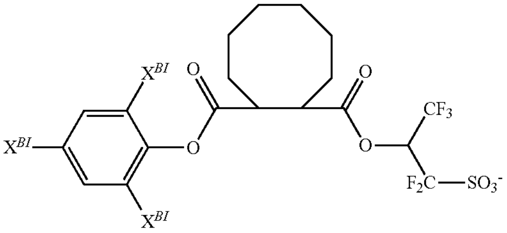
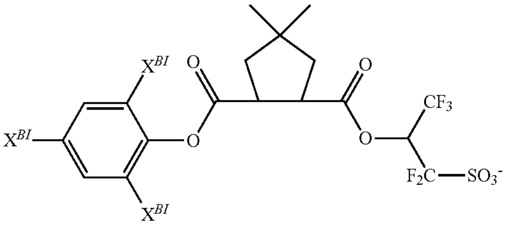
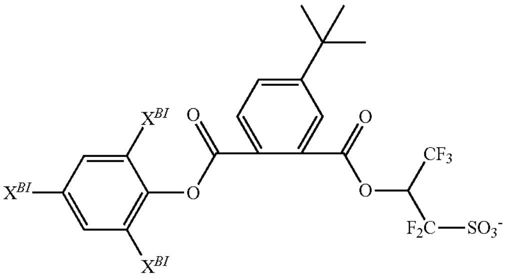
-continued
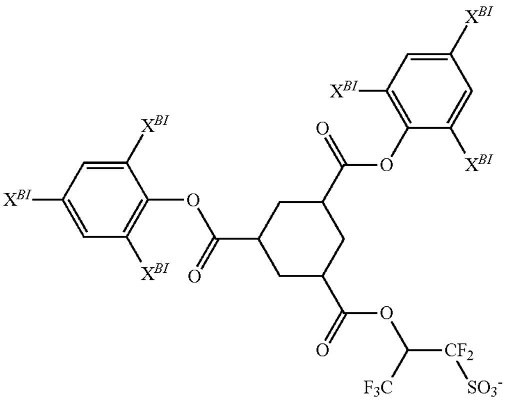
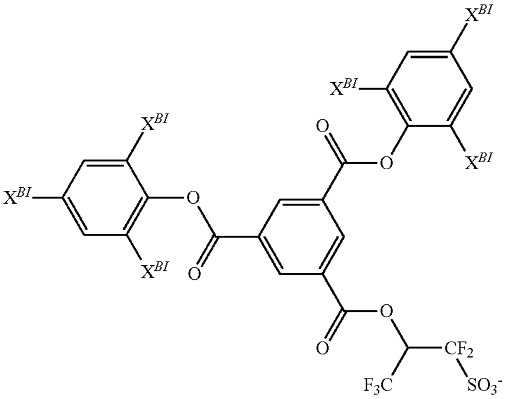
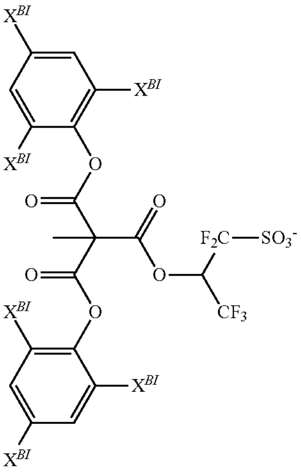
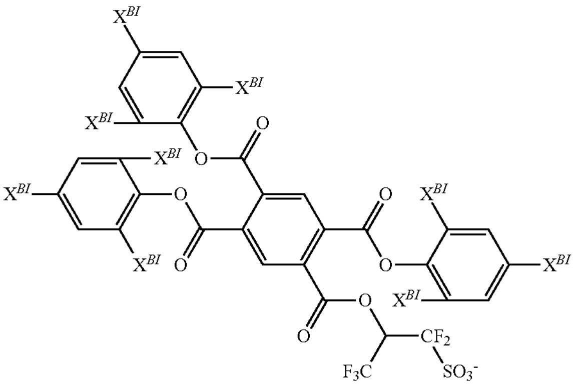

-continued
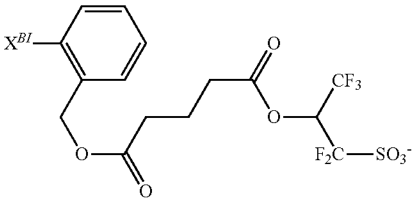
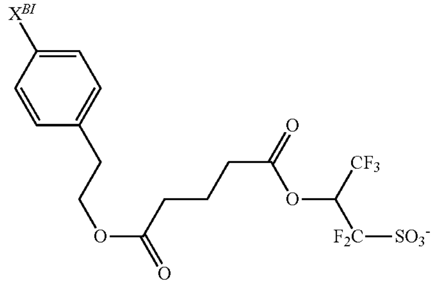
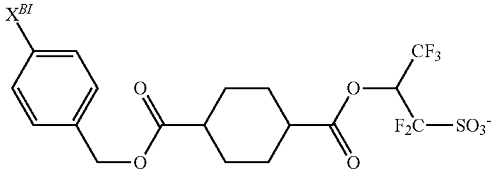
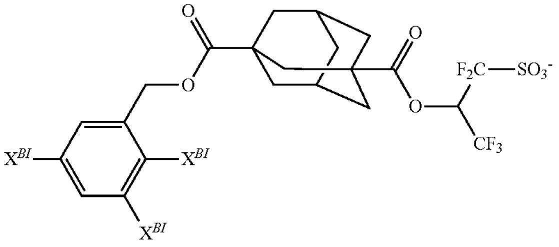
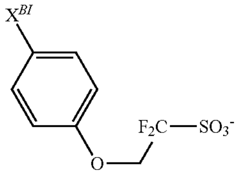
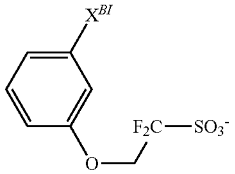
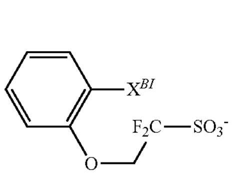
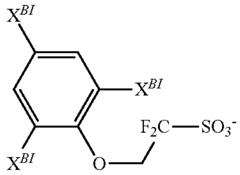
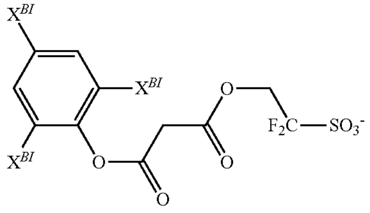
-continued
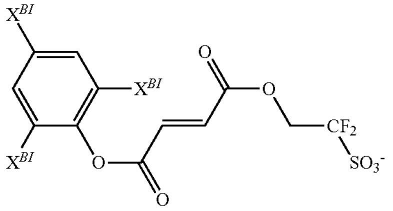
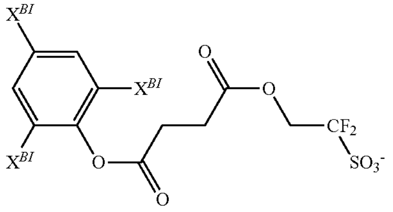
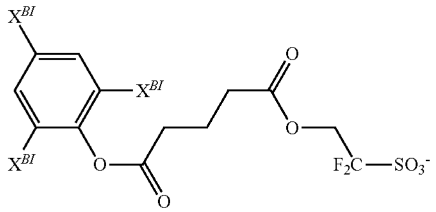
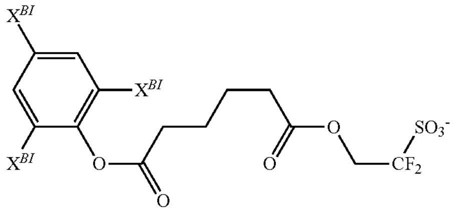
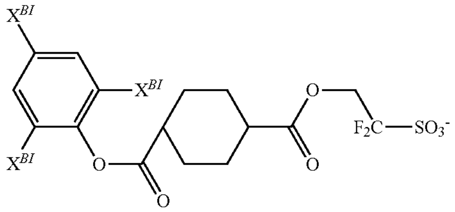
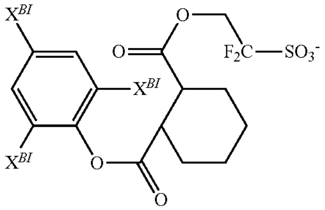
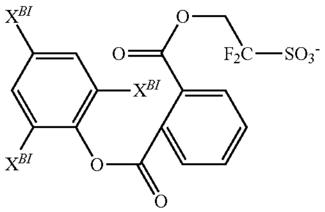
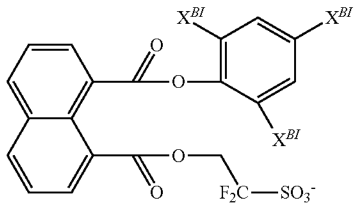

-continued
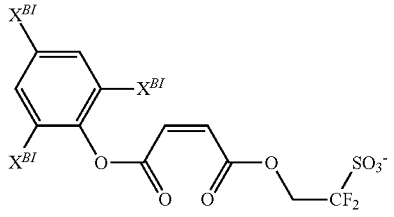
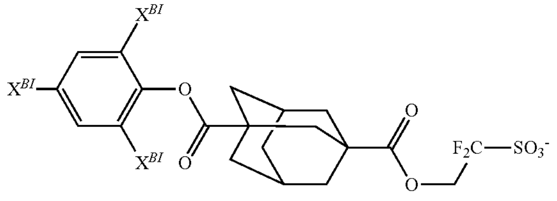
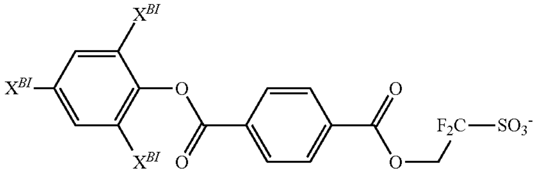
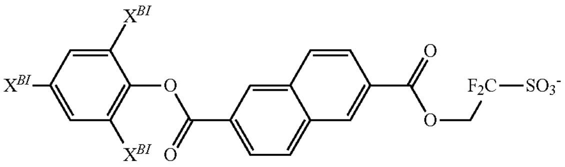
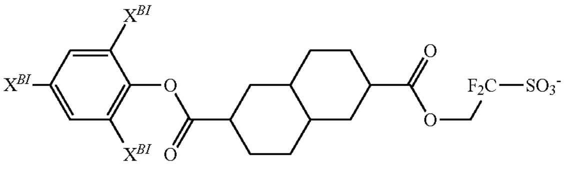
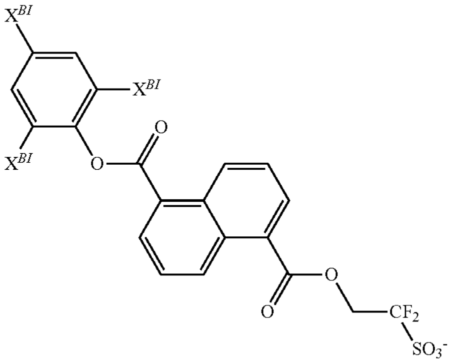
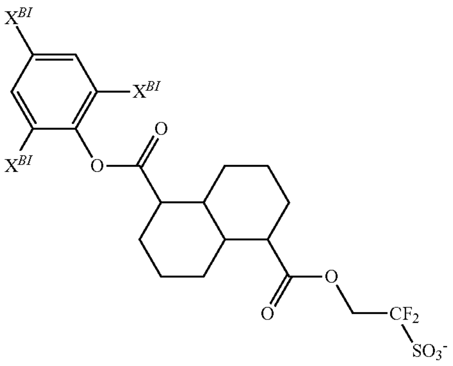
-continued
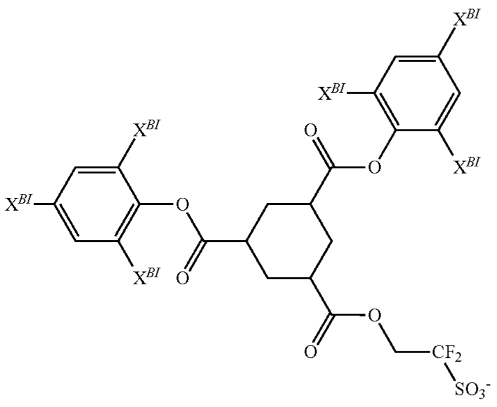
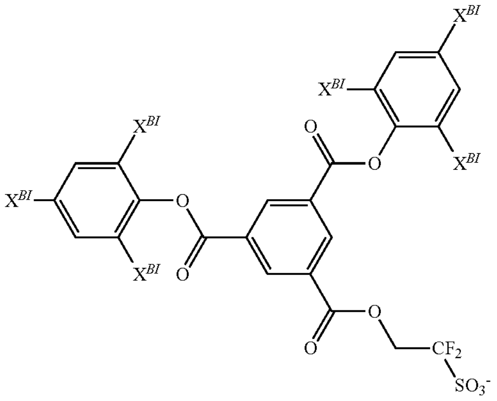
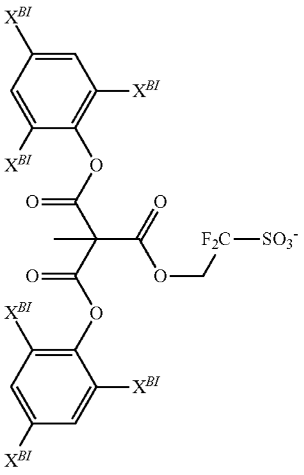
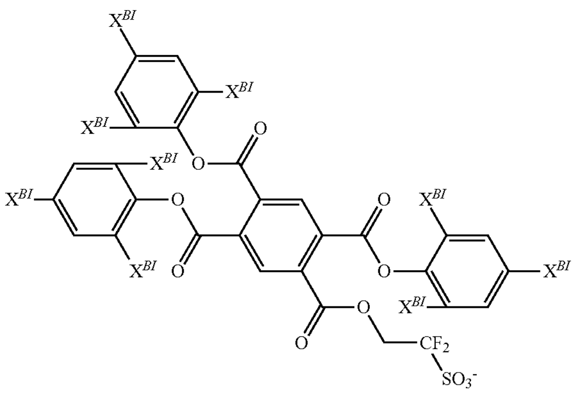

-continued
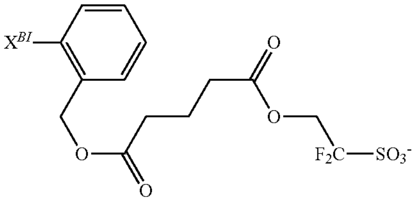
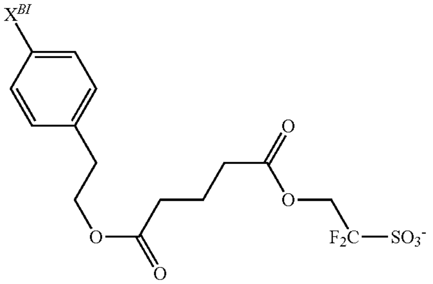
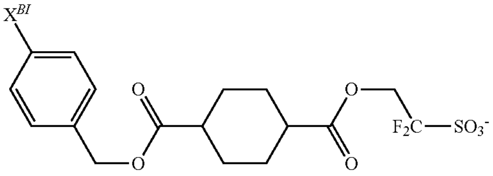
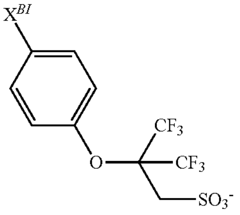
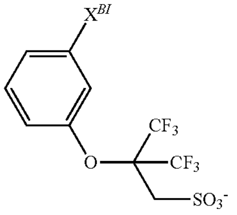
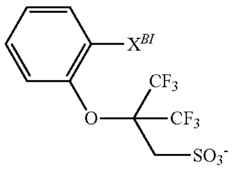
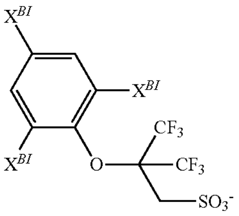
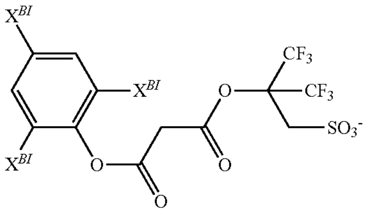
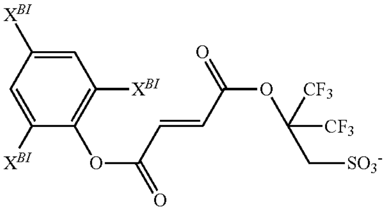
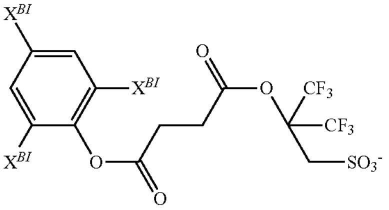
-continued
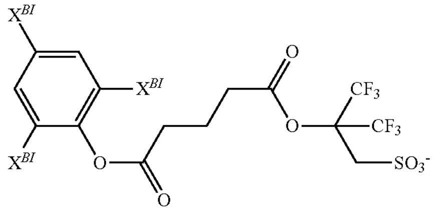
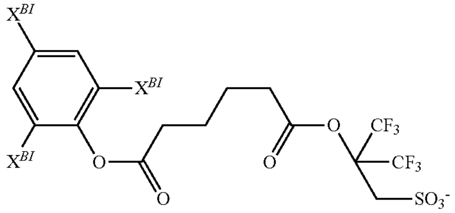
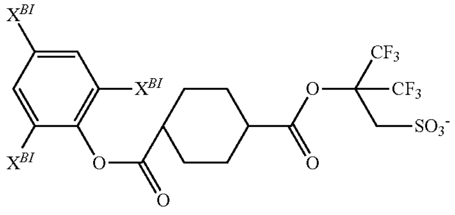
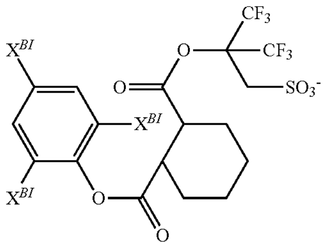
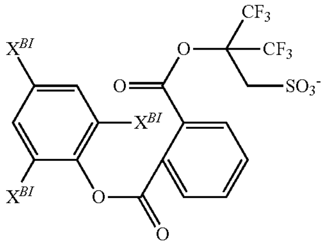
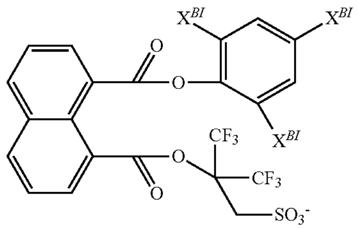
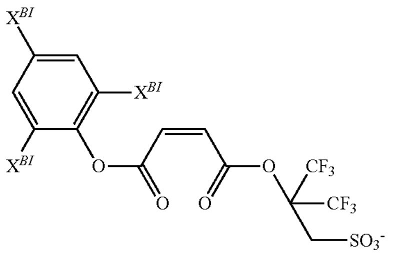

-continued
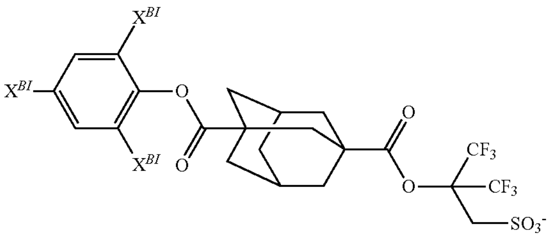
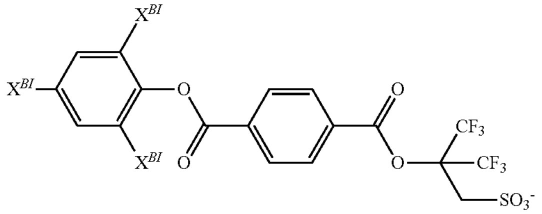
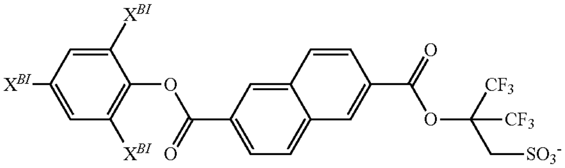
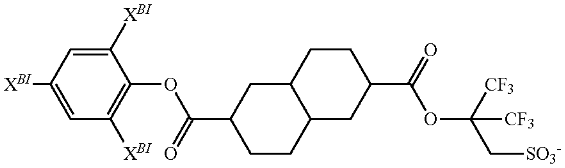
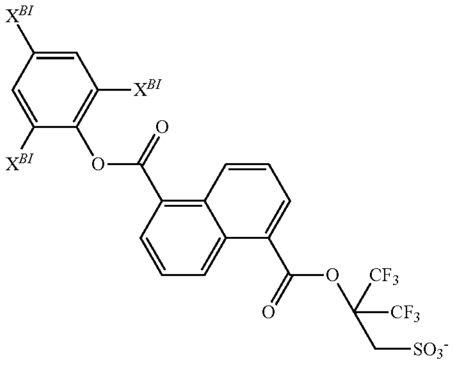
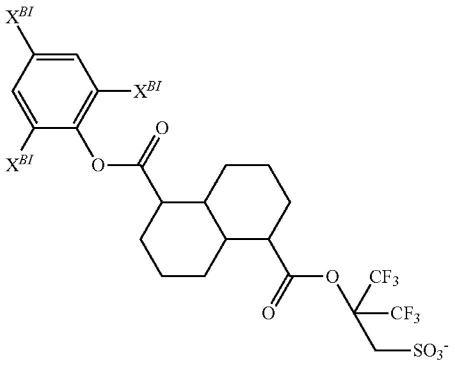
-continued
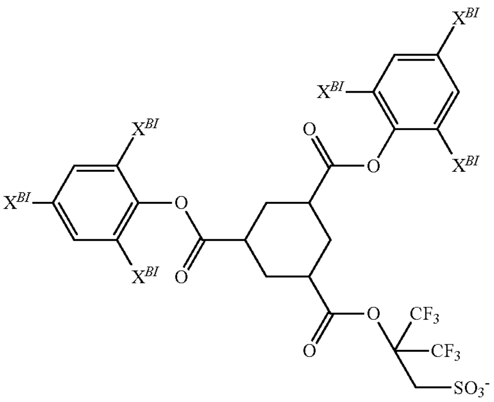
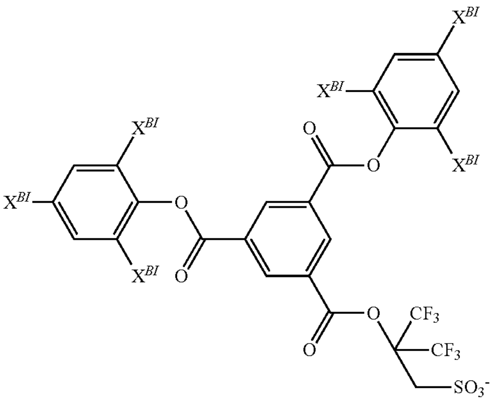
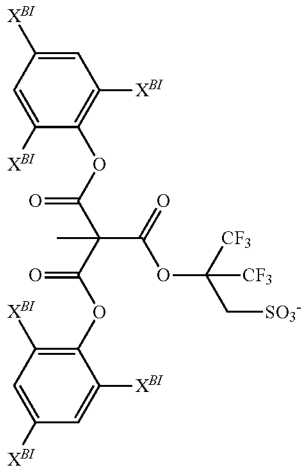
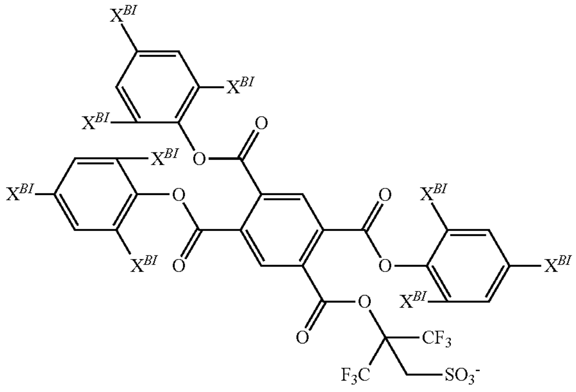

-continued

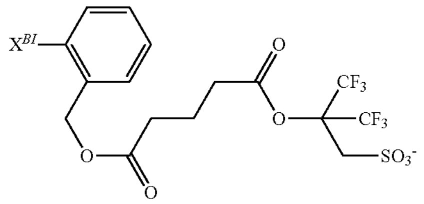

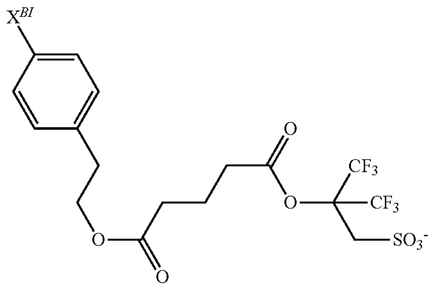

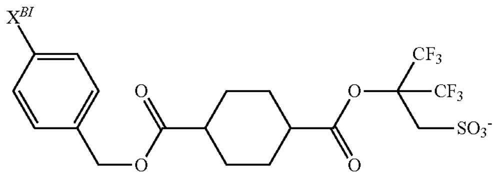

The amount of the acid generator of addition type is preferably 0.1 to 50 parts by weight, and more preferably 1 to 40 parts by weight per 100 parts by weight of a base polymer to be described later.

In an embodiment wherein the acid generator serves as a base polymer (to be described just below) as well, the acid generator is preferably a polymer comprising repeat units derived from a compound capable of generating an acid in response to actinic ray or radiation. More preferably, the acid generator is a base polymer essentially comprising repeat units (f) as will be described below.

Base Polymer

The chemically amplified resist composition preferably contains a base polymer. Where the resist composition is of positive tone, the base polymer comprises repeat units containing an acid labile group, preferably repeat units having the formula (a1) or repeat units having the formula (a2). These units are simply referred to as repeat units (a1) and (a2).

(a1)

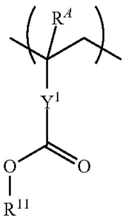

-continued (a2)

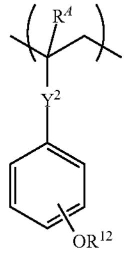

In formulae (a1) and (a2), $R^A$ is each independently hydrogen or methyl. $R^{11}$ and $R^{12}$ are each independently an acid labile group. When the base polymer contains both repeat units (a1) and (a2), $R^{11}$ and $R^{12}$ may be the same or different. $Y^1$ is a single bond, phenylene or naphthylene group, or $C_1$-$C_{12}$ linking group containing at least one moiety selected from ester bond and lactone ring. $Y^2$ is a single bond or ester bond.

Examples of the monomer from which repeat units (a1) are derived are shown below, but not limited thereto. $R^A$ and $R^{11}$ are as defined above.

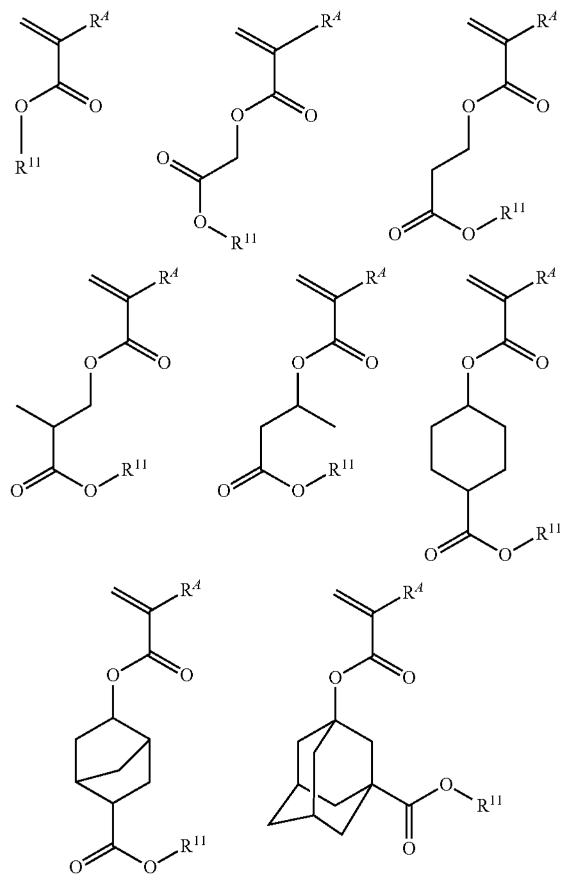

-continued

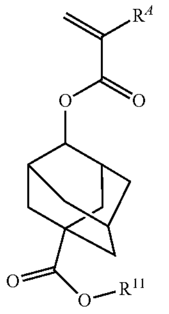

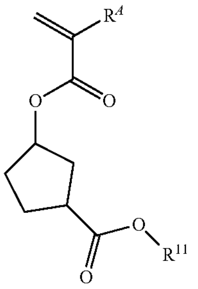

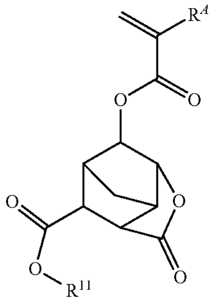

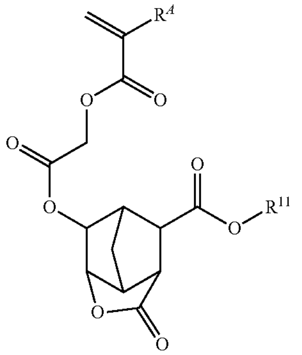

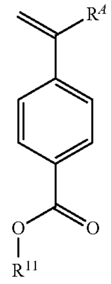

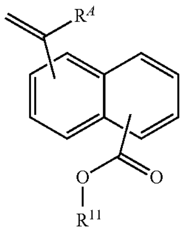

Examples of the monomer from which repeat units (a2) are derived are shown below, but not limited thereto. $R^A$ and $R^{12}$ are as defined above.

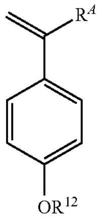

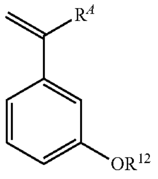

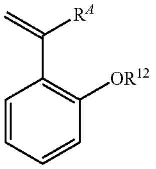

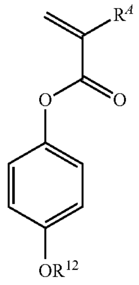

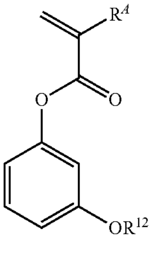

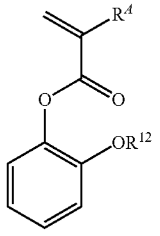

In formulae (a1) and (a2), $R^{11}$ and $R^{12}$ are each independently an acid labile group. The acid labile group may be selected from a variety of such groups, for example, groups having the following formulae (AL-1) to (AL-3).

(AL-1)

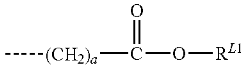

(AL-2)

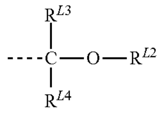

(AL-3)

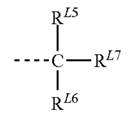

In formula (AL-1), "a" is an integer of 0 to 6. $R^{L1}$ is a $C_4$-$C_{20}$, preferably $C_4$-$C_{15}$ tertiary hydrocarbyl group, a trihydrocarbylsilyl group in which each hydrocarbyl moiety is a $C_1$-$C_6$ saturated hydrocarbyl moiety, a $C_4$-$C_{20}$ saturated hydrocarbyl group containing a carbonyl moiety, ether bond or ester bond, or a group having formula (AL-3). It is noted that the tertiary hydrocarbyl group refers to a group obtained by eliminating hydrogen on tertiary carbon from a hydrocarbon.

Of the groups represented by $R^{L1}$, the tertiary hydrocarbyl group may be saturated or unsaturated and branched or cyclic, and examples thereof include tert-butyl, tert-pentyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Examples of the trihydrocarbylsilyl group include trimethylsilyl, triethylsilyl and dimethyl-tert-butylsilyl. Examples of the saturated hydrocarbyl group containing a carbonyl moiety, ether bond or ester bond may be straight, branched or cyclic, preferably cyclic, and examples thereof include 3-oxocyclohexyl, 4-methyl-2-oxooxan-4-yl, 5-methyl-2-oxooxolan-5-yl, 2-tetrahydropyranyl and 2-tetrahydrofuranyl.

Examples of the acid labile group having formula (AL-1) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycarbonyl, 1-ethykyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Other examples of the acid labile group having formula (AL-1) include groups having the formulae (AL-1)-1 to (AL-1)-10.

(AL-1)-1

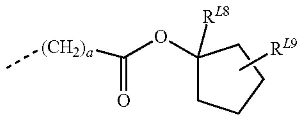

(AL-1)-2

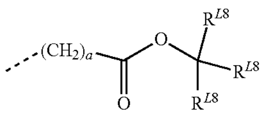

-continued (AL-1)-3

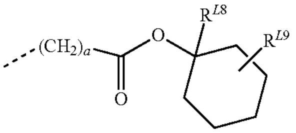

(AL-1)-4

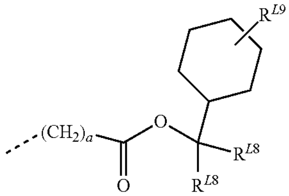

(AL-1)-5

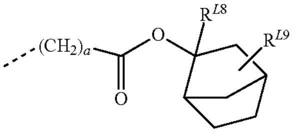

(AL-1)-6

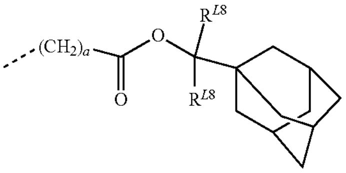

(AL-1)-7

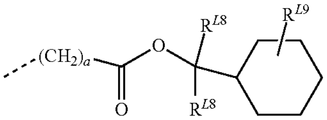

(AL-1)-8

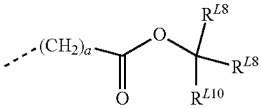

(AL-1)-9

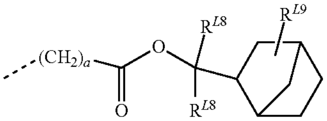

(AL-1)-10

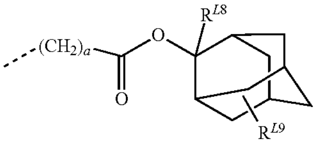

In formulae (AL-1)-1 to (AL-1)-10, "a" is as defined above. $R^{L8}$ is each independently a $C_1$-$C_{10}$ saturated hydrocarbyl group or $C_6$-$C_{20}$ aryl group. $R^{L9}$ is hydrogen or a $C_1$-$C_{10}$ saturated hydrocarbyl group. $R^{L10}$ is a $C_2$-$C_{10}$ saturated hydrocarbyl group or $C_6$-$C_{20}$ aryl group. The saturated hydrocarbyl group may be straight, branched or cyclic.

In formula (AL-2), $R^{L2}$ and $R^{L3}$ are each independently hydrogen or a $C_1$-$C_{18}$, preferably $C_1$-$C_{10}$ saturated hydrocarbyl group. The saturated hydrocarbyl group may be straight, branched or cyclic and examples thereof include methyl, ethyl, n-propyl, isopropyl, n-butyl, isobutyl, sec-butyl, tert-butyl, cyclopentyl, cyclohexyl, 2-ethylhexyl and n-octyl.

In formula (AL-2), $R^{L4}$ is a $C_1$-$C_{18}$, preferably $C_1$-$C_{10}$ hydrocarbyl group which may m contain a heteroatom. The hydrocarbyl group may be saturated or unsaturated and straight, branched or cyclic. Inter alia, $C_1$-$C_{18}$ saturated hydrocarbyl groups are preferred, in which some hydrogen may be substituted by hydroxy, alkoxy, oxo, amino or alkylamino. Examples of the substituted saturated hydrocarbyl group are shown below.

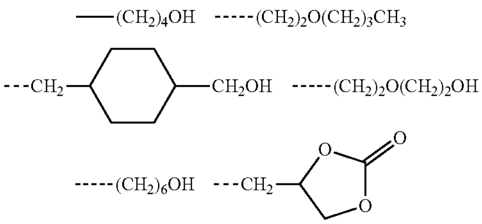

A pair of $R^{L2}$ and $R^{L3}$, $R^{L2}$ and $R^{L4}$, or $R^{L3}$ and $R^{L4}$ may bond together to form a ring with the carbon atom or carbon and oxygen atoms to which they are attached. $R^{L2}$ and $R^{L3}$, $R^{L2}$ and $R^{L4}$, or $R^{L3}$ and $R^{L4}$ which form a ring are each independently a $C_1$-$C_{18}$, preferably $C_1$-$C_{10}$ alkanediyl group. The ring thus formed is preferably of 3 to 10, more preferably 4 to 10 carbon atoms.

Of the acid labile groups having formula (AL-2), suitable straight or branched groups include those having formulae (AL-2)-1 to (AL-2)-69, but are not limited thereto.

(AL-2)-1

----$CH_2$—O—$CH_3$ (AL-2)-2

----$CH_2$—O—$CH_2$—$CH_3$ (AL-2)-3

----$CH_2$—O—$(CH_2)_2$—$CH_3$ (AL-2)-4

----$CH_2$—O—$(CH_2)_3$—$CH_3$ (AL-2)-5

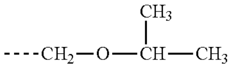

(AL-2)-6

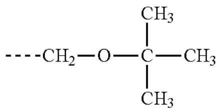

(AL-2)-7

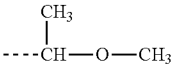

(AL-2)-8

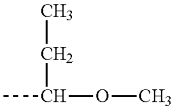

(AL-2)-9

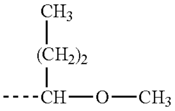

(AL-2)-10

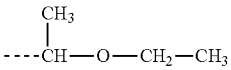

(AL-2)-11

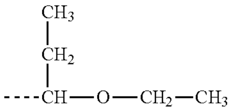

-continued
(AL-2)-12
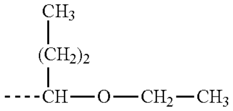
(AL-2)-13
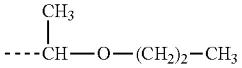
(AL-2)-14
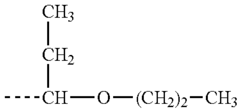
(AL-2)-15
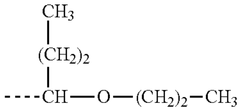
(AL-2)-16
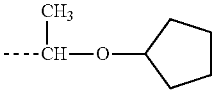
(AL-2)-17
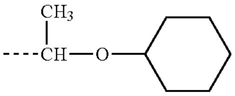
(AL-2)-18
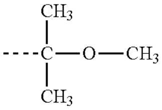
(AL-2)-19
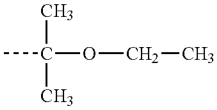
(AL-2)-20
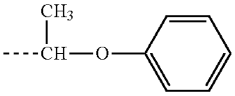
(AL-2)-21
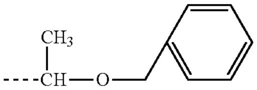
(AL-2)-22
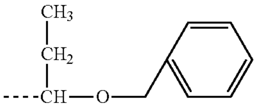
(AL-2)-23
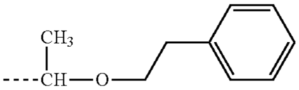
(AL-2)-24
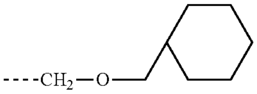
(AL-2)-25
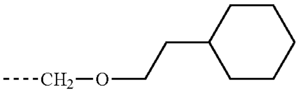
-continued
(AL-2)-26
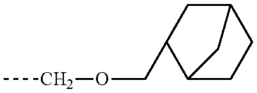
(AL-2)-27
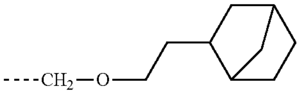
(AL-2)-28
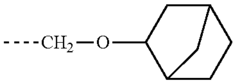
(AL-2)-29
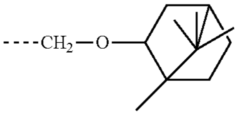
(AL-2)-30
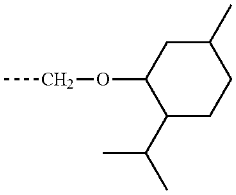
(AL-2)-31
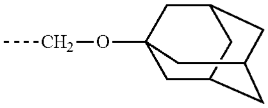
(AL-2)-32
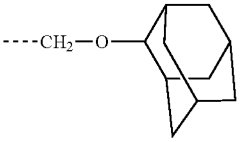
(AL-2)-33
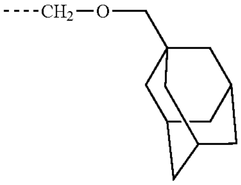
(AL-2)-34
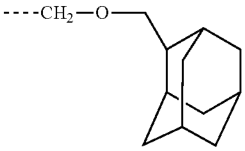
(AL-2)-35
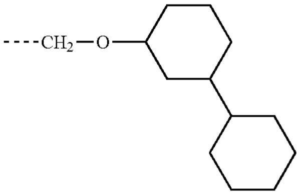
(AL-2)-36
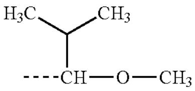

-continued
(AL-2)-37
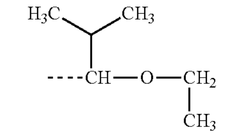
(AL-2)-38
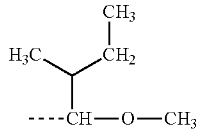
(AL-2)-39
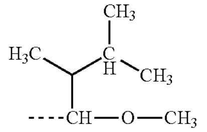
(AL-2)-40
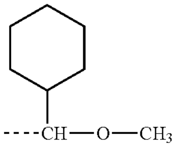
(AL-2)-41
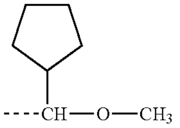
(AL-2)-42
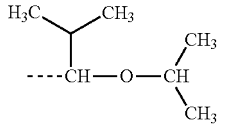
(AL-2)-43
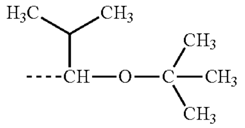
(AL-2)-44
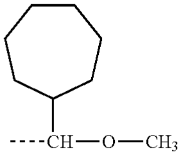
(AL-2)-45
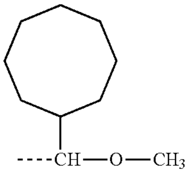
(AL-2)-46
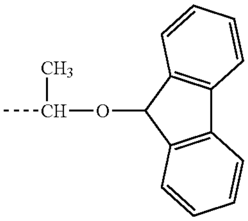
-continued
(AL-2)-47
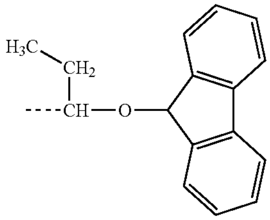
(AL-2)-48
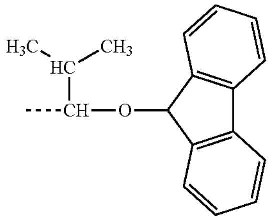
(AL-2)-49
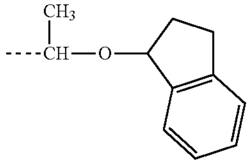
(AL-2)-50
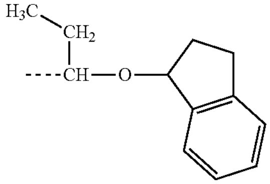
(AL-2)-51
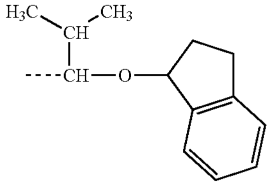
(AL-2)-52
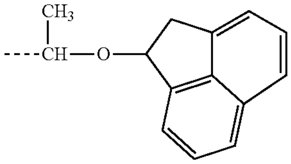
(AL-2)-53
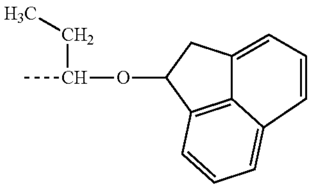
(AL-2)-54
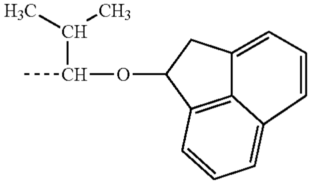

-continued (AL-2)-55

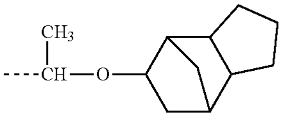

(AL-2)-56

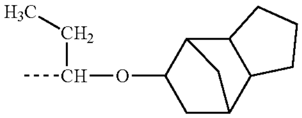

(AL-2)-57

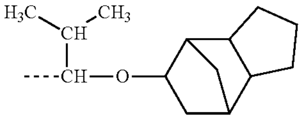

(AL-2)-58

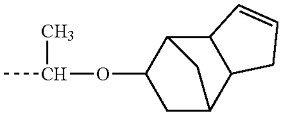

(AL-2)-59

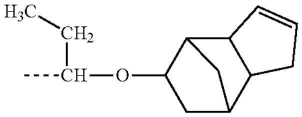

(AL-2)-60

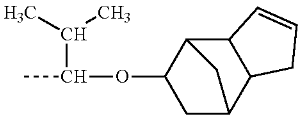

(AL-2)-61

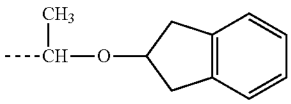

(AL-2)-62

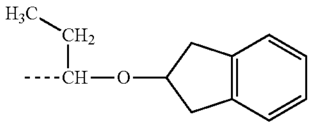

(AL-2)-63

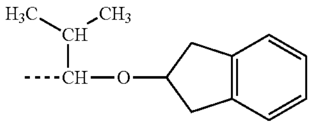

(AL-2)-64

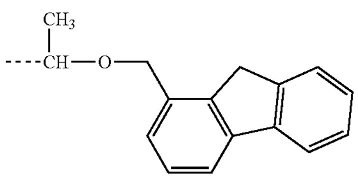

(AL-2)-65

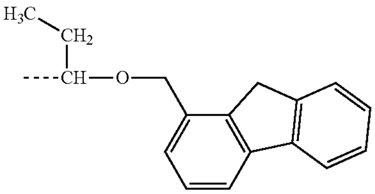

-continued (AL-2)-66

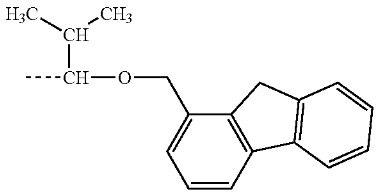

(AL-2)-67

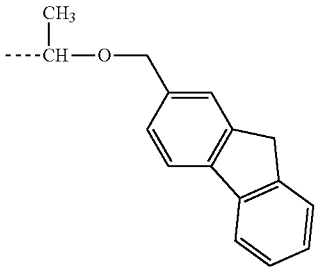

(AL-2)-68)

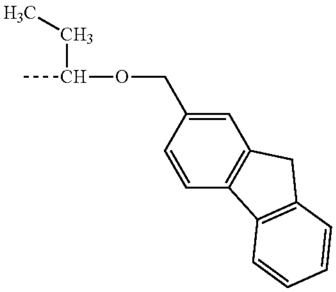

(AL-2)-69

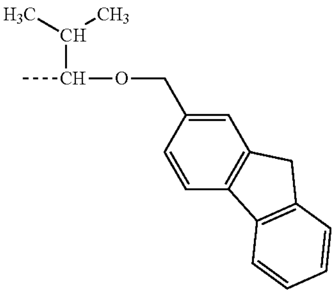

Of the acid labile groups having formula (AL-2), suitable cyclic groups include tetrahydrofuran-2-yl, 2-methyltetrahydrofuran-2-yl, tetrahydropyran-2-yl, and 2-methyltetrahydropyran-2-yl.

Also included are acid labile groups having the following formulae (AL-2a) and (AL-2b). With these acid labile groups, the base polymer may be crosslinked within the molecule or between molecules.

(AL-2a)

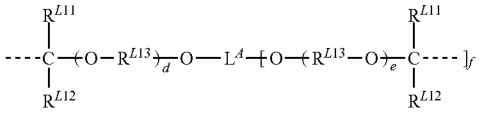

-continued (AL-2b)

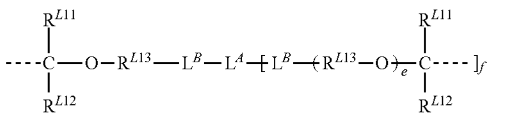

In formulae (AL-2a) and (AL-2b), $R^{L11}$ and $R^{L12}$ are each independently hydrogen or a $C_1$-$C_8$ saturated hydrocarbyl group which may be straight, branched or cyclic. Also, $R^{L11}$ and $R^{L12}$ may bond together to form a ring with the carbon atom to which they are attached, and in this case, $R^{L11}$ and $R^{L12}$ are each independently a $C_1$-$C_8$ alkanediyl group. $R^{L13}$ is each independently a $C_1$-$C_{10}$ saturated hydrocarbylene group which may be straight, branched or cyclic. The subscripts d and e are each independently an integer of 0 to 10, preferably 0 to 5, and f is an integer of 1 to 7, preferably 1 to 3.

In formulae (AL-2a) and (AL-2b), $L^A$ is a $C_1$-$C_{50}$ (f+1)-valent aliphatic saturated hydrocarbon group, $C_3$-$C_{50}$ (f+1)-valent alicyclic saturated hydrocarbon group, $C_6$-$C_{50}$ (f+1)-valent aromatic hydrocarbon group or $C_3$-$C_{50}$ (f+1)-valent heterocyclic group. In these groups, some constituent —$CH_2$— may be replaced by a heteroatom-containing moiety, or some carbon-bonded hydrogen may be substituted by a hydroxy, carboxy, acyl moiety or fluorine. $L^A$ is preferably a $C_1$-$C_{20}$ saturated hydrocarbon group (e.g., saturated hydrocarbylene group, trivalent saturated hydrocarbon group or tetravalent saturated hydrocarbon group), or $C_6$-$C_{30}$ arylene group. The saturated hydrocarbon group may be straight, branched or cyclic. $L^B$ is —C(═O)—O—, —NH—C(═O)—O— or —NH—C(═O)—NH—.

Examples of the crosslinking acetal groups having formulae (AL-2a) and (AL-2b) include groups having the formulae (AL-2)-70 to (AL-2)-77.

(AL-2)-70

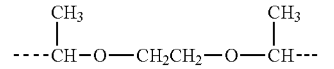

(AL-2)-71

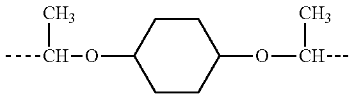

(AL-2)-72

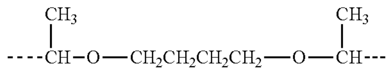

(AL-2)-73

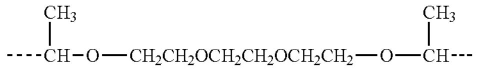

(AL-2)-74

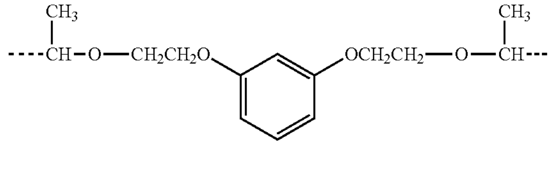

-continued (AL-2)-75

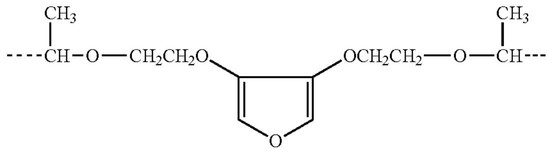

(AL-2)-76

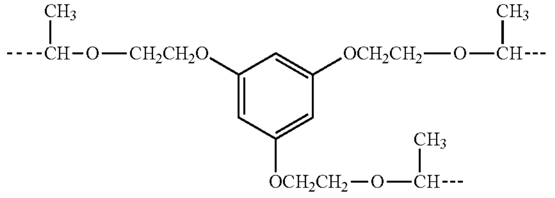

(AL-2)-77

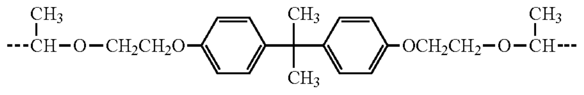

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic and examples thereof include $C_1$-$C_{20}$ alkyl groups, $C_3$-$C_{20}$ cyclic saturated hydrocarbyl groups, $C_2$-$C_{20}$ alkenyl groups, $C_3$-$C_{20}$ cyclic unsaturated aliphatic hydrocarbyl groups, and $C_6$-$C_{10}$ aryl groups. A pair of $R^{L5}$ and $R^{L6}$, $R^{L5}$ and $R^{L7}$, or $R^{L6}$ and $R^{L7}$ may bond together to form a $C_3$-$C_{20}$ aliphatic ring with the carbon atom to which they are attached.

Examples of the group having formula (AL-3) include tert-butyl, 1,1-diethylpropyl, 1-ethylnorbornyl, 1-methylcyclopentyl, 1-ethylcyclopentyl, 1-isopropylcyclopentyl, 1-methylcyclohexyl, 2-(2-methyl)adamantyl, 2-(2-ethyl)adamantyl, and tert-pentyl.

Examples of the group having formula (AL-3) also include groups having the formulae (AL-3)-1 to (AL-3)-19.

(AL-3)-1

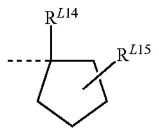

(AL-3)-2

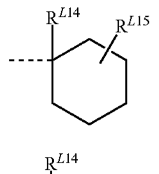

(AL-3)-3

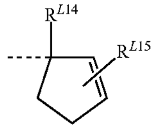

(AL-3)-4

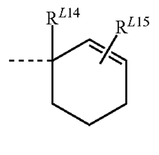

-continued (AL-3)-5

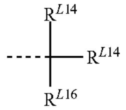

(AL-3)-6

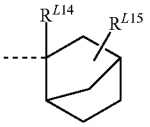

(AL-3)-7

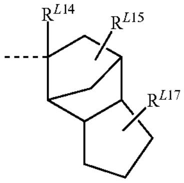

(AL-3)-8

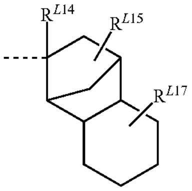

(AL-3)-9

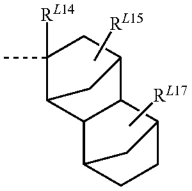

(AL-3)-10

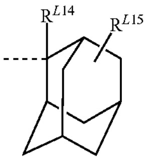

(AL-3)-11

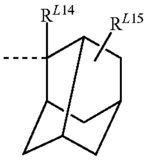

(AL-3)-12

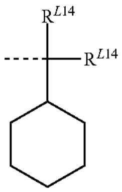

(AL-3)-13

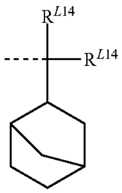

-continued (AL-3)-14

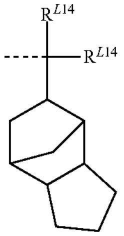

(AL-3)-15

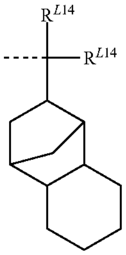

(AL-3)-16

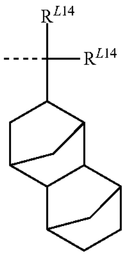

(AL-3)-17

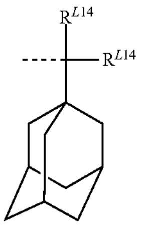

(AL-3)-18

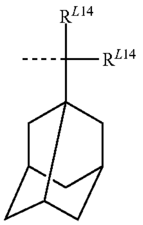

(AL-3)-19

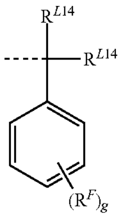

In formulae (AL-3)-1 to (AL-3)-19, $R^{L14}$ is each independently a $C_1$-$C_8$ saturated hydrocarbyl group or $C_6$-$C_{20}$ aryl group. $R^{L15}$ and $R^{L17}$ are each independently hydrogen or a $C_1$-$C_{20}$ saturated hydrocarbyl group. $R^{L16}$ is a $C_6$-$C_{20}$ aryl group. The saturated hydrocarbyl group may be straight, branched or cyclic. Typical of the aryl group is phenyl. $R^F$ is fluorine or trifluoromethyl, and g is an integer of 1 to 5.

Other examples of the group having formula (AL-3) include groups having the formulae (AL-3)-20 and (AL-3)-21. With these acid labile groups, the base polymer may be crosslinked within the molecule or between molecules.

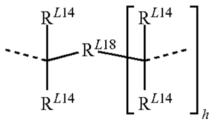

(AL-3)-20

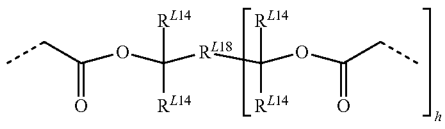

(AL-3)-21

In formulae (AL-3)-20 and (AL-3)-21, $R^{L14}$ is as defined above. $R^{L18}$ is a $C_1$-$C_{20}$ (h+1)-valent saturated hydrocarbylene group or $C_6$-$C_{20}$ (h+1)-valent arylene group, which may contain a heteroatom such as oxygen, sulfur or nitrogen. The saturated hydrocarbylene group may be straight, branched or cyclic, and h is an integer of 1 to 3.

Also included in the acid labile group represented by $R^{11}$ and $R^{12}$ are acid labile groups containing an aromatic group or multiple bond as described in JP 3832564, JP 5407892, JP 5407941, JP 5434983, JP 5463963, JP 5564293, JP 5565293, JP 5573595, JP 5655754, JP 5655755, JP 5655756, JP 5772760, JP-A 2007-279699, JP-A 2018-172640, JP-A 2019-214554, JP-A 2021-050307, and JP-A 2021-110922; and acid labile groups having a steroid structure as described in JP 6411967.

The base polymer may comprise repeat units (b) having a phenolic hydroxy group as an adhesive group. Examples of suitable monomers from which repeat units (b) are derived are given below, but not limited thereto. Herein $R^A$ is as defined above.

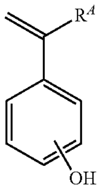
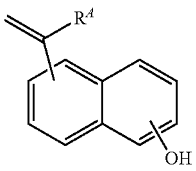
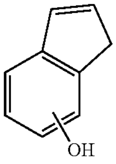

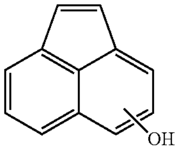
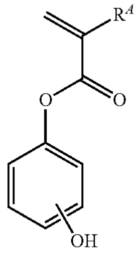
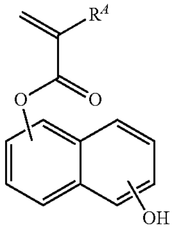

-continued

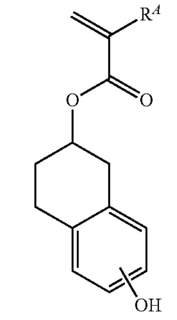
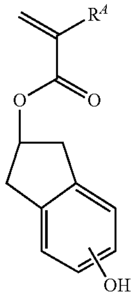
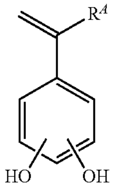

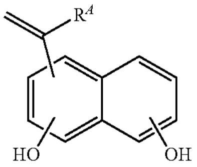
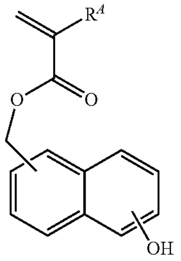
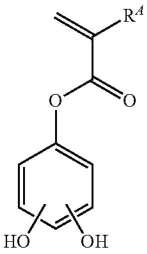

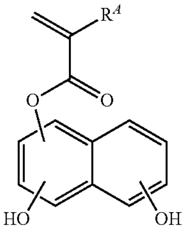
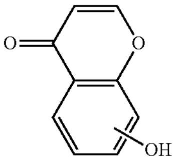

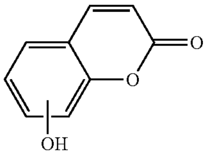
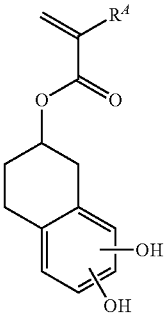
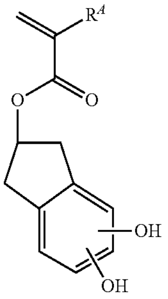

The base polymer may further comprise repeat units (c) having another adhesive group selected from hydroxy group (other than the foregoing phenolic hydroxy), lactone ring, sultone ring, ether bond, ester bond, sulfonate bond, carbonyl group, sulfonyl group, cyano group, and carboxy group. Examples of suitable monomers from which repeat units (c) are derived are given below, but not limited thereto. Herein $R^A$ is as defined above.

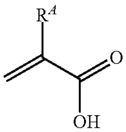
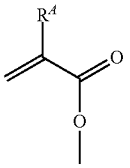
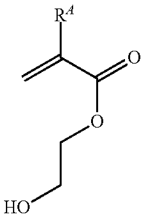

-continued
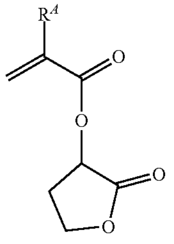
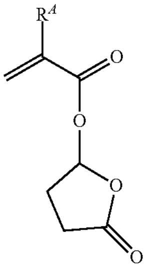
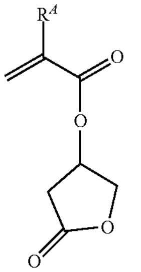
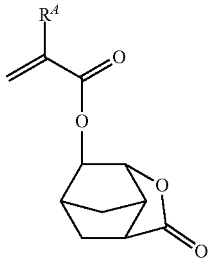
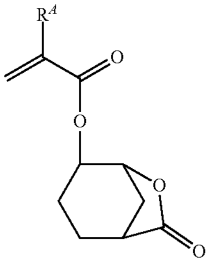
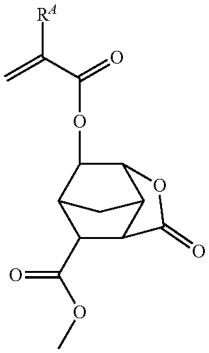
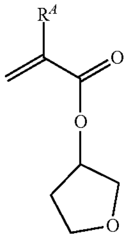
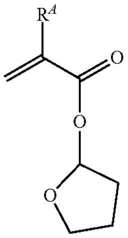
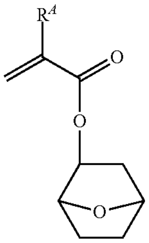
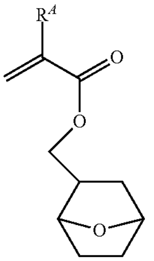
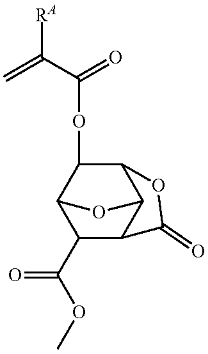
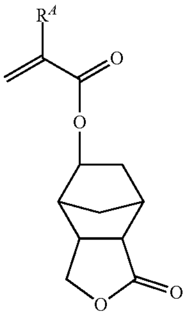
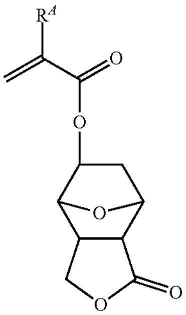
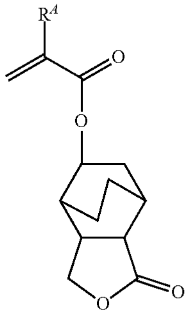
-continued
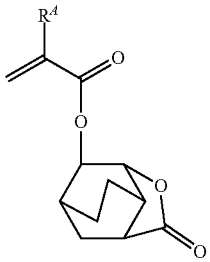
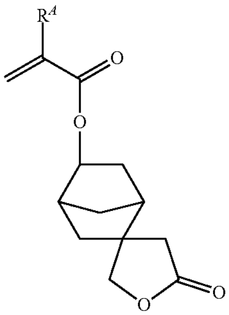
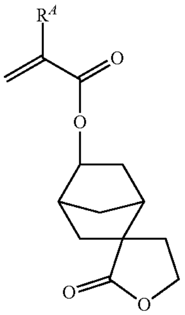
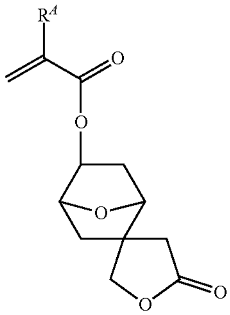
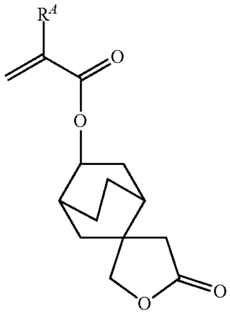
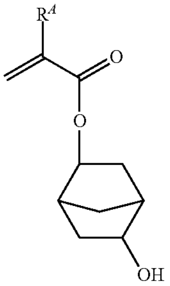
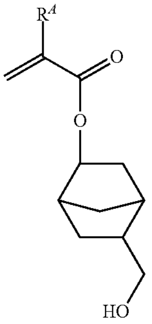
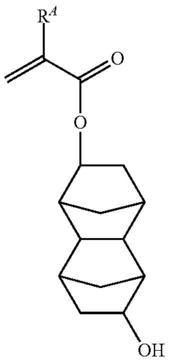
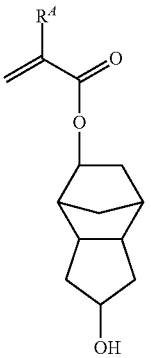
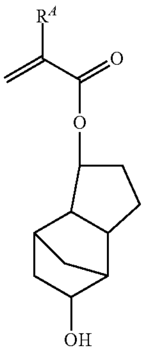

-continued
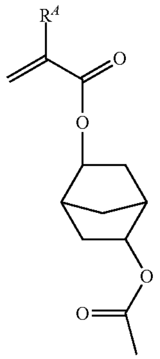
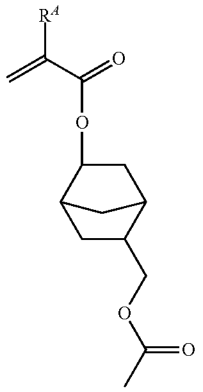
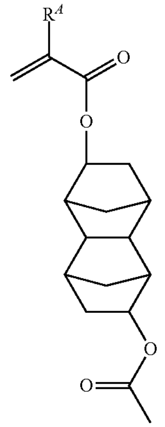
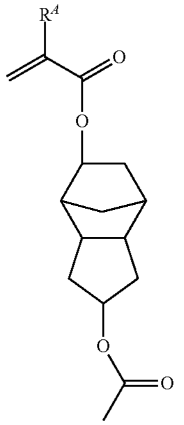
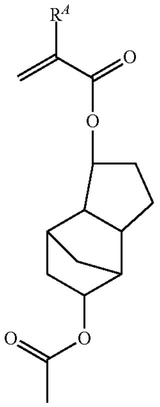
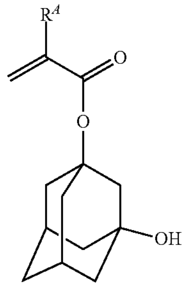
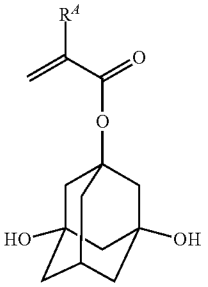
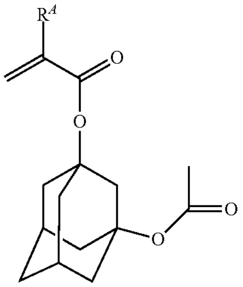
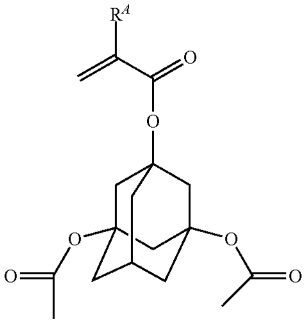
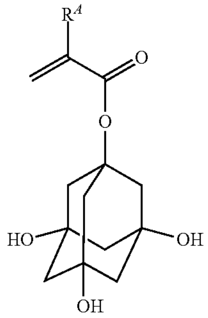
-continued
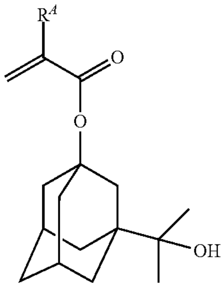
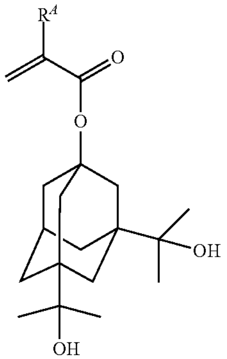
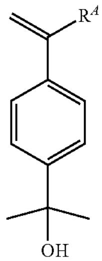
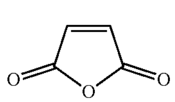
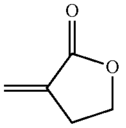
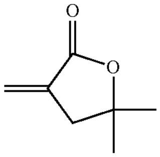
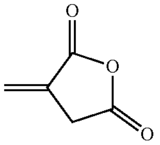
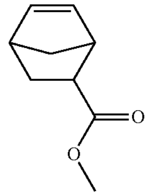
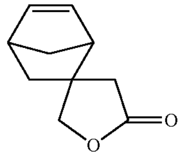
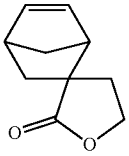
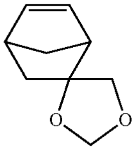
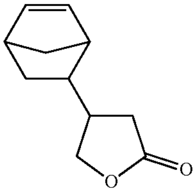
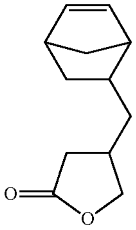
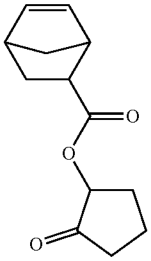
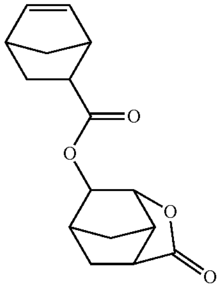
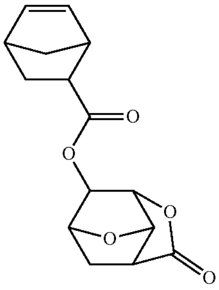
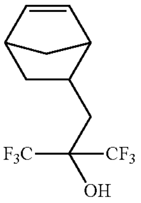
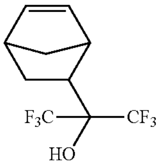
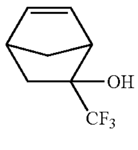
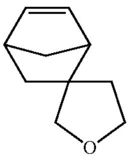
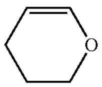

-continued
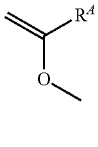
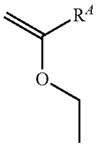
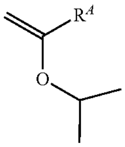
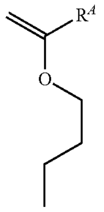
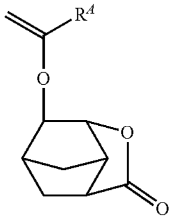
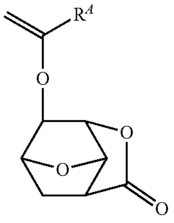
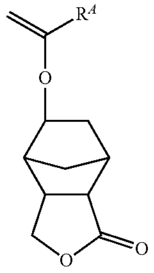
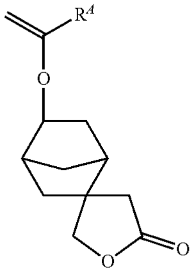
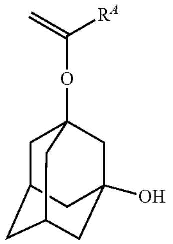
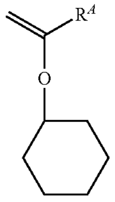
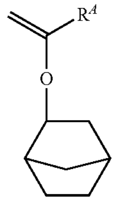
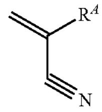
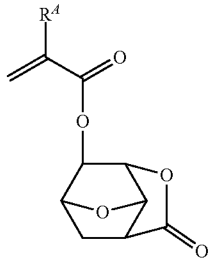
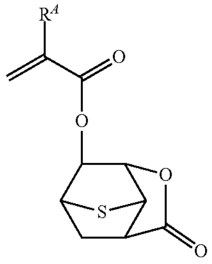
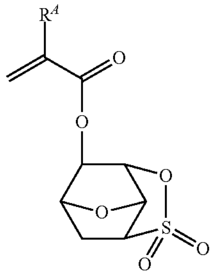
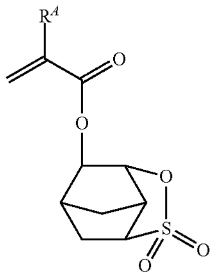
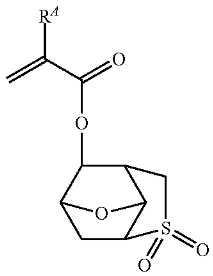
-continued
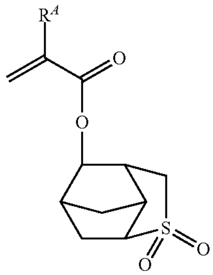
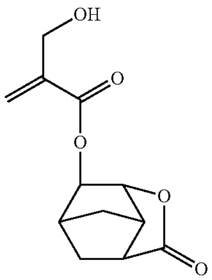
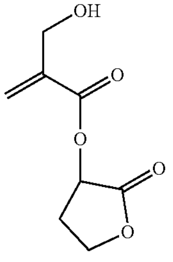
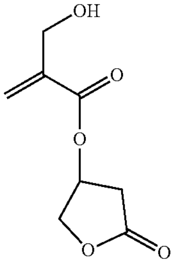
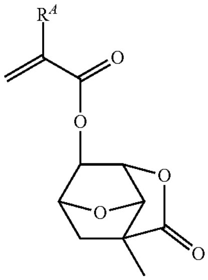
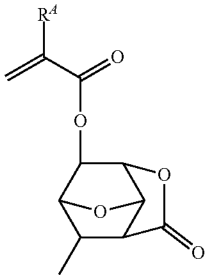
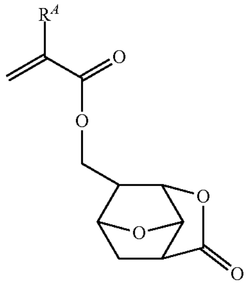
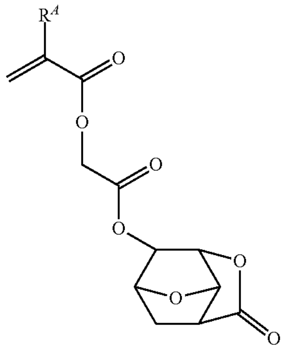
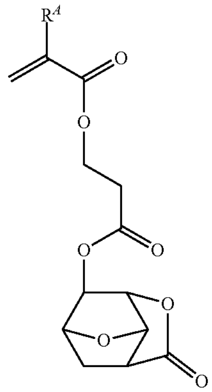
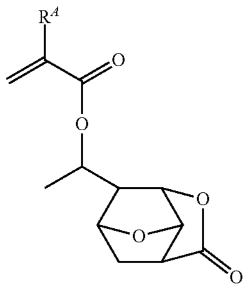
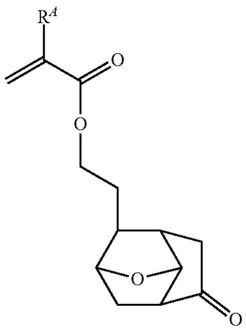

-continued
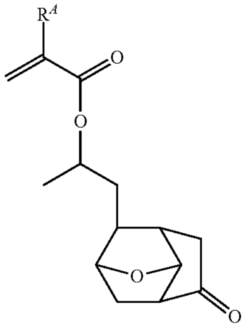
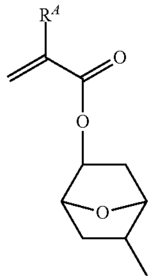
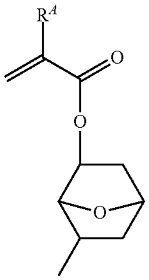
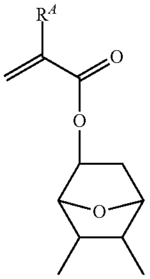
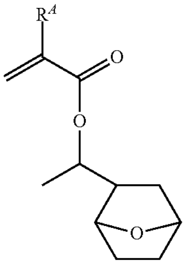
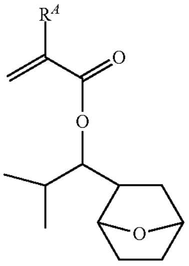
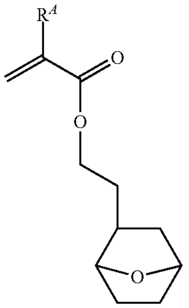
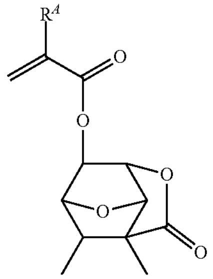
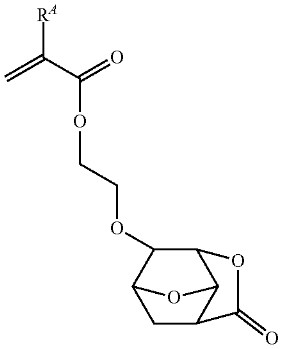
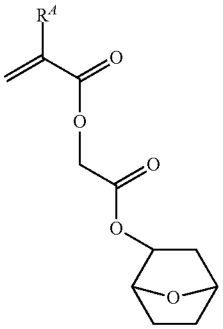
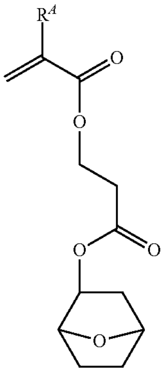
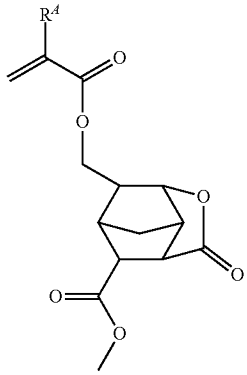
-continued
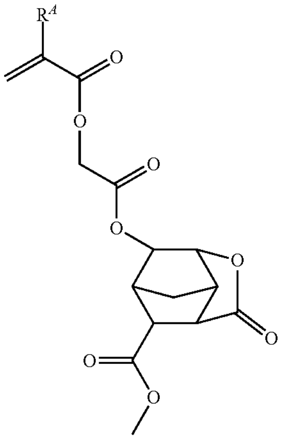
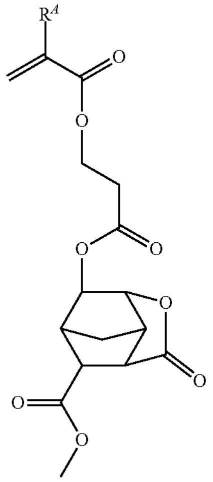
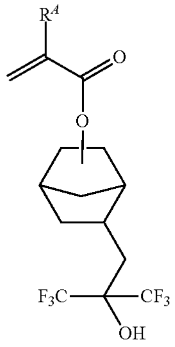
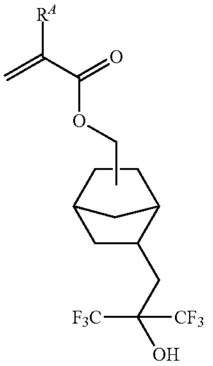
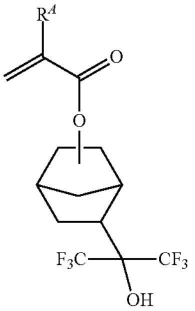
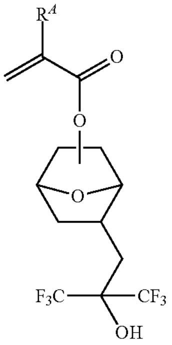
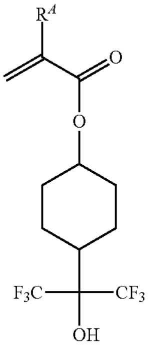
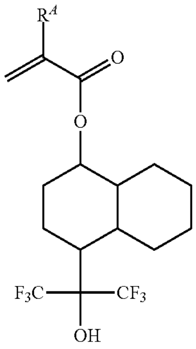
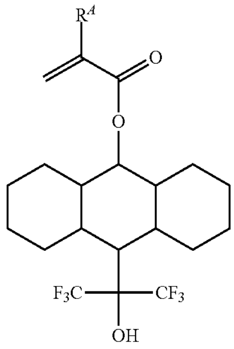

-continued
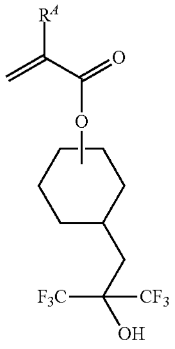
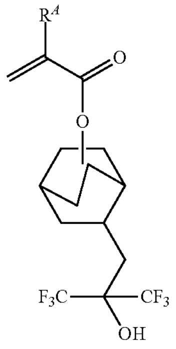
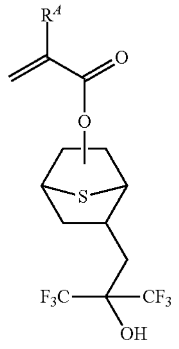
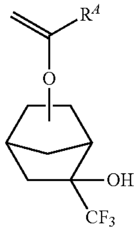
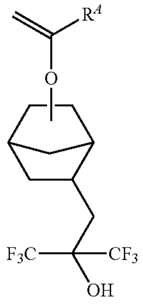
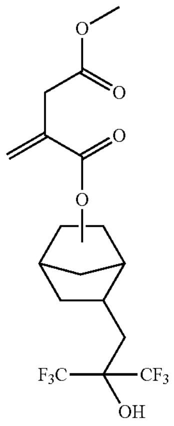
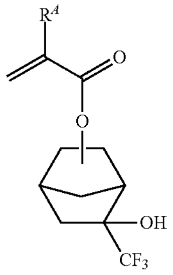
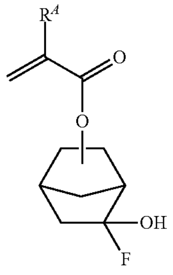
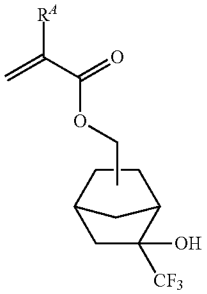
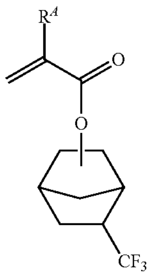
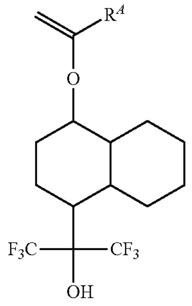
-continued
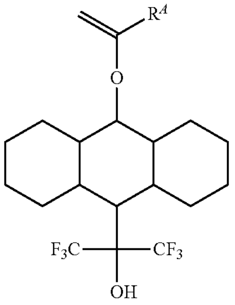
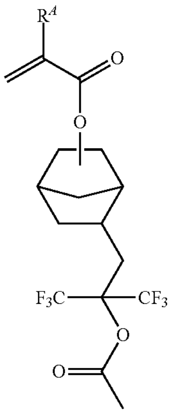
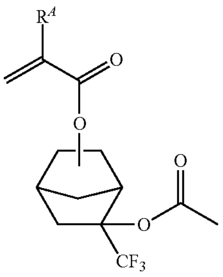
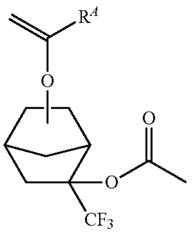
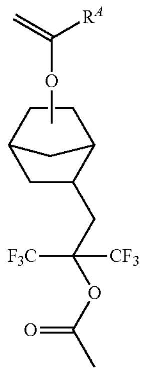
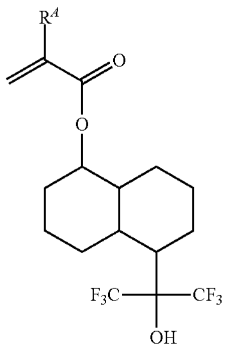
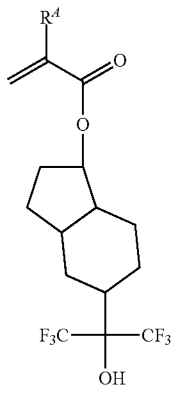
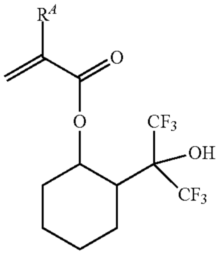
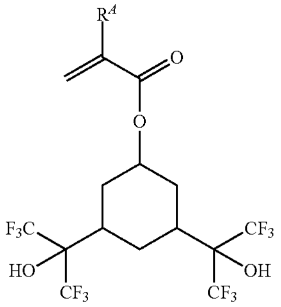

-continued
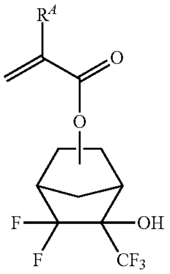
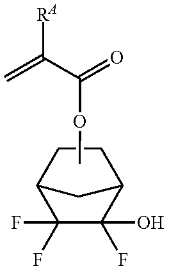
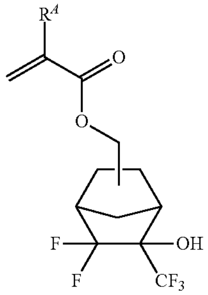
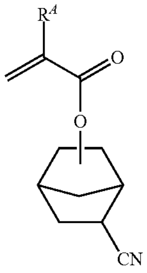
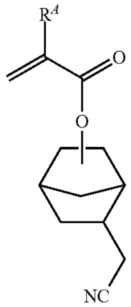
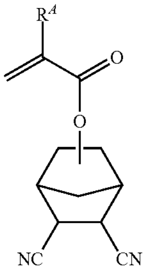
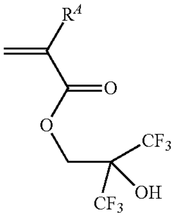
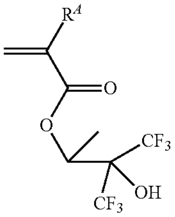
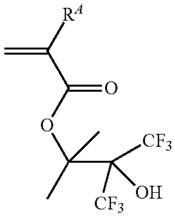
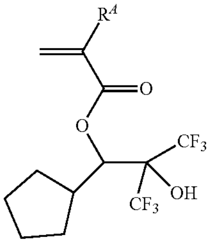
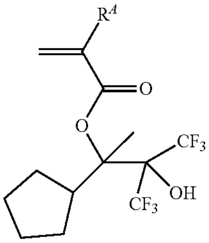
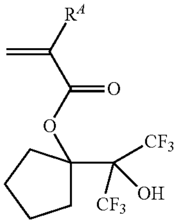
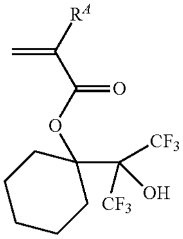
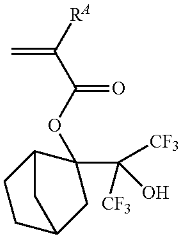
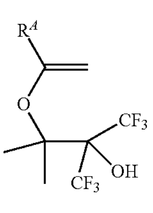
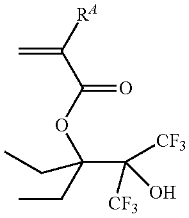
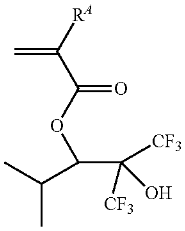
-continued
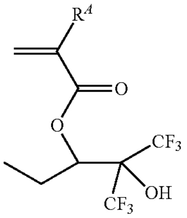
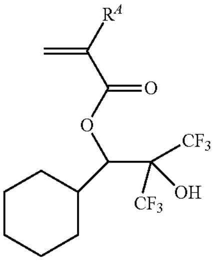
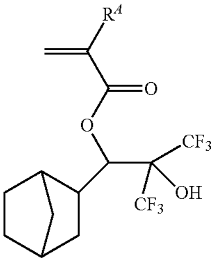
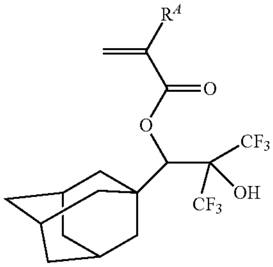
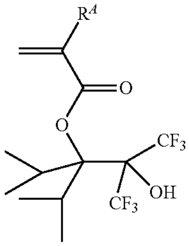
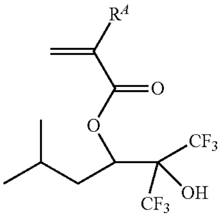
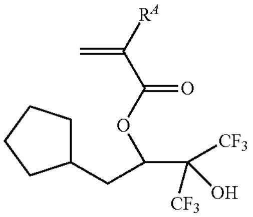
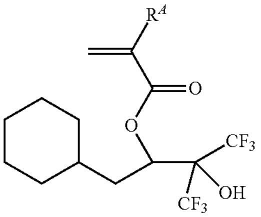
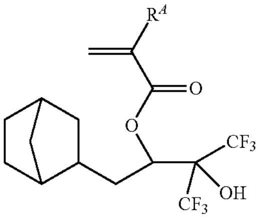
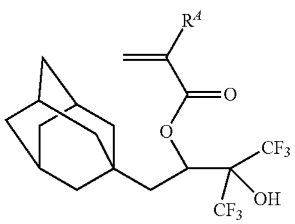
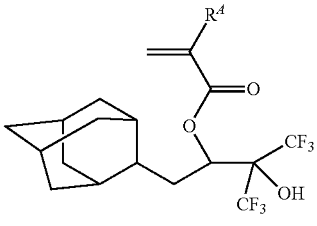
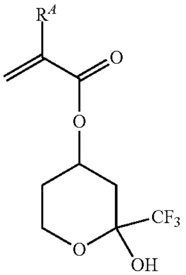

-continued
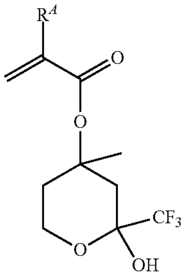
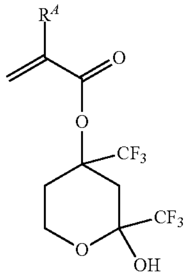
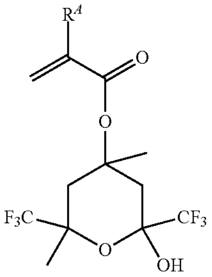
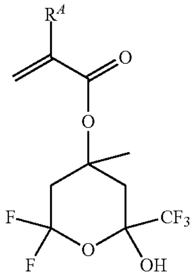
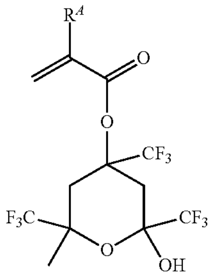
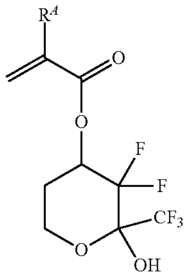
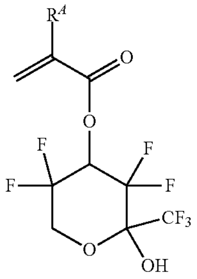
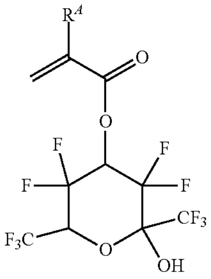
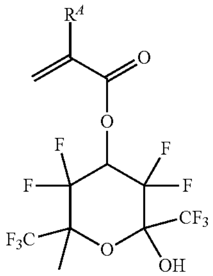
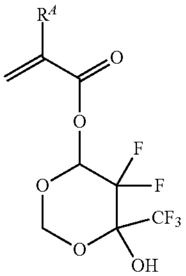
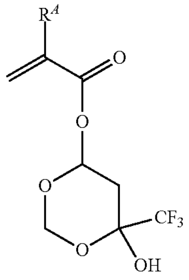
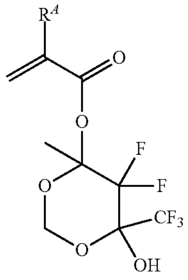
-continued
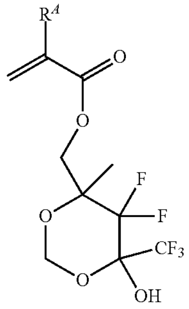
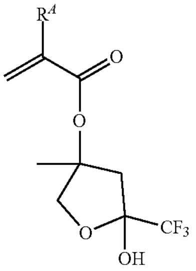
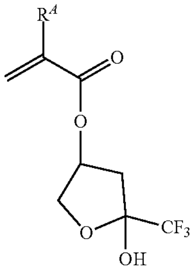
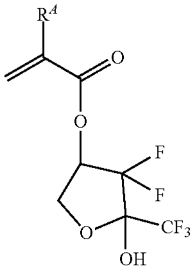
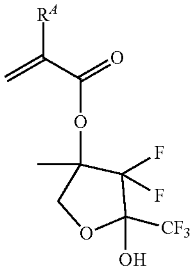
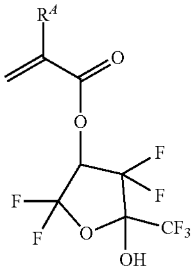
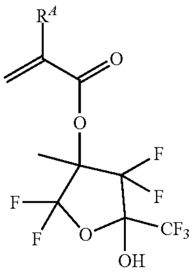
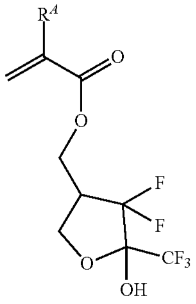
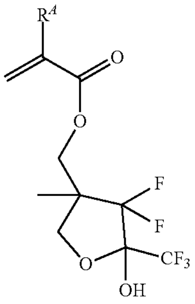
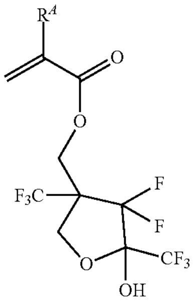
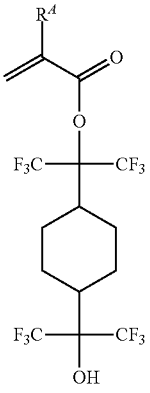

-continued
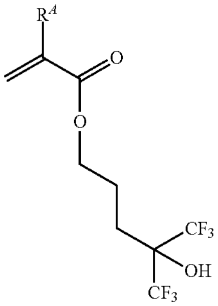
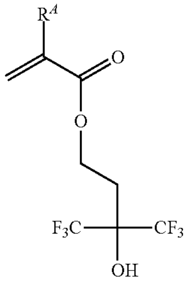
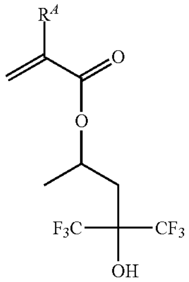
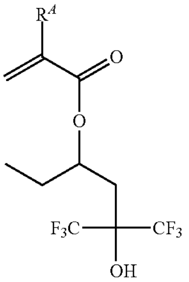
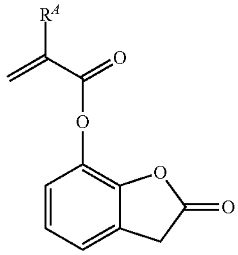
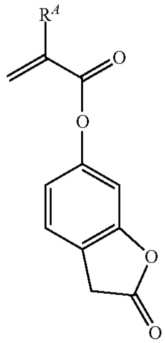
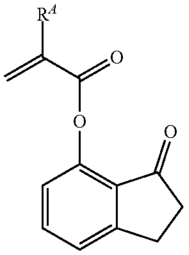
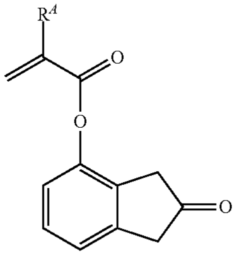
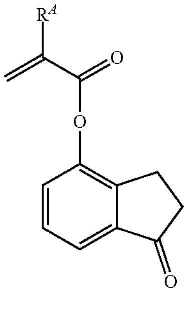
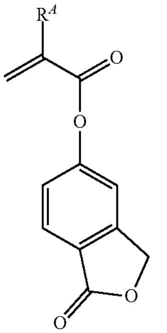
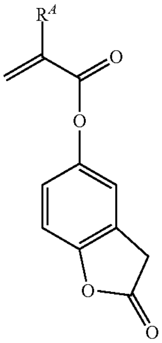
-continued
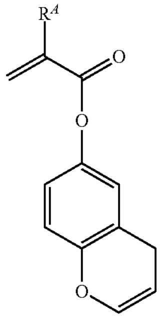
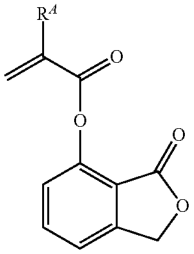
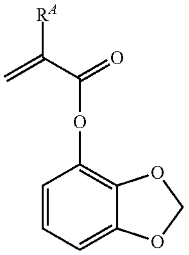
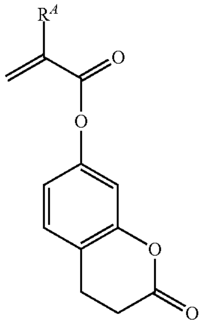
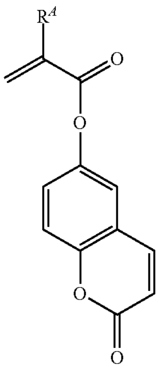
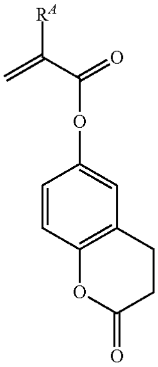
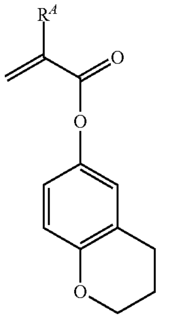
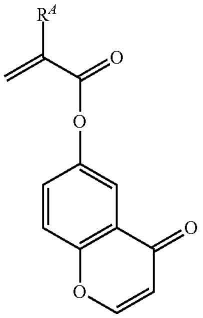
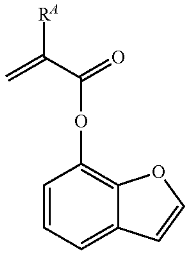
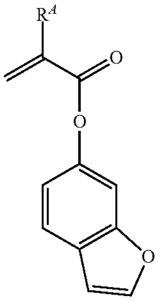
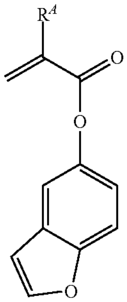
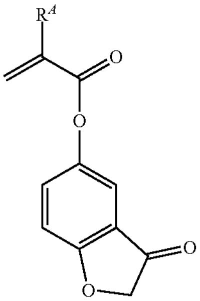
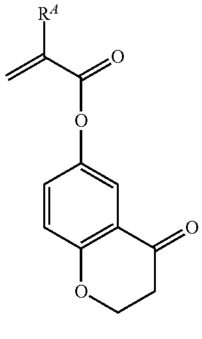
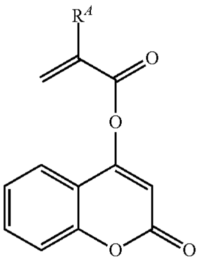

-continued
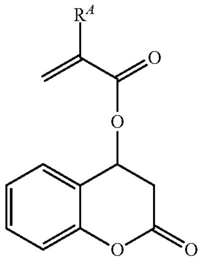
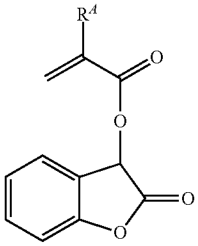
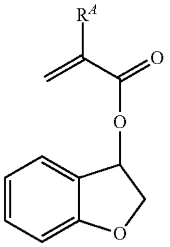
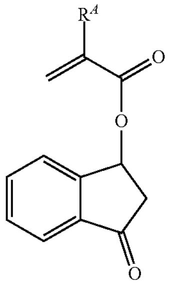
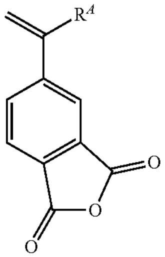
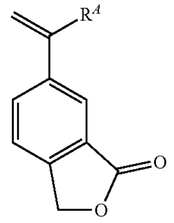
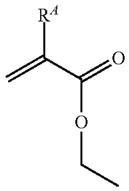
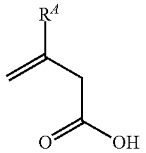
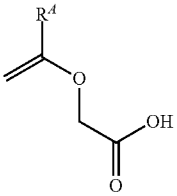
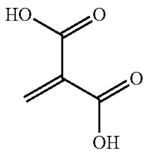
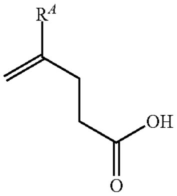
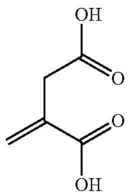
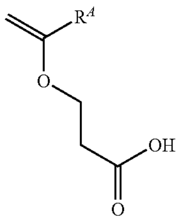
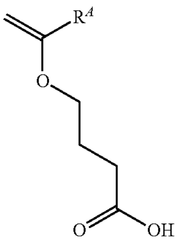
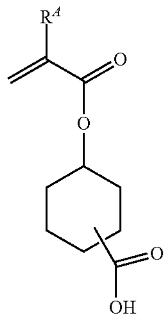
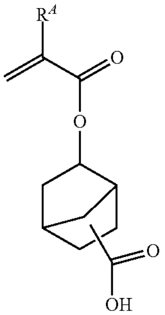
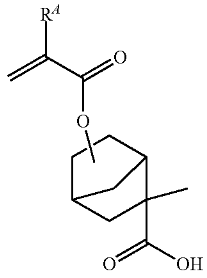
-continued
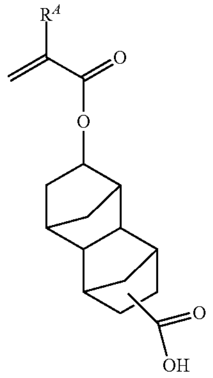
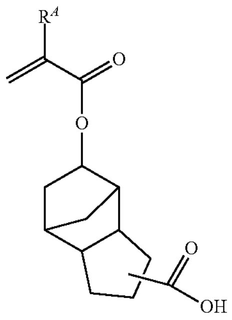
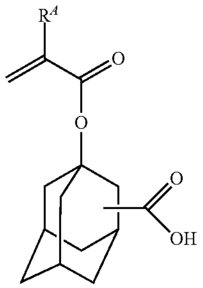
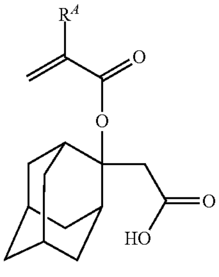
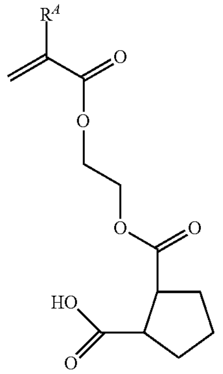
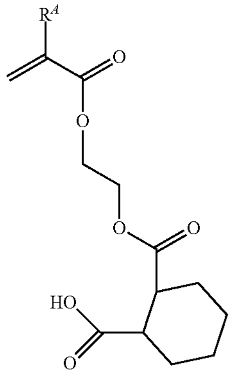
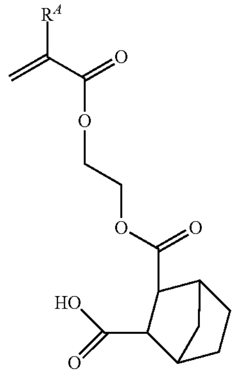
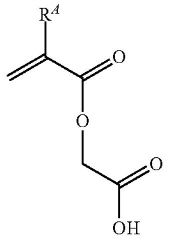
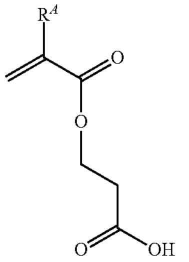
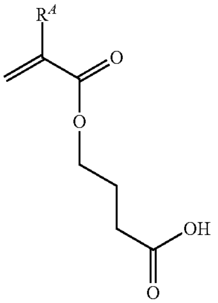
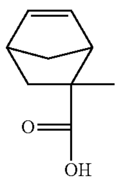

-continued

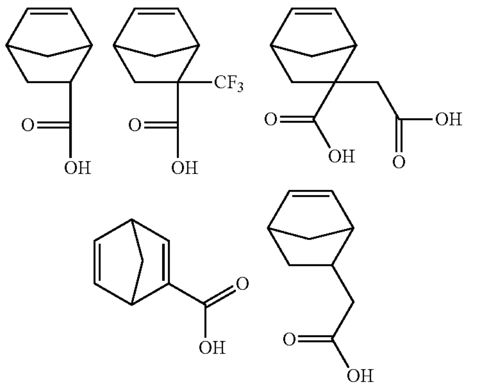

In another preferred embodiment, the base polymer may further comprise repeat units (d) derived from indene, benzofuran, benzothiophene, acenaphthylene, chromone, coumarin, and norbornadiene, or derivatives thereof. Suitable monomers are exemplified below.

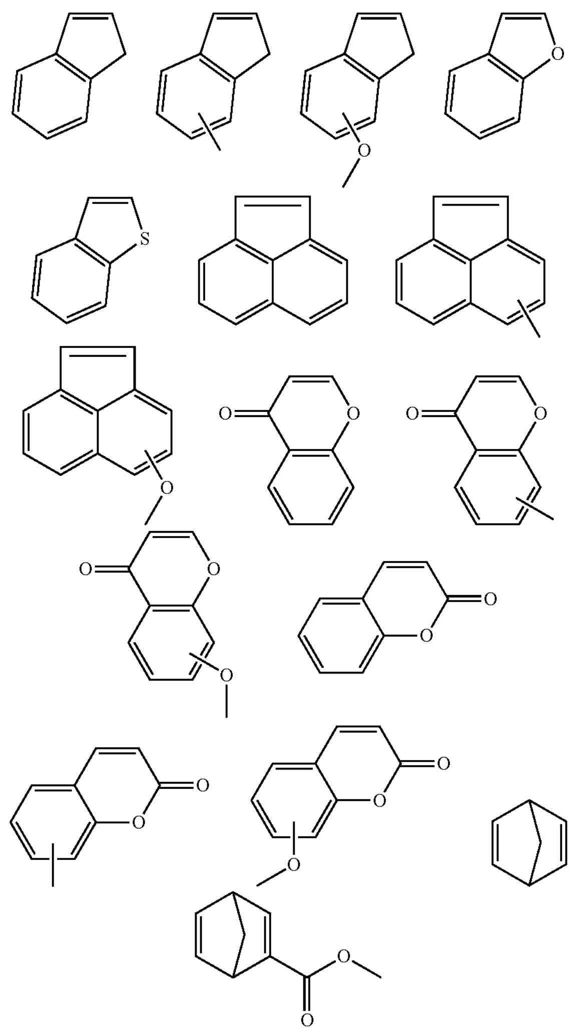

The base polymer may further comprise repeat units (e) which are derived from styrene, vinylnaphthalene, vinylanthracene, vinylpyrene, methyleneindene, vinylpyridine, vinylcarbazole, or derivatives thereof.

In a preferred embodiment, the base polymer may further comprise repeat units (f) derived from an onium salt having a polymerizable unsaturated bond. Specifically, the base polymer may comprise repeat units of at least one type selected from repeat units having formulae (f1), (f2) and (f3). These units are simply referred to as repeat units (f1), (f2) and (f3), which may be used alone or in combination of two or more types.

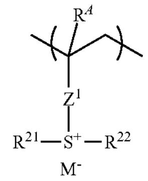

(f1)

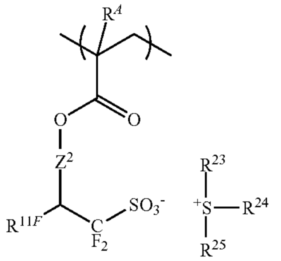

(f2)

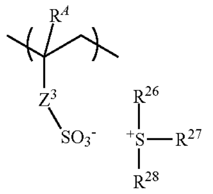

(f3)

In formulae (f1) to (f3), $R^A$ is each independently hydrogen or methyl. $Z^1$ is a single bond, $C_1$-$C_6$ aliphatic hydrocarbylene group, phenylene group, naphthylene group, or $C_7$-$C_{18}$ group obtained by combining the foregoing, —O—$Z^{11}$—, —C(═O)—O—$Z^{11}$, or —C(═O)—NH—$Z^{11}$. $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond, —$Z^{21}$—C(═)—O—, —$Z^{21}$—O— or —$Z^{21}$—O—C(═O). $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, trifluoromethyl-substituted phenylene, —O—$Z^{31}$—, —C(O)—O—$Z^{31}$—, or —C(═O)—NH—$Z^{31}$—. $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety. The aliphatic hydrocarbylene groups $Z^{11}$ and $Z^{31}$ may be saturated or unsaturated and straight, branched or cyclic. The saturated hydrocarbylene group $Z^{21}$ may be straight, branched or cyclic.

In formulae (f1) to (f3), $R^{21}$ to $R^{28}$ are each independently halogen or a $C_1$-$C_{20}$ hydrocarbyl group which may contain a heteroatom. The hydrocarbyl group may be saturated or unsaturated and straight, branched or cyclic. Examples thereof are as exemplified above for $R^{101}$ to $R^{103}$ in formula (3). In the hydrocarbyl group, some or all of the hydrogen atoms may be substituted by a moiety containing a heteroatom such as oxygen, sulfur, nitrogen or halogen, or some $—CH_2—$ may be replaced by a moiety containing a heteroatom such as oxygen, sulfur or nitrogen, so that the group may contain a hydroxy, fluorine, chlorine, bromine, iodine, cyano, nitro, mercapto, carbonyl, ether bond, ester bond, sulfonic ester bond, carbonate bond, lactone ring, sultone ring, carboxylic anhydride (—C(═O)—O—C(═O)—) or haloalkyl.

A pair of $R^{23}$ and $R^{24}$, or $R^{26}$ and $R^{27}$ may bond together to form a ring with the sulfur atom to which they are attached. Examples of the ring are as exemplified above for the ring that $R^{101}$ and $R^{102}$ in formula (3), taken together, form with the sulfur atom to which they are attached.

In formula (f2), $R^{HF}$ is hydrogen or trifluoromethyl.

In formula (f1), M is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (f1-1), sulfonate ions having fluorine substituted at α-position and trifluoromethyl at β-position as represented by the formula (f1-2), and iodized sulfonate ions as represented by the foregoing formula (5-1).

(f1-1)

$R^{31}—CF_2—SO_3^-$ (f1-2)

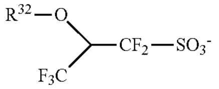

In formula (f1-1), $R^{31}$ is hydrogen, or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples of the hydrocarbyl group are as exemplified above for $R^{111}$ in formula (3A').

In formula (f1-2), $R^{32}$ is hydrogen, or a $C_1$-$C_{30}$ hydrocarbyl group or $C_2$-$C_{30}$ hydrocarbylcarbonyl group, which may contain an ether bond, ester bond, carbonyl moiety or lactone ring. The hydrocarbyl group and hydrocarbyl moiety in the hydrocarbylcarbonyl group may be saturated or unsaturated and straight, branched or cyclic. Examples of the hydrocarbyl group are as exemplified above for $R^{111}$ in formula (3A').

Examples of the cation in the monomer from which repeat unit (f1) is derived are shown below, but not limited thereto. $R^A$ is as defined above.

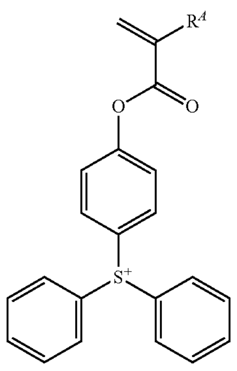
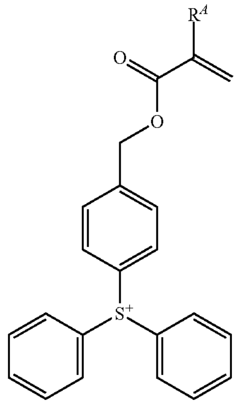
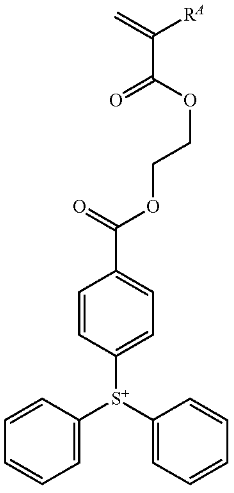
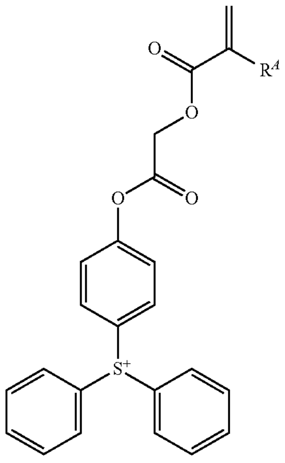
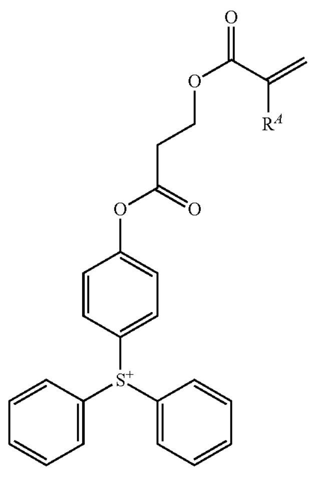
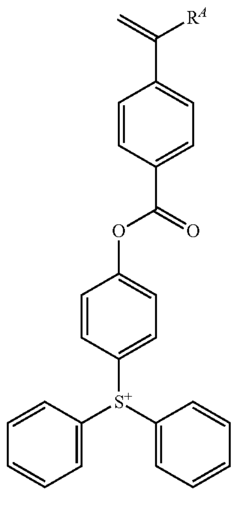

-continued
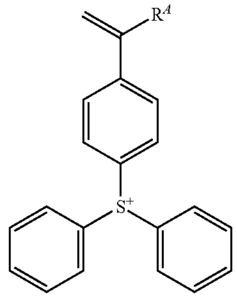
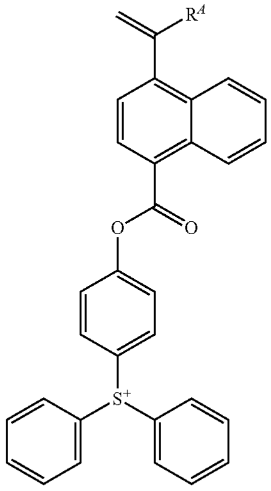
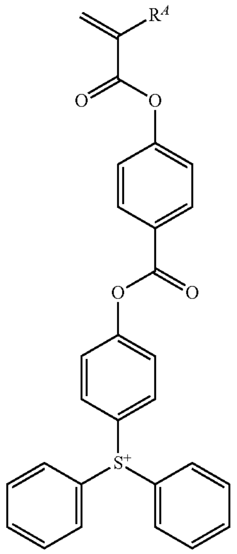
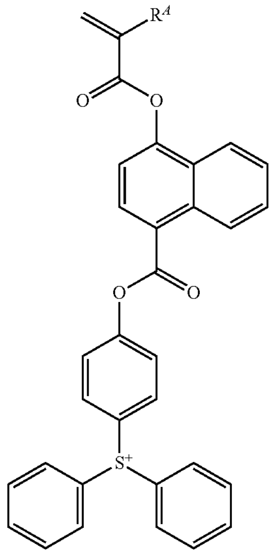
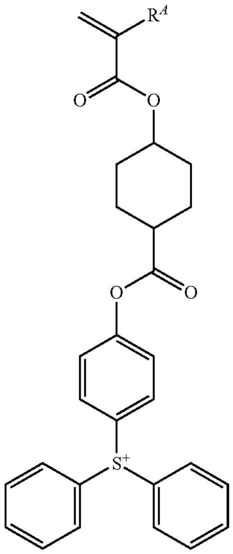
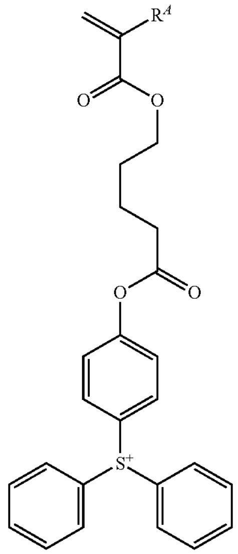
-continued
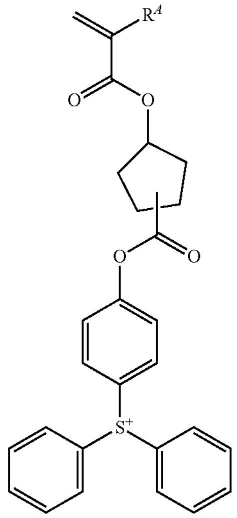
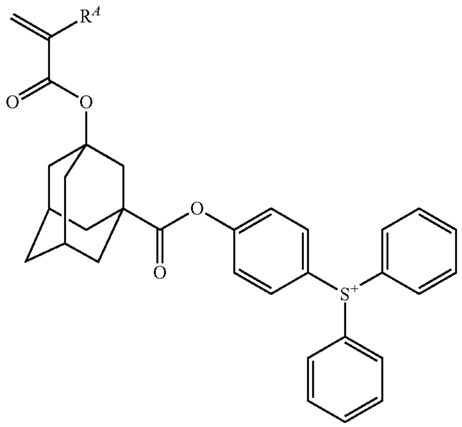
Examples of the cation in the monomer from which repeat unit (f2) or (f3) is derived are as exemplified above for the cation in the sulfonium salt having formula (3).
Examples of the anion in the monomer from which repeat unit (f2) is derived are shown below, but not limited thereto. $R^A$ is as defined above.
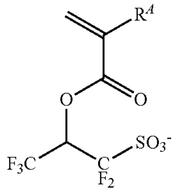
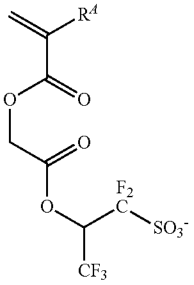

-continued
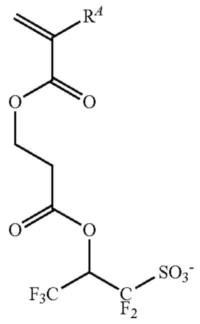
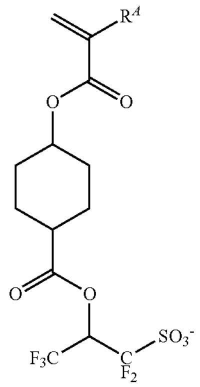
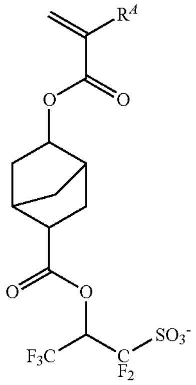
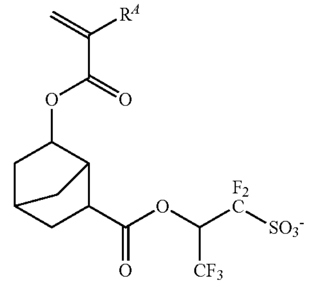
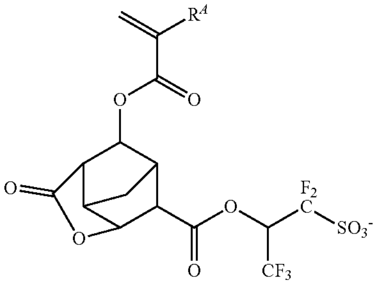
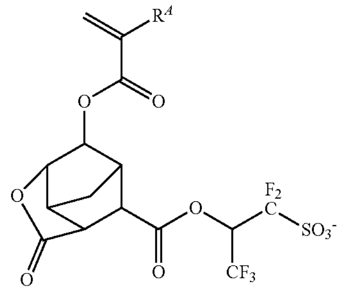
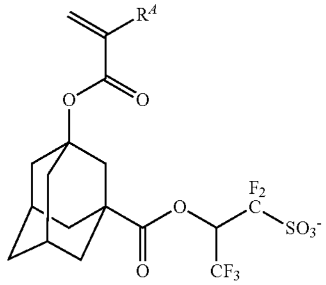
-continued
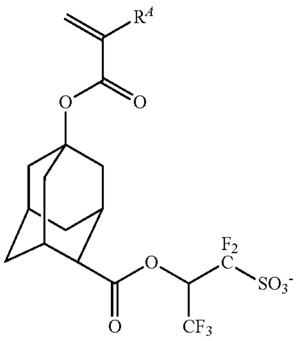
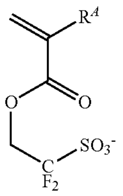
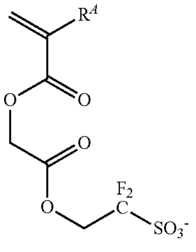
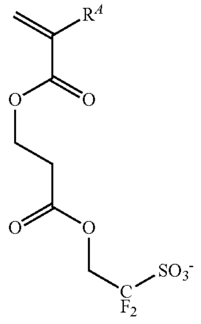
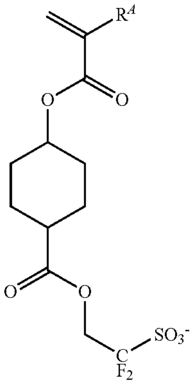
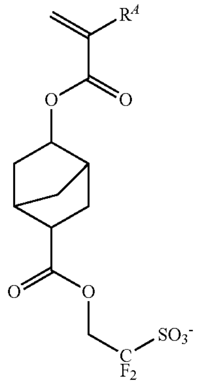
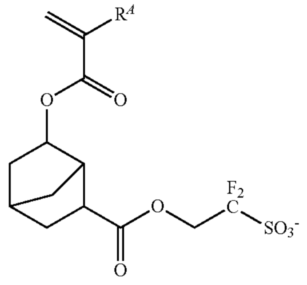
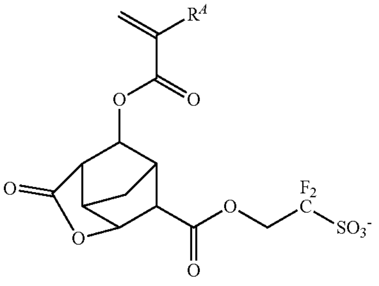

-continued
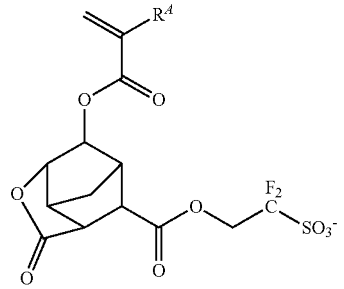
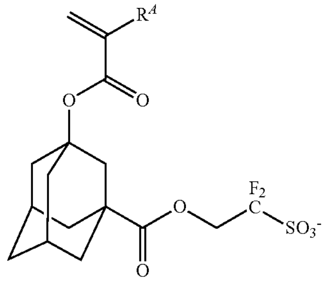
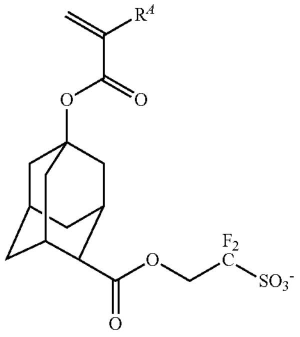
Examples of the anion in the monomer from which repeat unit (f3) is derived are shown below, but not limited thereto. $R^A$ is as defined above.
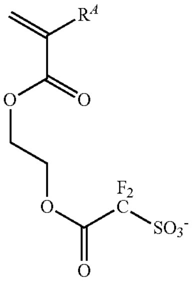
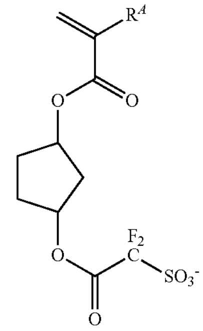
-continued
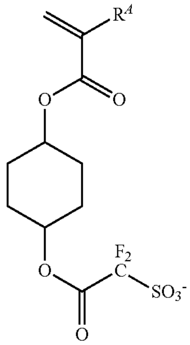
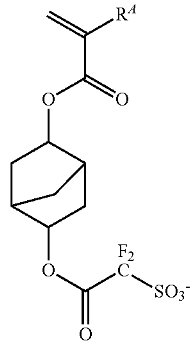
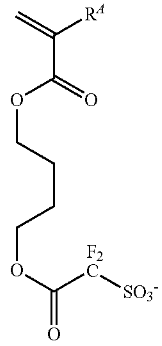
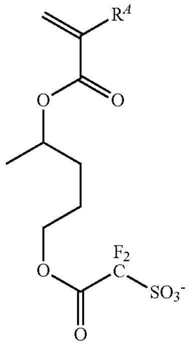
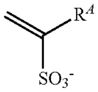
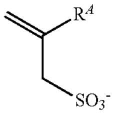
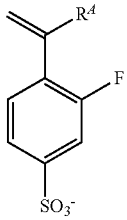
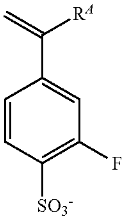
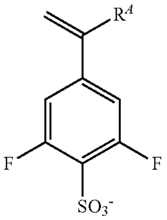
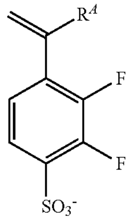
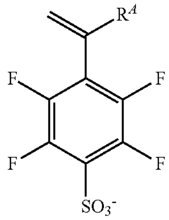
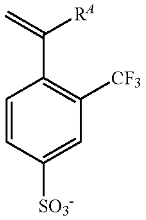
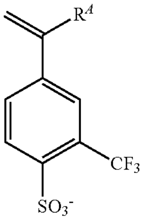
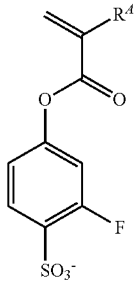
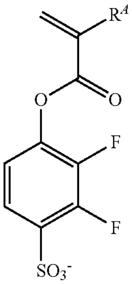
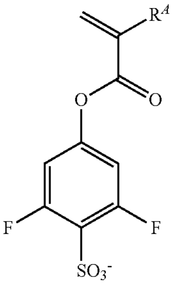
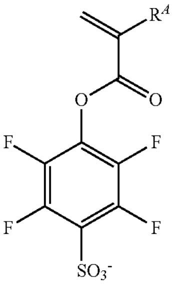

-continued

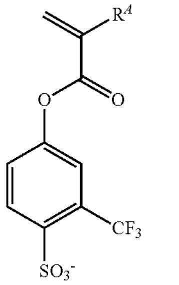

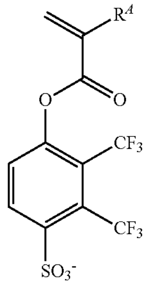

The attachment of an acid generator to the polymer main chain is effective in restraining acid diffusion, thereby preventing a reduction of resolution due to blur by acid diffusion. Also, LWR or CDU is improved since the acid generator is uniformly distributed.

When the base polymer contains repeat units (f), the base polymer also functions as an acid generator. The base polymer is integrated with the acid generator, i.e., polymer-bound acid generator. In this embodiment, the chemically amplified resist composition may or may not contain an acid generator of addition type.

The base polymer for formulating the chemically amplified positive resist composition comprises repeat units (a1) or (a2) having an acid labile group as essential component and additional repeat units (b), (c), (d), (e), and (f) as optional components. A fraction of units (a1), (a2), (b), (c), (d), (e), and (0 is: preferably 0≤a1<1.0, 0≤a2<1.0, 0<a1+a2<1.0, 0b≤0.9, 0≤c≤0.9, 0≤d≤0.8, 0≤e≤0.8, and 0≤f≤0.5; more preferably 0≤a1≤0.9, 0≤a2≤0.9, 0.1≤a1+a2≤0.9, 0≤b≤0.8, 0≤c≤0.8, 0≤d≤0.7, 0≤e≤0.7, and 0≤f≤0.4; and even more preferably 0≤a1≤0.8, 0≤a2≤0.8, 0.1≤a1+a2≤0.8, 0≤b≤0.75, 0≤c≤0.75, 0≤d≤0.6, 0≤e≤0.6, and 0≤f≤0.3. In the case of a polymer-bound acid generator, the fraction of repeat units (f) is preferably 0<f≤0.5, more preferably 0.01≤f≤0.4, even more preferably 0.02≤f≤0.3. Notably, f=f1+f2+f3, meaning that unit (f) is at least one of units (f1) to (f3), and a1+a2+b+c+d+e+f=1.0.

For the base polymer for formulating the chemically amplified negative resist composition, an acid labile group is not necessarily essential. The base polymer comprises repeat units (b), and optionally repeat units (c), (d), (e), and/or (f). A fraction of these units is: preferably 0<b≤1.0, 0≤c≤0.9, 0≤d≤0.8, 0≤e≤0.8, and 0≤f≤0.5; more preferably 0.2≤b≤1.0, 0≤c≤0.8, 0≤d≤0.7, 0≤e≤0.7, and 0≤f≤0.4; and even more preferably 0.3≤b≤1.0, 0≤c≤0.75, 0≤d≤0.6, 0≤e≤0.6, and 0≤f≤0.3. In the case of a polymer-bound acid generator, the fraction of repeat units (f) is preferably 0<f≤0.5, more preferably 0.01≤f≤0.4, even more preferably 0.02≤f≤0.3. Notably, f=f1+f2+f3, meaning that unit (0 is at least one of units (f1) to (f3), and b+c+d+e+f=1.0.

The base polymer may be synthesized by any desired methods, for example, by dissolving one or more monomers selected from the monomers corresponding to the foregoing repeat units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the reaction temperature is 50 to 80° C. and the reaction time is 2 to 100 hours, more preferably 5 to 20 hours.

Where a monomer having a hydroxy group is copolymerized, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. A Mw in the range ensures that the resist film has heat resistance and high solubility in alkaline developer.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Organic Solvent

An organic solvent may be added to the resist composition. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Other Components

With the foregoing components, other components such as a surfactant, dissolution inhibitor, crosslinker, water repellency improver, and acetylene alcohol may be blended in the resist composition.

Exemplary surfactants are described in JP-A 2008-111103, paragraphs [0165]401661 Inclusion of a surfactant may improve or control the coating characteristics of the resist composition. While the surfactant may be used alone or in admixture, it is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxy groups on the molecule, in which an average of from 0 to 100 mol % of all the hydrogen atoms on the phenolic hydroxy groups are replaced by acid labile groups or a compound having at least one carboxy group on the molecule, in which an average of 50 to 100 mol % of all the hydrogen atoms on the carboxy groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxy or carboxy group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer. The dissolution inhibitor may be used alone or in admixture.

In the case of negative resist compositions, a negative pattern may be formed by adding a crosslinker to reduce the dissolution rate of a resist film in exposed area. Suitable crosslinkers include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyloxy group. These compounds may be used as an additive or introduced into a polymer side chain as a pendant. Hydroxy-containing compounds may also be used as the crosslinker.

Examples of the epoxy compound include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyloxy group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the embodiment wherein the chemically amplified resist composition is negative and contains a crosslinker, the crosslinker is preferably added in an amount of 0.1 to 50 parts, more preferably 1 to 40 parts by weight per 100 parts by weight of the base polymer. The crosslinker may be used alone or in admixture.

To the resist composition, a water repellency improver may also be added for improving the water repellency on surface of a resist film. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as repeat units may serve as the water repellency improver and is effective for preventing evaporation of acid during PEB, thus preventing any hole pattern opening failure after development. An appropriate amount of the water repellency improver is 0 to parts, more preferably 0.5 to 10 parts by weight per 100 parts by weight of the base polymer. The water repellency improver may be used alone or in admixture.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer. The acetylene alcohol may be used alone or in admixture.

Pattern Forming Process

The chemically amplified resist composition is used in the fabrication of various integrated circuits. Pattern formation using the resist composition may be performed by well-known lithography processes. The process generally involves the steps of applying the resist composition onto a substrate to form a resist film thereon, exposing the resist film to high-energy radiation, and developing the exposed resist film in a developer. If necessary, any additional steps may be added.

Specifically, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.1 to 2 μm thick.

The resist film is then exposed to a desired pattern of high-energy radiation such as UV, deep-UV, EB, EUV of wavelength 3 to 15 nm, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto directly or through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 100 $\mu C/cm^2$, more preferably about 0.5 to 50 $\mu C/cm^2$. It is appreciated that the inventive resist composition is suited in micropatterning using i-line of wavelength 365 nm, KrF excimer laser, ArF excimer laser, EB, EUV, x-ray, soft x-ray, γ-ray or synchrotron radiation.

The exposure may be performed by conventional lithography whereas the immersion lithography of holding a liquid having a refractive index of at least 1.0, typically water between the projection lens and the resist film may be employed if desired. In this case, a protective film which is insoluble in water may be applied on the resist film.

After the exposure, the resist film may be baked (PEB) on a hot plate or in an oven at 60 to 150° C. for 10 seconds to 30 minutes, preferably at 80 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetabutylammonium hydroxide (TBAH). In the case of positive resist, the resist film in the exposed area is dissolved in the developer whereas the resist film in the unexposed area is not dissolved. In this way, the desired positive pattern is formed on the substrate. Inversely in the case of negative resist, the exposed area of resist film is to insolubilized whereas the unexposed area is dissolved in the developer.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexene, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, tert-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Quenchers Q-1 to Q-27 having the structure shown below were used in chemically amplified resist compositions.

Q-1

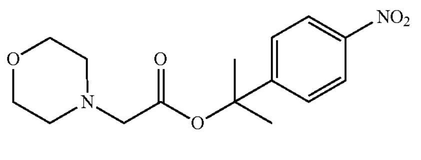

-continued
Q-2
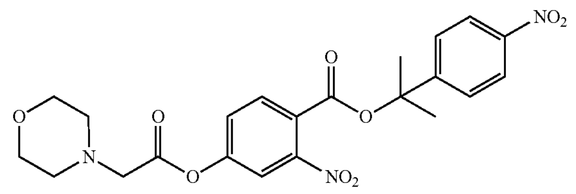
Q-3
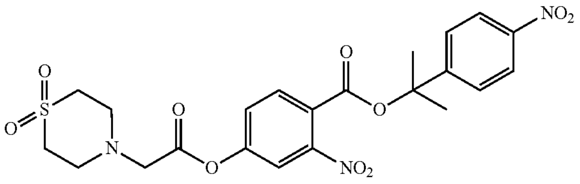
Q-4
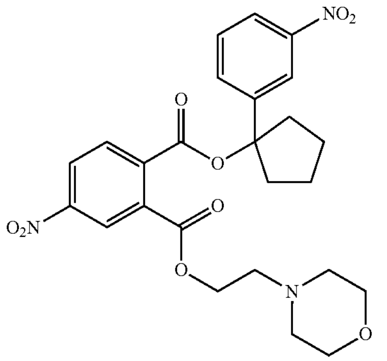
Q-5
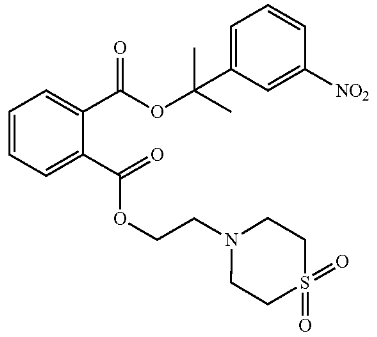
Q-6
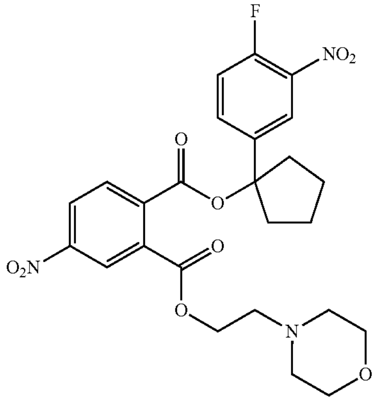
-continued
Q-7
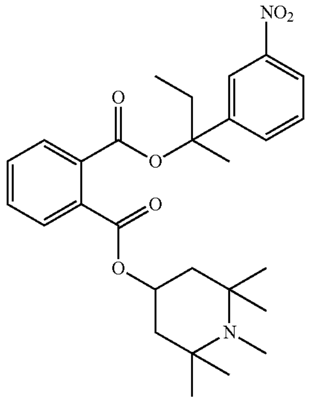
Q-8
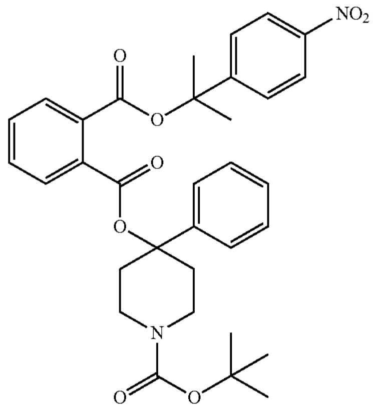
Q-9
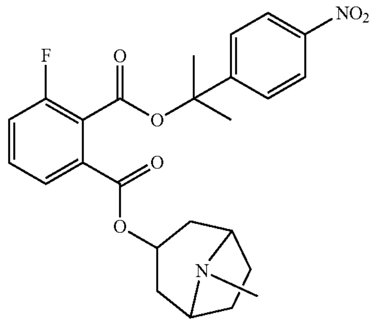
Q-10
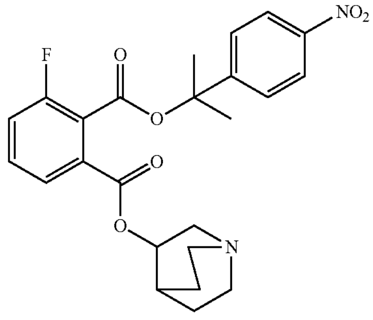

-continued
Q-11
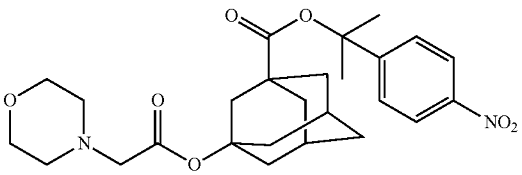
Q-12
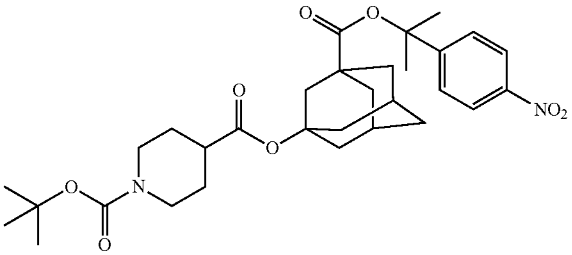
Q-13
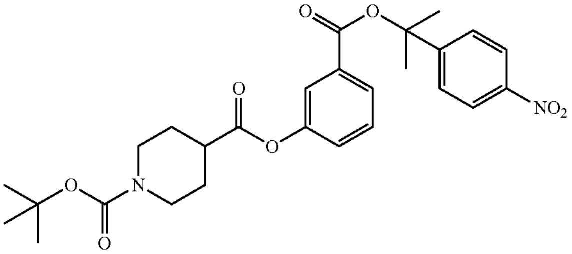
Q-14
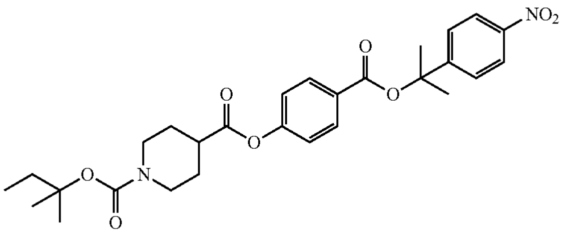
Q-15
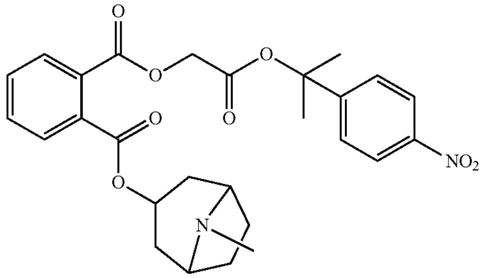
Q-16
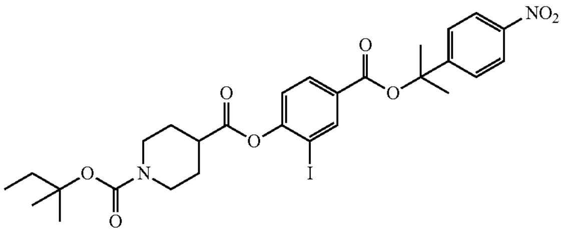
-continued
Q-17
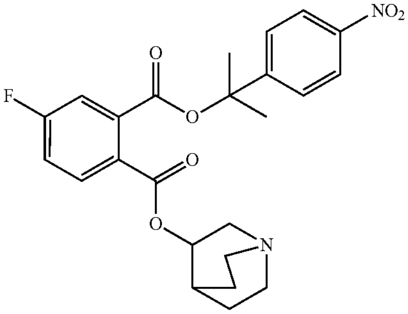
Q-18
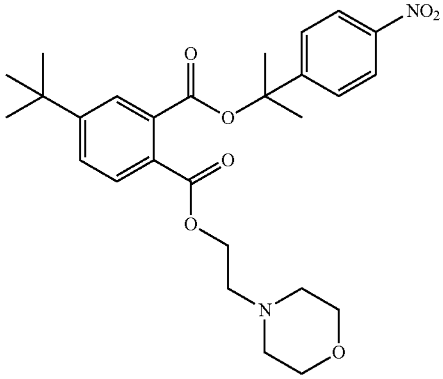
Q-19
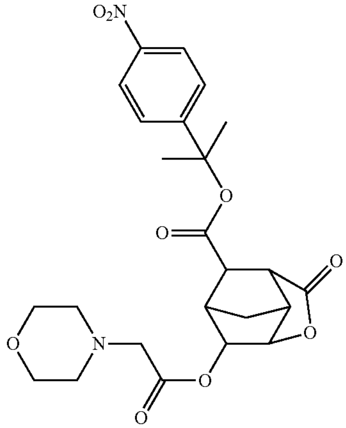
Q-20
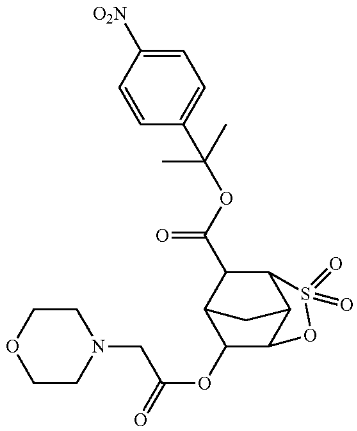

-continued

Q-21

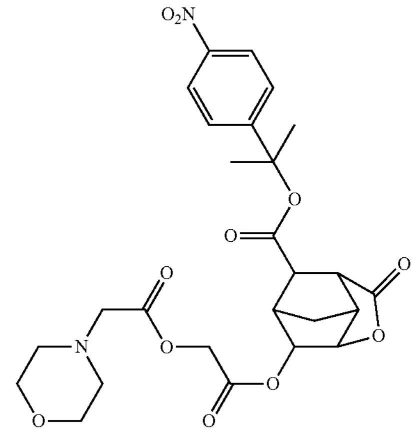

Q-22

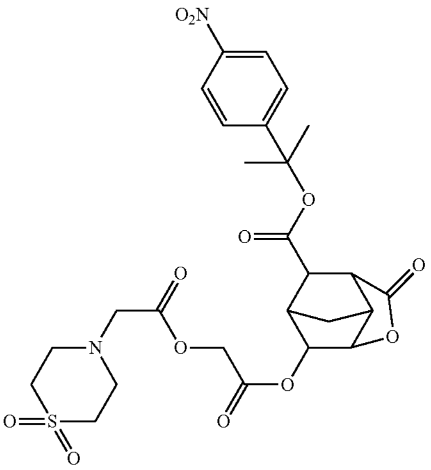

Q-23

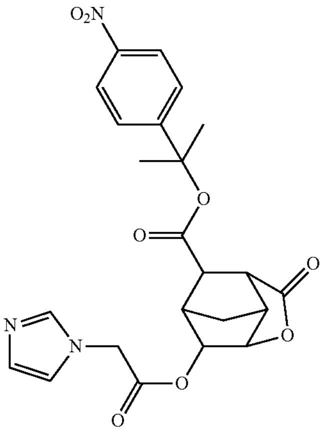

-continued

Q-24

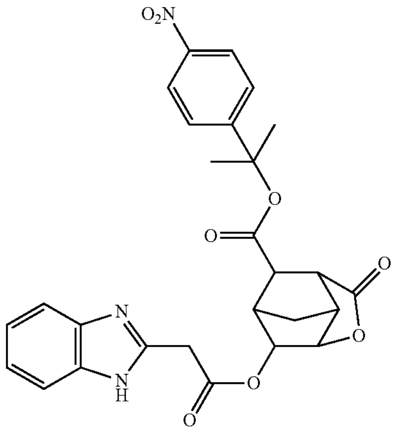

Q-25

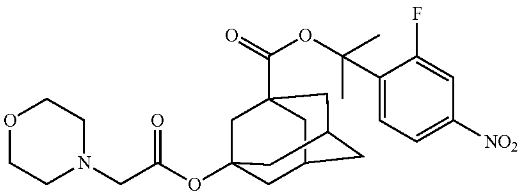

Q-26

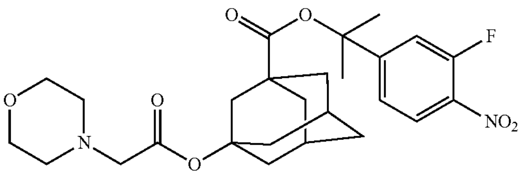

Q-27

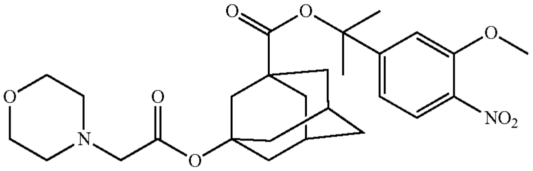

Synthesis Example

Synthesis of Base Polymers P-1 to P-3

Each of base polymers P-1 to P-3 was prepared by combining suitable monomers, effecting copolymerization reaction thereof in tetrahydrofuran (THF) solvent, pouring the reaction solution into methanol for precipitation, washing the precipitate with hexane, isolation, and drying. The resulting polymer was analyzed for composition by $^1$H-NMR spectroscopy and for Mw and Mw/Mn by GPC versus polystyrene standards using THF solvent.

P-1

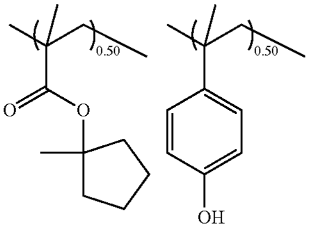

Mw = 4,600
Mw/Mn = 1.44

P-2

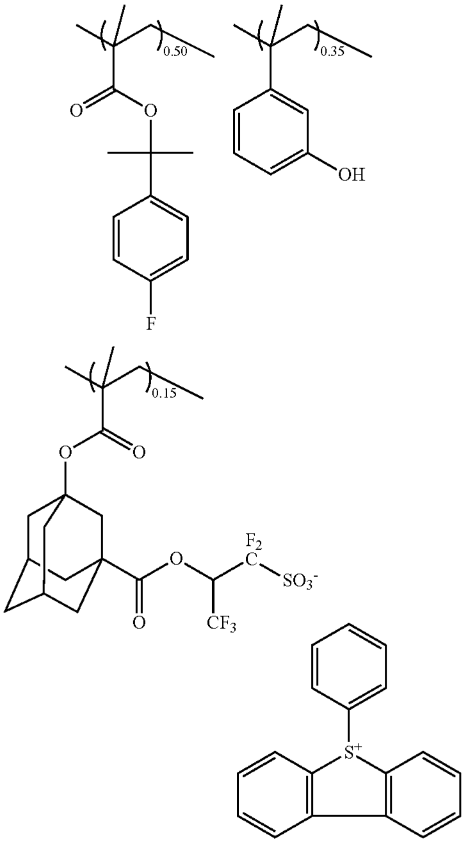

Mw = 8,300
Mw/Mn = 1.81

P-3

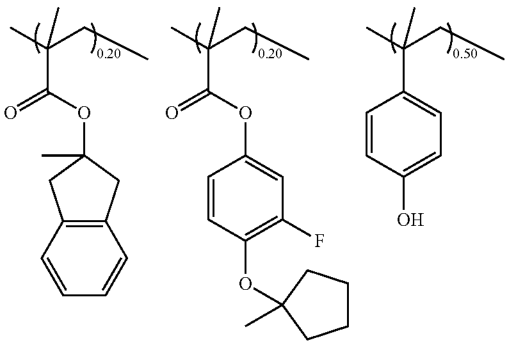

-continued

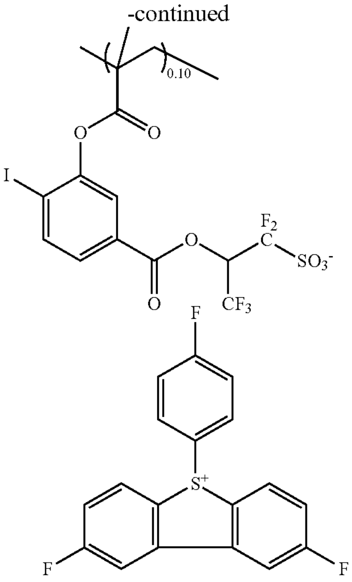

Mw = 7,900
Mw/Mn = 1.76

Examples 1 to 29 and Comparative Examples 1 to 3

(1) Preparation of Resist Compositions

Chemically amplified resist compositions were prepared by dissolving various components in a solvent in accordance with the recipe shown in Tables 1 to 3, and filtering through a filter having a pore size of 0.2 sun.

The components in Tables 1 to 3 are as identified below.

Organic Solvent:

PGMEA (propylene glycol monomethyl ether acetate)

DAA (diacetone alcohol)

EL (L form of ethyl lactate)

Acid Generator: PAG-1 to PAG-3

PAG-1

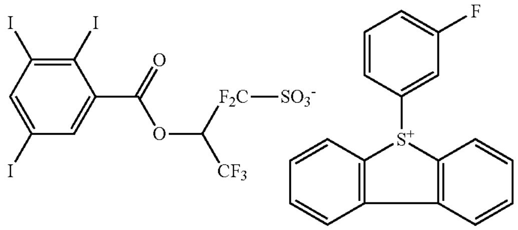

PAG-2

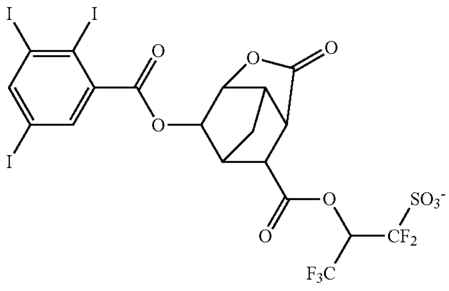

-continued

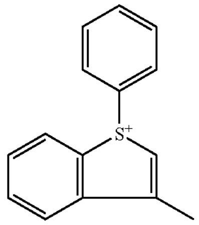

PAG-3

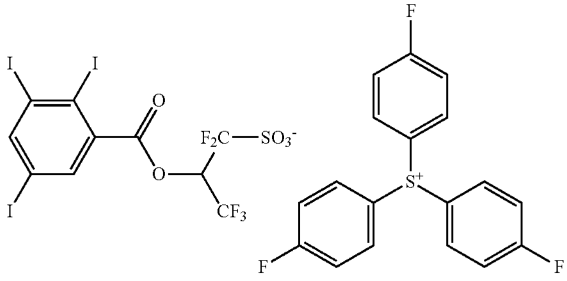

Comparative Quencher: cQ-1 to cQ-3 cQ-1

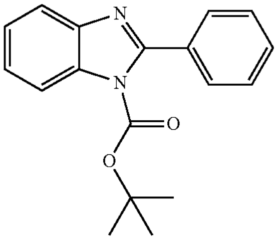

cQ-2

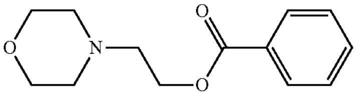

cQ-3

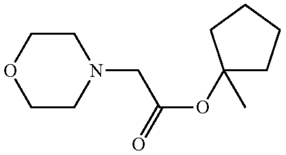

Blend Quencher: bQ-1 to bQ-4 bQ-1

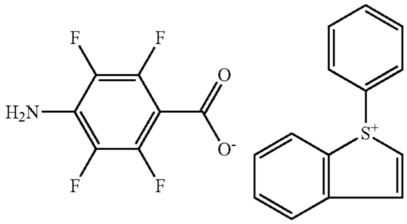

-continued bQ-2

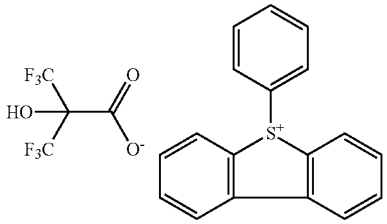

bQ-3

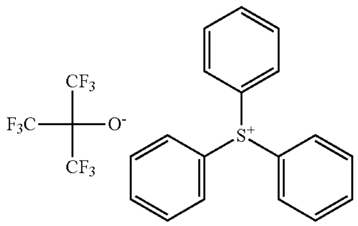

bQ-4

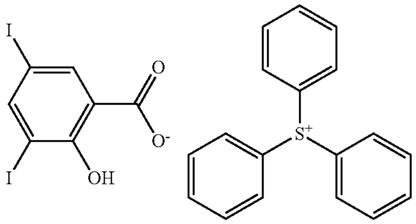

(2) EUV Lithography Test

Each of the resist compositions in Tables 1 to 3 was spin coated on a silicon substrate having a 20-nm coating of silicon-containing spin-on hard mask SHB-A940 (Shin-Etsu Chemical Co., Ltd., Si content 43 wt %) and prebaked on a hotplate at 100° C. for 60 seconds to form a resist film of 50 nm thick. Using an EUV scanner NXE3400 (ASML, NA 0.33, σ 0.9/0.6, quadrupole illumination), the resist film was exposed to EUV through a mask bearing a hole pattern at a pitch 44 nm (on-wafer size) and +20% bias. The resist film was baked (PEB) on a hotplate at the temperature shown in Tables 1 to 3 for 60 seconds and developed in a 2.38 wt % TMAH aqueous solution for 30 seconds to form a hole pattern having a size of 22 nm.

The resist pattern was observed under CD-SEM (CG6300, Hitachi High-Technologies Corp.). The exposure dose that provides a hole pattern having a size of 22 nm is reported as sensitivity. The size of 50 holes printed at that dose was measured, from which a 3-fold value (3σ) of the standard deviation (σ) was computed and reported as CDU.

The resist compositions are shown in Tables 1 to 3 together with the sensitivity and CDU of EUV lithography.

TABLE 1

| Example | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|
| 1 | P-1 (100) | PAG-1 (24.8) | Q-1 (1.54) bQ-1 (2.10) | EL (3,000) DAA (500) | 90 | 30 | 3.2 |
| 2 | P-1 (100) | PAG-2 (27.9) | Q-2 (2.37) bQ-2 (2.10) | PGMEA (3,000) DAA (500) | 90 | 36 | 3.3 |
| 3 | P-1 (100) | PAG-3 (25.7) | Q-3 (2.38) bQ-3 (2.49) | PGMEA (3,000) DAA (500) | 90 | 32 | 2.9 |
| 4 | P-1 (100) | PAG-3 (25.7) | Q-4 (2.56) bQ-4 (3.26) | PGMEA (3,000) DAA (500) | 90 | 31 | 2.8 |
| 5 | P-1 (100) | PAG-3 (25.7) | Q-5 (2.45) bQ-1 (2.10) | PGMEA (3,000) DAA (500) | 90 | 28 | 2.8 |
| 6 | P-1 (100) | PAG-3 (25.7) | Q-6 (2.65) bQ-1 (2.10) | PGMEA (3,000) DAA (500) | 90 | 31 | 2.7 |
| 7 | P-1 (100) | PAG-3 (25.7) | Q-7 (2.48) bQ-1 (2.10) | PGMEA (3,000) DAA (500) | 90 | 28 | 2.7 |
| 8 | P-1 (100) | PAG-3 (25.7) | Q-8 (2.94) bQ-1 (2.10) | PGMEA (3,000) DAA (500) | 90 | 29 | 2.8 |
| 9 | P-1 (100) | PAG-3 (25.7) | Q-9 (2.35) bQ-1 (2.10) | PGMEA (3,000) DAA (500) | 90 | 29 | 2.9 |
| 10 | P-1 (100) | PAG-3 (25.7) | Q-10 (2.19) bQ-1 (2.10) | PGMEA (3,000) DAA (500) | 90 | 27 | 2.6 |
| 11 | P-1 (100) | PAG-3 (25.7) | Q-11 (2.43) bQ-1 (2.10) | PGMEA (3,000) DAA (500) | 90 | 29 | 2.8 |
| 12 | P-1 (100) | PAG-3 (25.7) | Q-12 (5.70) | PGMEA (3,000) DAA (500) | 90 | 27 | 2.9 |
| 13 | P-1 (100) | PAG-3 (25.7) | Q-13 (2.56) bQ-1 (2.10) | PGMEA (3,000) DAA (500) | 90 | 26 | 2.8 |
| 14 | P-1 (100) | PAG-3 (25.7) | Q-14 (2.63) bQ-1 (2.10) | PGMEA (3,000) DAA (500) | 90 | 27 | 2.7 |
| 15 | P-1 (100) | PAG-3 (25.7) | Q-15 (2.55) bQ-1 (2.10) | PGMEA (3,000) DAA (500) | 90 | 28 | 2.9 |

TABLE 2

| Example | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|
| 16 | P-1 (100) | PAG-3 (25.7) | Q-16 (6.38) | PGMEA (3,000) DAA (500) | 90 | 26 | 2.9 |
| 17 | P-1 (100) | PAG-3 (25.7) | Q-17 (2.28) bQ-1 (2.10) | PGMEA (3,000) DAA (500) | 90 | 30 | 2.7 |
| 18 | P-1 (100) | PAG-3 (25.7) | Q-18 (2.49) bQ-1 (2.10) | PGMEA (3,000) DAA (500) | 90 | 27 | 2.9 |
| 19 | P-2 (100) | — | Q-18 (2.49) bQ-1 (2.10) | PGMEA (3,000) DAA (500) | 95 | 28 | 2.4 |
| 20 | P-3 (100) | — | Q-18 (2.49) bQ-1 (2.10) | PGMEA (3,000) DAA (500) | 95 | 27 | 2.5 |
| 21 | P-1 (100) | PAG-3 (25.7) | Q-19 (2.44) bQ-1 (2.10) | PGMEA (3,000) DAA (500) | 90 | 29 | 2.7 |
| 22 | P-1 (100) | PAG-3 (25.7) | Q-20 (2.62) bQ-1 (2.10) | PGMEA (3,000) DAA (500) | 90 | 29 | 2.7 |
| 23 | P-1 (100) | PAG-3 (25.7) | Q-21 (2.73) bQ-1 (2.10) | PGMEA (3,000) DAA (500) | 90 | 28 | 2.6 |
| 24 | P-1 (100) | PAG-3 (25.7) | Q-22 (2.97) bQ-1 (2.10) | PGMEA (3,000) DAA (500) | 90 | 28 | 2.7 |
| 25 | P-1 (100) | PAG-3 (25.7) | Q-23 (2.35) bQ-1 (2.10) | PGMEA (3,000) DAA (500) | 90 | 29 | 2.6 |
| 26 | P-1 (100) | PAG-3 (25.7) | Q-24 (2.60) bQ-1 (2.10) | PGMEA (3,000) DAA (500) | 90 | 30 | 2.7 |
| 27 | P-1 (100) | PAG-3 (25.7) | Q-25 (2.52) bQ-1 (2.10) | PGMEA (3,000) DAA (500) | 90 | 29 | 2.7 |
| 28 | P-1 (100) | PAG-3 (25.7) | Q-26 (2.52) bQ-1 (2.10) | PGMEA (3,000) DAA (500) | 90 | 29 | 2.6 |
| 29 | P-1 (100) | PAG-3 (25.7) | Q-27 (2.58) bQ-1 (2.10) | PGMEA (3,000) DAA (500) | 90 | 30 | 2.8 |

TABLE 3

| Comparative Example | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|
| 1 | P-1 (100) | PAG-2 (27.9) | cQ-1 (2.94) | PGMEA (3,000) DAA (500) | 90 | 34 | 4.8 |
| 2 | P-1 (100) | PAG-2 (27.9) | cQ-2 (2.35) | PGMEA (3,000) DAA (500) | 90 | 33 | 4.3 |
| 3 | P-1 (100) | PAG-2 (27.9) | cQ-3 (2.27) | PGMEA (3,000) DAA (500) | 90 | 33 | 4.7 |

It is demonstrated in Tables 1 to 3 that chemically amplified resist compositions comprising a compound having a nitro-substituted aromatic moiety-containing acid labile group and a heterocyclic amine structure in its molecule offer a high sensitivity and excellent CDU.

Japanese Patent Application No. 2022-038122 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a quencher and an acid generator, said quencher comprising a compound having an acid labile group containing a nitro-substituted aromatic moiety and a heterocyclic amine structure in its molecule, wherein the compound has the formula (1) or (2):

(1)

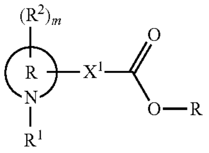

(2)

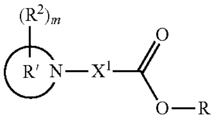

wherein m is 1 or 2, the circle R is a $C_3$-$C_{12}$ heterocycle containing the nitrogen atom in the formula, which may contain at least one moiety selected from an ether bond, ester bond, sulfide bond, sulfonyl moiety, and —N═, and $R^1$ and a carbon atom in the ring may bond together to form a bridged ring, the circle R' is a $C_3$-$C_{12}$ heterocycle containing the nitrogen atom in the formula, which may contain at least one moiety selected from an ether bond, ester bond, sulfide bond, sulfonyl moiety, —N═, and —N($R^1$)—, $R^1$ is hydrogen, a $C_1$-$C_6$ saturated hydrocarbyl group, acetyl, methoxycarbonyl, ethoxycarbonyl, n-propyloxycarbonyl, isopropyloxycarbonyl, tert-butoxycarbonyl, tert-entyloxycarbonyl, methylcyclopentyloxycarbonyl, ethylcyclopentyloxycarbonyl, propylcyclopentyloxycarbonyl, phenyl, benzyl, naphthyl, naphtylmethyl, methylcyclohexyloxycarbonyl, ethylcyclohexyloxycarbonyl, 9-fluorenylmethyloxycarbonyl, allyloxycarbonyl, methoxymethyl, ethoxymethyl, propoxymethyl, or butoxymethyl, $R^2$ is hydrogen, halogen, a $C_1$-$C_6$ saturated hydrocarbyl group or phenyl group, some or all of the hydrogen atoms in the saturated hydrocarbyl group and phenyl group may be substituted by halogen, $X^1$ is a single bond, or a $C_1$-$C_{20}$ saturated hydrocarbylene group, $C_6$-$C_{12}$ arylene group, $C_7$-$C_{14}$ alkenylene group or group obtained by combining the foregoing, the saturated hydrocarbylene group, arylene group, alkenylene group or group obtained by combining the foregoing may contain at least one moiety selected from an ether bond, ester bond, sulfide, cyano, nitro, sulfonyl, sultone ring, lactone ring and halogen, R is a group having the formula (R):

(R)

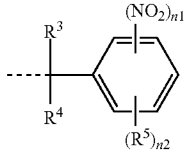

wherein n1 is 1 or 2, and n2 is an integer of 0 to 3, $R^3$ and $R^4$ are each independently a $C_1$-$C_{10}$ aliphatic hydrocarbyl group which may contain a heteroatom, $R^3$ and $R^4$ may bond together to form a ring with the carbon atom to which they are attached, $R^5$ is hydrogen, halogen, $C_1$-$C_6$ alkyl group, $C_1$-$C_6$ alkoxy group or $C_1$-$C_6$ acyloxy group, and the broken line designates a valence bond.

2. The resist composition of claim 1 wherein the acid generator is capable of generating a sulfonic acid, imide acid or methide acid.

3. The resist composition of claim 1, further comprising a base polymer.

4. The resist composition of claim 3 wherein the base polymer comprises repeat units having the formula (a1) or repeat units having the formula (a2):

(a1)

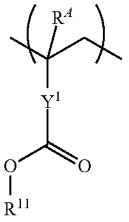

-continued (a2)

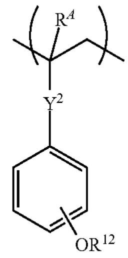

wherein $R^A$ is each independently hydrogen or methyl, $R^{11}$ and $R^{12}$ are each independently an acid labile group, $Y^1$ is a single bond, phenylene, naphthylene, or a $C_1$-$C_{12}$ linking group containing an ester bond and/or lactone ring, and $Y^2$ is a single bond or ester bond.

5. The resist composition of claim 4 which is a chemically amplified positive resist composition.

6. The resist composition of claim 3 wherein the base polymer is free of an acid labile group.

7. The resist composition of claim 6 which is a chemically amplified negative resist composition.

8. The resist composition of claim 3 wherein the base polymer comprises repeat units having any one of the formulae (f1) to (f3):

(f1)

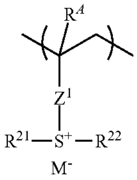

(f2)

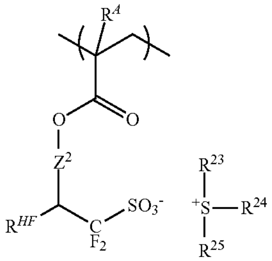

-continued (f3)

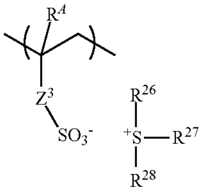

wherein $R^A$ is each independently hydrogen or methyl, $Z^1$ is a single bond, a $C_1$-$C_6$ aliphatic hydrocarbylene group, phenylene group, naphthylene group, or $C_7$-$C_{18}$ group obtained by combining the foregoing, or $-O-Z^{11}-$, $-(=O)-O-Z^{11}-$ or $-C(=O)-NH-Z^{11}-$, $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety, $Z^2$ is a single bond, $-Z^{21}-C(=O)-O-$, $-Z^{21}-O-$ or $-Z^{21}-O-C(=O)-$, $Z^{21}$ is a $C_1$-$C_{12}$ saturated hydrocarbylene group which may contain a carbonyl moiety, ester bond or ether bond, $Z^3$ is a single bond, methylene, ethylene, phenylene, fluorinated phenylene, trifluoromethyl-substituted phenylene group, $-O-Z^{31}-$, $-C(=O)-O-Z^{31}-$, or $-C(=O)-NH-Z^{31}-$, $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety, $R^{21}$ to $R^{28}$ are each independently halogen or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, $R^{HF}$ is hydrogen or trifluoromethyl, and $M^-$ is a non-nucleophilic counter ion.

9. The resist composition of claim 1, further comprising an organic solvent.

10. The resist composition of claim 1, further comprising a surfactant.

11. A pattern forming process comprising the steps of applying the chemically amplified resist composition of claim 1 onto a substrate to form a resist film thereon, exposing the resist film to high-energy radiation, and developing the exposed resist film in a developer.

12. The process of claim 11 wherein the high-energy radiation is i-line of wavelength 365 nm, ArF excimer laser of wavelength 193 nm, KrF excimer laser of wavelength 248 nm, EB or EUV of wavelength 3 to 15 nm.

* * * * *